(12) United States Patent
Delcamp et al.

(10) Patent No.: US 11,421,110 B2
(45) Date of Patent: Aug. 23, 2022

(54) DYES, DYE-SENSITIZED SOLAR CELLS, AND METHODS OF MAKING AND USING THE SAME

(71) Applicant: University of Mississippi, University, MS (US)

(72) Inventors: Jared Heath Delcamp, Oxford, MS (US); Roberta Ramalho Rodrigues, Oxford, MS (US); Adithya Peddapuram, Oxford, MS (US); Hammad Arshad Cheema, Lahore (PK); Christine Curiae, Oxford, MS (US)

(73) Assignee: UNIVERSITY OF MISSISSIPPI, University, MS (US)

( * ) Notice: Subject to any disclaimer, the term of this patent is extended or adjusted under 35 U.S.C. 154(b) by 110 days.

(21) Appl. No.: 16/779,569

(22) Filed: Jan. 31, 2020

(65) Prior Publication Data

US 2020/0247998 A1    Aug. 6, 2020

Related U.S. Application Data

(66) Continuation-in-part of application No. 16/634,050, Substitute for application No. PCT/US2018/043862, filed on Jul. 26, 2018.
(Continued)

(51) Int. Cl.
*C09B 23/01* (2006.01)
*H01L 51/00* (2006.01)
(Continued)

(52) U.S. Cl.
CPC ........ *C09B 23/0058* (2013.01); *C07F 15/065* (2013.01); *H01G 9/2018* (2013.01);
(Continued)

(58) Field of Classification Search
CPC .. H01G 9/2059; H01G 9/2018; C07F 15/065; C09B 23/0058
See application file for complete search history.

(56) References Cited

U.S. PATENT DOCUMENTS 10,562,913 B2 *   2/2020   Delcamp .............. C07D 471/04
11,084,839 B2 *   8/2021   Hollis ........................ C25B 1/00
(Continued)

FOREIGN PATENT DOCUMENTS

WO        20120102544 A2     8/2012

OTHER PUBLICATIONS

Zhu, W. et al.: "Organic D-A-pi—A Solar Cell Sensitizers with Improved Stability and Spectral Response", Adv. Funct. Mater., vol. 21, No. 4 Dec. 10, 2010 (Dec. 10, 2010), pp. 756-763, XP001560462.
(Continued)

*Primary Examiner* — Seahvosh Nikmanesh
(74) *Attorney, Agent, or Firm* — Thomas|Horstemeyer, LLP

(57) ABSTRACT

Provided herein are dyes, dye-sensitized solar cells, and sequential series multijunction dye-sensitized solar cell devices. The dyes include an electron deficient acceptor moiety, a medium electron density π-bridge moiety, and an electron rich donor moiety comprising a biaryl, a substituted biaryl, or an $R^1$, $R^2$, $R^3$ substituted phenyl where each of $R^1$, $R^2$, and $R^3$ independently comprises H, aryl, multiaryl, alkyl substituted aryl, alkoxy substituted aryl, alkyl substituted multiaryl, alkoxy substituted multiaryl, $OR^4$, $N(R^5)_2$, or a combination thereof; each $R^4$ independently comprises H, alkyl, aryl, alkyl substituted aryl, alkoxy substituted aryl, or a combination thereof; and each $R^5$ independently comprises aryl, multiaryl, alkyl substituted aryl, alkoxy substituted aryl, alkyl substituted multiaryl, alkoxy substituted multiaryl, or a combination thereof. The solar cells include a glass
(Continued)

substrate, a dye-sensitized active layer, and a redox shuttle. The devices include at least two dye-sensitized solar cells connected in series.

20 Claims, 31 Drawing Sheets

Related U.S. Application Data

(60) Provisional application No. 62/547,981, filed on Aug. 21, 2017, provisional application No. 62/537,208, filed on Jul. 26, 2017.

(51) Int. Cl.
  *C07F 15/06* (2006.01)
  *H01G 9/20* (2006.01)

(52) U.S. Cl.
  CPC ....... *H01G 9/2059* (2013.01); *H01L 51/0064* (2013.01); *H01L 51/0096* (2013.01)

(56) References Cited

U.S. PATENT DOCUMENTS

| | | | |
|---|---|---|---|
| 2014/0239288 A1* | 8/2014 | Delcamp | H01L 51/0064 257/40 |
| 2016/0343515 A1 | 11/2016 | Mehmood et al. | |
| 2019/0016741 A1* | 1/2019 | Hollis | C07F 15/006 |

OTHER PUBLICATIONS

Yum, J.-H. et al.: "A cobalt complex redox shuttle for dye-sensitized solar cells with high open-circuit potentials", nature communications, vol. 3, No. 631 Jan. 17, 2012 (Jan. 17, 2012), pp. 1-8, XP055569643.

Chou, H.-H. et al.: "First-principle Determination of Electronic Coupling and Prediction of Charge Recombination Rates in Dye-sensitized Solar Cells", J. Phys. Chem. C, vol. 121, No. 2 Dec. 14, 2016 (Dec. 14, 2016), pp. 983-992, XP055569648.

Gavin Tsai, H.-H. et al.: "First-Principle Characterization of the Adsorption Configurations of Cyanoacrylic Dyes on TiO2 Film for Dye-Sensitized Solar Cells", J. Phys. Chem. A, vol. 120, No. 44 Oct. 20, 2016 (Oct. 20, 2016), pp. 8813-8822, XP055569650.

Gao Peng et al: fused acenes as electrochemical properties 11,11 Organic dyes containing building blocks: Optical, and photovoltaic 2,6.7 Chinese Chemical Letters, vol. 29, No. 2, Sep. 28, 2017 (Sep. 28, 2017), 289-292, XP055849559, Amsterdam, NL ISSN: 1001-8417, DOI: 10.1016/j.cclet.2017.09.056 * p. 290; figure 2 *.

International Search Report and Written Opinion for PCT/US2018/043862 dated Nov. 16, 2018.

Extended European Search Report for Application No. 18837771. 7-1110 dated Oct. 21, 2021.

* cited by examiner

HD-2-mono

DYES, DYE-SENSITIZED SOLAR CELLS, AND METHODS OF MAKING AND USING THE SAME

RELATED APPLICATIONS

This application is a continuation-in-part of U.S. application Ser. No. 16/634,050, filed Jan. 24, 2020, which is a national stage application, filed under 35 U.S.C. § 371, of International Patent Application No. PCT/US2018/043862, filed Jul. 26, 2018, which claims the benefit of U.S. Provisional Application Ser. No. 62/537,208, filed Jul. 26, 2017, and 62/547,981, filed Aug. 21, 2017, the entire disclosures of which are incorporated herein by this reference.

GOVERNMENT INTEREST

This invention was made with government support under grant numbers 1539035 and 1455167 awarded by the National Science Foundation (NSF), and DE-SC0019131 awarded by the U.S. Department of Energy. The government has certain rights in the invention.

TECHNICAL FIELD

The present invention relates to dyes, dye-sensitized solar cells, and methods of making and using the same. In particular, the presently-disclosed subject matter relates to sensitizer dyes, sequential series multijunction dye-sensitized solar cells (SSM-DSC), and methods of making and using the same.

BACKGROUND

Global energy demand is expected to increase from 18TW in 2013 to 24-26 TW in 2040, along with corresponding increase in $CO_2$ emissions, due to inevitable increase in population and industrialization. So far most of the energy (~80%) has been derived from fossil fuels, which is not sustainable and detrimental to the environment. Therefore, sustainable fossil fuel-free pathways to electricity and fuel production, such as conversion of water to $H_2$, nitrogen to ammonia, and/or $CO_2$ to carbons fuels with only $O_2$ as a byproduct, are highly desirable.

While solar energy may be the most abundant energy source, efficient solar energy capture, conversion, and storage (potentially in chemical bonds) must be realized in order to provide a large scale, cost effective, carbon neutral energy source. Despite intensive research efforts over the last few decades, such photovoltaic powered solar fuel systems are currently lacking. For example, one highly studied type of solar cell includes perovskite solar cells (PSCs), which have been reported with record efficiencies for powering water splitting and $CO_2$ reduction catalysts. However, the stability of PSCs currently limits long term generation of fuels from these systems, while their water soluble lead-based nature raises various environmental and health concerns.

One possible alternative to PSC powered solar fuel systems includes dye-sensitized solar cells (DSCs). DSCs are promising in terms of cost, stability, commercial viability, and environmental impact when compared with many solar cell technologies. Additionally, DSCs are an exceptionally attractive solar cell technology for efficiently converting high potential energy photons. Existing research efforts for DSCs have attempted to increase efficiency of single-junction devices primarily through balancing both photocurrent ($J_{sc}$) and $V_{oc}$.

With respect to achieving high $V_{oc}$, $Co(bpy-pz)_2^{3+/2+}$ was first reported in 2011 by Gratzel et al. as a legitimate alternative to $I^-/I_3^-$ and $Co(bpy)_3^{3+/2+}$ for DSCs with Y123 sensitizer. The highest $V_{oc}$ provided by these DSCs was 1.0 V, with a PCE of up to 10%. The $V_{oc}$ was further improved to 1.1 V with custom made $TiO_2$ paste and atomic layer deposition. Additionally, Hagfeldt and Boschloo's group reported D35 giving $V_{oc}$ of 1.02 V and overall PCE of 3.6% with $Co(bpy-pz)_2^{3+/2+}$, as well as $V_{oc}$ of 0.85 V and overall PCE of 6.5% with $Co(bpy)_3^{3+/2+}$ under the reported conditions. However, single cell devices convert all absorbed photons regardless of potential energy to the same voltage, resulting in significant energetic waste from high-energy solar spectrum photons. As such, the highest $V_{oc}$ values for a single DSC cell, as reported by Hanaya et al., are currently 1.45 V and 1.21 V with a tailored organic dye and $Br_3^-/Br^-$ redox shuttle.

One strategy for increasing solar cell power conversion efficiencies includes using series tandem DSCs (ST-DSCs) in conjunction with inorganics (e.g., GaAs or silicon) and/or organic photovoltaic (OPV) cells. This strategy relies on light absorbing materials of different wavelength ranges, or photons of different potential energies, in separate subcells to divide up the solar spectrum between these subcells (FIG. 1A). In contrast to parallel tandem DSCs, where the $J_{sc}$ of the individual devices is added, ST-DSCs provide addition of the $V_0$ from individual devices to provide a higher overall $V_{oc}$. There are two main approaches that can be adopted to achieve high $V_{oc}$ in ST-DSCs, one includes mechanically stacked devices with n*2 terminals (n is the number of sub-cells) and the other includes mono-lithic two terminal cells. Using these approaches, ST-DSC $V_{oc}$ values in the range of 1.4-1.85 V have been reported with organic dyes in conjunction with inorganics and porphyrin sensitizers. DSCs in conjunction with other type solar cells exhibited high voltages of 1.36 V with DSC/Silicon, 1.85 V with DSC/GaAs, and 1.2 V with DSC/OPV.

This is particularly attractive for powering electrochemical cells, where $V_{oc}$ values of 1.83 and 3.0 V were demonstrated to function for water oxidation and $CO_2$ reduction, respectively. In fact, 1.83 V organic/porphyrin dye tandem DSCs have been successfully employed for water oxidation along with 0.248 mV bias resulting in 7.4% applied bias photon-to-current efficiency (ABPE) and solar to hydrogen (STH) efficiency of 5.75%. Although this represents an increase in photovoltage over a single DSC cell, such device architectures have not demonstrated a photovoltage in excess of 1.85 V from a single illuminated area to date. In addition, existing ST-DSC devices have been limited to two subcell (double junction) systems, because efficient light harvesting was expected to diminish beyond this point.

Accordingly, there is a need for devices and methods that provide increased overall efficiency while generating high photovoltages from a single illuminated area.

SUMMARY

This summary describes several embodiments of the presently-disclosed subject matter, and in many cases lists variations and permutations of these embodiments. This summary is merely exemplary of the numerous and varied embodiments. Mention of one or more representative features of a given embodiment is likewise exemplary. Such an embodiment can typically exist with or without the feature(s) mentioned; likewise, those features can be applied to other embodiments of the presently-disclosed subject matter, whether listed in this summary or not. To avoid excessive repetition, this summary does not list or suggest all possible combinations of features.

The presently-disclosed subject matter provides, in some embodiments, a dye including an electron deficient acceptor moiety, a medium electron density π-bridge moiety, and an electron rich donor moiety comprising a biaryl, a substituted biaryl, or a moiety having the following structure:

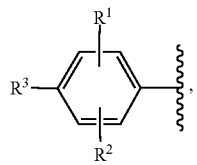

where each of $R^1$, $R^2$, and $R^3$ independently comprises H, alkyl, aryl, multiaryl, fused aryl, fused multiaryl, alkyl substituted aryl, alkoxy substituted aryl, alkyl substituted multiaryl, alkoxy substituted multiaryl, $OR^4$, or a combination thereof; and where each $R^4$ independently comprises H, alkyl, aryl, alkyl substituted aryl, alkoxy substituted aryl, or a combination thereof.

In some embodiments, the donor moiety comprises:

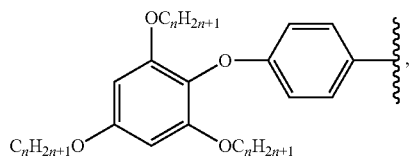

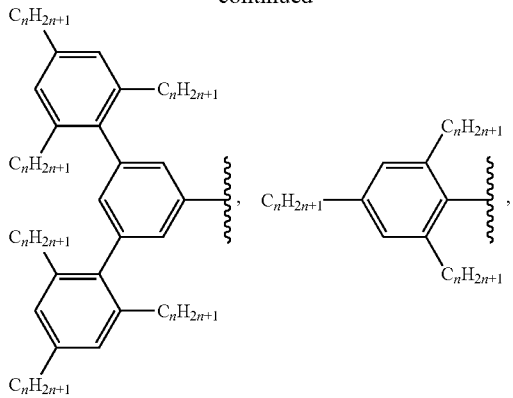

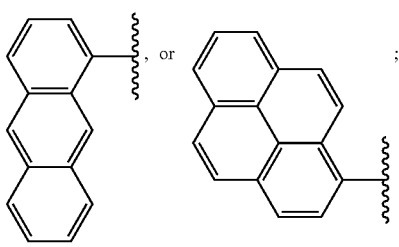

and
where n is between 1 and 30.

In some embodiments, the dye comprises:

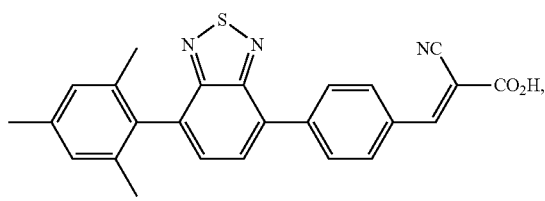

CC3

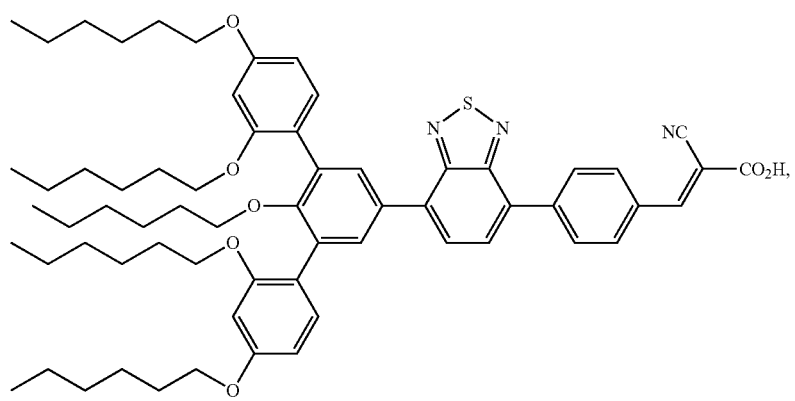

RR9

-continued
RR10
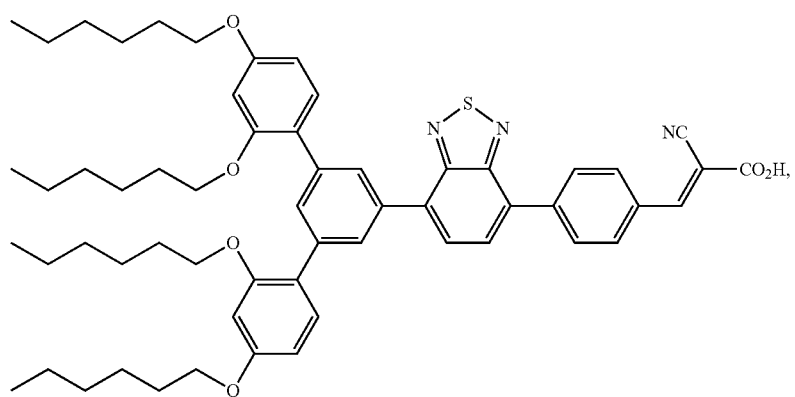
AP14
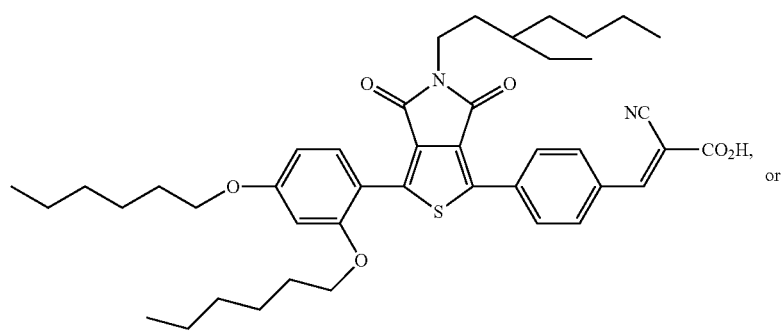
or
Target 1
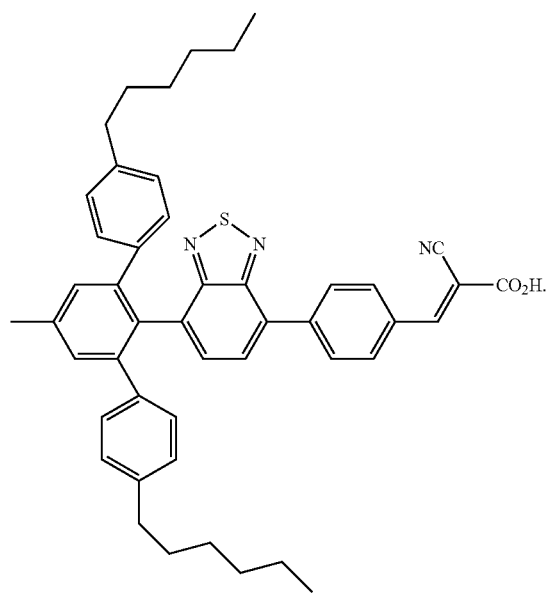
In some embodiments, the substituted biaryl comprises an alkyl or alkoxy substituted biaryl. In one embodiment, the alkyl substituted biaryl comprises the structure:
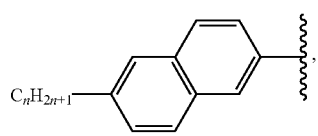
wherein n is between 1 and 30. In one embodiment, the alkoxy substituted biaryl comprises the structure:
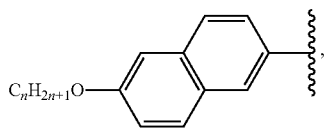
where n is between 1 and 30.

In some embodiments, the π-bridge moiety comprises:
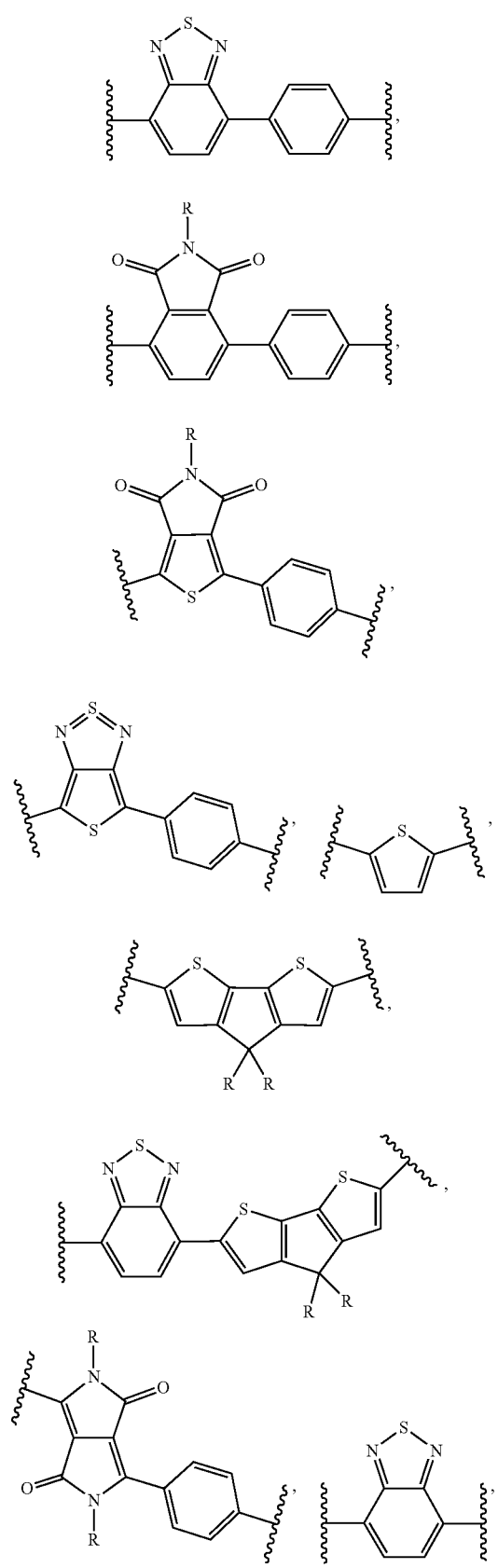
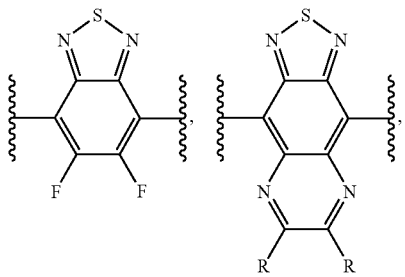
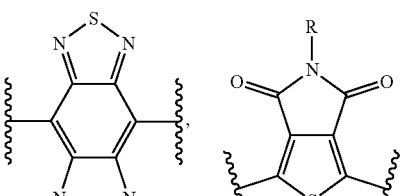
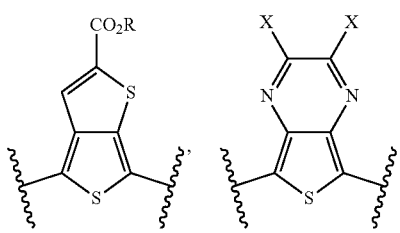
or derivatives thereof;
where each X independently comprises H, F, CN, or $CO_2R$; and each R independently comprises H, alkyl, aryl, alkyl substituted aryl, alkoxy substituted aryl, or a combination thereof.
In some embodiments, the acceptor moiety comprises:
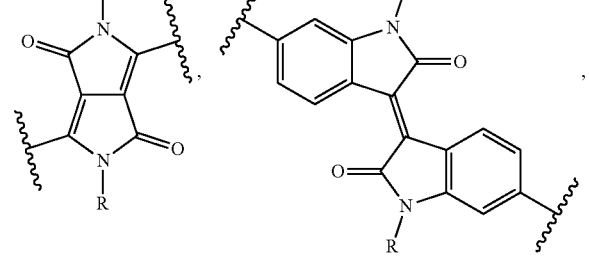
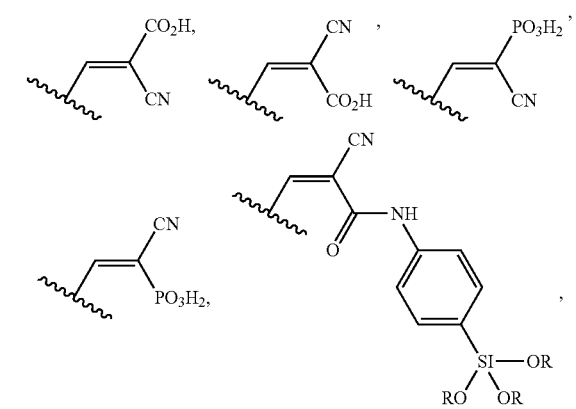

-continued

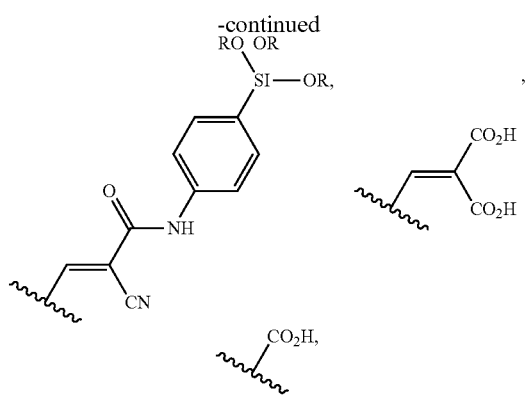

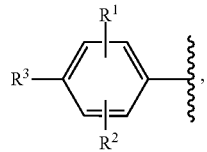

or derivatives thereof,
where each R independently comprises H, alkyl, aryl, alkyl substituted aryl, alkoxy substituted aryl, or a combination thereof.

Also provides herein, in some embodiments, is a sequential series dye-sensitized solar cell including three dye-sensitized subcells mechanically stacked and connected in series, each of the subcells including a glass substrate coated with a transparent conductive film, a dye-sensitized active layer, and a redox shuttle. In some embodiments, the dye-sensitized active layer of at least the first subcell is sensitized with a dye comprising the dye of claim 1, D35, B11, Y123, or Black Dye. In some embodiments, the dye-sensitized active layer is sensitized with a dye comprising D35, Y123, RR9, or a dye including an electron deficient acceptor moiety, a medium electron density π-bridge moiety, and an electron rich donor moiety comprising a biaryl, a substituted biaryl, or a moiety having the following structure:

$$\begin{array}{c}R^1\\R^3-\!\!\!\!-\!\!\!\!\!\!\!\!\bigcirc\!\!\!\!\!-\!\!\!\!\!-\!\!\!\!\!\!\\R^2\end{array}$$

where each of $R^1$, $R^2$, and $R^3$ independently comprises H, alkyl, aryl, multiaryl, fused aryl, fused multiaryl, alkyl substituted aryl, alkoxy substituted aryl, alkyl substituted multiaryl, alkoxy substituted multiaryl, $OR^4$, or a combination thereof, and where each $R^4$ independently comprises H, alkyl, aryl, alkyl substituted aryl, alkoxy substituted aryl, or a combination thereof. In some embodiments, the redox shuttle is a cobalt redox shuttle.

In some embodiments, the dye-sensitized solar cell further includes a UV cutoff filter. In one embodiment, the dye-sensitized active layer of the first subcell has a thickness of between 0.8 and 3.0 µm. In another embodiment, the dye-sensitized active layer of the second subcell has a thickness of between 1.5 and 5.0 µm. In some embodiments, the dye-sensitized solar cell further includes an antireflective coating applied over a non-conductive side of at least one of a photoanode and a cathode of one or more of the dye-sensitized solar cells. In some embodiments, the dye-sensitized solar cell further includes an immersion oil positioned between at least two of the subcells.

In some embodiments, the dye-sensitized active layer of the first subcell is sensitized with a dye comprising:

CC1

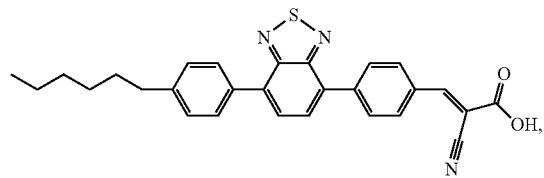

CC2

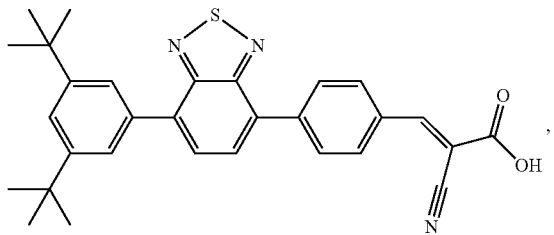

CC3

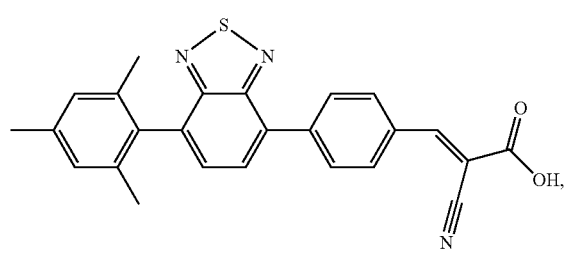

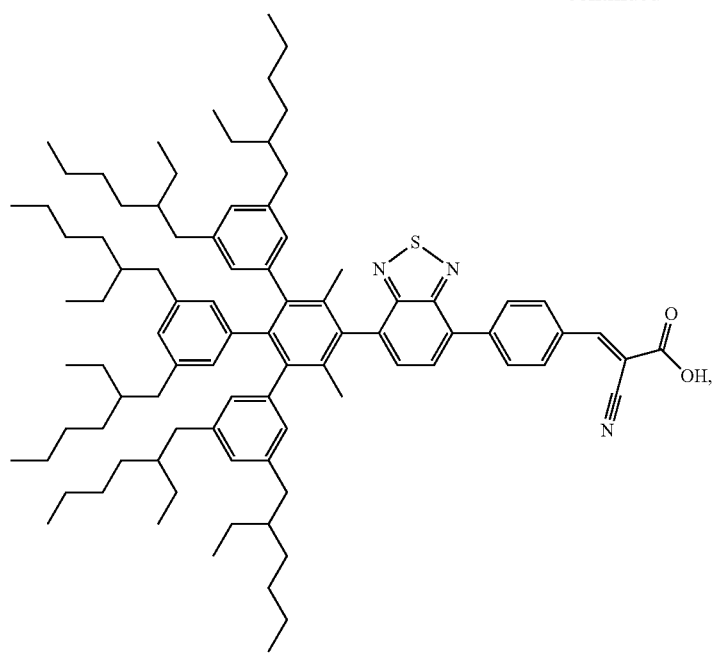
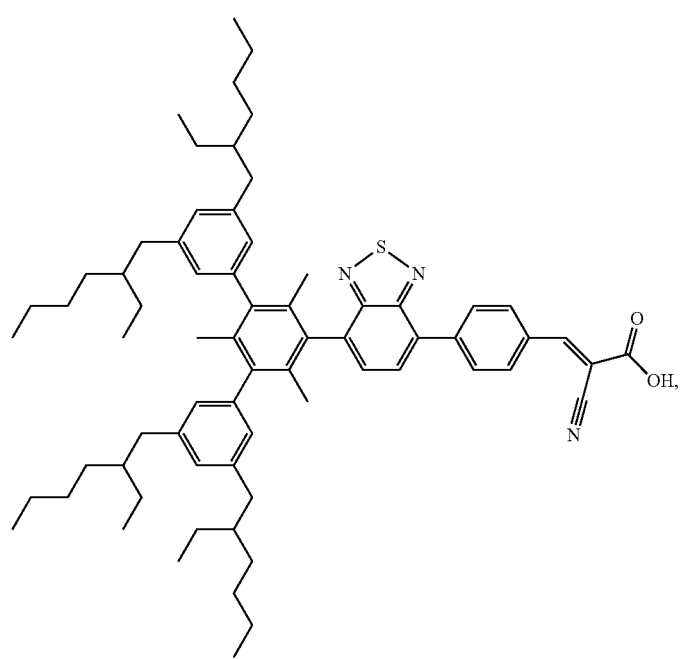

-continued
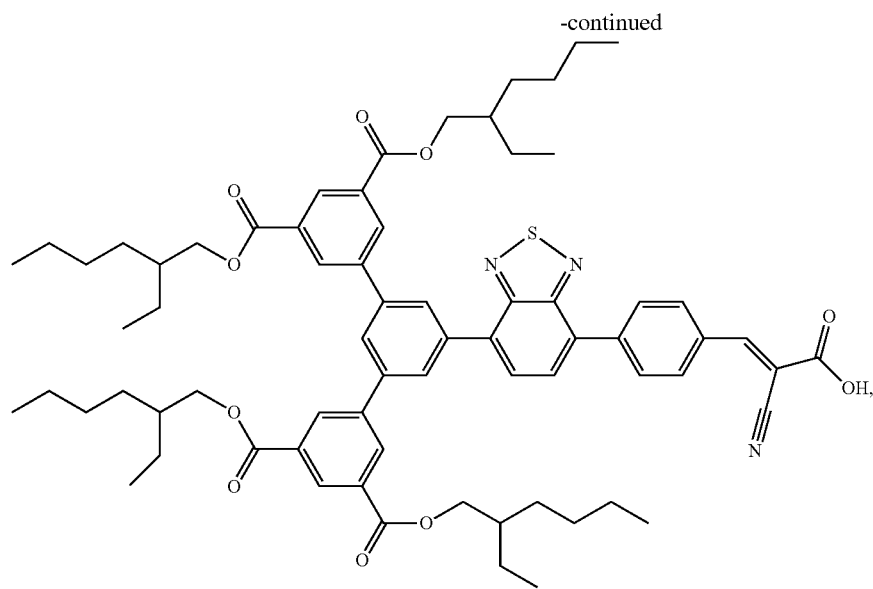
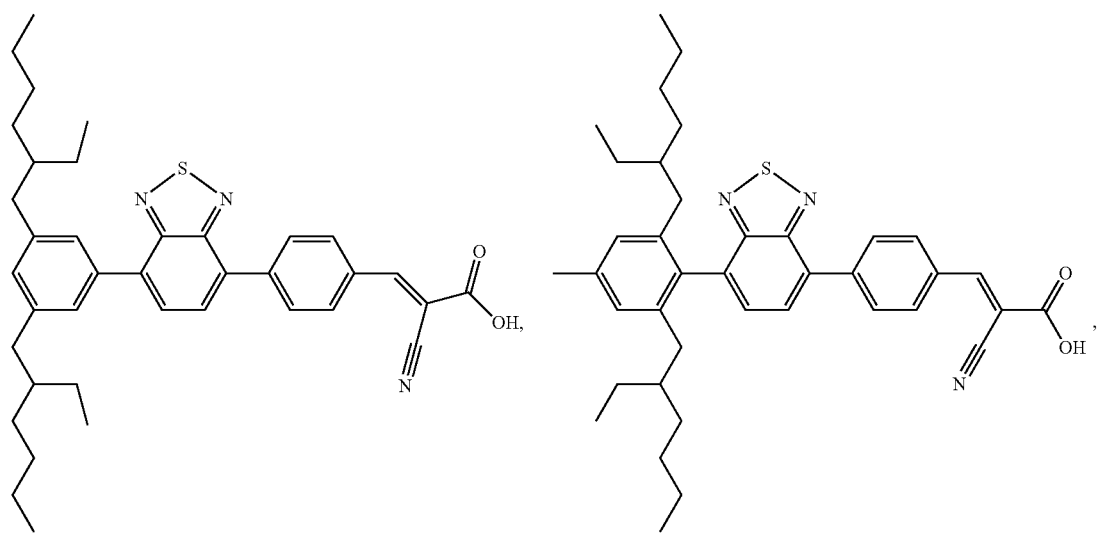
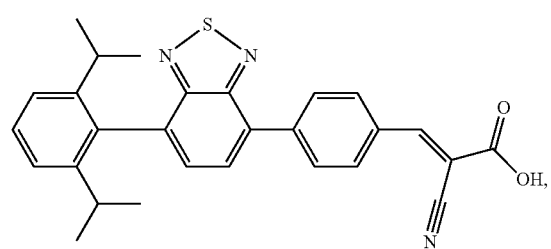

-continued
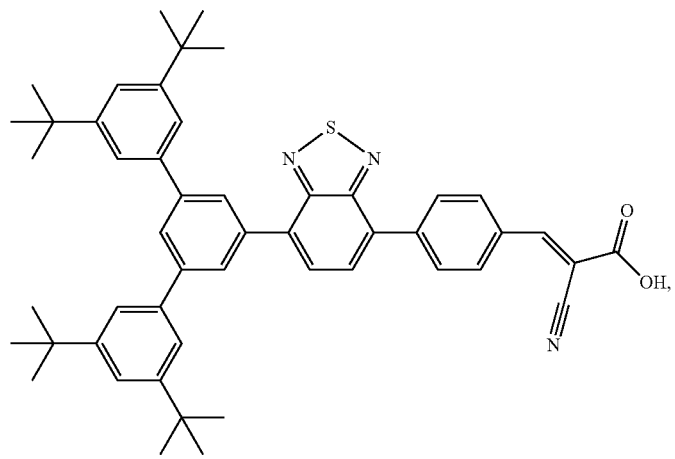
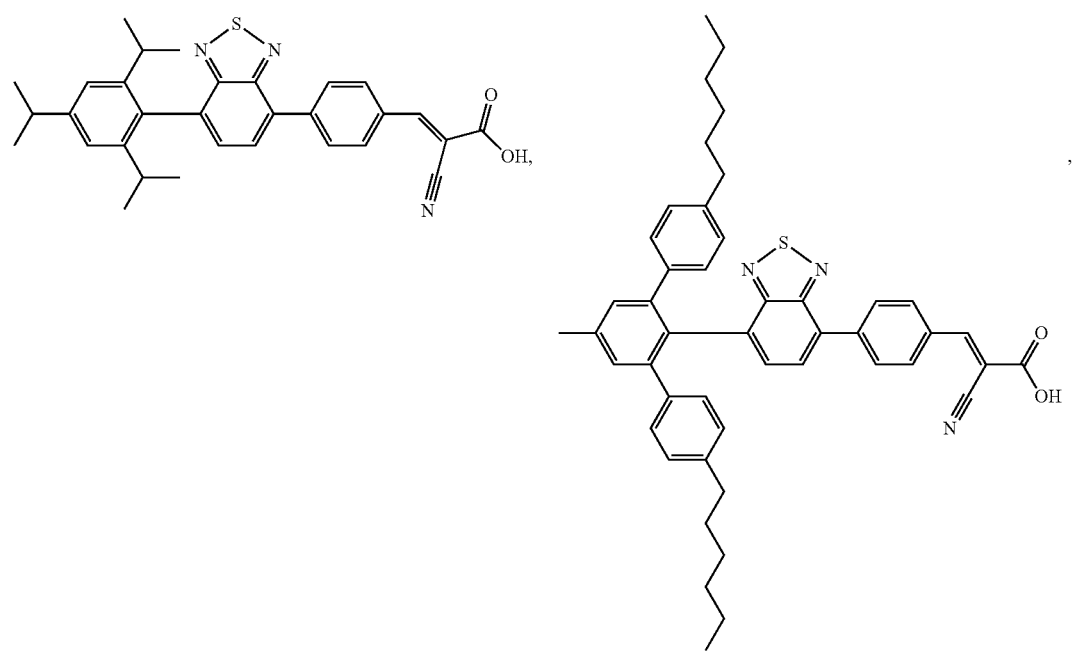
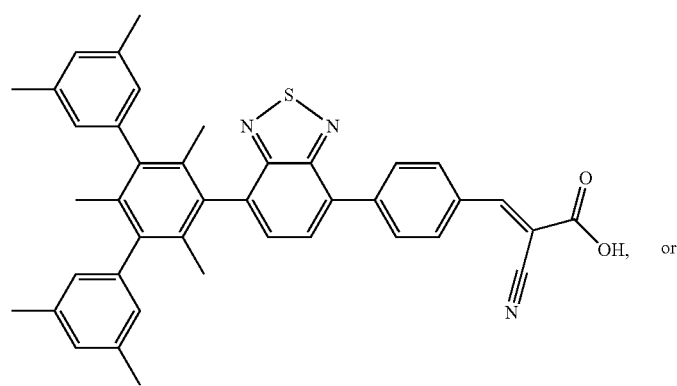

-continued

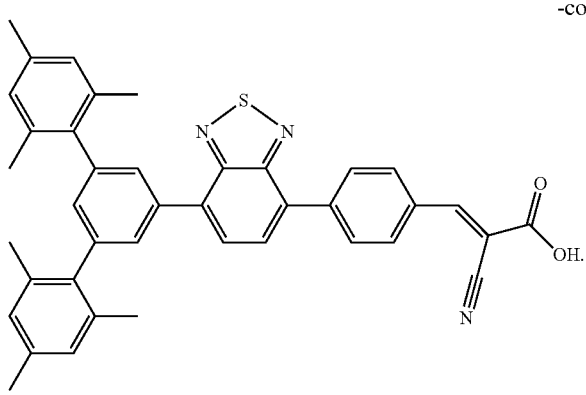

In some embodiments, the dye-sensitized active layer of at least the first and second subcells is sensitized with a dye comprising the dye of claim 1, D35, B11, Y123, or Black Dye. In some embodiments, the dye-sensitized active layer of each of the subcells is sensitized with a dye comprising the dye of claim 1, D35, B11, Y123, or Black Dye.

Further provided herein, in some embodiments, is a sequential series multijunction dye-sensitized solar cell including at least two dye-sensitized subcells mechanically stacked and connected in series, each of the subcells including a glass substrate coated with a transparent conductive, a dye-sensitized active layer, and a redox shuttle, and at least one additional subcell mechanically stacked and connected in series, where the at least one additional subcell is an inorganic solar cell. In some embodiments, the dye-sensitized active layer of the first subcell has a thickness of between 0.8 and 3.0 μm. In some embodiments, the dye-sensitized active layer of the second subcell has a thickness of between 1.5 and 5.0 μm.

BRIEF DESCRIPTION OF THE DRAWINGS

The presently-disclosed subject matter will be better understood, and features, aspects and advantages other than those set forth above will become apparent when consideration is given to the following detailed description thereof. Such detailed description makes reference to the following drawings, wherein.

Figure 1A:
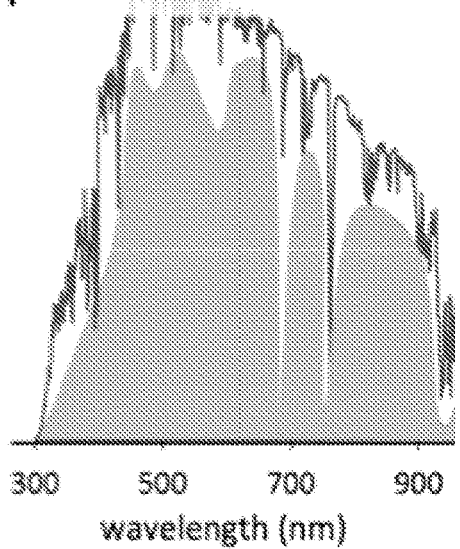
FIGS. 1A-I show graphs and images illustrating SSM-DSC systems. (A) Shows a graph illustrating how solar spectrum photons were divided in prior work. (B) Shows the general structure for metal-free organic sensitizers. (C) Shows the structure of metal-free organic sensitizer D35. (D) Shows the structure of metal-free organic sensitizer Y123. (E) Shows the structure of the cobalt redox shuttle $Co(bpy-pz)_2^{3+/2+}$. (F) Shows the structure of the cobalt redox shuttle $Co(bpy)_3^{3+/2+}$. (G) Shows the structure of the surface capping agents pivalic acid, heptanoic acid, myristic acid, stearic acid, melisic acid, decylphosphonic acid, octadecylphosphonic acid, ethyltrimethoxy silane, isooctyltrimethoxy silane, octyltrimethoxy silane, dodecyltrimethoxy silane, octadecyltrimethoxy silane, perfluorooctyltrimethylsilane (PFTS; 3,3,4,4,5,5,6,6,7,7,8,8,8-tridecafluorooctyl-trimethoxysilane), 3,3,4,4,5,5,6,6,7,7,8,8,9,9,10,10,11,11,12,12,12-heneicosafluorododecyl-trimethoxysilane, 3,3,4,4,5,5,6,6,7,7,8,8,9,9,10,10,10-heptadecafluorodecyl-trimethoxysilane, 3,3,4,4,5,5,6,6,6-nonafluorohexyl-trimethoxysilane, 3,3,4,4,5,5,5-heptafluoropentyl-trimethoxysilane, 3,3,4,4,4-pentafluorobutyl-trimethoxysilane, and 3,3,3-trifluoropropyl-trimethoxysilane. (H) Shows the structure of Ru-sensitizer HD-2-mono. (I) Shows a graph illustrating energetic and theoretical maximum possible values of D35, Y123, and HD-2-mono when paired with $I^-/I_3^-$, $Co(bpy)_3^{3+/2+}$, and $Co(bpy-pz)_2^{3+/2+}$. D35 was measured on $TiO_2$. Y123 energetics are reported previously. HD-2-mono was measured in DMF solution. Redox shuttle values are measured in MeCN.
Figure 1B:
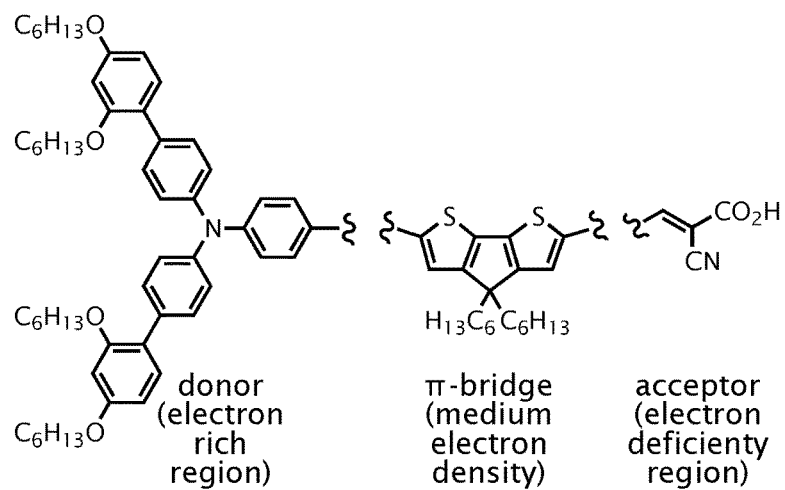
Figure 1C:
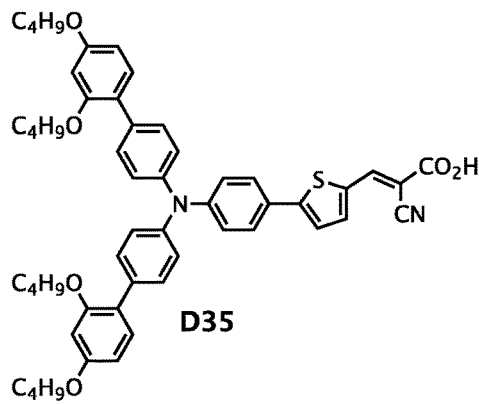
Figure 1D:
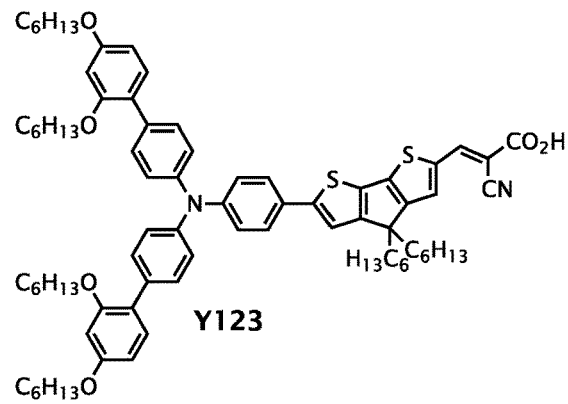

While the disclosure is susceptible to various modifications and alternative forms, specific embodiments thereof have been shown by way of example in the drawings and are herein described below in detail. It should be understood, however, that the description of specific embodiments is not intended to limit the disclosure. All modifications, equivalents, and alternatives falling within the spirit and scope of the disclosure as defined by the appended claims are to be covered.

Definitions

Unless defined otherwise, all technical and scientific terms used herein have the same meaning as commonly understood by one of ordinary skill in the art to which the disclosure belongs. Any methods and materials similar to or equivalent to those described herein can be used in the practice or testing of the present disclosure, including the methods and materials are described below.

Following long-standing patent law convention, the terms "a," "an," and "the" refer to "one or more" when used in this application, including the claims. Thus, for example, reference to "a cell" includes a plurality of cells, and so forth.

The terms "comprising," "including," and "having" are intended to be inclusive and mean that there may be additional elements other than the listed elements.

Unless otherwise indicated, all numbers expressing quantities of ingredients, properties such as reaction conditions, and so forth used in the specification and claims are to be understood as being modified in all instances by the term "about." Accordingly, unless indicated to the contrary, the numerical parameters set forth in this specification and claims are approximations that can vary depending upon the desired properties sought to be obtained by the presently-disclosed subject matter.

As used herein, the term "medium electron density" means any group or moiety having less electron density than the donor region but more than the acceptor region. As will be understood by those skilled in the art, the range of suitable electron densities will depend upon the specific donor and acceptor regions of the compounds disclosed herein.

As used herein, the term "about," when referring to a value or to an amount of mass, weight, time, volume, concentration, percentage, or the like is meant to encompass variations of in some embodiments ±50%, in some embodiments ±40%, in some embodiments ±30%, in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, ranges can be expressed as from "about" one particular value, and/or to "about" another particular value. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

All combinations of method or process steps as used herein can be performed in any order, unless otherwise specified or clearly implied to the contrary by the context in which the referenced combination is made.

DETAILED DESCRIPTION

The details of one or more embodiments of the presently-disclosed subject matter are set forth in this document. Modifications to embodiments described in this document, and other embodiments, will be evident to those of ordinary skill in the art after a study of the information provided in this document. The information provided in this document, and particularly the specific details of the described exemplary embodiments, is provided primarily for clearness of understanding and no unnecessary limitations are to be understood therefrom. In case of conflict, the specification of this document, including definitions, will control.

The presently-disclosed subject matter relates to dyes, solar cells, and methods for making and using the same. Provided herein, in some embodiments, is a dye for use in solar cells. For example, in one embodiment, the dye includes a sensitizer dye for use in dye-sensitized solar cells (DSCs). In another embodiment, the dye includes a donor-it-bridge-acceptor (D-it-A) structure, where the donor moiety is an electron rich region, the it-bridge moiety includes medium electron density, and the acceptor moiety is an electron deficient region.

In some embodiments, the donor moiety includes, but is not limited to, any moiety according to Structure I below:

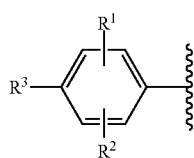

I where $R^1$, $R^2$, and $R^3$ individually include, but are not limited to, H, alkyl, aryl, multiaryl, fused aryl, fused multiaryl, alkyl substituted aryl, alkoxy substituted aryl, alkyl substituted multiaryl, alkoxy substituted multiaryl, $OR^4$, $N(R^5)_2$, or a combination thereof; each $R^4$ individually includes, but is not limited to, H, alkyl, aryl, alkyl substituted aryl, alkoxy substituted aryl, or a combination thereof; and each $R^5$ individually includes, but is not limited to, aryl, multiaryl, alkyl substituted aryl, alkoxy substituted aryl, alkyl substituted multiaryl, alkoxy substituted multiaryl, or a combination thereof.

In some embodiments, the donor moiety includes, but is not limited to, any moiety according to Structure II below:

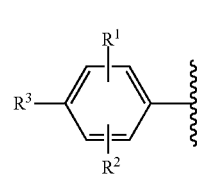

II where $R^1$, $R^2$, and $R^3$ individually include, but are not limited to, H, alkyl, aryl, multiaryl, fused aryl, fused multiaryl, alkyl substituted aryl, alkoxy substituted aryl, alkyl substituted multiaryl, alkoxy substituted multiaryl, $OR^4$, or a combination thereof; each $R^4$ individually includes, but is not limited to, H, alkyl, aryl, alkyl substituted aryl, alkoxy substituted aryl, or a combination thereof.

Suitable donor moieties according to generic Structures I and II above include, but are not limited to:

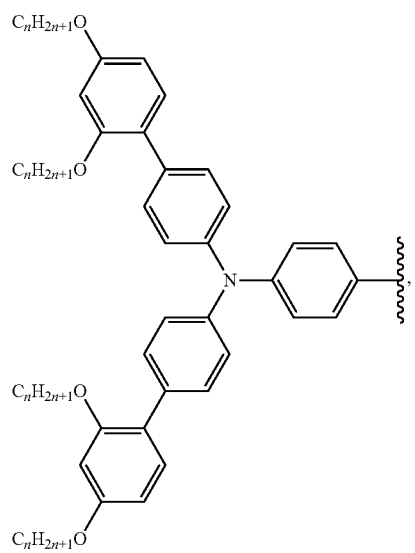

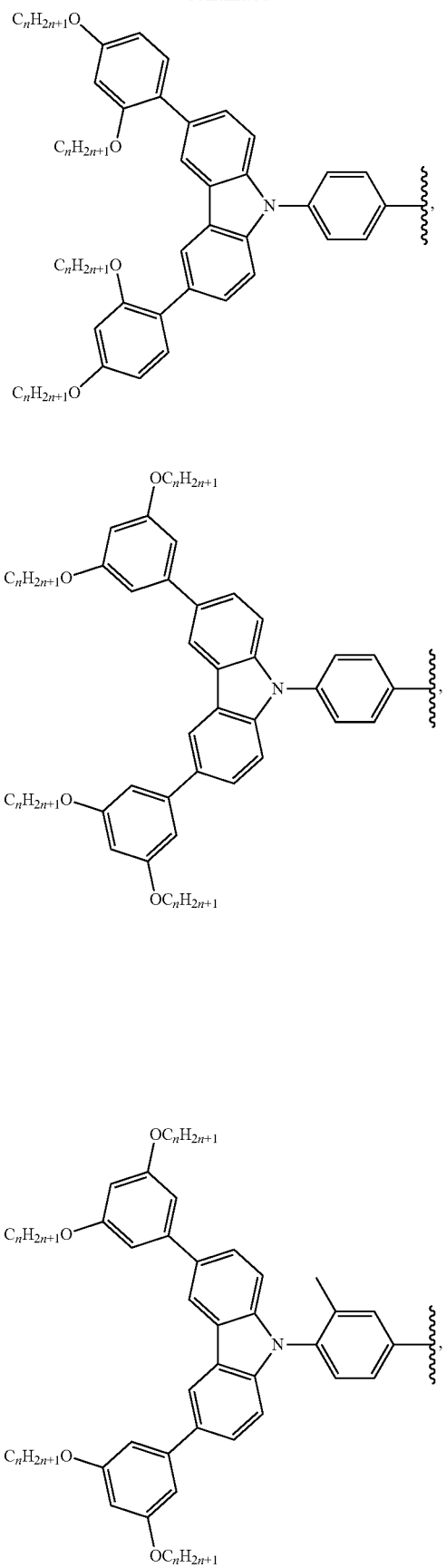
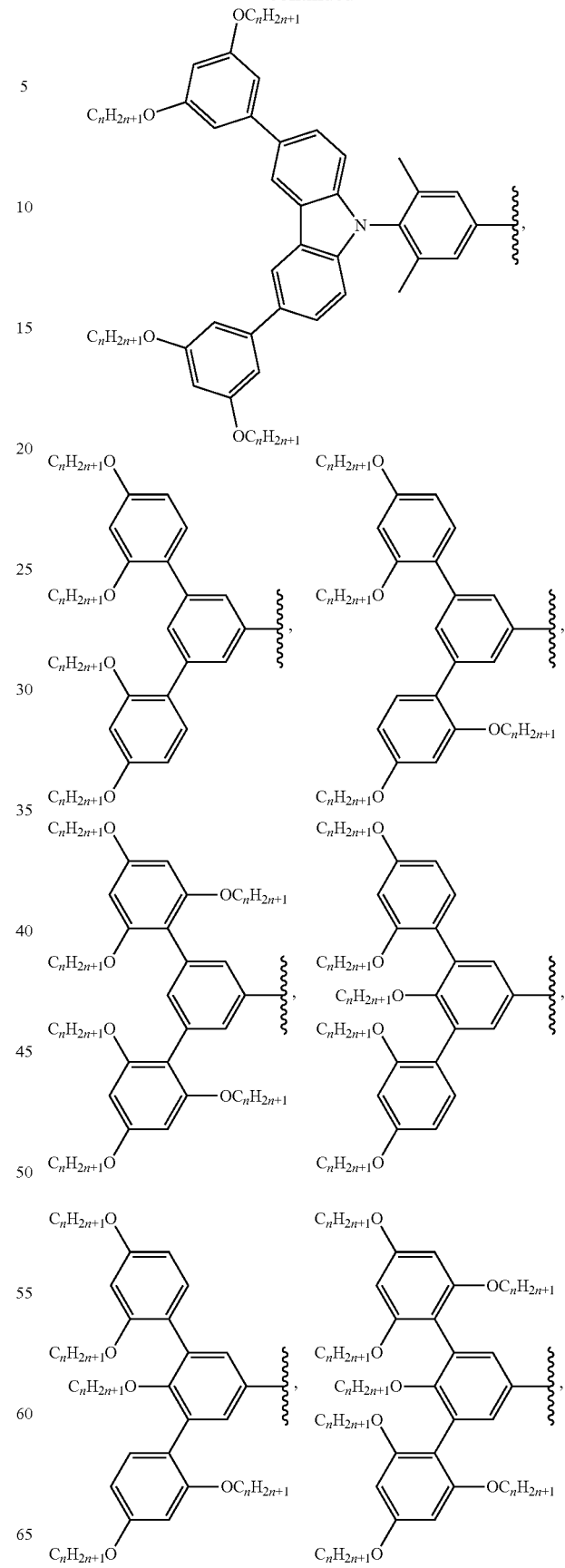

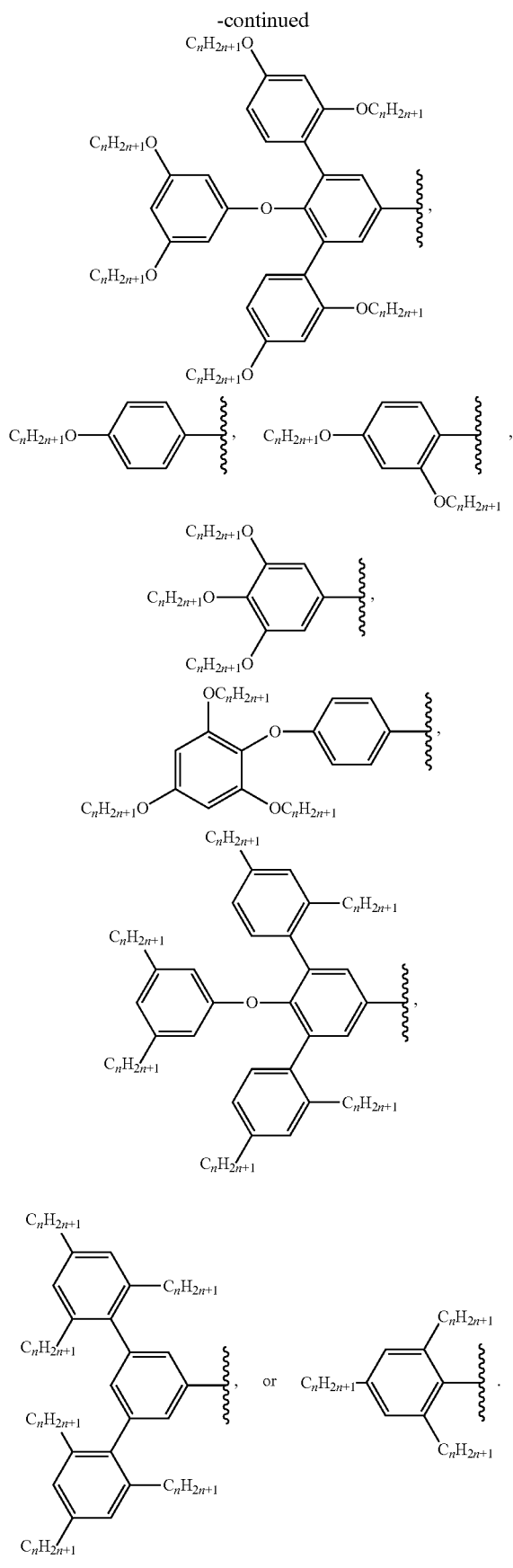

Additionally or alternatively, in some embodiments, the donor moiety includes a polycyclic moiety, such as, but not limited to, biaryl moiety, an unsubstituted biaryl, an alkyl substituted biaryl, or an alkoxy substituted biaryl, any other suitable polycyclic moiety with two or more fused rings, or any other suitable polycyclic moiety. In one embodiment, the biaryl donor moiety includes:

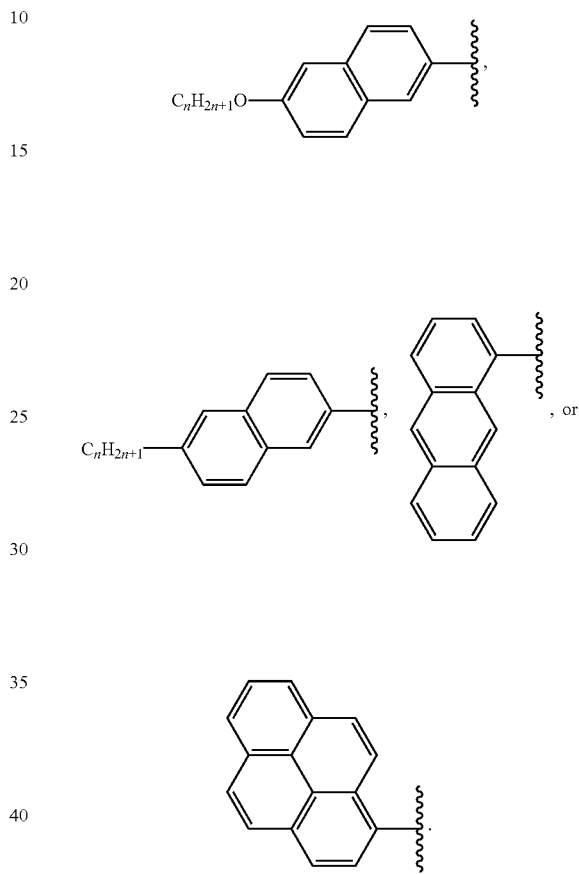

In another embodiment, the donor moiety includes one or more of the following:

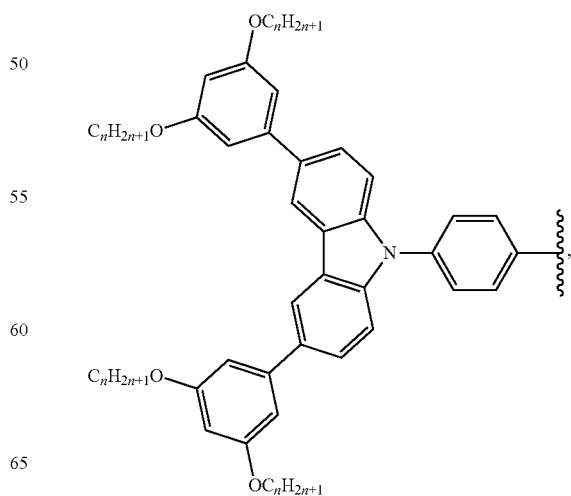

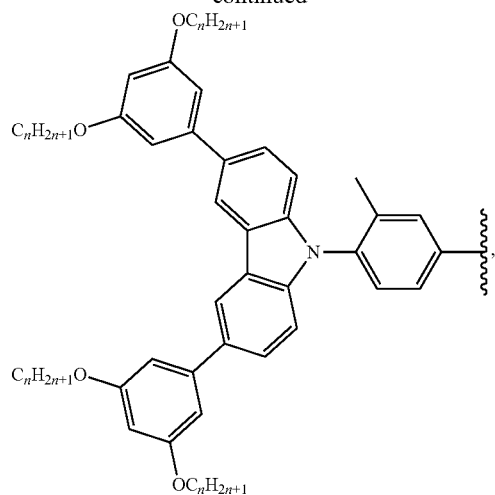
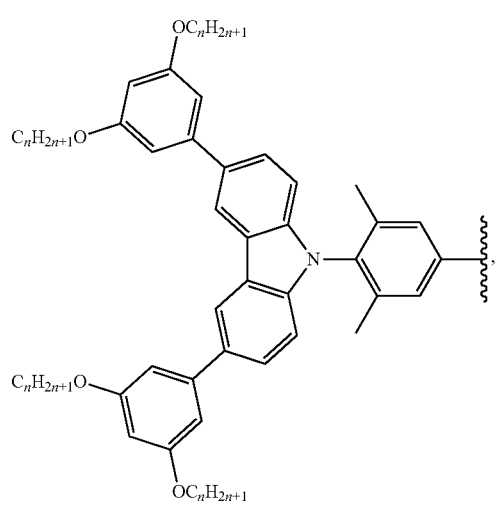
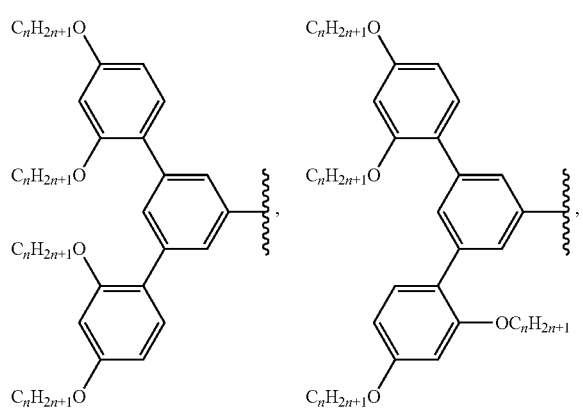
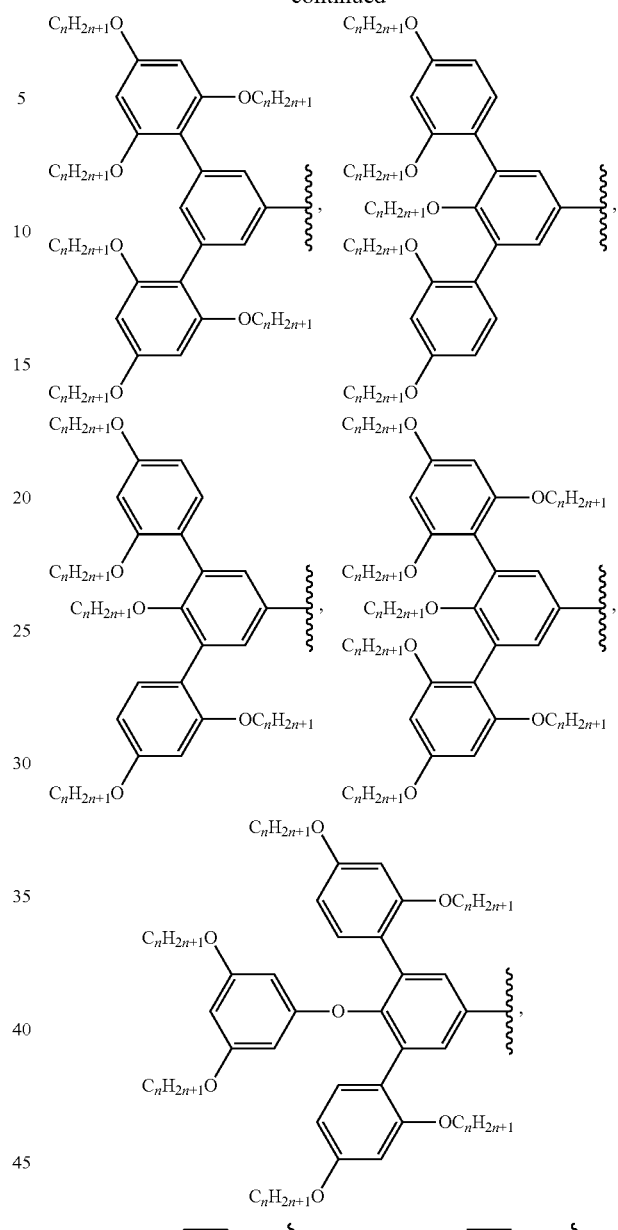
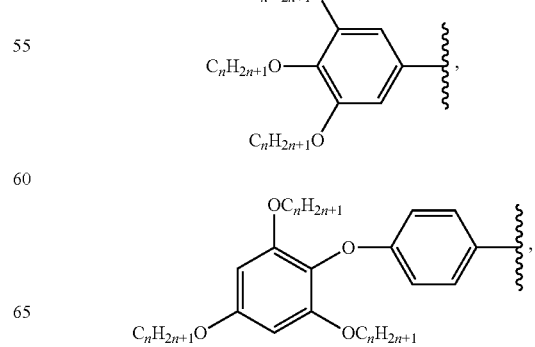

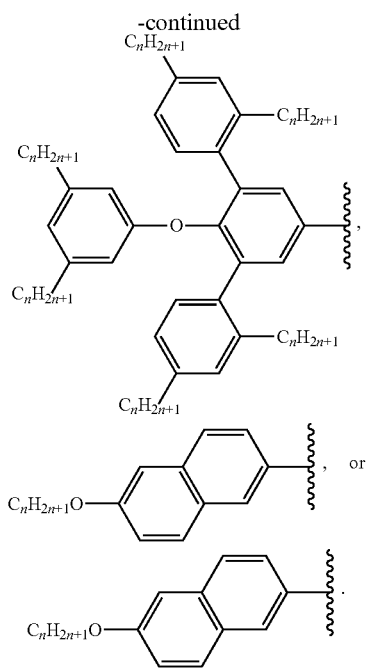

In each of the donor moieties above, n is at least 1, between 1 and 30, between 1 and 20, between 1 and 15, between 1 and 10, between 1 and 6, or any combination, sub-combination, range, or sub-range thereof. For example, in one embodiment, n is 6, such that $C_nH_{2n+1}$ and $C_nH_{2n+1}O$ are $C_6H_{13}$ and $C_6H_{13}O$, respectively. In another example, the donor moiety is selected from the following group:

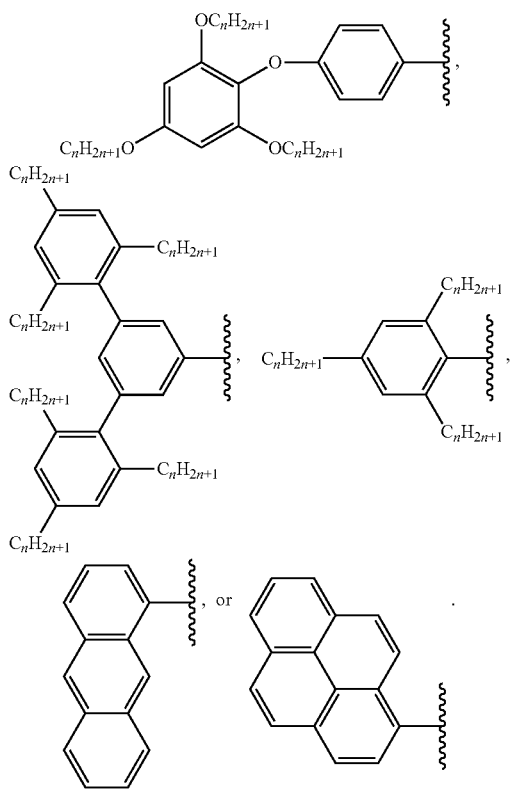

Each of the donor moieties disclosed herein above may individually be combined with any suitable π-bridge and acceptor moiety to form the sensitizer dye. Suitable π-bridge moieties include, but are not limited to, any moiety according to one or more of the following structures:

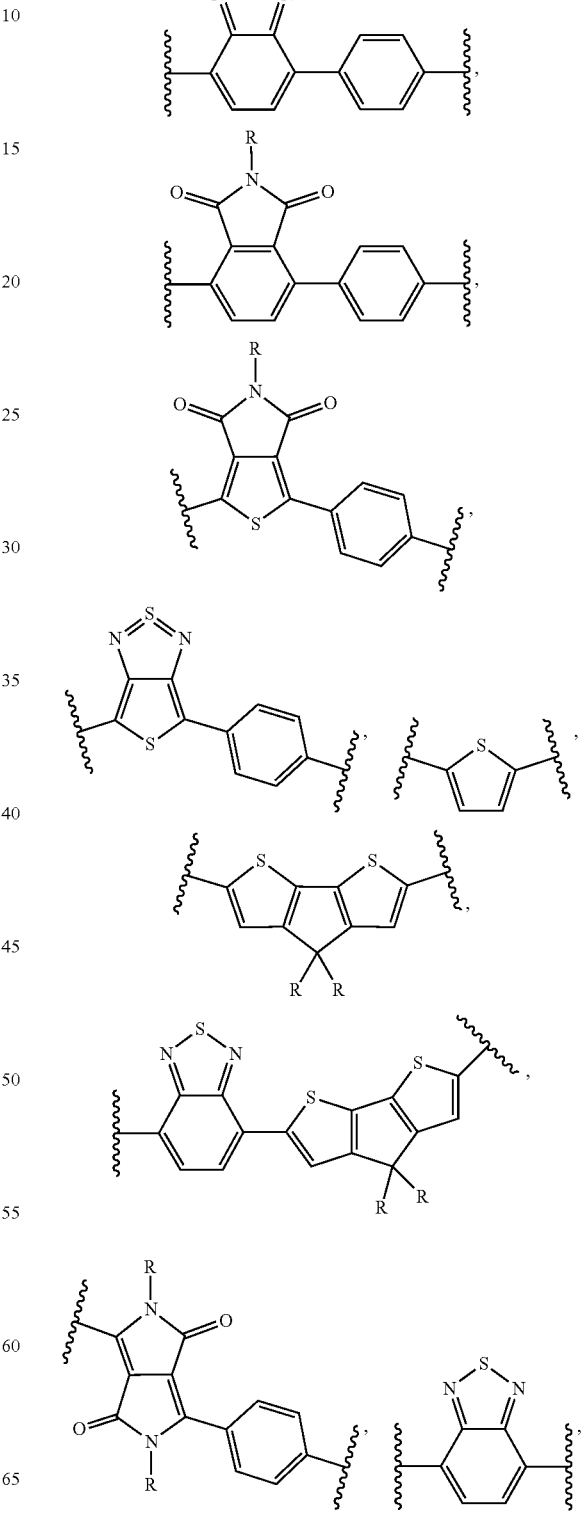

-continued

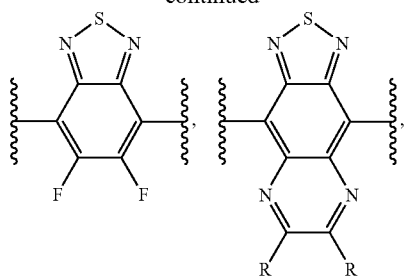

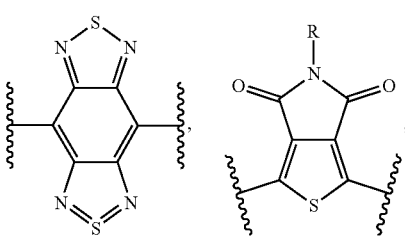

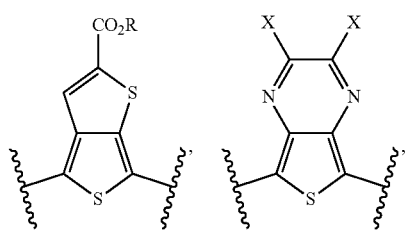

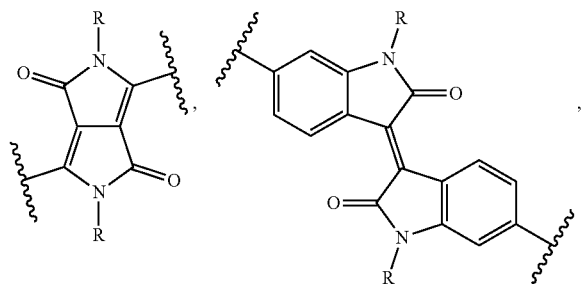

or derivatives thereof. Each R group in the π-bridge moieties above independently includes, but is not limited to, H, alkyl, aryl, alkyl substituted aryl, alkoxy substituted aryl, or a combination thereof. Each X group in the π-bridge moieties above independently includes, but is not limited to, H, F, CN, or $CO_2R$. For example, such π-bridge moieties include, but are not limited to:

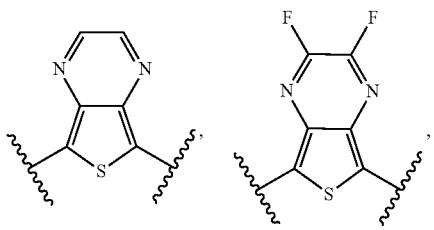

-continued

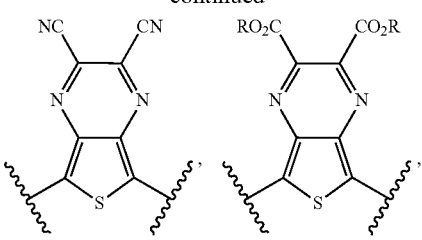

or derivative there. Although the examples above focus on symmetric π-bridge moieties, as will be understood by those skilled in the art, the disclosure is not so limited and includes dissymmetric π-bridge moieties as well. Dissymmetric π-bridge moieties may include simple analogues of the above-mentioned symmetric moieties, in terms of synthesis and/or device performance. For example, as each X is chosen independently of the other, one dissymmetric π-bridge moiety may include F at one X and H, CN, or $CO_2R$ at the other X. Similarly, in another example, both X may include $CO_2R$ with different R groups at each X.

In certain embodiments, the π-bridge moieties are selected based upon a desired electron density. While those skilled in the art will readily be able to determine the relative electron density and/or deficiency of the π-bridge moieties through common knowledge and/or routine experimentation, as an example, the following π-bridge moieties are listed in order of increasing electron deficiency:

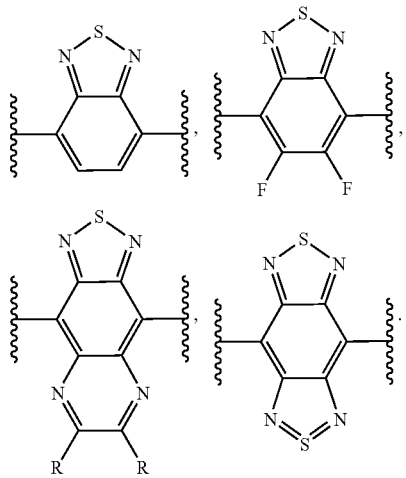

Suitable acceptor moieties include those known to individuals skilled in the art, such as, but not limited to, any moiety according to the following structure:

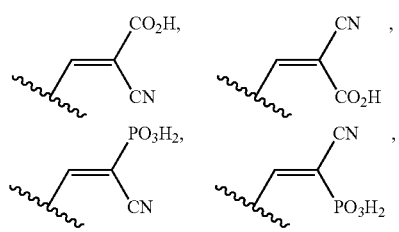

-continued

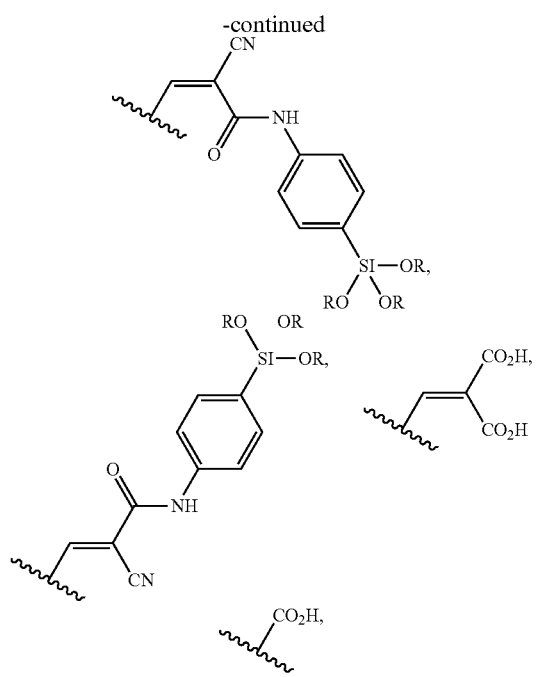

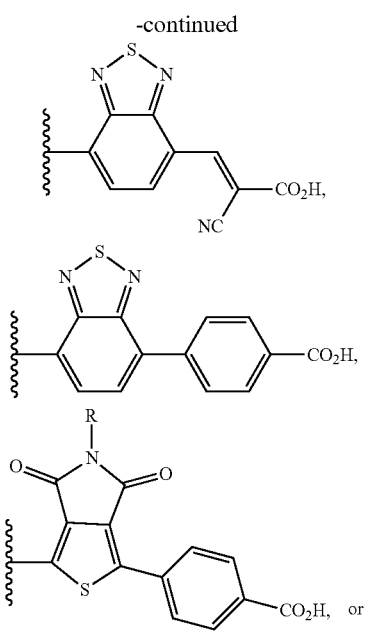

or a derivative thereof. Each R group in the acceptor moieties above independently includes, but is not limited to, H, alkyl, aryl, alkyl substituted aryl, alkoxy substituted aryl, or a combination thereof. For example, in some embodiments, the π-bridge-acceptor moiety with which any of the donor groups disclosed herein may be combined includes, but is not limited to:

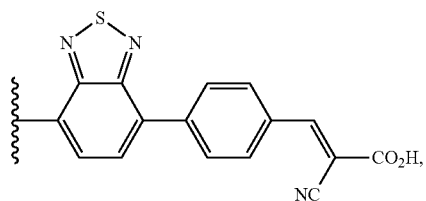

where each R group is as defined above.

In some embodiments, the sensitizer dyes according to generic Structure I or II, and including the donor, π-bridge, and acceptor moieties above, include one or more of the following:

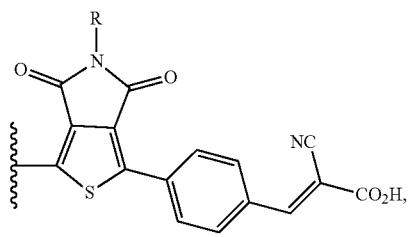

CC3

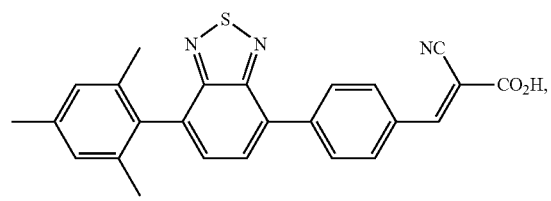

RR9

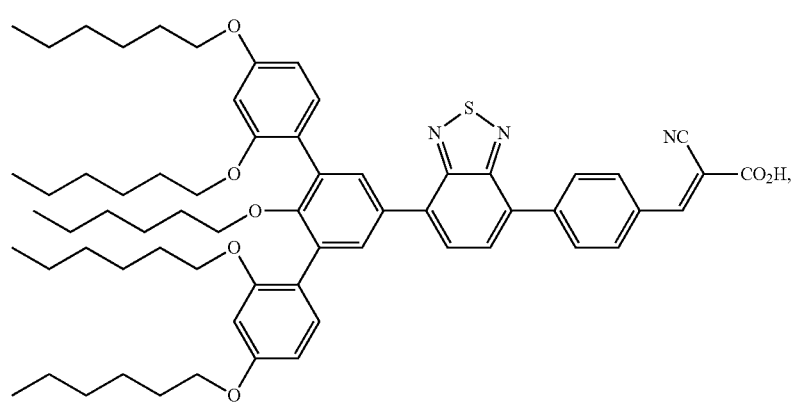

RR10
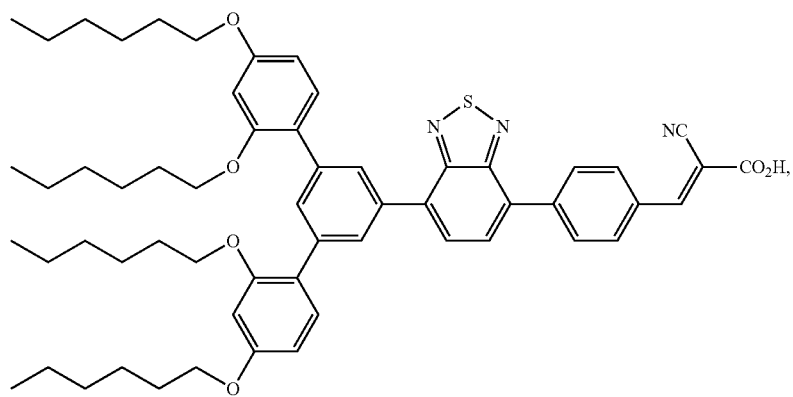
AP14
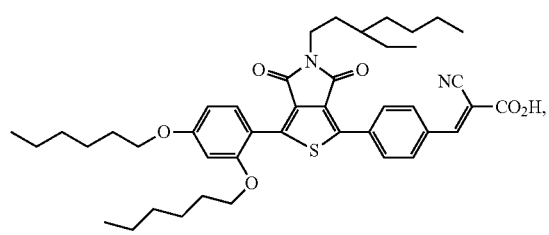
Target 1
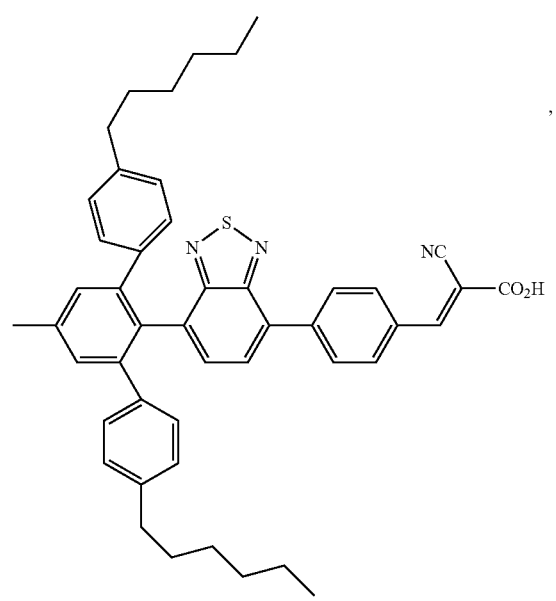
CC1
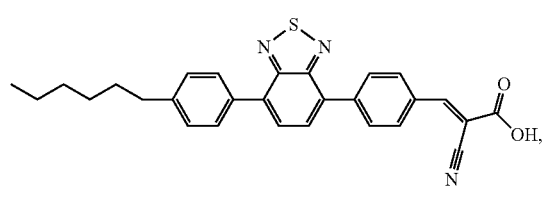
CC2
CC3
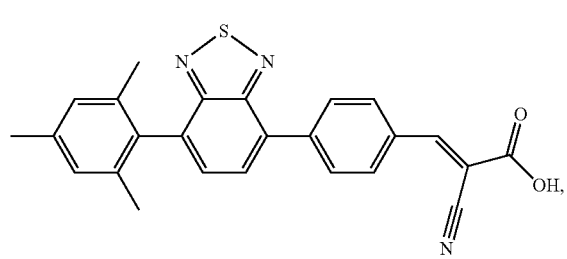

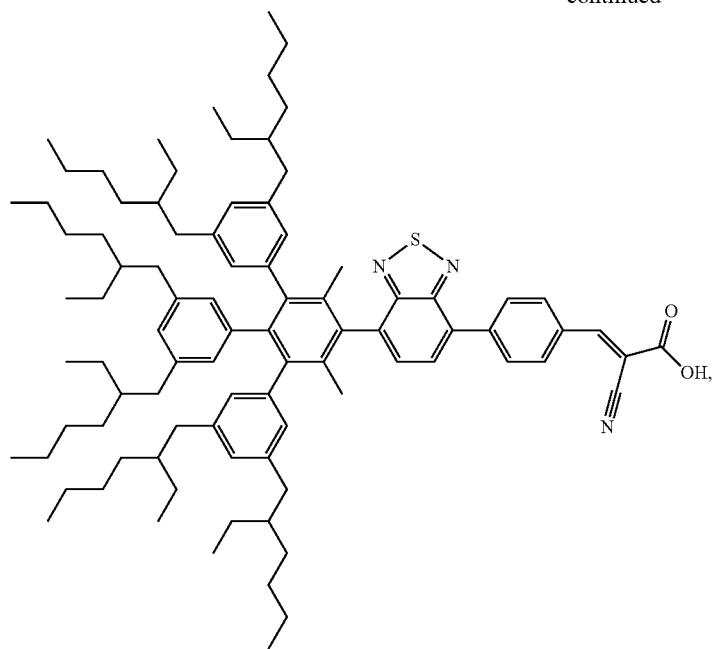
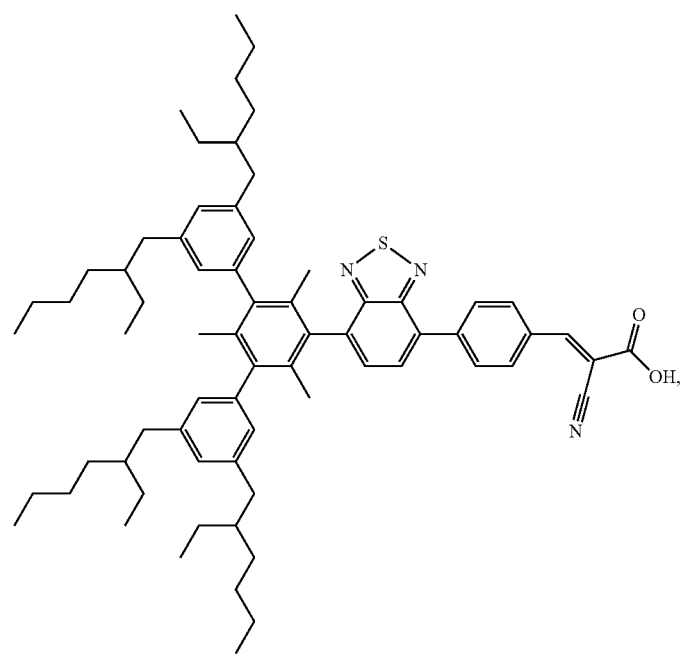

-continued
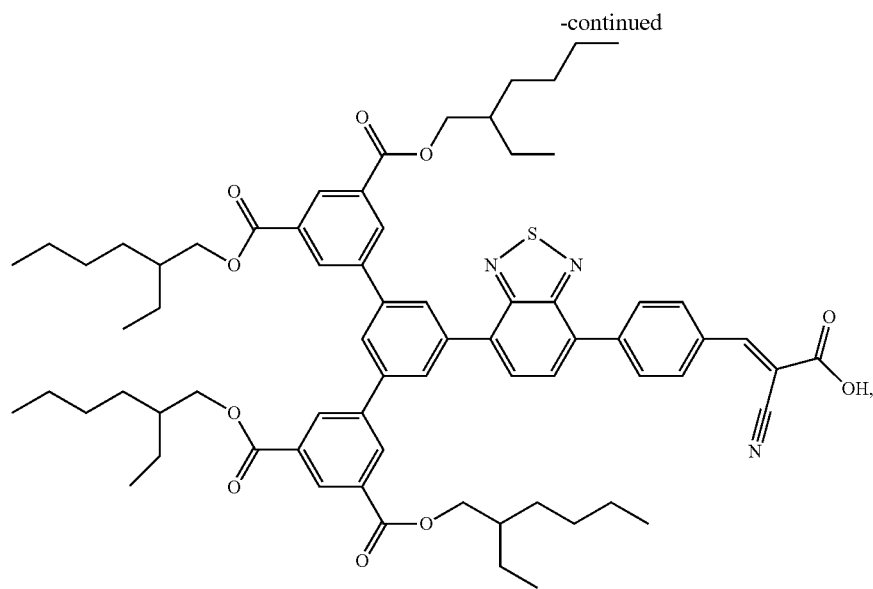
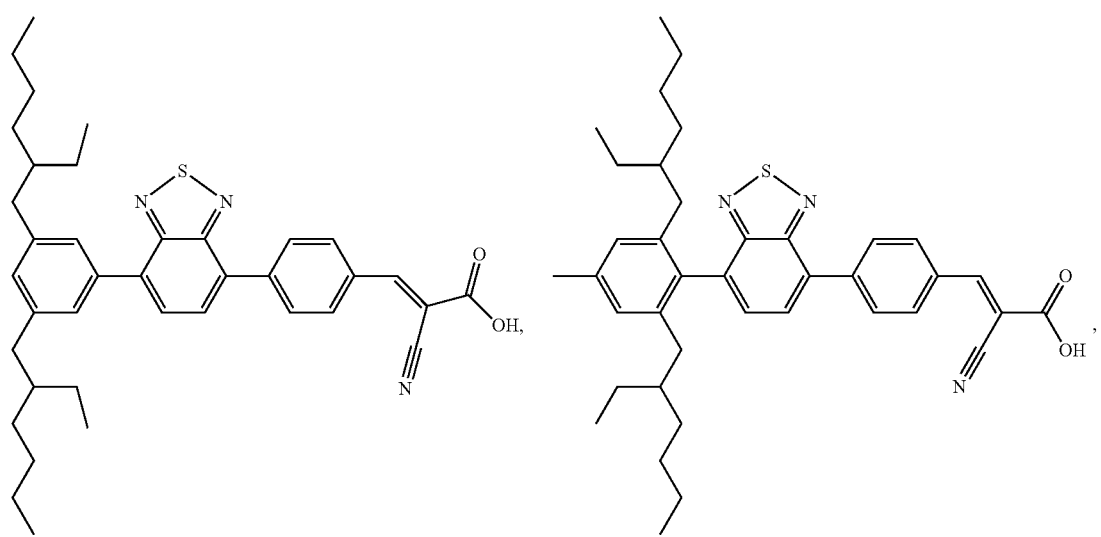
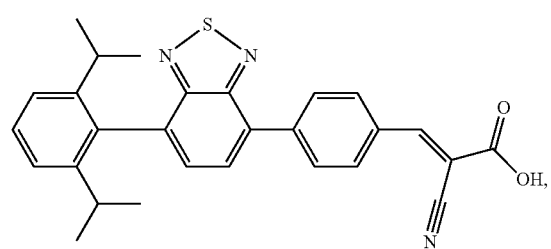

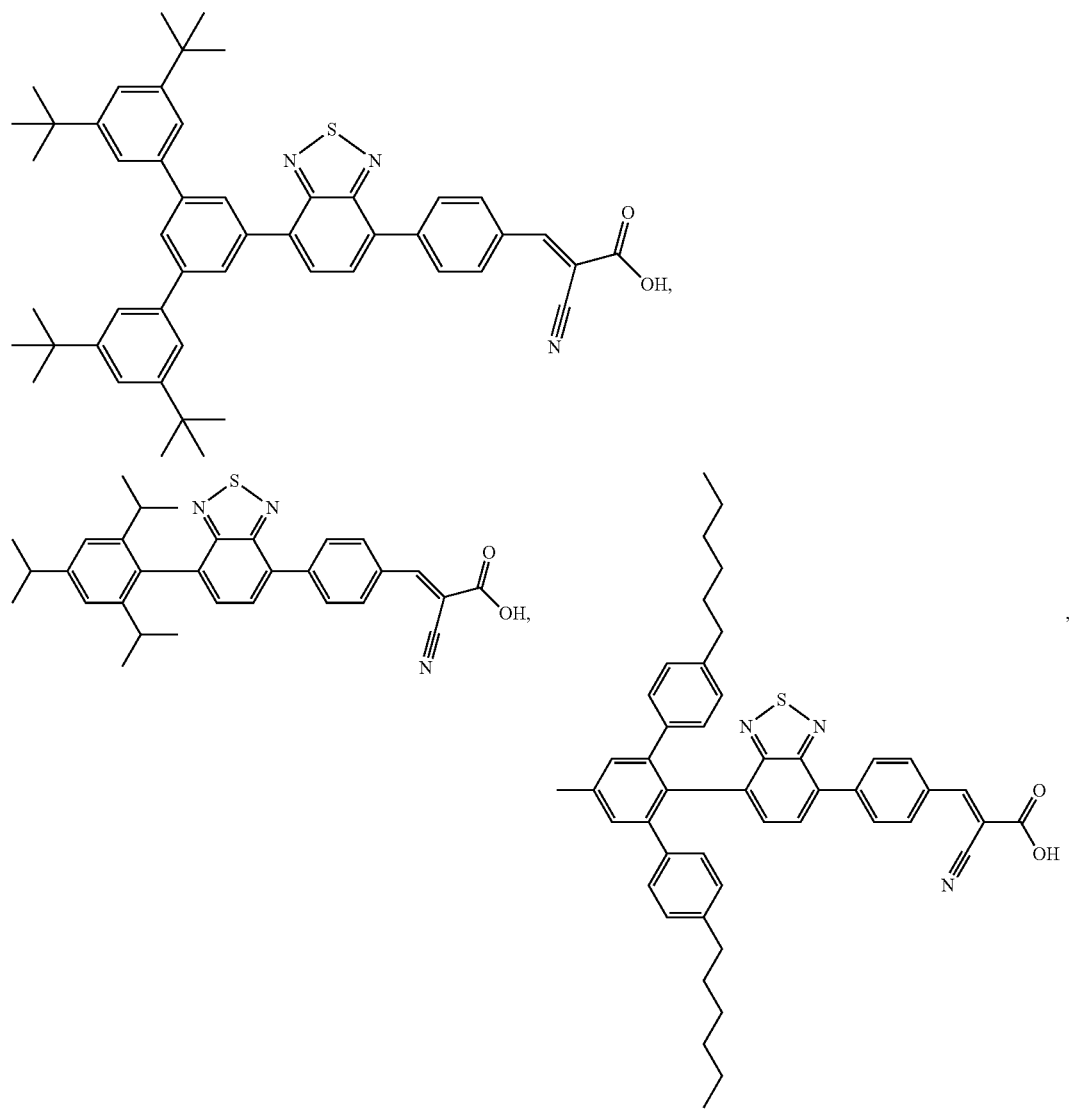
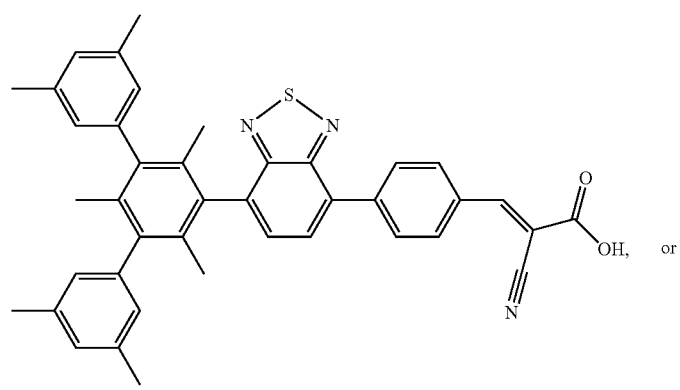

-continued

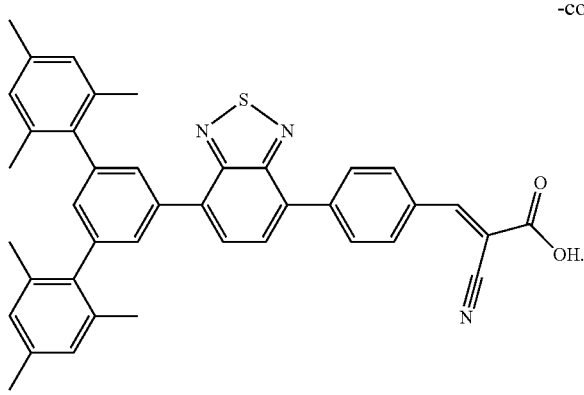

When including the donor groups disclosed herein, the resulting sensitizer dyes provide improved photovoltaic properties as compared to existing dyes and/or sensitizers. For example, in some embodiments, the dyes disclosed herein provide increased voltage in DSCs without $TiO_2$ modification. More specifically, in one embodiment, the dyes provide a voltage of at least 1.0 V, at least 1.1 V. at least 1.2 V, at least 1.3 V, at least 1.4 V, or any combination, sub-combination, range, or sub-range thereof, from a single junction system.

In some embodiments, alkylated donor moieties may be used for course tuning of the dye ground-state oxidation potential. Additionally or alternatively, the use of multiple alkyl chains may decrease counter-productive electron transfer pathways in devices.

Also provided herein, in some embodiments, is a solar cell device including one or more dye-sensitized solar cells (DSCs). In one embodiment, the one or more DSCs are stacked within the solar cell device, forming a sequential series multijunction (SSM)-DSC device. In such embodiments, each DSC may alternatively be referred to herein as a subcell. In another embodiment, the SSM-DSC device includes a single illuminated area, where light travels sequentially through each of the DSCs in a stack. In a further embodiment, the voltage output of each DSC in the SSM device is additive, such that the overall photovoltage ($V_{oc}$) of the device is equal to the sum of the individual DSC voltages forming the device.

The SSM-DSC devices disclosed herein include any suitable combination of DSCs. Each DSC independently includes any suitable dye for use in a solar system. In one embodiment, at least one of the DSCs in the system includes one or more of the dyes disclosed herein. In another embodiment, all of the DSCs in the system include one or more of the dyes disclosed herein. Alternatively, at least one of the DSCs in the system may include one or more existing dyes.

In some embodiments, a dye is individually selected for each of the DSCs, such that the dye of any one DSC may be the same or different from the dye of any other DSC in the device. In one embodiment, the dye for each DSC is selected based upon positioning of the DSC within the stack. In another embodiment, the DSCs higher in the stack, which light passes through first, may include different dyes from DSCs lower in the stack, which light passes through later in the series (i.e., after passing through at least one other DSC). For example, in one embodiment, DSCs higher in the stack include an orange dye, such as (E)-3-(5-(4-(bis(2',4'-dibutoxy-[1,1'-biphenyl]-4-yl)amino)phenyl)thiophen-2-yl)-2-cyanoacrylic acid (D35), while DSCs lower in the stack include a red dye, such as 3-{6-{4-[bis(2',4'-dihexyloxybiphenyl-4-yl)amino-]phenyl}-4,4-dihexyl-cyclopenta-[2,1-b:3,4-b']dithiphene-2-yl}-2-cyanoacrylic acid (Y123). In another example, the SSM-DSC device includes three subcells, with the first subcell including D35, the second subcell including B11, and the third subcell including Black Dye.

Additionally or alternatively, in some embodiments, the first subcell may include a wide band-gap dye. Wide band-gap dyes include, but are not limited to:

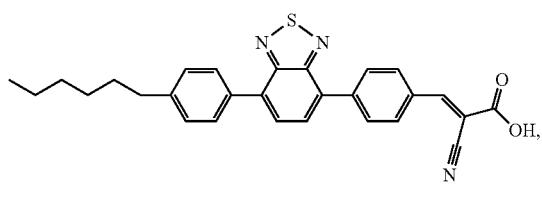

CC1

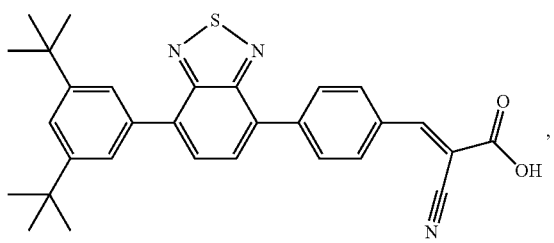

CC2

-continued
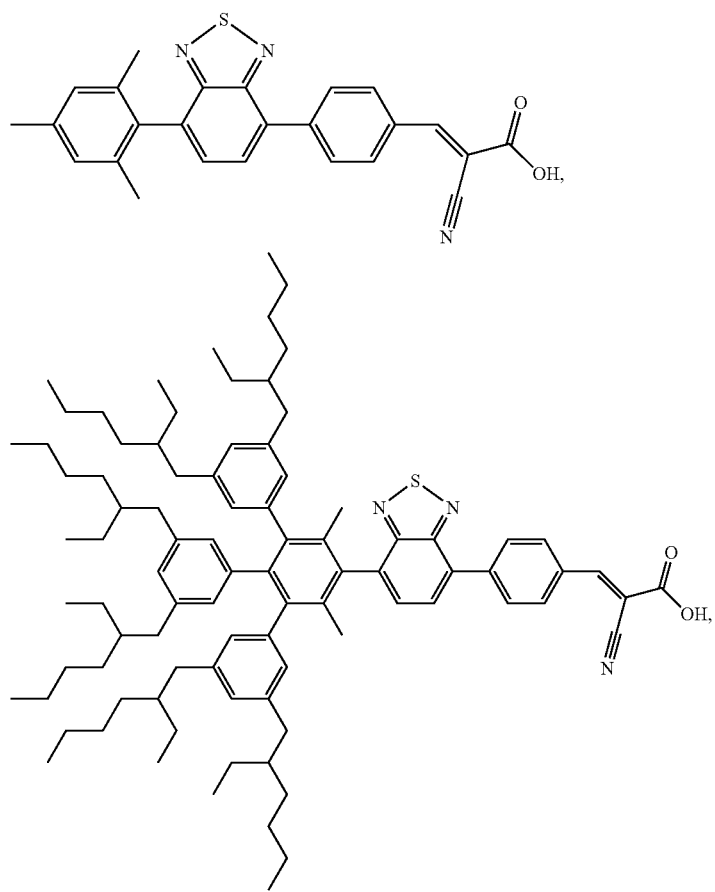
CC3
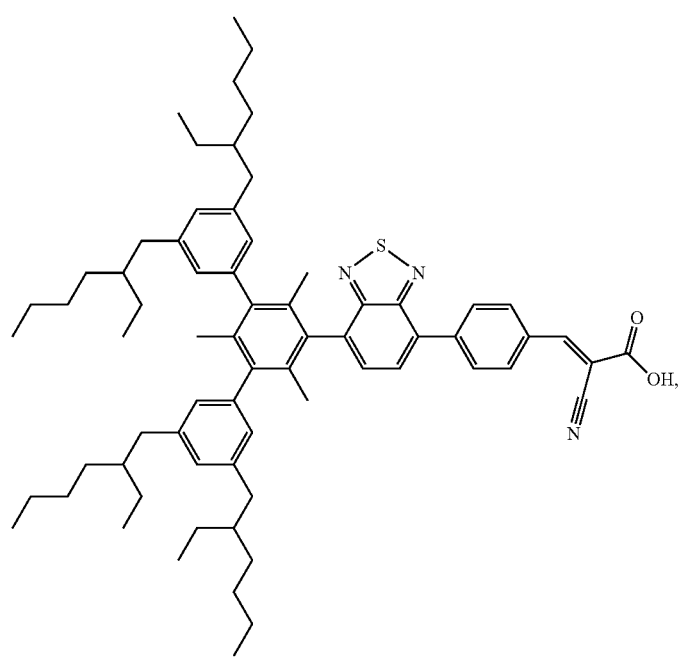

-continued
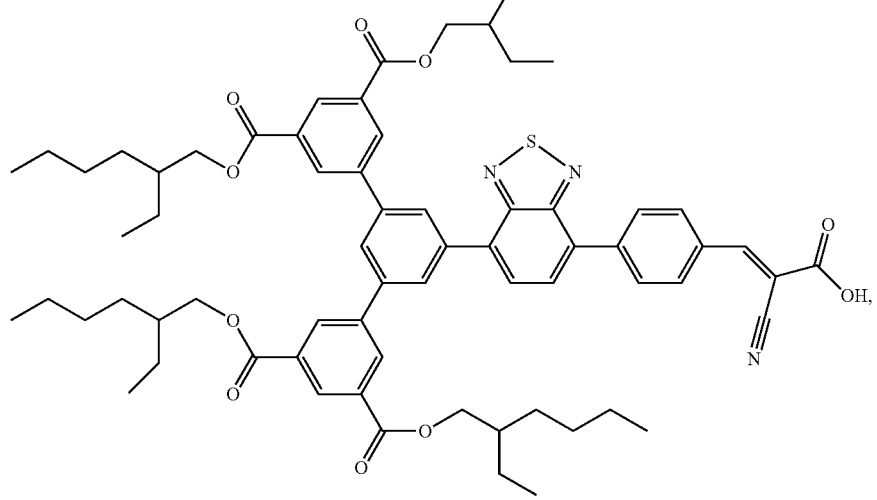
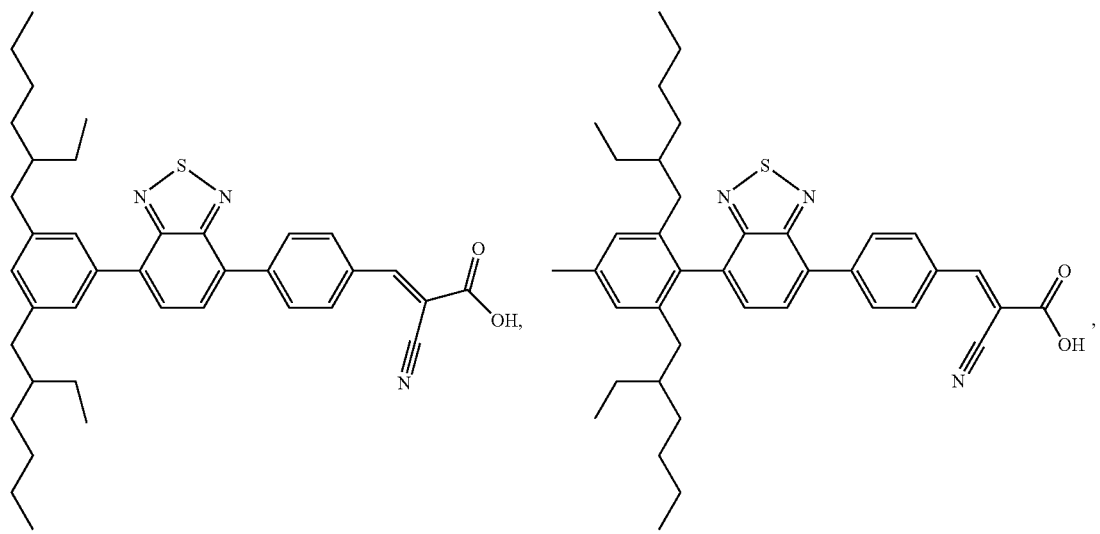
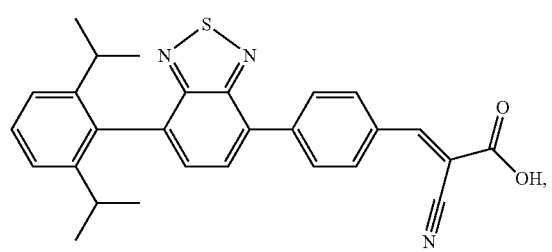

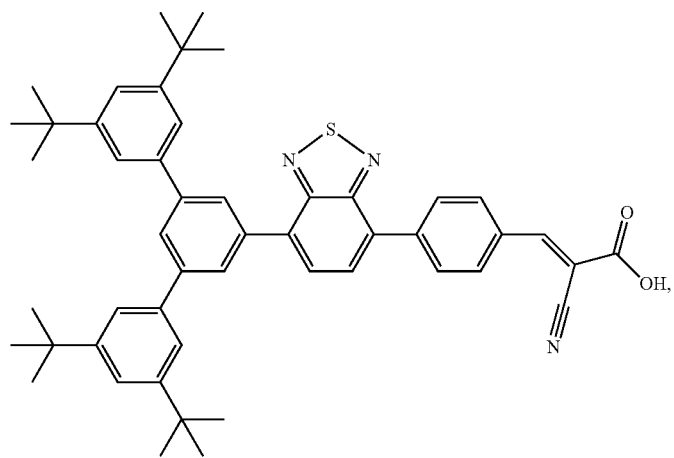
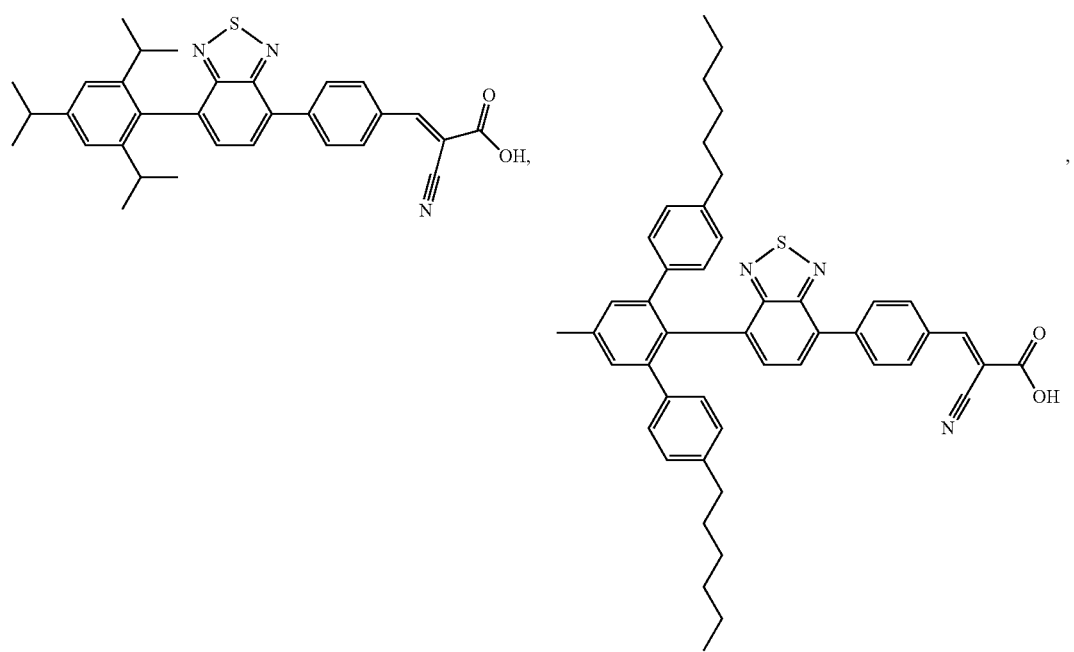
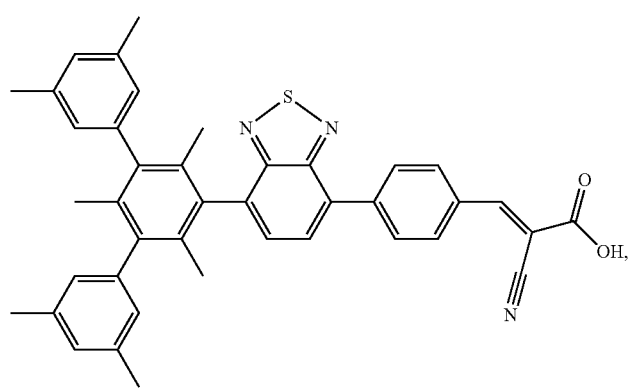

-continued

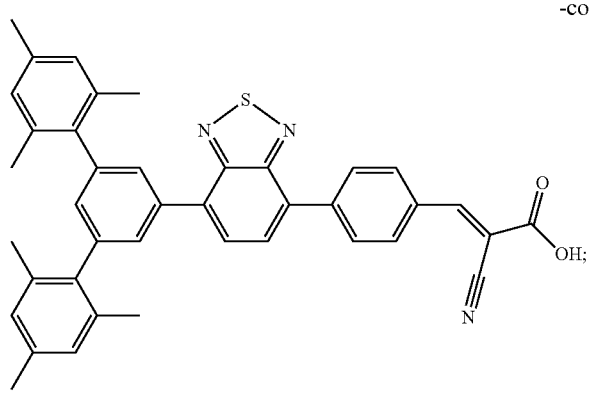

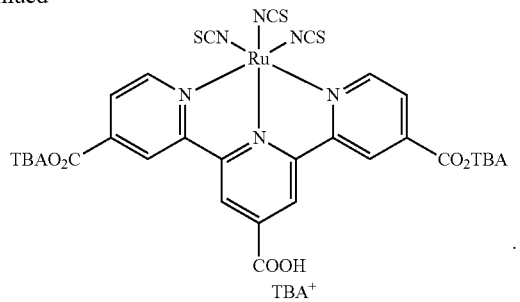

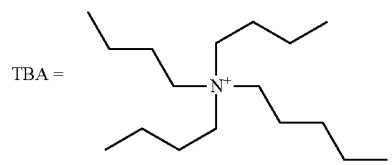

In such embodiments, the second subcell may include any other suitable dye disclosed herein, such as, but not limited to, D35 or Y123. Furthermore, a third subcell may include a dye such as, but limited to, Black Dye, or an inorganic solar cell. For example, a three subcell SSM-DSC device may include a wide band-gap dye in the first subcell, D35 in the second subcell, and Black Dye in the third subcell. In some embodiments, this combination of dyes including a wide band-gap dye in the first subcell increases the voltage output as compared to devices using D35 in the first subcell. Alternatively, the use of an inorganic solar cell as the third subcell forms a hybrid SSM-DSC/inorganic solar cell device. Without wishing to be bound by theory, it is believed that the addition of the SSM-DSC subcells to form the hybrid SSM-DSC/inorganic solar cell boosts the efficiency of existing solar cells. In addition, the device using the wide band-gap dye in the first subcell enable the use of alternate positively charged redox shuttles to Fe.

As will be appreciated by those skilled in the art, the disclosure is not limited to the specific dyes or arrangement described above, and may include any other suitable combination and/or arrangement of dyes, such as, but not limited to, dyes having peak absorption spectrums in the range of from 400 to 1200 nm, metal free organic dyes, RR9, or a combination thereof. Furthermore, each of the DSCs in the device may also include any suitable redox shuttle, with the redox shuttle of any one DSC being the same or different from the redox shuttle of any other DSC in the device. Suitable redox shuttles include, but are not limited to, cobalt redox shuttles, such as $[Co(bpy-pz)_2]^{3+/2+}$, $[Co(bpy)_3]^{3+/2+}$; $[Co(bpyNO_2)_3]^{3+/2+}$, and/or $[Co(phen)_3]^{3+/2+}$; copper redox shuttles such as $[Cu(dmby)_2]^{2+/1+}$ and/or $[Cu(dmp)_2]^{2+/1+}$; ruthenium redox shuttles such as $[Ru(bpy)_3]^{3+/2+}$; nickel redox shuttles such as $[Ni(bpy(OMe)_2)_3]^{3+/2+}$; manganese redox shuttles such as $[Mn(bpy)_3]^{3+/2+}$; iron redox shuttles, such as $Fe(bpy)_3^{3+/2+}$; common derivatives thereof; or any suitable combination thereof.

Additionally or alternatively, in some embodiments, a composition and/or thickness of any one DSC may be the same or different from the composition and/or thickness of any other DSC in the device. For example, in one embodiment, an active layer of the DSCs higher in the stack, such as a $TiO_2$ active layer, includes a decreased thickness as compared to the active layer of DSCs lower in the stack. In another embodiment, DSCs lower in the stack include a scattering layer, such as a $TiO_2$ scattering layer, and/or DSCs higher in the stack are devoid of a scattering layer. In a further embodiment, a thickness of the scattering layer is up to about 4.5 μm.

Suitable thicknesses for the active layer of each DSC in the device include, but are not limited to, between about 0.5 and about 20 μm, between about 0.5 and about 15 μm, between about 0.5 and about 10 μm, between about 0.5 and about 5 μm, between about 0.5 and about 4.5 μm, between about 0.5 and about 4.0 μm, between about 0.5 and about 3.5 μm, between about 0.5 and about 3.0 μm, between about 0.5 and about 2.5 μm, between about 0.8 and about 3.0 μm, between about 0.8 and about 2.2 μm, between about 1.5 and about 5.0 μm, between about 1.5 and about 4.5 μm, between about 10 and about 20 μm, between about 10 and about 15 μm or any combination, sub-combination, range, or sub-range thereof. In some embodiments, the active layer of the first subcell includes a thickness of between about 0.5 and about 3.0 μm, between about 0.8 and about 3.0 μm, between about 0.8 and about 2.2 μm, or any combination, sub-combination, range, or sub-range thereof. In some embodiments, the active layer of the second subcell includes a thickness of between about 1.5 and about 5.0 μm, between about 1.5 and about 4.5 μm, or any combination, sub-combination, range, or sub-range thereof. In some embodiments, the active layer of the third subcell includes a thickness of between about 10 and about 20 μm, between about 10 and about 15 μm or any combination, sub-combination, range, or sub-range thereof. For example, in one embodiment, the active layer of the first subcell includes a thickness of between about 0.8 and about 3.0 μm, the active layer of the second subcell includes a thickness of between about 1.5 and about 5.0 μm, and the active layer of the third subcell includes a thickness of between about 10 and about 15 μm.

In some embodiments, the thickness of the active layer is controlled through paste formulations and screen mesh selection. In some embodiments, as compared to existing devices which utilize thicker active layers, the active layers disclosed herein provide improved performance of the device. Additionally or alternatively, in some embodiments, the active layers disclosed herein are transparent or partially transparent.

In some embodiments, the SSM-DSC devices disclosed herein include a UV cutoff filter. In certain embodiments, one or more of the DSCs include a surface capping layer. The surface capping layer, when present, forms an insulating layer that slows the recombination of electrons in the active layer with the redox shuttles. By slowing the recombination of electrons with the redox shuttles, the surface capping layer increases the $V_{oc}$ of the device. In one embodiment, the surface capping layer includes a fluorinated self-assembled mono layer (FSAM), such as, but not limited to, perfluorooctyltrimethylsilane (PFTS). In another embodiment, inclusion of the surface capping layer is dependent upon the dye selected for that particular DSC. For example, in a further embodiment, DSCs with D35 include a surface capping layer, while DSCs with Y123 are devoid of a surface capping layer. Without wishing to be bound by theory, it is believed that PFTS treatment of DSCs with Y123 resulted in dye desorption from the $TiO_2$ surface, which decreased overall performance of the DSC.

The DSCs disclosed herein may also include antireflective coatings and/or immersion oils on the surfaces outside the DSC devices. The antireflective coating, when included, is positioned and/or applied over the non-conductive side of the photoanode and/or cathode/counter electrode of one or more DSCs in the device. As used herein, the term photoanode refers to the anode portion of each DSC, which is opposite a cathode/counter electrode with respect to a substrate of the DSC, and when in use is positioned on a surface of the substrate that faces toward a light/energy source. In one embodiment, the antireflective coating includes a CYTOP layer formed over the photoanode of at least one DSC in the device. In another embodiment, the antireflective coating includes a block copolymer polystyrene-block-poly (methyl methacrylate) (PS-b-PMMA). In another embodiment, the antireflective coating includes a polymer blend of polystyrene and poly(methyl methacrylate). The immersion oil with a similar refractive index to the substrate of the DSC devices, when included, is positioned between the counter electrode of one DSC and the photoanode of another DSC.

In some embodiments, the use of an antireflective coating and/or an immersion oil changes the interfacial refractive index to minimize light losses. Additionally or alternatively, in some embodiments, the use of an antireflective coating and/or immersion oil provides an increase in overall power conversion efficiency (PCE). For example, in one embodiment, the use of an antireflective coating and an immersion oil in a 3 SSM-DSC system provides an overall PCE of greater than 10% with output of greater than 2 V, which represents a substantial increase as compared to other 3 SSM-DSC systems not including antireflective coatings and/or immersion oils.

By employing the dyes, compositions, thicknesses, redox shuttles, surface capping layers, antireflective coatings, and/or immersion oils disclosed herein, the instant DSCs provide increased photovoltage and/or power conversion efficiency (PCE) as compared to existing DSCs, while maintaining and/or increasing photocurrent and fill factor. For example, in contrast to existing series tandem DSCs, which are limited to a photovoltage of less than 1.9 V from two solar cells, the instant DSCs provided a double junction photovoltage from a single area illuminated device of 1.93 V. Additionally, in contrast to existing series tandem devices, which have been limited to two DSCs due to a lack of light harvesting with additional cells, the DSCs disclosed herein may be selected to divide the usable solar spectrum between cells and permit the inclusion of three or more DSCs in a single stack. For example, the SSM-DSC devices disclosed herein may include 2, 3, 4, 5, 6, 7, 8, 9, 10, or more devices in a single stack. Furthermore, light harvesting of the lower cells in devices with three or more DSCs may be increased through sequential active layer thickness modulation and dye selection.

This increased number of DSCs in a single stack and/or increased light harvesting from lower cells in such stacks further increases the overall photovoltage of the device, providing photovoltages not previously possible with existing devices. For example, in one embodiment, a triple junction (i.e., three solar cell) device provides a photovoltage of at least about 2.8 V with an overall PCE of at least about 7%, which is sufficient to potentially power water oxidation and $CO_2$ reduction without the need of external bias. In another embodiment, a four junction (i.e., four solar cell) device with a D35 sensitized first cell having a $TiO_2$ active layer thickness of about 0.8 µm, followed by a D35 sensitized second cell with a $TiO_2$ active layer thickness of about 2.2 µm, a Y123 sensitized third cell with a $TiO_2$ active layer thickness of about 2.2 µm, and a Y123 sensitized fourth cell with a $TiO_2$ active layer thickness of about 4.5 µm and a $TiO_2$ scattering layer thickness of about 4.5 µm provides a photovoltage of at least about 3.75 V with an overall PCE of at least about 6%. In a further embodiment, a five junction (i.e., five solar cell) device provides a photovoltage of at least about 4.7 V with a PCE of about 4.3%, while maintaining a photocurrent density of about 2.4 mA/cm$^2$.

In some embodiments, two or more SSM-DSC devices may be combined in a side-by-side tandem configuration to further increase the overall photovoltage. In one embodiment, for example, a side-by-side SSM-DSC configuration (i.e., a double illuminated area device) provides a photovoltage of at least about 8.5 V with a PCE of at least about 4%. As will be appreciated by those skilled in the art, the SSM-DSC devices disclosed herein are not limited to the photovoltages and PCE values provided above, as varying the SSM-DSC device configurations will provide different photovoltages. For example, the photovoltages discussed above may be increased by application of efficient red photon harvesting sensitizers (>750 nm), connecting SSM-DSC devices in tandem with inorganic PV's (Silicon, GaAs, etc.), reducing glass related transmission losses (e.g., application of low reflectance glass coatings), incorporation of colorless redox shuttles with theoretical $V_{oc}$ values greater than 1.5 V for a single cell, optimization of materials for differing spectral regions, or combinations thereof. Accordingly, in certain embodiments, the single stacked system provides a photovoltage of up to about 10 V or more, and the two SSM-DSC devices in a side-by-side tandem configuration provides a photovoltage of up to about 20 V or more. Practical conversion efficiencies of at least about 15% are also contemplated by the SSM-DSC devices disclosed herein.

Also provided herein are methods of using the SSM-DSC devices disclosed above. One such method includes powering battery charging with the SSM-DSC devices disclosed herein, such as those batteries typically requiring an external source with 3.7 V to 7.0 V. Another method includes employing the SSM-DSC devices disclosed herein to power solar-to-fuel conversion. For example, in one embodiment, the unassisted (non-potential biased) SSM-DSC devices disclosed herein provide the at least 1.83 V photovoltage required to power the electrolysis of $H_2O$ (i.e., conversion of $H_2O$ to $H_2$ fuel). In contrast to existing devices that do not observe $O_2$ production, both half reactions occur during the electrolysis of water with the SSM-DSC devices disclosed herein. In another embodiment, the unassisted (non-potential biased) SSM-DSC devices disclosed herein provide the at least 3.0 V photovoltage required to power the electrolysis of $CO_2$ (i.e., conversion of $CO_2$ to the gasoline precursor CO). In a further embodiment, in contrast to Perovskite systems, which require the use of a constant flow argon chamber, the instant devices provide $H_2O$ and $CO_2$ reduction when open to air and/or fully submerged in water. Additionally or alternatively, due to increased voltage per area as compared to existing solar cell technology, the SSM-DSC devices disclosed herein may be employed to provide power for a host of applications where surface areas are limited, such as on clothing, automobiles, portable solar cells, etc.

Further provided herein are methods of forming the instant DSCs and SSM-DSC devices. In some embodiments, forming the DSCs includes sealing a photoanode and a counter electrode, then adding an electrolyte to the counter electrode and securing contacts to the DSC. In one embodiment, the photoanode and counter electrode are sealed with a hot melt gasket by heating the system under pressure. For example, in another embodiment, the photoanode and counter electrode are sealed with a 10-60 μm thick hot melt gasket by heating the system at 130° C. under a pressure of 0.2 psi for 1 minute. In a further embodiment, the electrolyte is added through a hole in the counter electrode, which is subsequently sealed once the electrolyte has been added. The contacts are secured to the DSC by any suitable method, such as, but not limited to, soldering.

In some embodiments, the photoanode and/or counter electrode are prepared prior to forming the DSC. In one embodiment, preparing the photoanode includes providing a substrate, pre-treating the substrate, applying an active layer to the substrate, optionally applying a scattering layer to the substrate, and sensitizing the substrate. The substrate includes any suitable material for use in a photoanode, including, but not limited to, glass, plastics, textiles, and/or any other suitable material. In some embodiments, the glass or other substrate is coated with a transparent conducting film (TCF), such as fluorine doped tin oxide (FTO). A suitable sheet resistance for the substrate includes between about 5 and about 25 Ω/sq. sheet, between about 5 and about 20 Ω/sq. sheet, between about 10 and about 15 Ω/sq. sheet, or any suitable combination, sub-combination, range, or sub-range thereof. For example, in one embodiment, FTO coated glass substrates that will ultimately include a scattering layer have a sheet resistance of 10 Ω/sq. sheet, and FTO coated glass substrates that will not include a scattering layer have a sheet resistance of 15 Ω/sq. sheet.

In certain embodiments, pre-treating the substrate includes cleaning the substrate and/or applying an underlayer to the substrate. In one embodiment, cleaning the substrate includes one or more of submerging and sonicating the substrate in an aqueous solution, rinsing the substrate with water, sonicating the substrate in acetone, sonicating the substrate in ethanol, and/or UV/ozone cleaning the substrate. In another embodiment, applying an underlayer to the substrate, such as a $TiO_2$ underlayer, includes submerging the substrate (conductive side up) in a $TiCl_4$ solution in water, followed by heating the submerged substrate. After heating, the substrate is rinsed first with water then with ethanol.

Next, in some embodiments, applying the active layer to the substrate includes screen printing a mesoporous layer of a desired thickness on the substrate. In one embodiment, the mesoporous layer includes a $TiO_2$ layer with a particle size of about 30 nm. In another embodiment, the thickness of the mesoporous layer is at least partially determined by the properties of the screen selected for the screen printing. Additionally or alternatively, the thickness may be adjusted by modifying the consistency of the material prior to applying. Modifying the consistency of the material may include diluting the material prior to applying. For example, the thickness of the applied layer may be reduced by diluting a P30 $TiO_2$ paste with terpineol. Applying the optional scattering layer includes screen printing of a material with an increased particle size as compared to the active layer. Suitable particle sizes for the scattering layer material include, but are not limited to, at least about 100 nm.

After applying the active layer, the substrate is sintered with progressive heating. In one embodiment, sintering the substrate includes progressively heating the substrate from about 125° C. to about 500° C. with various ramp speeds and/or hold lengths between temperatures. Following sintering, the photoanode is soaked in a $TiCl_4$ water solution and heated to about 500° C. Subsequent sensitization of the photoanode includes immersing the active layer film in a dye solution, such as, but not limited to, a D35 or Y123 dye solution.

Preparing the counter electrodes includes forming one or more holes through the insulating side to the conductive side of a substrate material. For example, in one embodiment, preparing the counter electrodes includes drilling two holes through the insulating side to the conductive side of an FTO coated glass substrate. In another embodiment, the FTO coated glass substrate of the counter electrode includes a resistance of 7 Ω/sq. sheet for full subcells and 15 Ω/sq. sheet for all other subcells. In a further embodiment, for platinum electrodes, a thin layer of Pt-paste is slot printed with a punched piece of tape on the conductive side, followed by heading of the electrode at a set temperature for a predetermined amount of time.

These solution processable solar cells provide comparable manufacturing potentials as compared to PSC and OPV solar cells without the decreased voltage of PSC cells or the internal losses and decreased efficiency of OPV cells. Additionally, the DSCs disclosed herein can be formed without strictly controlled atmosphere (e.g., open to air), including conditions that would render OPVs and PSCs inoperable.

As further discussed in the Examples below, the DSCs disclosed herein provide ease of manufacture through solution processes, high performance under low light conditions, and/or variety in terms of devices color and materials on which the solar cells can be built.

The presently-disclosed subject matter is further illustrated by the following specific but non-limiting examples. The following examples may include compilations of data that are representative of data gathered at various times during the course of development and experimentation related to the presently-disclosed subject matter.

EXAMPLES

Example 1

This Example demonstrates a novel strategy in DSC literature, where a single chromophore can be used to increase the voltage of a tandem DSC system through careful photon management based on photoactive electrode preparation methods. Through: (1) judicious control of electrode film thickness, (2) proper dye selection, (3) careful redox shuttle selection, and (4) addition of a film surface protection technique, sequential ST-DSCs or SSM-DSCs (mechanically stacked with a single illuminated area) can reach record high $V_{oc}$ values. Intriguingly, the photovoltage is obtained with only the use of early photons (400-700 nm) and metal-free organic sensitizers D35 and Y123 (FIGS.

Figure 1E:
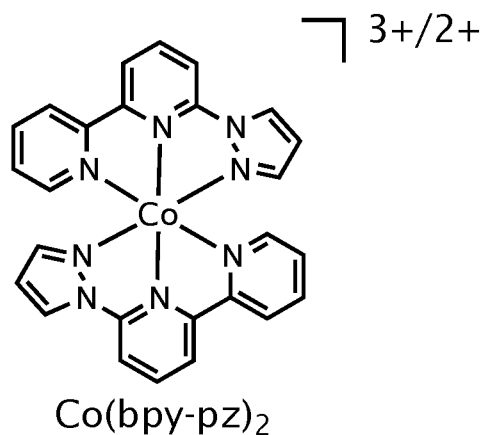
Figure 1F:
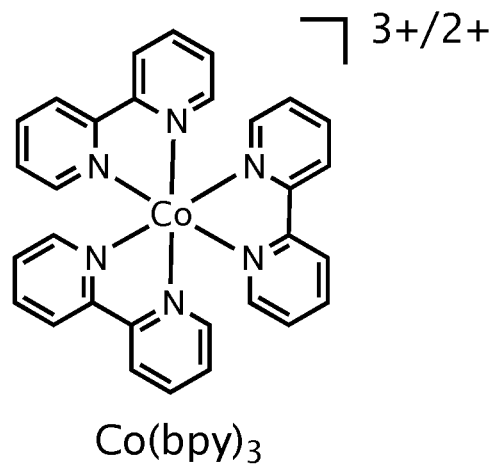

1B-D) along with low energy redox shuttles [Co(bpy-pz)$_2$]$^{3+/2+}$ (FIG. 1E) and [Co(bpy)$_3$]$^{3+/2+}$ (FIG. 1F).

Figure 1G:
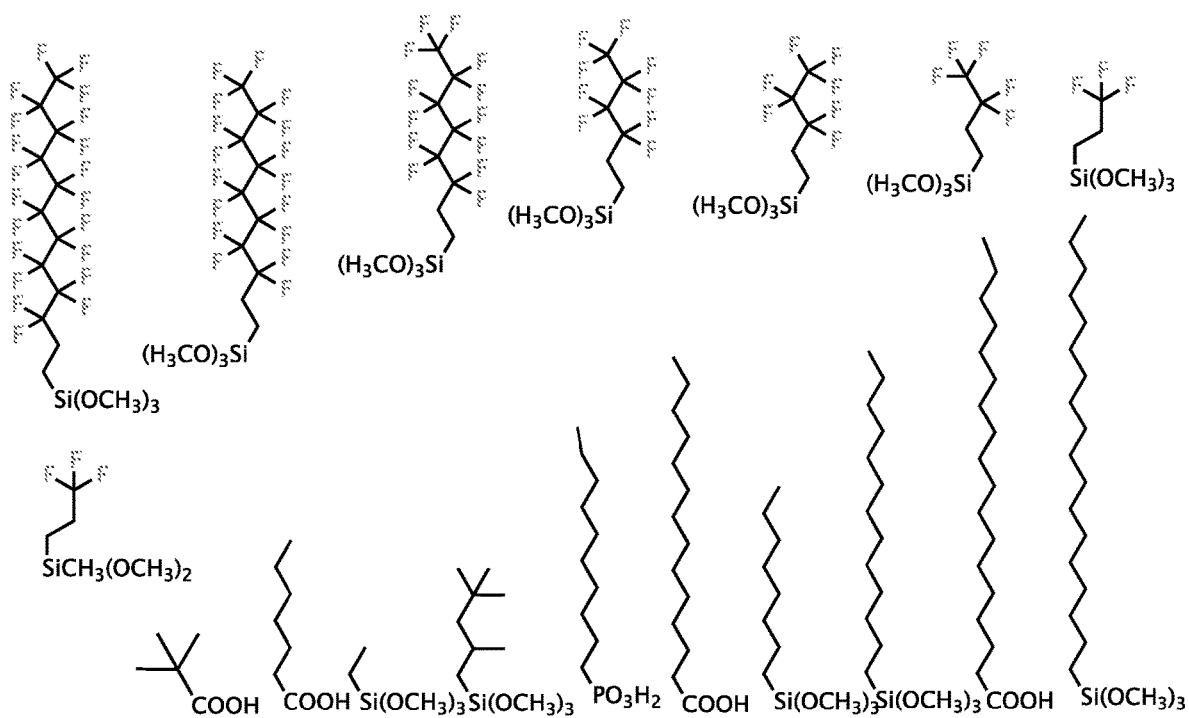

Physically stacked and electrically connected ST-DSCs were finely tuned for each device TiO$_2$ thickness and number of individual devices to achieve high V$_{oc}$ values. Optimization of electrolyte additive (tert-butylpridine, TBP) concentration and surface capping with fluorinated self-assembled mono layer (FSAM), such as perfluorooctyltrimethylsilane (PFTS) (FIG. 1G), for individual devices played a key role in achieving high V$_{oc}$ and PCE mainly for front D35 devices. This was validated by small modulation photovoltage transient measurements showing decreased electron recombinations with the electrolyte.

Methods and Materials

Figure 1H:
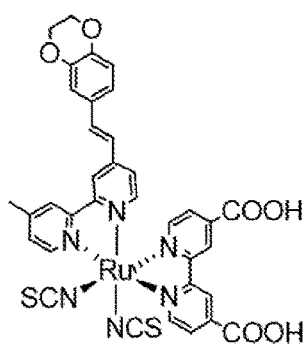
Figure 1I:
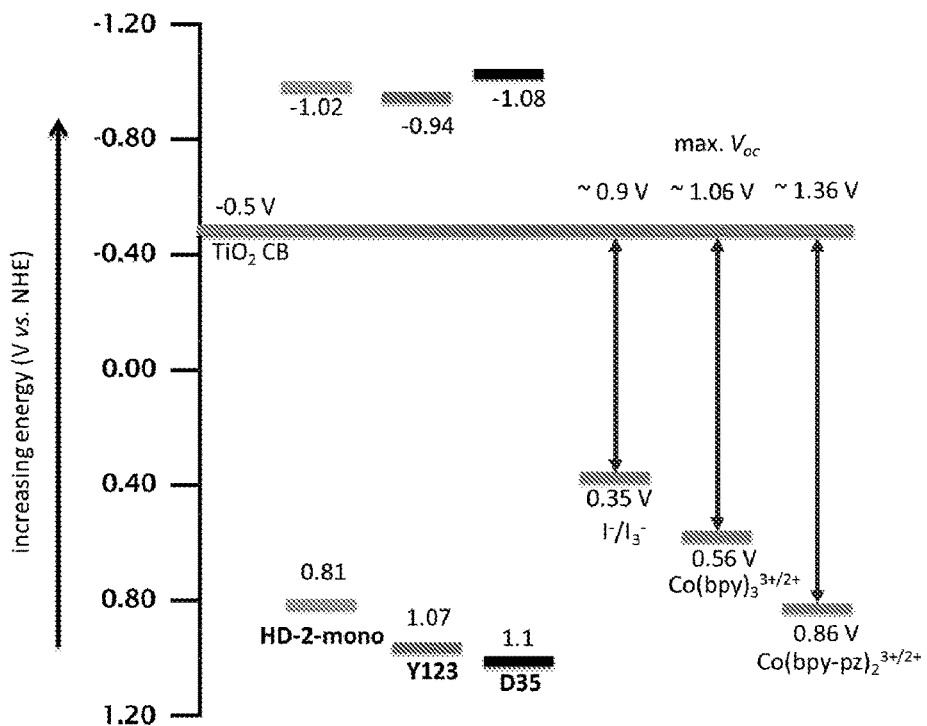

All commercially obtained reagents and extra dry solvents were used as received. D35 and Y123 were purchased from Dyenamo, Sweden. $^1$H NMR spectra were recorded on a Bruker Avance-500 (500 MHz) spectrometer and are reported in ppm using solvent as an internal standard (CDCl$_3$ at 7.26 ppm). Data reported as s=singlet, d=doublet, t=triplet, q=quartet, p=pentet, m=multiplet, br=broad, ap=apparent, dd=doublet of doublets, and coupling constant(s) are in Hz. The optical and electrochemical properties of Y123, D35, and the Ru-sensitizer HD-2-mono (FIG. 1H) are shown in Table 1 and FIG. 1I.

TABLE 1

Optical and electrochemical properties of D35, Y123, and HD-2-mono.

| Dye | $\lambda_{onset}$ (nm)$^a$ | $\lambda_{max}$ (nm)$^a$ | ε (M$^{-1}$cm$^{-1}$)$^a$ | E$_{(S+/S)}$ (V vs NHE)$^b$ | E$_{(S+/S*)}$ (V vs NHE)$^c$ | E$_g^{opt}$ (eV)$^d$ |
|---|---|---|---|---|---|---|
| D35 | 570 | 500 | 31000 | 1.10 | −1.08 | 2.18 |
| Y123 | 650 | 540 | 49000 | 1.07 | −0.94 | 2.01 |
| HD-2-mono | 680 | 539 | 13900 | 0.81 | −1.02 | 1.83 |

$^a$D35 was measured in DCM.$^9$ Y123 was also measured in DCM.$^7$ HD-2-mono was measured in DMF.$^{10}$ $\lambda_{onset}$ was estimated by drawing a tangent line on the low energy side of the lowest energy transition and reporting the value as the intersection of the x-axis.
$^b$D35 and Y123 were measured on TiO$_2$.$^{11}$ HD-2-mono was measured in DMF with glassy carbon working electrode, platinum wire as counter electrode and Ag/AgNO$_3$ as the reference electrode. Ferrocene was used an internal reference to calibrate the reference electrode. Ferrocene was taken as 0.63 V vs NHE in DMF.
$^c$E$_{(S+/S*)}$ = E$_{(S+/S)}$ − E$_g^{opt}$.
$^d$E$_g^{opt}$ was calculated from the equation E$_g^{opt}$ = 1240 (nm)(eV)/$\lambda_{onset}$.

Synthesis of Co(bpy-pz)$_2$$^{+2/+3}$.

Figure 2A:
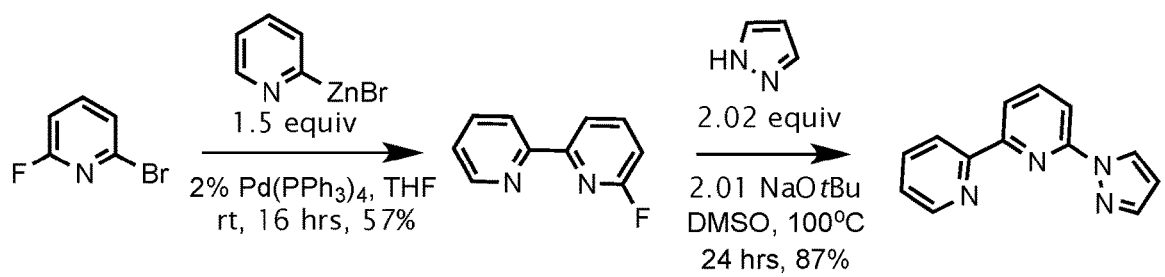
FIGS. 2A-B show schematics illustrating the synthesis of a cobalt redox shuttle. (A) Shows a schematic illustration of a method of synthesizing a bpy-pz ligand according to an embodiment of the disclosure. (B) Shows a schematic illustration of a method of synthesizing $Co(bpy-pz)_2^{3+/2+}$ using the ligand of (A).

A modified method of synthesizing a bpy-pz ligand for the Co(bpy-pz)$_2$$^{+2/+3}$ complexes is illustrated in FIG. 2A and described below. Characterization data matches that of the known compounds.

6-fluoro-2,2'-bipyridine

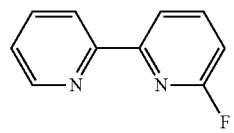

To an oven dried, N$_2$ filled round bottom flask was added 17 ml of a 0.5 M solution of pyridin-2-ylzinc (II) bromide (8.50 mmol) in THF and 2-bromo-6-fluoropyridine (1.0 g, 5.67 mmol). Then Pd(PPh$_3$)$_4$ (0.131 g, 0.11 mmol) was added as a single portion at room temperature. The reaction mixture was stirred at room temperature overnight. The reaction was monitored by TLC until the starting bromopyridine had been consumed. The crude product was poured into an EDTA/K$_2$CO$_3$ aqueous solution (~100 mL saturated in both EDTA and K$_2$CO$_3$) and extracted with Et$_2$O (~100 mL). The organic layer was separated and dried with Na$_2$SO$_4$. After concentration, the product was purified by silica gel (125 mL SiO$_2$) chromatography with a gradient elution starting with 10% and progressing to 20% ethyl acetate/hexanes to give a white solid (563 mg, 3.23 mmol, 57% yield). $^1$H NMR (300 MHz, d$_6$-DMSO) δ 8.71 (d, J=4.7 Hz, 1H), 8.32 (dd, J=7.4, 2.7 Hz, 1H), 8.26 (d, J=7.9 Hz, 1H), 8.15 (ap q, J=7.7 Hz, 1H), 7.96 (dt, J=7.7, 1.6 Hz, 1H), 7.50 (dd, J=7.2, 4.7 Hz, 1H), 7.21 (dd, J=8.1, 2.8 Hz, 1H). This molecule was previously prepared through an alternate procedure and the characterization data was in agreement.

6-(1H-pyrazol-1-yl)-2,2'-bipyridine

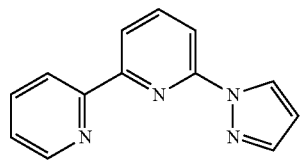 [SMILES: c1ccc(-c2cccc(-n3cccn3)n2)nc1]

To an oven dried, N$_2$ filled round bottom flask was added 1H-pyrazole (479 mg, 7.04 mmol), sodium tert-butoxide (678 mg, 7.06 mmol), and 5 ml of N$_2$-degassed, dry DMSO at room temperature. Note: reaction gives off heat. After stirring for 10 minutes the reaction ceased to give off heated. 6-fluoro-2,2'-bipyridine (1.2 g, 6.89 mmol) was added in one portion. The reaction was heated to 100° C. with stirring and monitored by TLC. After 24 hours, the reaction was cooled to room temperature and the mixture was extracted with Et$_2$O (~100 mL) and H$_2$O (~100 mL). The organics were separated and dried with Na$_2$SO$_4$. The concentrated mixture was then purified by silica gel chromatography first by eluting 100% DCM to remove any excess pyrazole, then 50% MeOH/DCM to give a white solid (1.3 g, 5.99 mmol, 87% yield). $^1$H NMR (300 MHz, d$_6$-DMSO) δ 8.92 (d, J=1.8 Hz, 1H), 8.72 (d, J=3.8 Hz, 1H), 8.58 (dd, J=7.7, 0.8 Hz, 1H) 8.33 (d, J=7.7 Hz, 1H), 8.11 (t, J=7.7 Hz, 1H), 8.05-7.95 (m, 2H), 7.87 (d, J=0.7 Hz, 1H), 7.51 (dd, J=7.7, 4.8 Hz, 1H), 6.64 (ap t, J=1.6 Hz, 1H). This molecule was previously prepared through an alternate procedure and the characterization data was in agreement.

Figure 2B:
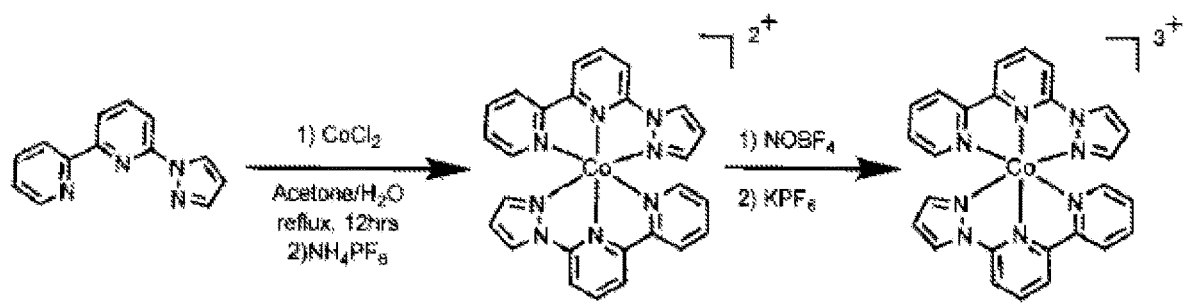

Further complexation and oxidation, along with preparation Co(bpy-pz)$_{2+2/+3}$ using the bpy-pz ligand is illustrated in FIG. 2B.

Photovoltaic Characterization.

Photovoltaic characteristics were measured using a 150 W xenon lamp (Model SF300A, SCIENCETECH Inc. Class AAA) solar simulator equipped with an AM 1.5 G filter for a less than 2% spectral mismatch. Prior to each measurement, the solar simulator output was calibrated with a KG5 filtered mono-crystalline silicon NREL calibrated reference cell from ABET Technologies (Model 15150-KG5). The current density-voltage characteristic of each cell was obtained with Keithley digital source meter (Model 2400). The incident photon-to-current conversion efficiency was measured with an IPCE instrument manufactured by Dyenamo comprised of a 175 W xenon lamp (CERMAX, Model LX175F), monochromator (Spectral Products, Model CM110, Czerny-Turner, dual-grating), filter wheel (Spectral Products, Model AB301T, fitted with filter AB3044 [440 nm high pass] and filter AB3051 [510 nm high pass]), a calibrated UV-enhanced silicon photodiode reference and Dyenamo issued software.

Electron lifetime measurements through small modulation photovoltage transient measurements, were carried out with a Dyenamo Toolbox (DN-AE01) instrument and software. The intensity of the LED light source (Seoul Semiconductors, Natural White, S42182H, 450 nm to 750 nm emission) is varied to modulate the device open-circuit voltage. The base light intensity was modulated by applied voltages of 2.80, 2.85, 2.90, 2.95 and 3.00 V applied to the LED with the 3.0 V bias approaching 1 sun intensity (97%). The direction of illumination was from the photoanode to the counter electrode, and the device was positioned 5 cm from the LED light source. The voltage rise and decay times are fitted with a Levenberg-Marquardt fitting algorithm via LabView, and the electron lifetime was obtained from the averaging of rise and decay times.

Charge extraction at open circuit conditions ($Q_{oc}$) as function of light intensity was carried out with a Dyenamo Toolbox (DN-AE01) instrument and software. Different open-circuit values were achieved by the programmed control of a biased LED (description above) from 2.5 V to 3.2 V. The LED is switched on for 1 second of illumination, then switched off for 10 seconds with a simultaneous switch to short-circuit conditions and monitoring of current. The total charge is found by integrating the current measured over time.

Photoanode Preparation:

TEC 10 FTO glass (10 Ω/sq. sheet resistance: FTO [fluorine doped tin oxide]) for the final subcell in the SSM-DSC devices with scattering layer and TEC 15 FTO glass (15 Ω/sq. sheet resistance: FTO) for all other subcells was purchased from Hartford Glass. Once cut into 2×2 cm squares the substrate was submerged in a 0.2% Deconex 21 aqueous solution and sonicated for 15 minutes at room temperature. The electrodes were rinsed with water, sonicated in acetone 10 minutes, and sonicated in ethanol for 10 minutes. The electrodes were then placed under UV/ozone for 15 minutes (UV-Ozone Cleaning System, Model Pro-Cleaner by UVFAB Systems). A compact $TiO_2$ underlayer was then applied by pre-treatment of the substrate submerged in a 40 mM $TiCl_4$ solution in water (prepared by careful addition of 99.9% $TiCl_4$ to water at 0-5° C.). The submerged substrates (conductive side up) were heated for 30 minutes at 70° C. After heating, the substrates were rinsed first with water then with ethanol.

A thickness between 1.2 and 4.5 μm mesoporous P30 $TiO_2$ layer (particle size: 30 nm, Dyenamo, DN-GPS-30TS, >99% anatase) was screen printed from a Sefar screen (54/137-64W) resulting in 4.5 μm or Sefar screen (90/230-48W) resulting in 2.2 μm thickness on average for each print. For thickness of 1.2 μm and 0.8 μm, the commercial P30 paste was diluted with terpineol (2:1, paste:terpineol) and (1:1, paste:terpineol), respectively, and printed with Sefar screen (90/230-48W). For thickness of 1.5 μm, P30 paste was diluted with terpineol (2:1, paste:terpineol) and printed with Sefar screen (54/137-64W). Particle sizes were indicated to be typically within +2 nm of the average and are >99% anatase at the time of paste formulation as indicated by the distributor. A 4.5 μm $TiO_2$ scattering layer (for full device) (particle size: >100 nm, Solaronix R/SP) was screen printed onto electrodes where indicated.

Between each print of $TiO_2$ paste, the substrate was heated for 7 minutes at 125° C. and the thickness was measured with a profilometer (Alpha-Step D-500 KLA Tencor). The substrate was then sintered with progressive heating from 125° C. (5 μminute ramp from r.t., 5 minute hold) to 325° C. (15 minute ramp from 125° C., 5 minute hold) to 375° C. (5 minute ramp from 325° C., 5 minute hold) to 450° C. (5 minute ramp from 375° C., 15 minute hold) to 500° C. (5 minute ramp from 450° C., 15 minute hold) using a programmable furnace (Vulcan® 3-Series model 3-550). The cooled, sintered photoanode was soaked 30 minutes at 70° C. in a 40 mM $TiCl_4$ water solution and heated at 40° C. per minute to 500° C. and held at 500° C. for 30 minutes prior to sensitization. The complete working electrode was prepared by immersing the $TiO_2$ film into a D35 dye solution (0.3 mM, 4:1 (EtOH:THF)), with 40× (12 mM) of chenodeoxycholic acid (CDCA), or Y123 dye solution (0.2 mM, 1:1 (ACN:tert-butanol)) with 50×CDCA. The electrodes were immersed in the dye solutions at room temperature for 6 hours.

Counter Electrode Preparation:

Two holes were drilled through the insulating side to the conductive side of 2×2 cm squares of TEC 7 FTO glass (7 Ω/sq. sheet resistance) for full subcells, and TEC 15 FTO glass (15 Ω/sq. sheet resistance) for all other subcells, using a Dremel-4000 with a Dremel 7134 Diamond Taper Point Bit submerged in water to reduce glass cracking with Scotch tape on the FTO side to minimize scratching. The tape was removed, and the electrodes were washed with water followed by a 0.1 M HCl in EtOH solution. The electrodes were then sonicated in an acetone bath for 10 minutes and dried at 400° C. for 15 minutes. For platinum electrodes: A thin layer of Pt-paste (Solaronix, Platisol T/SP) was slot printed with a punched Scotch tape piece on the conductive side. The electrodes were then heated at 450° C. for 10 minutes.

PEDOT electrodes: PEDOT electrodes were prepared following the previously reported procedure. Briefly, an aqueous solution of 0.1 M sodium dodecylsulfate (SDS, Biotechnology Grade, VWR) and 0.01 M 3,4-ethylenedioxythiophene (EDOT, 97%, Alfa Aesar) was prepared through sonicating for 90 minutes. Electro-oxidative polymerization was performed by a CHI 6054E potentiostat. In a two electrode cell, a 2×2 cm cleaned, predrilled FTO glass substrate was used as a working electrode and same size cleaned FTO was used as counter and reference electrode. Electro-oxidative polymerization was performed under galvanostatic (chronopotentiometry on the instrument) mode with the following parameters: anodic current valued at 3 mA, high and low potential (E) 3.5-2.5 V, low E hold time 0 seconds, cathodic time of 0.005 seconds, anodic time 70 seconds, with initial polarity anodic, data storage interval as 0.1 seconds and number of segments 2, where current switching priority was based on time. The blue colored films were rinsed thoroughly with deionized water and dried for 2 minutes at 125° C. before use.

Dye-Sensitized Solar Cell Assembly.

The photoanode and counter electrode were sealed with a 25 μm thick hot melt gasket (Surlyn, Solaronix, "Meltonix 1170-25") by heating the system at 130° C. under a pressure of 0.2 psi for 1 minute with a sealing machine (Dyenamo, product DN-HM01). The electrolyte was added through the pre-drilled holes in the counter electrodes with the rubber sealing tip from a Solaronix "Vac'n'Fill Syringe" until the electrolyte began to emerge from the second counter electrode hole. The holes were sealed with a Surlyn sheet and a thin glass cover by heating at 130° C. under pressure (0.1 psi) for 25 seconds both for full and thin devices. Finally, soldered contacts were added with a MBR Ultrasonic soldering machine (model USS-9210) with solder alloy (Cerasolzer wire diameter 1.6 mm, item # CS 186-150). A circular black mask (active area 0.15 cm²) punched from black tape was used in the subsequent photovoltaic studies.

Photoanode Surface Treatment.

Sensitized $TiO_2$ films were submerged in a 0.1 M solution of 97% 1H,1H,2H,2H-perfluorooctyltrimethoxysilane (PFTS) in hexanes for 90 μminutes at 30° C. The electrodes were rinsed with hexanes and assembled as described above.

Preparation of $CO_2$ Reduction Electrodes ($Au_2O_3$ and $IrO_2$).

Figure 3:
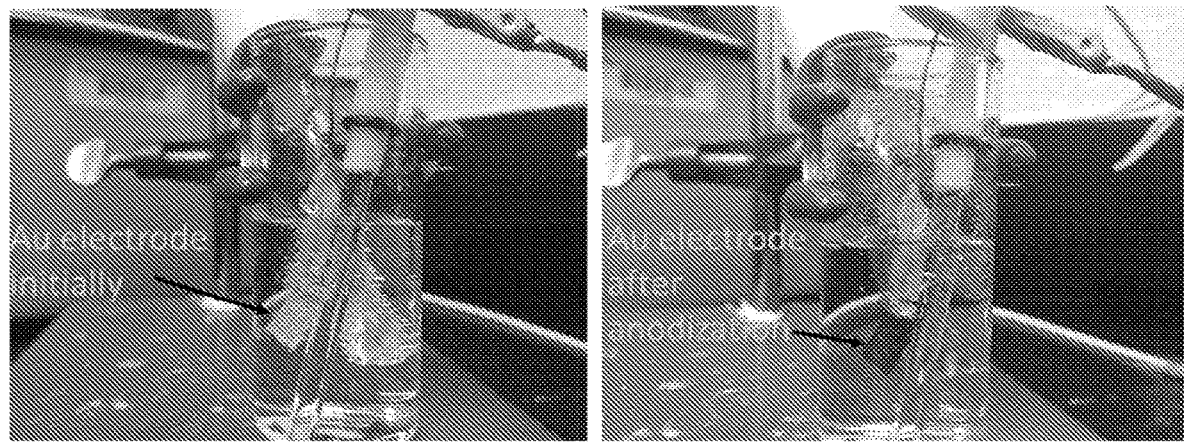
FIG. 3 shows images of an $Au_2O_3$ electrode before (left) and after (right) anodization.

Gold oxide ($Au_2O_3$) and Iridium oxide ($IrO_2$) electrodes were prepared according to literature. The ratio of the area of $Au_2O_3$ to $IrO_2$ electrode was (1:4.5). Briefly, for the preparation $Au_2O_3$ electrode, gold foil (99.95% metal basis, 0.1 mm thickness, 25*25 mm, Alfa Aesar, cut into 0.8 $cm^2$ (L*W, 0.4 cm*1 cm) was rinsed with diluted aqua regia mixed with deionized water (1:3), which was subsequently oxidized in 0.5 M $H_2SO_4$ by applying step functions, with a CHI 6054E potentiostat, by applying square pulses between 1.183 and 3.183 V versus Ag/AgCl (KCl sat.) with a large area platinum foil counter electrode at 500 Hz (2 ms period) with 1,800,000 million cycles in a single chamber cell. Note: Extending the number of cycles to 3,600,000 led to lower performance of the $Au_2O_3$ electrode and a powder to be observed to fall off the electrodes during longer cycle times. Images of the electrodes over time has been added for the 1,800,000 cycle case to show the change in electrode color over time which was observed for high performing electrodes (FIG. 3).

The $Au_2O_3$ cathode was further rinsed with water carefully and dipped in 0.5 M $NaHCO_3$ solution for 2-3 μminutes before use in the electrochemical cell. Briefly, for the anode preparation, a titanium foil (99.7%, 0.25 mm thick [3 cm*1.5 cm], Sigma Aldrich) was etched for 60 minutes in boiling 1.0 M oxalic acid, then a 0.2 M solution of $H_2IrCl_6$ (CAS #110802-84-1, 99.9% Ir, STREM Chemicals) in isopropanol was drop cast onto the electrode in order to cover the entire surface. The titanium foil was first dried at 70° C. for 10 minutes in air followed by calcination at 500° C. for 10 minutes in the same ovens used for the preparation of $TiO_2$ electrodes for DSCs (Vulcan® 3-Series model 3-550). This process was repeated three times on each side of the titanium foil. The prepared electrodes were further tested with cyclic voltammetry for current-voltage properties with a saturated $CO_2$ in 0.5 M $NaHCO_3$ aqueous solution. The required size 3.6 $cm^2$ (3 cm*0.6 cm) was then cut from the prepared $IrO_2$ electrodes for use in the electrochemical cells.

Electrochemical Cell (EC) and Measurements.

Electrolysis was performed in a three neck flask with total volume of 61 ml. $Au_2O_3$ (area 0.8 $cm^2$) and $IrO_2$ (area 3.6 $cm^2$) electrodes were completely dipped in 25 ml of a 0.5 M $NaHCO_3$ aqueous solution along with a Ag/AgCl (CH Instruments) reference electrode sealed by septa (Suba Seal, Sigma Aldrich). $CO_2$ was bubbled through the solution for 30 minutes with an exit needle in place before sealing the system. The $CO_2$ saturated system was then activated at −0.65 V vs Ag/AgCl until a steady current was reached (~500 seconds). The CO produced during this period (and the amount of CO/current generated in the first 20 μminutes of SSM-DSC powered catalysis) was subtracted from the reported CO values to ensure all catalysis was powered by the SSM-DSC device. CO, $H_2$ and $O_2$ were detected by a dual detector (TCD for $H_2/O_2$, FID for $CO/O_2$ with a methanizer) custom Agilent 7890B gas chromatograph instrument (additional details below).

After this the two electrodes, $Au_2O_3$ and $IrO_2$, were connected to a SSM-DSCs device (active area 0.5 $cm^2$) illuminated by a solar simulator (AAA rated for AM 1.5G sunlight) at 100 $mWcm^{-2}$. The continuous current flow through the photovoltaic-electrochemical (PV-EC) cell was monitored by a potentiostat (CHI 6054E) under controlled potential electrolysis (current versus time) conditions with no applied potential. During electrolysis headspace samples (300 μL) were taken at different intervals with a VICI valved syringe. The gas in the syringe was compressed to 250 μL, then with the tip of the syringe submerged in a vial of ether, the valve was open to allow the pressure to equalize to atmospheric pressure. The entire 250 μL sample was then injected onto a custom Agilent 7890B Gas Chromatograph (column, Agilent PorapakQ 6 ft, ⅛ OD) with a dual detector system (TCD and FID), a methanizer before the FID detector, and a backflush system to maintain good spectrum quality in the presence of $CO_2$. Quantitation of CO and methane was made using the FID detector and $H_2$ was quantified on the TCD detector (all calibrated using standards purchased from BuyCalGas.com).

Discussion

DSCs operate by photoexcitation of a dye, which then transfers an electron from the excited-state to $TiO_2$. The electron then traverses an external circuit before being collected at a counter electrode and returning to the oxidized dye. The overall power conversion efficiency (PCE) is calculated through the equation: $PCE=(V_{oc} \times J_{sc} \times FF)/I_0$, where $V_{oc}$ is the open circuit voltage, $J_{sc}$ is the short-circuit current density, FF is the fill factor, and $I_o$ is the incident light intensity. The redox shuttle should only be slightly higher in energy than the ground-state energy of the dye for minimal photovoltage loss.

Figure 4:
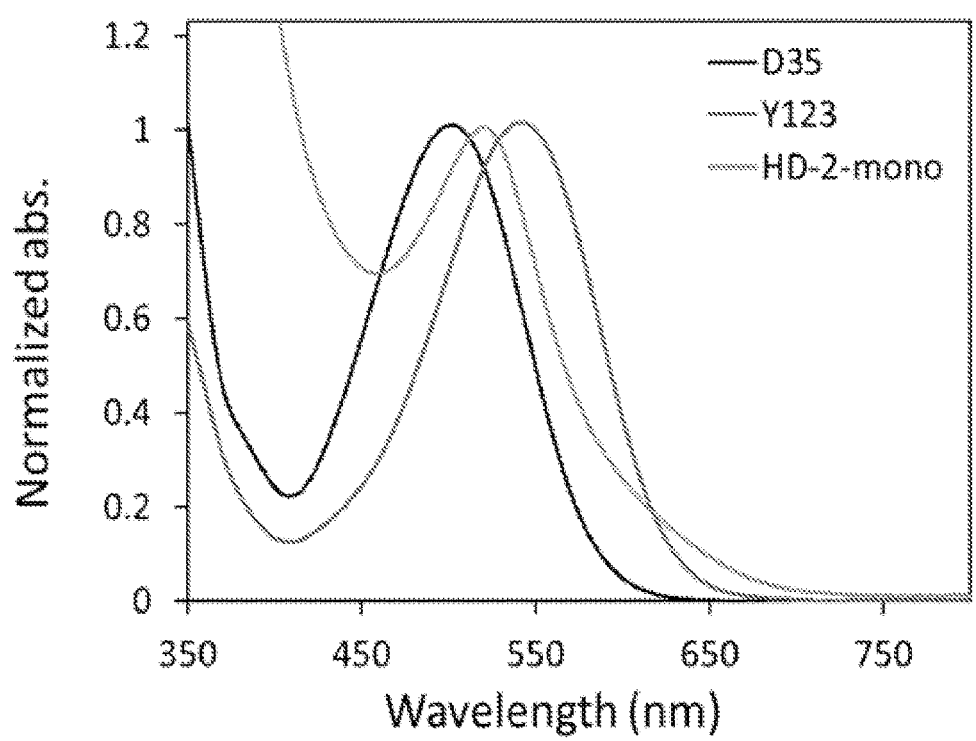
FIG. 4 shows a graph illustrating the UV-Vis absorption profile of D35 and Y123 in DCM with HD-2-mono in DMF.

Metal free organic sensitizers chosen for this study (D35 and Y123), are widely studied and well known for high absorptivity, aggregation free electrode sensitization and efficient PCEs in DSCs along with $Co^{3+/2+}$ redox shuttles. D35 offers characteristic orange color with absorption $\lambda_{max}$ at 500 nm and Y123 offer up to 40 nm red shifted light absorption properties (FIG. 4). Furthermore, redox shuttles of $Co(bpy-pz)_2^{3+/2+}$ and $Co(bpy)_3^{3+/2+}$ are capable of a theoretical maximum $V_{oc}$ of 1.36 V and 1.06 V, respectively, depending on the difference between redox potential and the energy level difference of $TiO_2$ with the conduction band energy of $TiO_2$ taken as −0.5 V versus NHE (FIG. 4). However, the highest reported values for $Co(bpy-pz)^{3+/2+}$ are up to 300 mV and for $Co(bpy)^{3+/2+}$ up to 160 mV lower than the theoretically possible for either D35 and Y123. On the other hand, $I^-/I_3^-$ system is only capable of theoretical maximum $V_{oc}$ of 0.9V, and $V_{oc}$ high as 0.882 V was recently reported.

Figure 5:
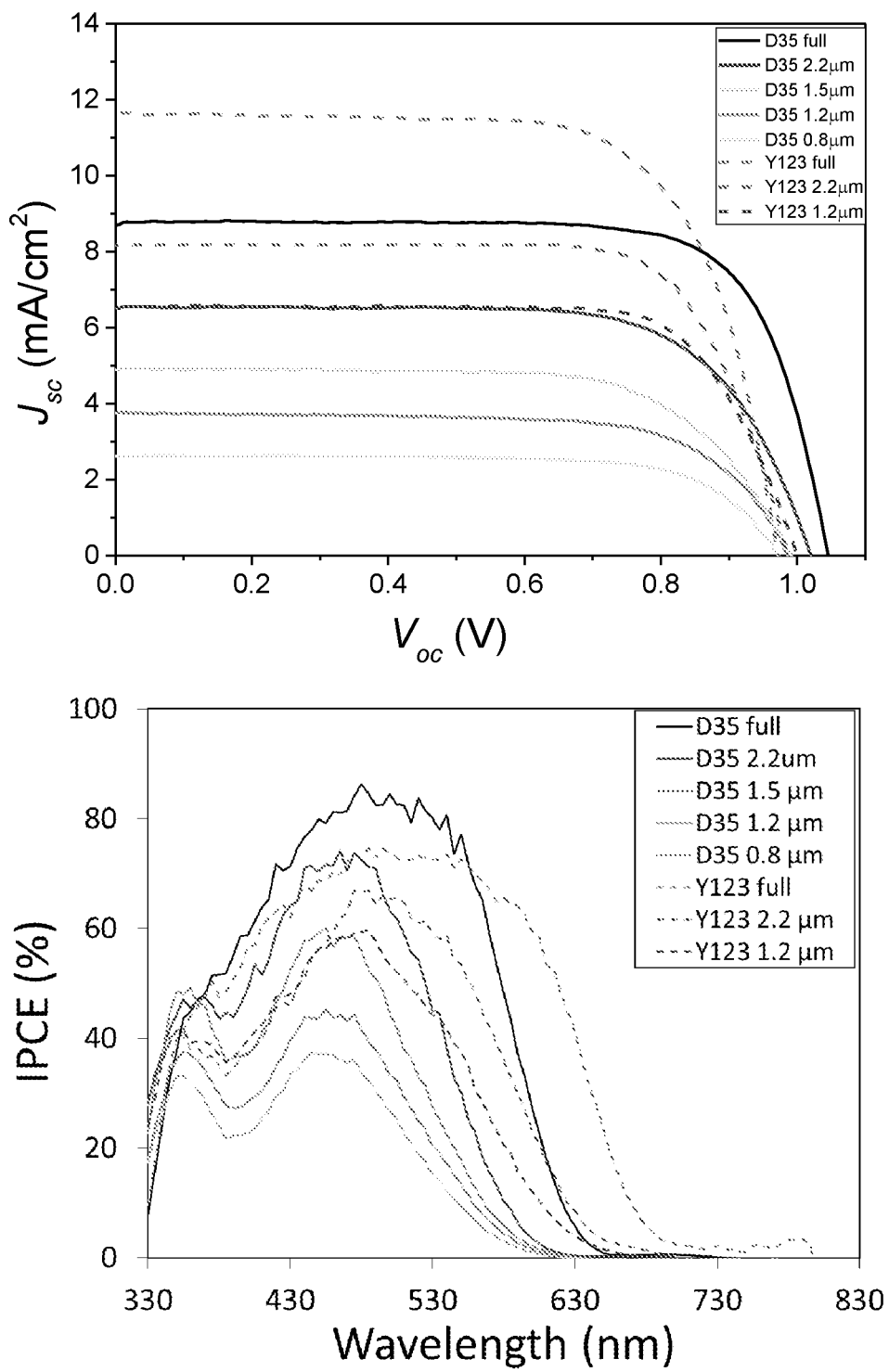
FIG. 5 shows graphs illustrating IV curves (left) and IPCE (right) of optimized $Co(bpy-pz)_2^{3+/2+}$ based devices in Table 1 for D35 (solid lines) and Y123 (dotted lines).
Figure 6:
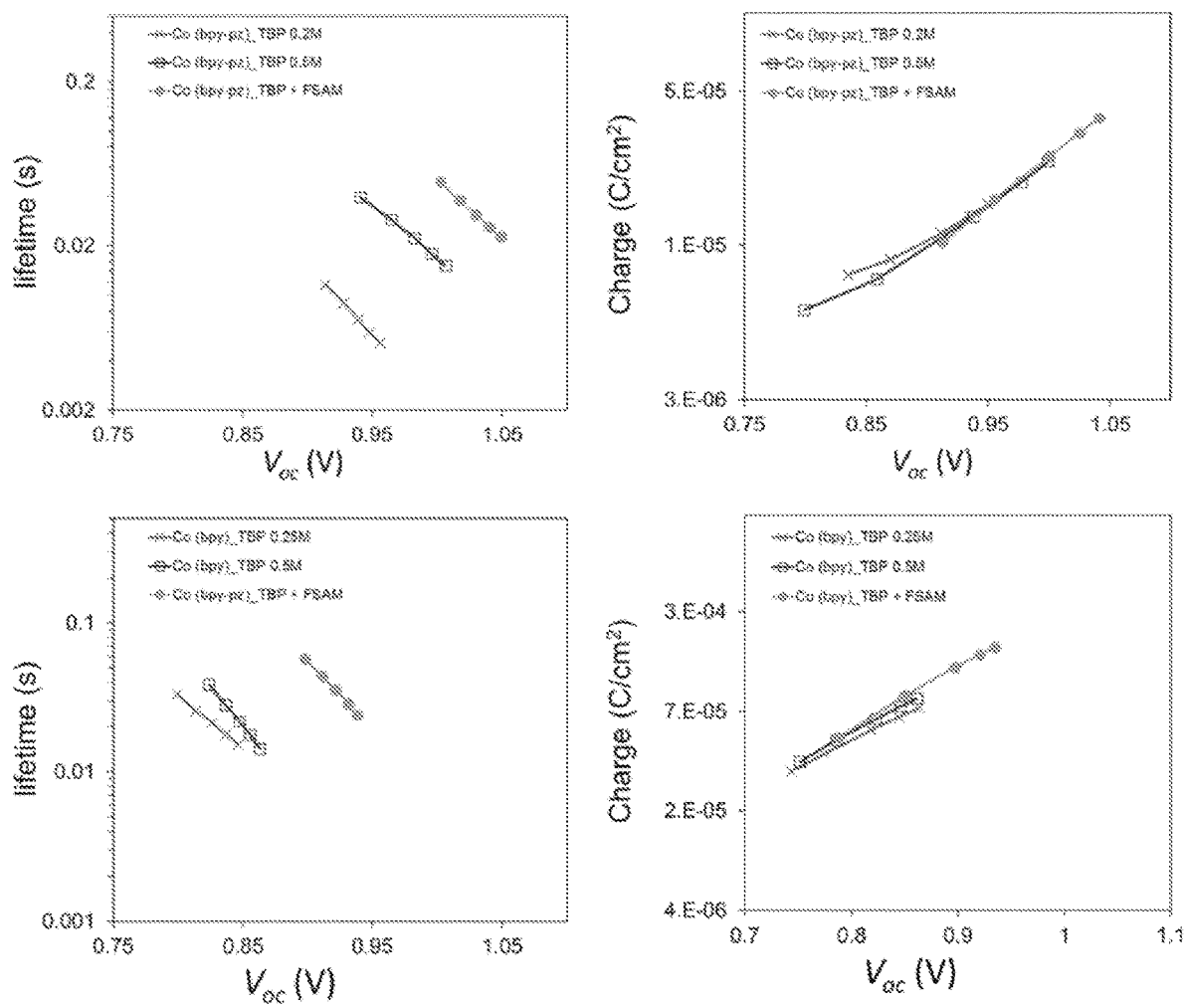
FIG. 6 shows graphs illustrating photovoltage transient measurements plotted as electron lifetime versus open-circuit voltage and charge density versus open-circuit voltage for $Co(bpy-pz)_2^{3+/2+}$ (top) and $Co(bpy)_3^{3+/2+}$ (bottom).

Under the conditions described herein (FIG. 5, Table 2) with previously employed electrolyte concentrations, PCE of up to 5.1% and $V_{oc}$ of 0.950 V was achieved for D35 with $Co(bpy-pz)_2^{3+/2+}$. The $V_{oc}$ and PCE were further improved to 0.998 V and 5.9%, respectively, by increasing the concentration of $Co(bpy-pz)_2^{3+/2+}$ from 0.22 M to 0.25 M and the concentration of tert-butylpyridine (TBP) from 0.2 M to 0.5 M (FIG. 5, Table 2). An insulating capping layer (PFTS: perfluorooctyltrimethylsilane) was then used to slow the recombination of electrons in $TiO_2$ with the redox shuttles, which led to $V_{oc}$ values of up to 1040 mV, with a PCE of 6.8% (Table 2 Entries 2 & 3). This is believed to be the first time a fluorinated self-assembled monolayer (FSAM) treatment such as PFTS has been achieved with a $Co^{3+/2+}$ redox systems. The device was found to improve in PCE through an increase in both $V_{oc}$ and $J_{sc}$. An increase in electron lifetime in $TiO_2$ (FIG. 6) was observed with a PFTS treatment, indicating slower recombination kinetics. However, no shift in the conduction band of $TiO_2$ was observed based on charge-extraction from open-circuit conditions as a function of light intensity, which indicates that the gain in voltage is due to slowing recombination losses (FIG. 6).

Turning to Y123, $V_{oc}$ of up to 0.960 V and PCE of up to 8.1% were obtained, on average, with PEDOT as the counter electrode and without anti-reflecting coating (Table 2, entries 4-6). Unlike D35 devices though, Y123 based-devices were found to show lower performance as a result of apparent dye desorption from the $TiO_2$ surface with PFTS treatment (Table 2). Accordingly, only D35 devices employ a PFTS treatment in the remaining studies.

TABLE 2

D35 and Y123 optimizations with Co(bpy-pz)$_2^{3+/2+}$ electrolyte and FSAM surface treatment.

| Entry | Dye and TiO$_2$ Thickness | Treatment | $V_{oc}$ (mV) | $J_{sc}$ (mA/cm$^2$) | FF | PCE % |
|---|---|---|---|---|---|---|
| Co(bpy-pz)$_2^{3+/2+}$ electrolyte and surface treatment optimization with a scattering layer | | | | | | |
| 1 | D35 full | None[a] | 953 ± 3 | 7.1 ± 0.3 | 74 ± 1 | 5.1 ± 0.3 |
| 2 | | None | 998 ± 7 | 7.9 ± 0.2 | 72 ± 4 | 5.9 ± 0.4 |
| 3 | | FSAM | 1037 ± 15 | 8.7 ± 0.4 | 74 ± 2 | 6.8 ± 0.08 |
| 4 | Y123 full | None | 965 ± 0 | 9.7 ± 0.3 | 67 ± 0.2 | 6.6 ± 0.2 |
| 5 | | None[b] | 959 ± 21 | 11.4 ± 0.3 | 72 ± 2 | 8.1 ± 0.3 |
| 6 | | FSAM[b] | 946 ± 5 | 9.6 ± 0.3 | 71 ± 0.9 | 6.5 ± 0.3 |
| Co(bpy-pz)$_2^{3+/2+}$ devices with thin TiO$_2$ films, without a scattering layer | | | | | | |
| 7 | D35 0.8 µm | FSAM | 981 ± 7 | 2.8 ± 0.1 | 70 ± 3 | 2 ± 0.2 |
| 8 | D35 1.2 µm | FSAM | 979 ± 17 | 3.7 ± 0.1 | 69 ± 0.5 | 2.5 ± 0.1 |
| 9 | D35 1.5 µm | FSAM | 997 ± 9 | 5.1 ± 0.2 | 69 ± 2 | 3.5 ± 0.1 |
| 10 | D35 2.2 µm | FSAM | 1031 ± 8 | 7.1 ± 0.5 | 68 ± 2 | 5.4 ± 0.4 |
| 11 | Y123 1.2 µm | None | 1010 ± 2 | 5.2 ± 0.1 | 64 ± 1.4 | 3.5 ± 0.2 |
| 12 | Y123 2.2 µm | None | 1010 ± 2 | 7.5 ± 0.05 | 70 ± 1.7 | 5.4 ± 0.08 |

All cells employ an optimized electrolyte having concentrations as: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile unless otherwise noted. Devices employ a Pt counter electrode unless otherwise noted. Device parameters are the average of 3 cells. Active area was fixed at 0.15 cm$^2$ throughout the study, with a black tape mask. Values after cell type refer to TiO$_2$ film thickness.
"full" refers to a 4.5 µm active layer of 30 nm particles and a 4.5 µm scattering layer.
[a]Electrolyte with concentrations as previously reported for Y123, which was comprised of: 0.22 M Co(bpy-pz)$_2$(PF$_6$)$_2$, 0.05M Co(bpy-pz)$_2$(PF$_6$)$_3$, 0.1M LiClO$_4$, and 0.2 M tert-butylpyridine, in acetonitrile.$^5$
[b]PEDOT counter electrode used.

Careful control of device thicknesses for each electrode in the SSM-DSC system is used to balance the photon distribution to each subcell by strategically allowing light to pass through the first electrodes. Judicious photon management strategies for SSM-DSC devices are critical for high performances since subcells wired in series are limited by the lowest current subcell in the SSM-DSC device, and the maximal current is proportional to the number of photons absorbed by a subcell. Accordingly, for application of D35 and Y123, in mechanically stacked series connected tandem devices, TiO$_2$ active layer thickness was minimized without a scattering layer to permit sufficient light to pass through to bottom cells. More specifically, in this Example, the TiO$_2$ film active layer thickness for the front subcells was evaluated between 0.8-2.2 µm without a scattering layer (FIG. 5, Table 2 entries 7-10). The range of TiO$_2$ thickness was controlled by diluting the regular paste with terpineol (paste:terpineol, 1:1 or 2:1) and printing screen for thinner films.

The IV and IPCE of the different thickness devices are shown in FIG. 5 and Table 2. For devices without a scattering layer, $J_{sc}$ values ranging from 2.8-7.1 mA/cm$^2$ and IPCE peak values ranging from 38-75% could be obtained with D35 through film thickness control (FIG. 5). In a similar fashion, the $J_{sc}$ of Y123 based devices could be modulated between 5.2 and 7.5 mA/cm$^2$ by changing the film thickness (FIG. 5, Table 2 entries 11-12). For devices with a scattering layer, a peak IPCE value of 83% at 490 nm was achieved for D35 and a peak IPCE value of 74% at 530 nm was achieved for Y123. Increase in thickness from 0.8-2.2 µm showed linear increase in IPCE response for both D35 and Y123.

Figure 7A:
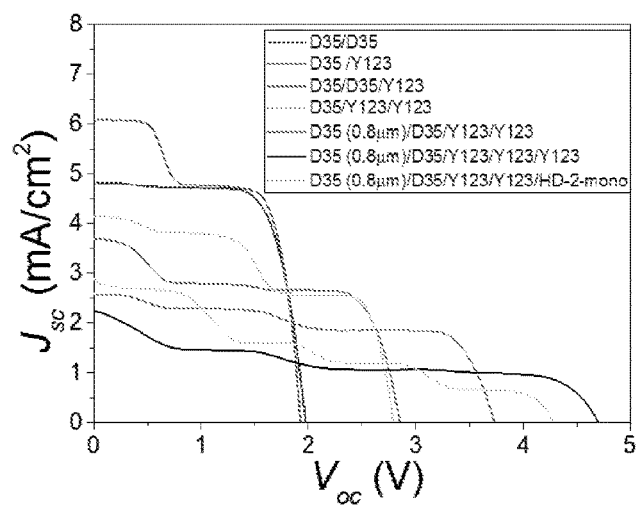
FIGS. 7A-C show graphs illustrating IV results for various SSM-DSC devices. (A) Shows IV curve results for single illuminated area, 2-5 SSM-DSC devices (top). IV curves for 2 SSM-DSC systems (4+4 or 4+5 subcells) irradiated side-by-side (bottom). (B) Shows graphs illustrating IV results for tandem devices left (two and three devices), right (four and five devices) given in Table 3 for $Co(bpy-pz)^{3+/2+}$ electrolyte based devices. (C) Shows IV graphs for four and five devices with two sets (set1 and set2) which were connected in series to add up photovoltage.
Figure 7B:
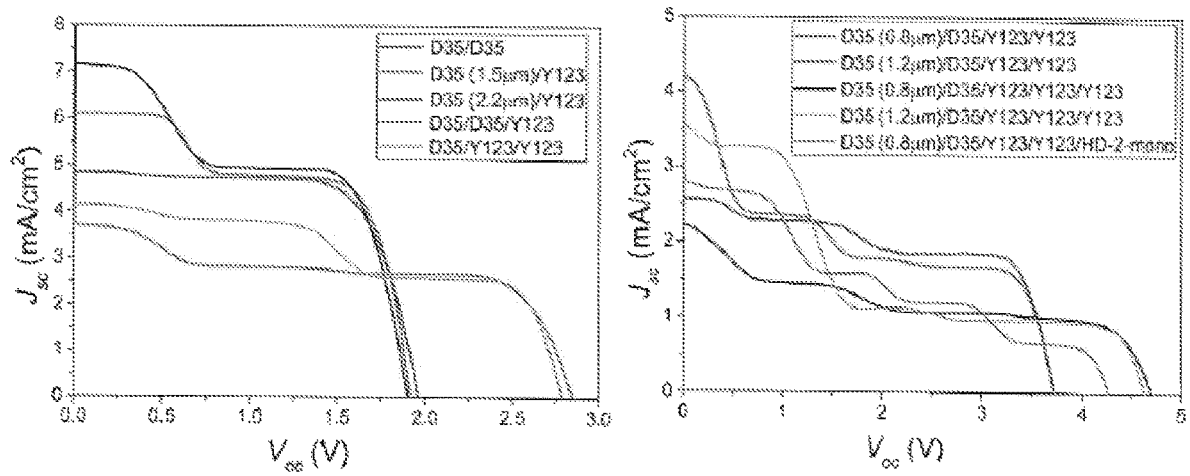
Figure 7C:
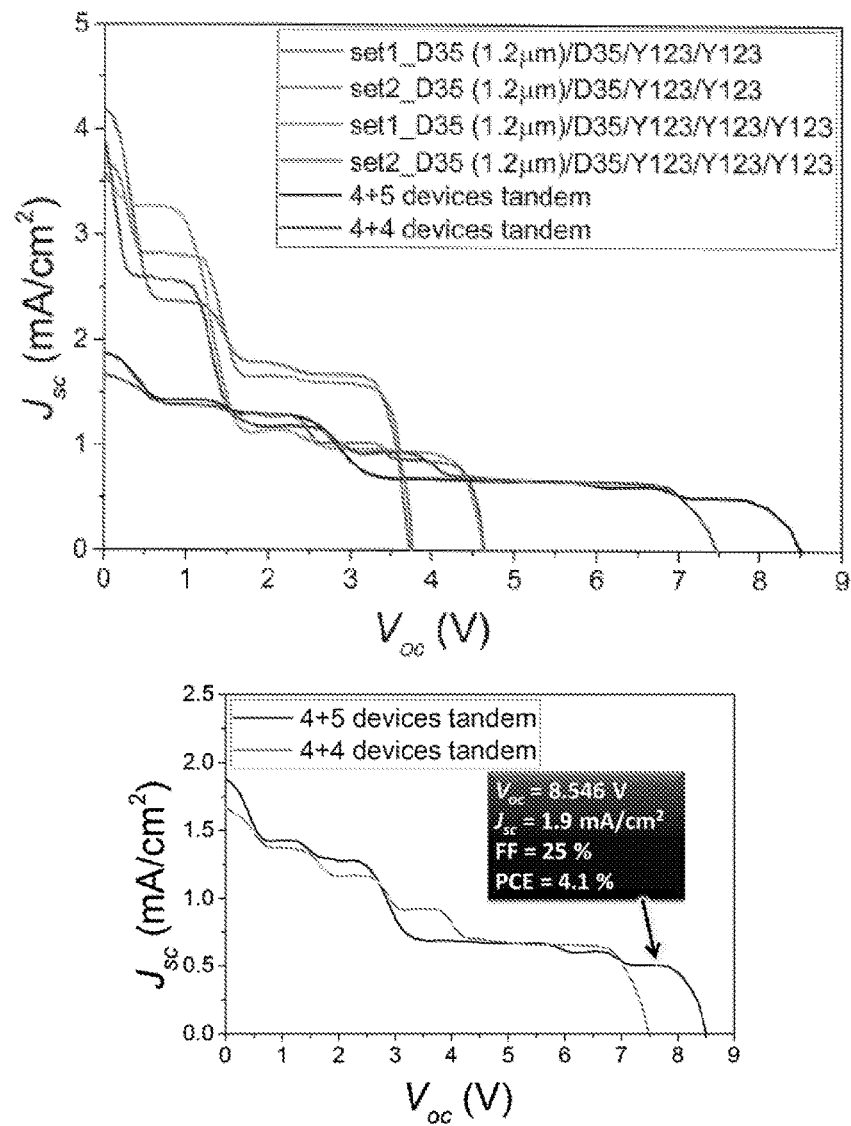

With a method for tuning device photocurrents in hand, SSM-DSC devices with 2-5 subcells were constructed by judicious selection of subcell thicknesses (FIGS. 7A-C, Tables 3-4). Ideally, irradiation should be equally distributed among the subcells according to photon flux, segregated based on photon potential energy, and minimal transmitted photons should be allowed through the SSM-DSC system. Thus, the front subcell was varied depending on the total number of subcells in the SSM-DSC to ensure maximal efficiency.

TABLE 3

SSM-DSC results for 2-3 subcell systems with D35, Y123 and HD-2-mono

| Entry | Subcell Type | Thickness (µm) | $V_{oc}$ (mV) | $J_{sc}$ (mA/cm$^2$) | FF | PCE % |
|---|---|---|---|---|---|---|
| 1 | D35/D35 | 1.5/full | 1965 ± 5 | 4.9 ± 0.1 | 0.71 ± 0.01 | 6.9 ± 0.2 |
| 2 | D35/Y123 | 1.5/full | 1918 ± 19 | 5.9 ± 0.2 | 0.62 ± 0.01 | 7.1 ± 0.2 |
| 3 | D35/D35/Y123 | 1.2/2.2/full | 2871 ± 14 | 3.9 ± 0.2 | 0.55 ± 0.04 | 6.4 ± 0.1 |
| 4 | D35/Y123/Y123 | 1.2/2.2/full | 2809 ± 8 | 3.7 ± 0.1 | 0.61 ± 0.01 | 6.4 ± 0.1 |
| 5 | D35/Y123/Y123[a] | 1.2/2.2/full | 2666 ± 5 | 3.6 ± 0.2 | 0.72 ± 0.02 | 7.0 ± 0.02 |
| 6 | D35/Y123/HD-2-mono | 1.2/2.2/full | 2628 ± 17 | 3.9 ± 0.3 | 0.74 ± 0.03 | 7.7 ± 0.1 |

Front cells are the first dyes listed with the respective thickness of the TiO$_2$ film listed first as well. Subsequent subcells are listed in order from front to back.
"full" indicates subcells use a 4.5 µm TiO$_2$ active layer and a 4.5 µm TiO$_2$ scattering layer.
Electrolyte used for all cells unless otherwise noted is as follows: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile.
[a]Indicates Co(bpy)$_3^{3+/2+}$ was used in this subcell

TABLE 4

SSM-DSC results for comparison of different front cells thicknesses.

| Entry | Subcell Type | Thickness (μm) | $V_{oc}$ (mV) | $J_{sc}$ (mA/cm$^2$) | FF | PCE % |
|---|---|---|---|---|---|---|
| 1 | D35/Y123 | 1.5/full | 1918 ± 19 | 5.9 ± 0.2 | 0.62 ± 0.01 | 7.1 ± 0.2 |
| 2 | D35/Y123 | 2.2/full | 1930 ± 10 | 7.2 ± 0.2 | 0.51 ± 0.01 | 7.2 ± 0.3 |
| 3 | D35/D35/Y123 | 0.8/2.2/2.2/full | 3718 ± 8 | 2.7 ± 0.1 | 0.58 ± 0.03 | 5.8 ± 0.2 |
| 4 | D35/D35/Y123 | 1.2/2.2/2.2/full | 3776 ± 9 | 4.1 ± 0.3 | 0.35 ± 0.02 | 5.4 ± 0.2 |
| 5 | D35/D35/Y123/Y123 | 0.8/2.2/1.2/2.2/full | 4670 ± 38 | 2.4 ± 0.1 | 0.38 ± 0.05 | 4.3 ± 0.3 |
| 6 | D35/D35/Y123/Y123 | 1.2/2.2/1.2/2.2/full | 4667 ± 32 | 3.7 ± 0.1 | 0.22 ± 0.03 | 3.8 ± 0.4 |

Front cells are the first dyes listed with the respective thickness of the TiO$_2$ film listed first as well. Subsequent subcells are listed in order from front to back.
"full" indicates subcells use a 4.5 μm TiO$_2$ active layer and a 4.5 μm TiO$_2$ scattering layer.
Electrolyte used for all cells unless otherwise noted is as follows: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile.

For a two subcell SSM-DSC with D35/D35 (1.5 μm/full), a record high $V_{oc}$ is obtained at 1.97 V with a PCE of 6.9% (FIGS. 7A-B, Table 3 entry 1). A D35/Y123 (1.5 μm/full) SSM-DSC using a broader absorbing second dye led to a $V_{oc}$ of 1.92 V and higher PCE of 7.1% (FIGS. 7A-B, Table 3 entry 2). The substantially improved efficient light harvesting in the tandem cells with D35 at the bottom as compared to Y123 at the bottom is believed to be due to better complement of top and bottom cell light absorption properties. A loss of FF was also observed for the D35/Y123 SSM-DSC when compared to the D35/D35 system (0.71 vs 0.62). This loss is due to a mismatch of current through the two devices. It was further observed that thickness of the front device showed a large effect on FF and $J_{sc}$ whereas overall PCE was comparable (Table 4 entries 1-2).

Figure 8:
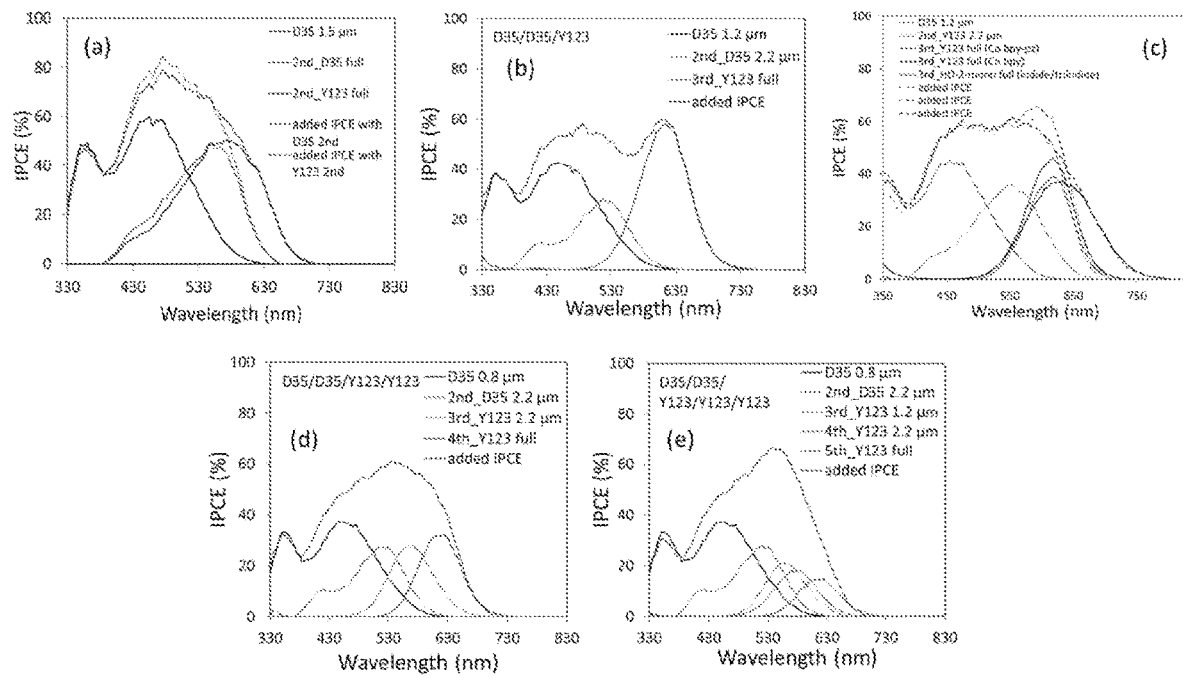
FIG. 8 shows IPCE graphs for individual subcells in the SSM-DSC configuration for $Co(bpy-pz)_2^{3+/2+}$ electrolyte in Tables 5-7. Blue colored dotted line in each graph represent the curve as the result of manual addition of all the IPCE's from devices in the stack.

Adding a third subcell (D35/D35/Y123, 1.2/2.2/full) further increased the device photovoltage to 2.87 V with a PCE of 6.4%. Changing the center subcell to Y123 led to a comparable $V_{oc}$ of 2.81 V with a PCE of 6.4%, however; a significant increase in FF was observed for the D35/Y123/Y123 system at 0.61 (from 0.55) due to a better matching of subcell $J_{sc}$ values. Although the current is generally thought to be limited by the minimum current device in series tandem devices, a current pushing-up (i.e., tandem device current higher than the lowest current device) was noticed. In this configuration, the third cell was found to be current limiting via IV and IPCE measurements and diminishing overall device performances (FIGS. 8A-9B, Table 3 entries 4-6). FIG. 8C compares the IPCE for subcells in an SSM-DSC device with a combined IPCE of three subcells showing a peak IPCE of ~60% near 600 nm. Changing the redox shuttle system from [Co(bpy-pz)$_2$]$^{2+/3+}$ to [Co(bpy)$_3$]$^{2+/3+}$ for the third cell alone (Table 3 entry 5) gave a significant increase in current leading to an SSM-DSC with a $V_{oc}$ 2.67 V and 7.0% PCE. To further increase the current at the back cell, a broader absorbing Ru-sensitizer was selected (HD-2-mono) with I$^-$/I$_3^-$ as the redox shuttle system (FIG. 2). A D35/Y123/HD-2-mono SSM-DSC system gives a high PCE of 7.7% with a $V_{oc}$ of 2.62 V. Both the D35/Y123/Y123 and D35/Y123/HD-2-mono devices gave excellent fill factors (0.72 and 0.74, respectively) owing to very well balanced currents through all three devices as shown by change in IV and IPCE curves (FIGS. 8A-9B).

The device stacks were also analyzed with different front device thicknesses, where the thickness of each individual device was chosen strategically to allow enough light to pass to next device. Thinner front devices including TiO$_2$ with a thickness of 0.8 μm lead to overall higher PCE and FF. The effect of mismatched currents in different devices is illustrated in FIGS. 7A-C (middle right) by sudden humps. It was observed that instead of following the normal trend of current being limited by the lowest current device in the series tandem, $J_{sc}$ and FF were found to interchange. Referring to Table 3, device parameters generally followed the front device current, however, as noticed from the IV graphs and device parameters, high $J_{sc}$ lead to lower FF and vice versa. To the best of our knowledge, this is a record demonstration of photovoltage in a dye-sensitized solar cell system from a single illuminated area.

Figure 9A:
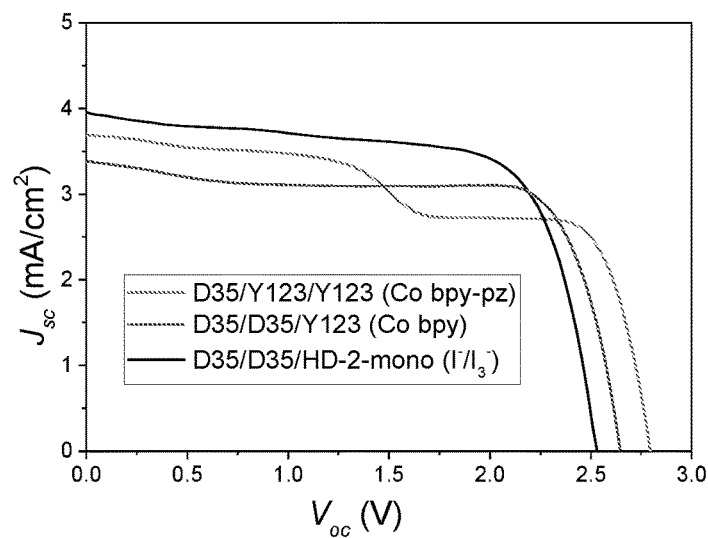
FIGS. 9A-B show graphs illustrating (A) IV and (B) IPCE curves corresponding to devices reported in Table 6 comparing varying only the third device.
Figure 9B:
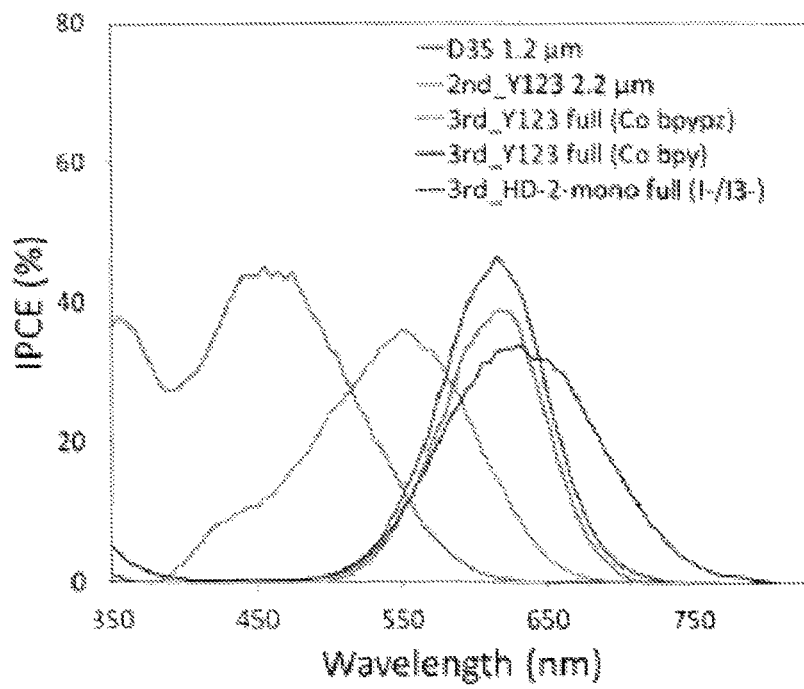

To evaluate the equal distribution of photons, incident photon-to-current conversion efficiency (IPCE) (FIGS. 8A-E) and IV measurements (Tables 5-7) were made for each individual cell after being configured in an SSM-DSC system. For a three device system with a Co(bpy-pz)$_2^{3+/2+}$ redox shuttle, it was noted that in one configuration the third device had a $J_{sc}$ of 2.6 mA/cm$^2$, which was decreased as compared to the 3.7 mA/cm$^2$ $J_{sc}$ of the front two devices (Table 6). However, increased $J_{sc}$ was achieved by replacing the third device with Y123 employing Co(bpy)$_3^{3+/2+}$ and/or HD-2-mono employing an iodine redox shuttle (FIG. 9A, Table 6). With these configurations, $J_{sc}$ for the third device in the stack increased to 3.2 and 3.6 mA/cm$^2$ for Y123 with Co(bpy)$^{3+/2+}$ and HD-2-mono, respectively. As the result of better current match in $J_{sc}$ of three devices in the stack, increased FF (61% to 74%) and overall PCE (6.4% to 7.7%) was achieved as well (FIG. 9B).

TABLE 5

Tandem device and its individual subcell photovoltaic characteristics for Co(bpy-pz)$_2^{3+/2+}$ based electrolyte with two and three stacked devices.

| Dye and TiO$_2$ Thickness (μm) | Position | $V_{oc}$ (mV) | $J_{sc}$ (mA/cm$^2$) | FF % | PCE % |
|---|---|---|---|---|---|
| D35/D35 | | | | | |
| D35 1.5 μm | itself | 997 ± 9 | 5.1 ± 0.2 | 69 ± 2 | 3.5 ± 0.1 |
| D35 full | itself | 1037 ± 15 | 8.7 ± 0.4 | 74 ± 2 | 6.8 ± 0.08 |
|  | 2nd | 984 ± 8 | 4.9 ± 0.1 | 73 ± 2 | 4.0 ± 0.2 |
| D35/D35 (1.5/full) | Tandem | 1965 ± 5 | 4.9 ± 0.05 | 71 ± 1 | 6.9 ± 0.2 |
| D35/Y123 | | | | | |
| D35 1.5 μm | itself | 997 ± 9 | 5.1 ± 0.2 | 69 ± 2 | 3.5 ± 0.1 |
| Y123 full | itself | 959 ± 21 | 11.4 ± 0.3 | 72 ± 2 | 8.1 ± 0.3 |
|  | 2nd | 905 ± 13 | 6.2 ± 0.4 | 77 ± 2 | 4.5 ± 0.4 |
| D35/Y123 (1.5/full) | Tandem | 1918 ± 19 | 5.9 ± 0.2 | 62 ± 1 | 7.1 ± 0.2 |
| D35/D35/Y123 | | | | | |
| D35 1.2 μm | itself | 979 ± 17 | 3.7 ± 0.1 | 69 ± 0.5 | 2.5 ± 0.1 |
| D35 2.2 μm | itself | 1031 ± 8 | 7.1 ± 0.5 | 68 ± 2 | 5.4 ± 0.4 |
|  | 2nd | 987 ± 5 | 2.3 ± 0.2 | 71 ± 5 | 1.8 ± 0.03 |
| Y123 full | itself | 959 ± 21 | 11.4 ± 0.3 | 72 ± 2 | 8.1 ± 0.3 |
|  | 3rd | 876 ± 26 | 3.3 ± 0.1 | 78 ± 1 | 2.4 ± 0.02 |
| D35/D35/Y123 (1.2/2.2/full) | Tandem | 2871 ± 14 | 3.9 ± 0.2 | 55 ± 4 | 6.4 ± 0.1 |

"itself" refers to measurements made on this subcell when taken out of the SSM-DSC configuration and measured directly. "2$^{nd}$ or 3$^{rd}$" refers to measurements made on this specific subcell only, when in the SSM-DSC configuration. Front cells are the first dyes listed with the respective thickness of the TiO$_2$ film listed first as well. Subsequent subcells are listed in order from front to back. "Full" indicates subcells use a 4.5 μm TiO$_2$ active layer and a 4.5 μm TiO$_2$ scattering layer. Electrolyte used for all cells unless otherwise noted is as follows: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile.

TABLE 6

Tandem SSM-DSC devices and subcell photovoltaic characteristics for varying electrolyte at the final cell.

| Dye and TiO$_2$ Thickness | Position | $V_{oc}$ (mV) | $J_{sc}$ (mA/cm$^2$) | FF | PCE % |
|---|---|---|---|---|---|
| front two subcells based on D35/Y123 used for the remainder of the table | | | | | |
| D35 1.2 μm | itself | 979 ± 17 | 3.7 ± 0.1 | 69 ± 0.5 | 2.5 ± 0.1 |
| Y123 2.2 μm | itself | 998 ± 12 | 7.9 ± 0.4 | 71 ± 2 | 5.7 ± 0.3 |
|  | 2nd | 958 ± 8 | 3.7 ± 0.2 | 76 ± 2 | 2.7 ± 0.2 |
| 3$^{rd}$ (and final) subcell based on Y123 employing Co(bpy-pz)$_2^{3+/2+}$ | | | | | |
| Y123 full | itself | 959 ± 21 | 11.4 ± 0.3 | 72 ± 2 | 8.1 ± 0.3 |
|  | 3rd | 883 ± 15 | 2.6 ± 0.05 | 78 ± 1 | 1.9 ± 0.05 |
| D35/Y123/Y123 | Tandem | 2809 ± 8 | 3.7 ± 0.1 | 61 ± 1 | 6.4 ± 0.1 |
| 3$^{rd}$ (and final) subcell based on Y123 employing Co(bpy)$_3^{3+/2+}$ | | | | | |
| Y123 full | itself | 811 ± 18 | 12.3 ± 0.5 | 73 ± 2 | 7.6 ± 0.2 |
|  | 3rd | 732 ± 20 | 3.2 ± 0.1 | 78 ± 0.6 | 2.0 ± 0.1 |
| D35/Y123/Y123 | Tandem | 2666 ± 5 | 3.6 ± 0.2 | 72 ± 2 | 7.0 ± 0.02 |
| 3$^{rd}$ (and final) subcell based on HD-2-mono employing (I$^-$/I$_3^-$) | | | | | |
| HD-2-mono | itself | 719 ± 8 | 16.6 ± 0.1 | 0.73 ± 0.01 | 8.8 ± 0.1 |
|  | 3rd | 688 ± 20 | 3.6 ± 0.05 | 78 ± 1 | 1.84 ± 0.1 |
| full D35/Y123/HD-2-mono | Tandem | 2628 ± 17 | 3.9 ± 0.3 | 74 ± 3 | 7.7 ± 0.1 |

"itself" refers to measurements made on this subcell when taken out of the SSM-DSC configuration and measured directly. "2$^{nd}$ or 3$^{rd}$" refers to measurements made on this specific subcell only, when in the SSM-DSC configuration. Front cells are the first dyes listed with the respective thickness of the TiO$_2$ film listed first as well. Subsequent subcells are listed in order from front to back. "Full" indicates subcells use a 4.5 μm TiO$_2$ active layer and 4.5 μm TiO$_2$ scattering layer. Electrolyte used for all cells unless otherwise noted is as follows: for Co(bpy-pz)$_2^{3+/2+}$: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile; for Co(bpy)$_3^{3+/2+}$: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile; for I$^-$/I$_3^-$: electrode thickness was 10.0 μm 30 nm TiO$_2$ particles and 4.5 μm scattering layer. Iodine electrolyte was used: 1.0M DMII (1,3-dimethylimidazolium iodide), 0.05M LiI, 30 mM I$_2$, 0.5M TBP (4-tert-butylpyridine), 0.1M GNCS (guanadinium thiocyanate) in acetonitrile and valeronitrile (v/v, 85/15).

TABLE 7

Tandem device and its individual subcell photovoltaic characteristics for Co(bpy-pz)$_2^{3+/2+}$ based electrolyte with 4 and 5 stacked devices. See Table 6 for device parameters.

| Dye and TiO$_2$ Thickness | Position | $V_{oc}$ (mV) | $J_{sc}$ (mA/cm$^2$) | FF | PCE % |
|---|---|---|---|---|---|
| D35 (0.8 μm)/D35/Y123/Y123 | | | | | |
| D35 0.8 μm | front | 981 ± 7 | 2.8 ± 0.1 | 70 ± 3 | 2 ± 0.2 |
| D35 2.2 μm | itself | 1031 ± 8 | 7.1 ± 0.5 | 68 ± 2 | 5.4 ± 0.4 |
|  | 2nd | 970 ± 22 | 2.5 ± 0.3 | 71 ± 02 | 1.8 ± 0.1 |
| Y123 1.2 μm | itself | 998 ± 12 | 7.9 ± 0.4 | 71 ± 2 | 5.7 ± 0.3 |
|  | 3rd | 930 ± 24 | 2.1 ± 0.3 | 77 ± 1 | 1.6 ± 0.3 |
| Y123 full | itself | 959 ± 21 | 11.4 ± 0.3 | 72 ± 2 | 8.1 ± 0.3 |
|  | 4th | 887 ± 14 | 1.9 ± 0.1 | 78 ± 3 | 1.4 ± 0.05 |
| D35/D35/Y123/Y123 | Tandem | 3718 ± 8 | 2.6 ± 0.1 | 58 ± 3 | 5.8 ± 0.2 |
| D35 (1.2 μm)/D35/Y123/Y123 | | | | | |
| D35 1.2 μm | front | 979 ± 17 | 3.7 ± 0.1 | 69 ± 0.5 | 2.5 ± 0.1 |
| D35 2.2 μm | itself | 1031 ± 8 | 7.1 ± 0.5 | 68 ± 2 | 5.4 ± 0.4 |
|  | 2nd | 987 ± 5 | 2.3 ± 0.2 | 71 ± 5 | 1.8 ± 0.03 |
| Y123 1.2 μm | itself | 998 ± 12 | 7.9 ± 0.4 | 71 ± 2 | 5.7 ± 0.3 |
|  | 3rd | 937 ± 5 | 1.7 ± 0.1 | 78 ± 1 | 1.3 ± 0.1 |
| Y123 full | itself | 959 ± 21 | 11.4 ± 0.3 | 72 ± 2 | 8.1 ± 0.3 |
|  | 4th | 867 ± 5 | 1.6 ± 0.05 | 79 ± 2 | 1.2 ± 0.02 |
| D35/D35/Y123/Y123 | Tandem | 3776 ± 10 | 3.9 ± 0.3 | 35 ± 2 | 5.4 ± 0.2 |

Figure 10:
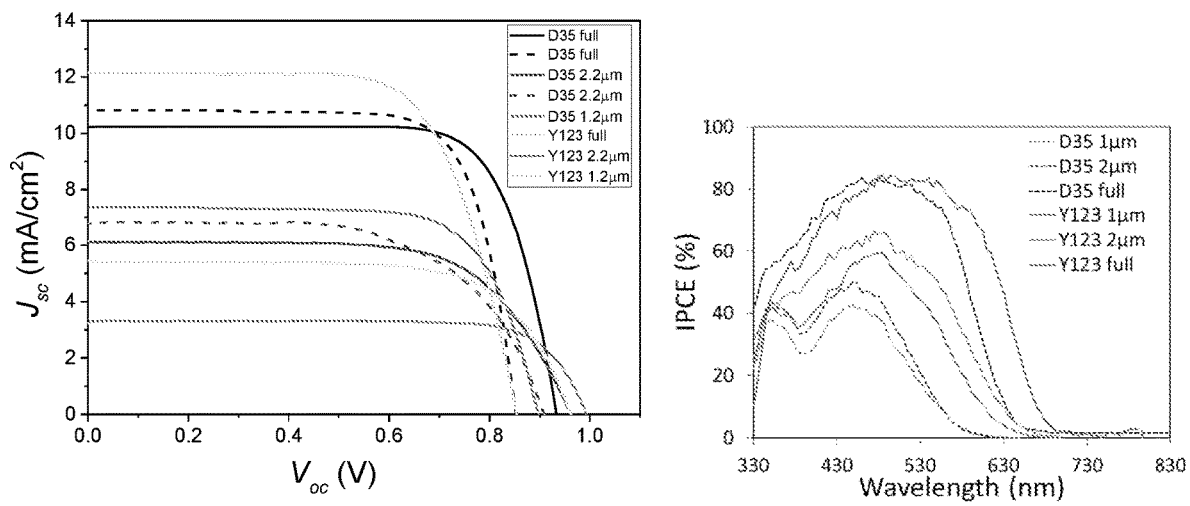
FIG. 10 shows graphs illustrating IV (left) and IPCE (right) of $Co(bpy)_3^{3+/2+}$ electrolyte based devices in Table 8.
Figure 11:
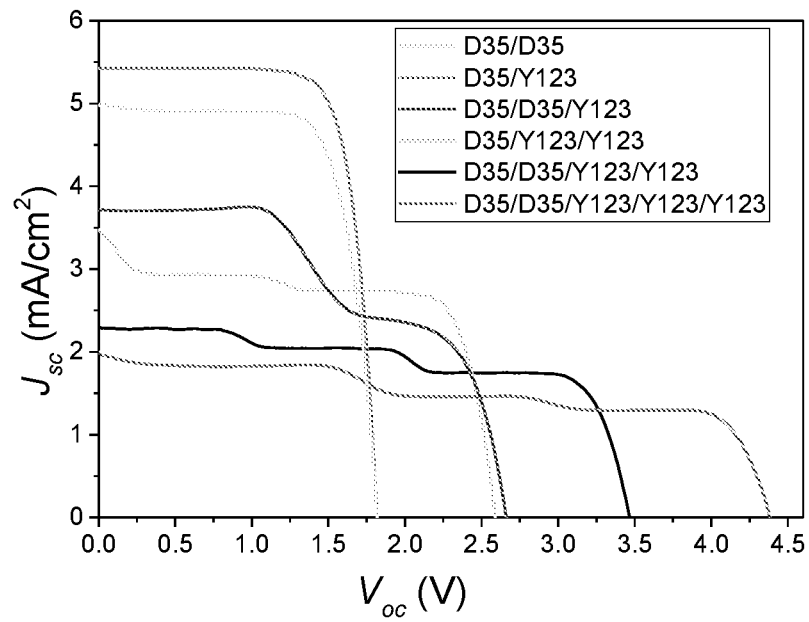
FIG. 11 shows a graph illustrating IV results for SSM-DSC devices given in Table 9 for $Co(bpy)_3^{3+/2+}$ electrolyte based devices.

IV and IPCE for D35, Y123, and HD-2-mono were also measured with Co(bpy)$_3^{3+2/3+}$ electrolyte (FIG. 10, Table 8). As demonstrated in Table 8, FSAM treatment with Co(bpy)$^{3+/2+}$ and D35 increased $V_{oc}$ by up to 70 mV, similar to previously studied Ru (II) dye and I$^-$/I$_3^-$, which improved $V_{oc}$ by up to 70 mV with similar TiO$_2$ films. The results from Co(bpy)$_3^{2+/3+}$ based SSM-DSC devices are shown in FIG. 11 and Tables 9-10. Comparatively, Co(bpy-pz)$_2^{3+/2+}$ based D35/D35 devices resulted in higher $V_{oc}$(1.965 V) compared to (1.861 V) of Co(bpy)$_3^{3+/2+}$ due to inherently more positive redox potential of former, with comparable overall PCE.

TABLE 8

D35, Y123 and HD-2-mono optimization with Co(bpy)$_3^{3+/2+}$ electrolyte and FSAM surface treatment.

| Entry | Dye and TiO$_2$ Thickness | Treatment | $V_{oc}$ (mV) | $J_{sc}$ (mA/cm$^2$) | FF | PCE % |
|---|---|---|---|---|---|---|
| Co(bpy)$_3^{3+/2+}$ electrolyte and surface treatment optimization with scattering layer ||||||||
| 1 | D35$^{a,b}$ | None | 854 ± 6 | 10.3 ± 0.3 | 73 ± 1.8 | 6.6 ± 0.1 |
| 2 | D35$^b$ | None | 854 ± 14 | 10.7 ± 0.5 | 74 ± 1 | 6.9 ± 0.2 |
| 3 |  | FSAM | 921 ± 15 | 10.2 ± 0.6 | 73 ± 4 | 7 ± 0.4 |
| 4 | Y123$^b$ | none | 842 ± 23 | 12.3 ± 1.3 | 72 ± 1 | 7.7 ± 0.4 |
| 5 | HD-2-mono$^{c,d}$ | none | 719 ± 8 | 16.6 ± 0.1 | 73 ± 0.01 | 8.8 ± 0.1 |
| Co(bpy)$_3^{3+/2+}$ devices with different thickness and without scattering layer ||||||||
| 6 | D35 1.2 um | FSAM | 993 ± 23 | 3.2 ± 0.15 | 73 ± 1.4 | 2.4 ± 0.08 |
| 7 | D35 2.2 um | FSAM | 974 ± 14 | 6.1 ± 0.4 | 67 ± 3 | 4.1 ± 0.2 |
| 8 | Y123 1.2 um | None | 973 ± 28 | 5.5 ± 0.3 | 66 ± 8 | 3.6 ± 0.3 |
| 9 | Y123 2.2 um | None | 898 ± 25 | 7.4 ± 0.96 | 70 ± 4 | 5 ± 0.5 |

All cells employ the optimized electrolyte having concentrations as: 0.25M Co(bpy)$_3$(PF$_6$)$_2$, 0.05M Co(bpy)$_3$(PF$_6$)$_3$, 0.1M LiTFSI, and 0.5M tert-butylpyridine in acetonitrile unless otherwise noted.
$^a$Electrolyte with concentrations as: 0.25M Co(bpy)$_3$(PF$_6$)$_2$, 0.05M Co(bpy)$_3$(PF$_6$)$_3$, 0.1M LiTFSI, and 0.25M tert-butylpyridine in acetonitrile.
$^b$Electrode thickness was 4.5 μm 30 nm TiO$_2$ particles and 4.5 μm scattering layer.
$^c$Electrode thickness was 10.0 μm 30 nm TiO$_2$ particles and 4.5 μm scattering layer.
$^d$Iodine electrolyte was used: 1.0 M DMII (1,3-dimethylimidazolium iodide), 0.05M LiI, 30 mM I$_2$, 0.5M TBP (4-tert-butylpyridine), 0.1M GNCS (guanadinium thiocyanate) in acetonitrile and valeronitrile (v/v, 85/15).

TABLE 9

Summary of Co(bpy)$_3^{3+/2+}$ based SSM-DSCs.

| Entry | Dye | Thickness (μm) | $V_{oc}$ (mV) | $J_{sc}$ (mA/cm$^2$) | FF % | PCE % |
|---|---|---|---|---|---|---|
| 1 | D35/D35 | 1.5/full | 1824 ± 5 | 5.1 ± 0.1 | 71 ± 1 | 6.5 ± 0.1 |
| 2 | D35/Y123 | 2.2/full | 1832 ± 12 | 5.6 ± 0.2 | 75 ± 3 | 7.6 ± 0.01 |
| 3 | D35/D35/Y123 | 1.2/3/full | 2666 ± 30 | 3.9 ± 0.1 | 52 ± 1 | 5.3 ± 0.1 |
| 4 | D35/Y123/Y123 | 2.2/2.2/full | 2584 ± 30 | 3.4 ± 0.3 | 75 ± 5 | 6.7 ± 0.2 |

Front cells are the first dyes listed with the respective thickness of the TiO$_2$ film listed first as well. Subsequent subcells are listed in order from front to back.
"full" indicates subcells use a 4.5 μm TiO$_2$ active layer and a 4.5 μm TiO$_2$ scattering layer.
Electrolyte used for all cells unless otherwise noted is as follows: 0.25M Co(bpy)$_3$(PF$_6$)$_2$, 0.05M Co(bpy)$_3$(PF$_6$)$_3$, 0.1M LiTFSI, and 0.5M tert-butylpyridine, in acetonitrile.

TABLE 10

Tandem device and its individual subcell photovoltaic characteristics for Co(bpy)$_3^{3+/2+}$ based electrolyte with 2 to 5 subcell SSM-DSC devices.

| Dye and TiO$_2$ Thickness | Position | $V_{oc}$ (mV) | $J_{sc}$ (mA/cm$^2$) | FF % | PCE % |
|---|---|---|---|---|---|
| D35/D35 ||||||
| D35 1.5 μm | itself | 937 ± 3 | 5.2 ± 0.2 | 66 ± 2 | 3.3 ± 0.1 |
| D35 full | itself | 921 ± 15 | 10.2 ± 0.6 | 73 ± 4 | 7 ± 0.4 |
|  | 2nd | 892 ± 7 | 5.0 ± 0.2 | 76 ± 1 | 3.6 ± 0.2 |
| D35/D35 | Tandem | 1824 ± 5 | 5.1 ± 0.1 | 71 ± 1.1 | 6.5 ± 0.1 |
| D35/Y123 ||||||
| D35 2.2 μm | itself | 974 ± 14 | 6.1 ± 0.4 | 67 ± 3 | 4.1 ± 0.2 |
| Y123 full | itself | 842 ± 23 | 12.3 ± 1.3 | 72 ± 1 | 7.7 ± 0.4 |
|  | 2nd | 835 ± 33 | 5.6 ± 0.05 | 76 ± 2 | 3.5 ± 0.1 |
| D35/Y123 | Tandem | 1832 ± 12 | 5.6 ± 0.2 | 75 ± 3 | 7.6 ± 0.01 |
| D35/D35/Y123 ||||||
| D35 1.2 μm | itself | 987 ± 11 | 3.9 ± 0.1 | 69 ± 1 | 2.9 ± 0.03 |
| D35 3 μm | itself | 948 ± 2 | 7 ± 0.4 | 73 ± 1 | 4.9 ± 0.2 |
|  | 2nd | 930 ± 9 | 2.4 ± 0.3 | 71 ± 5 | 1.7 ± 0.1 |
| Y123 full | itself | 837 ± 23 | 11.9 ± 0.7 | 73 ± 2 | 7.6 ± 0.1 |
|  | 3rd | 732 ± 2 | 3.9 ± 0.1 | 76 ± 0.5 | 2.4 ± 0.02 |
| D35/D35/Y123 | Tandem | 2666 ± 30 | 3.9 ± 0.1 | 52 ± 1 | 5.3 ± 0.1 |
| D35/Y123/Y123 ||||||
| D35 2.2 μm | itself | 974 ± 14 | 6.1 ± 0.4 | 67 ± 3 | 4.1 ± 0.2 |
| Y123 2.2 μm | itself | 898 ± 25 | 7.4 ± 0.96 | 70 ± 4 | 5 ± 0.5 |
|  | 2nd | 875 ± 5 | 3.1 ± 0.4 | 77 ± 4 | 2.2 ± 0.2 |
| Y123 full | itself | 842 ± 23 | 12.3 ± 1.3 | 72 ± 1 | 7.7 ± 0.4 |
|  | 3rd | 732 ± 20 | 3.4 ± 0.1 | 78 ± 0.6 | 2.1 ± 0.1 |
| D35/Y123/Y123 | Tandem | 2584 ± 30 | 3.4 ± 0.3 | 75 ± 5 | 6.7 ± 0.2 |

"itself" refers to measurements made on this subcell when taken out of the SSM-DSC configuration and measured directly. "2$^{nd}$, 3$^{rd}$, 4$^{th}$ or 5$^{th}$" refers to measurements made on this specific subcell only, when in the SSM-DSC configuration. Front cells are the first dyes listed with the respective thickness of the TiO$_2$ film listed first as well. Subsequent subcells are listed in order from front to back. "Full" indicates subcells use a 4.5 μm TiO$_2$ active layer and a 4.5 μm TiO$_2$ scattering layer. Electrolyte used for all cells unless otherwise noted is as follows: 0.25M Co(bpy)$_2$(PF$_6$)$_2$, 0.05M Co(bpy)$_2$(PF$_6$)$_3$, 0.1M LiTFSI, and 0.5M tert-butylpyridine, in acetonitrile.

Figure 12:
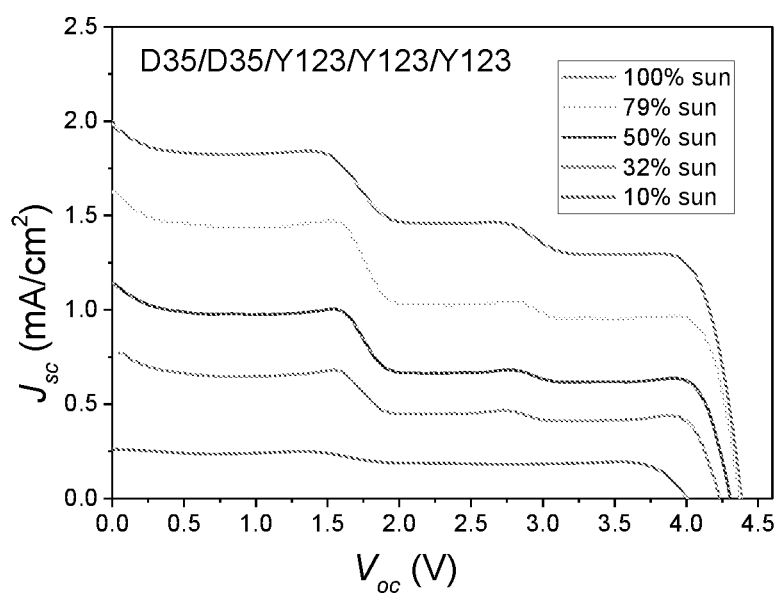
FIG. 12 shows a graph illustrating IV results for a 5 subcell SSM-DSC device (the final entry in Table 10) with the Co(bpy)$_3^{3+/2+}$ redox shuttle measured under different % sun values.

Intriguingly, the SSM-DSC system maintains high photovoltages even under low light conditions at 3.99 V at 10% sun intensity for a PCE of 7.0% (FIG. 12, Table 11). This SSM-DSCs system is highly attractive for indoor light-to-electric applications requiring high voltages such as a lithium ion battery charging at ~3.7-4.0 V.

TABLE 11

Device parameters for a 5 subcell SSM-DSC device (the final entry in Table 10) with the $Co(bpy)_3^{3+/2+}$ redox shuttle measured under different % sun values.

| % Sun | $V_{oc}$ (mV) | $J_{sc}$ (mA/cm$^2$) | FF | PCE % |
|---|---|---|---|---|
| 100% | 4369 | 1.9 | 57.9 | 4.9 |
| 79% | 4322 | 1.6 | 58 | 4.1 (5.2%) |
| 50% | 4256 | 1.1 | 58 | 2.8 (5.6%) |
| 32% | 4190 | 0.8 | 59 | 2 (6.25%) |
| 10% | 3990 | 0.3 | 60 | 0.7 (7%) |

Electrocatalytic Reduction of $CO_2$ to CO

Figure 13:
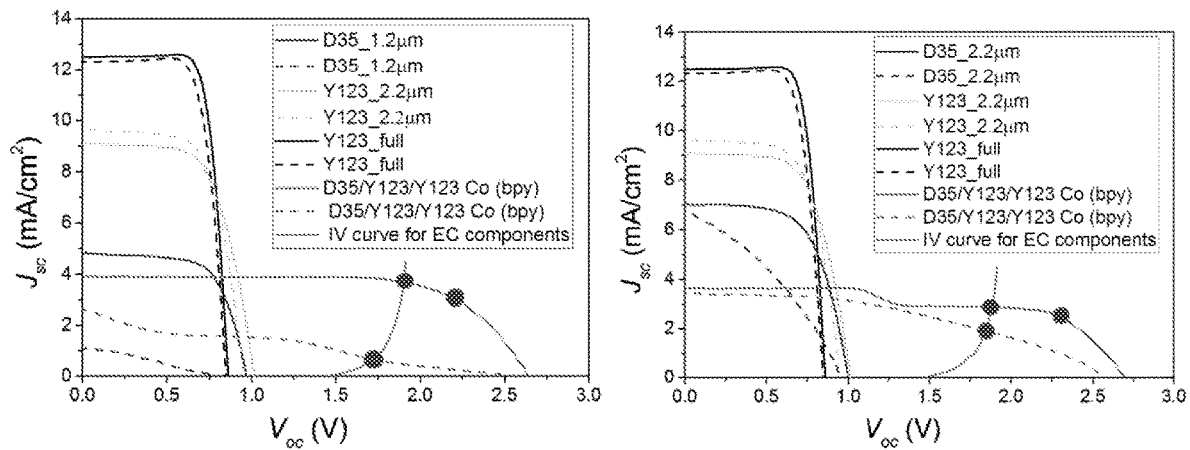
FIG. 13 shows graphs illustrating IV results for a three subcell SSM-DSC device and each subcell in the SSM-DSC configuration before electrolysis (solid) and after electrolysis (dotted). Left: A 1.2 μm D35 front device was used for enhanced current matching through each subcell with a slightly lower overall voltage. Right: A 2.2 μm D35 front device was used for a higher overall voltage with a slight lower current due to mismatching of the subcell current flow. The IV curve for the Au$_2$O$_3$/IrO$_2$ EC system is shown as well with the marked intersection of the IV curve. The left hand case has the EC curve intersection of the SSM-DSC curve closer to the maximum power point of the SSM-DSC (marked as a blue dot with no intersecting line) leading to a higher overall solar-to-fuel efficiency. The right hand case shows a device with enhanced stability of the front cell.
Figure 14:
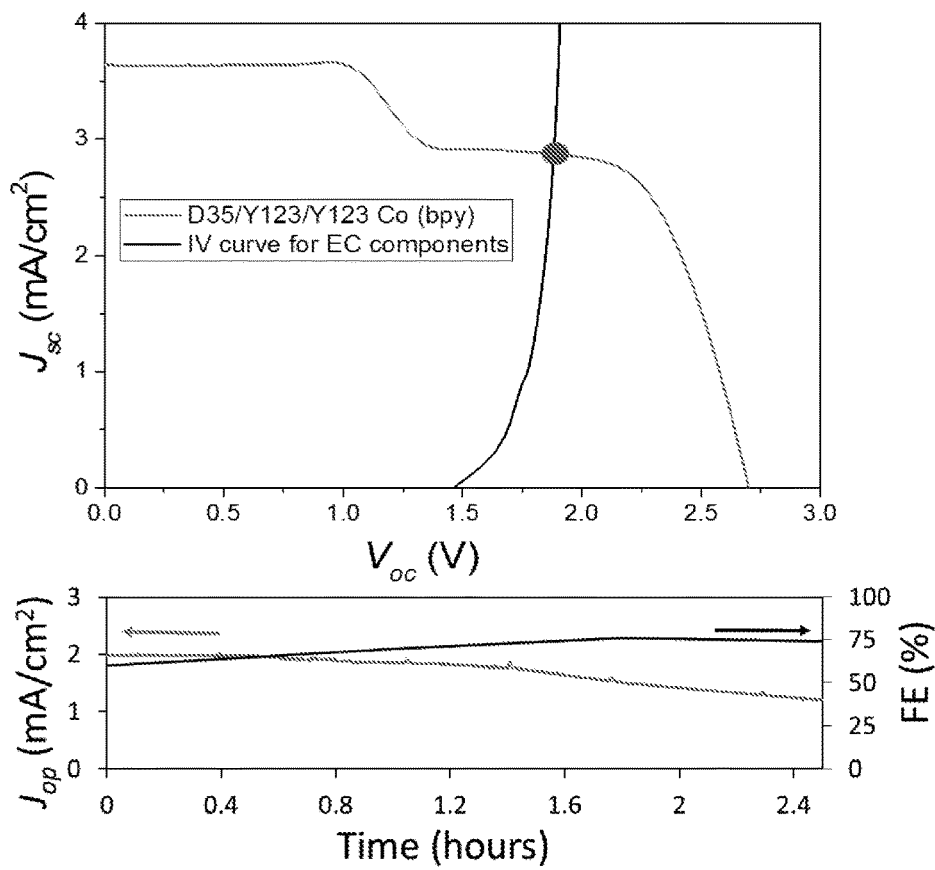
FIG. 14 shows graphs illustrating PV-EC IV results for a 3 subcell SSM-DSC, blue dot highlights the operating point for a PV-EC device (top). J$_{op}$ and FE as a function of time for the PV-EC system (bottom).
Figure 15:
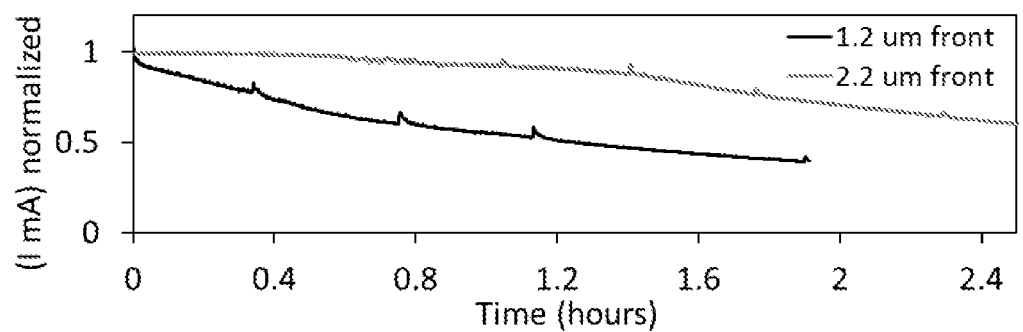
FIG. 15 shows a graph illustrating current flow comparison through a PV-EC cell with different front cells.
Figure 16:
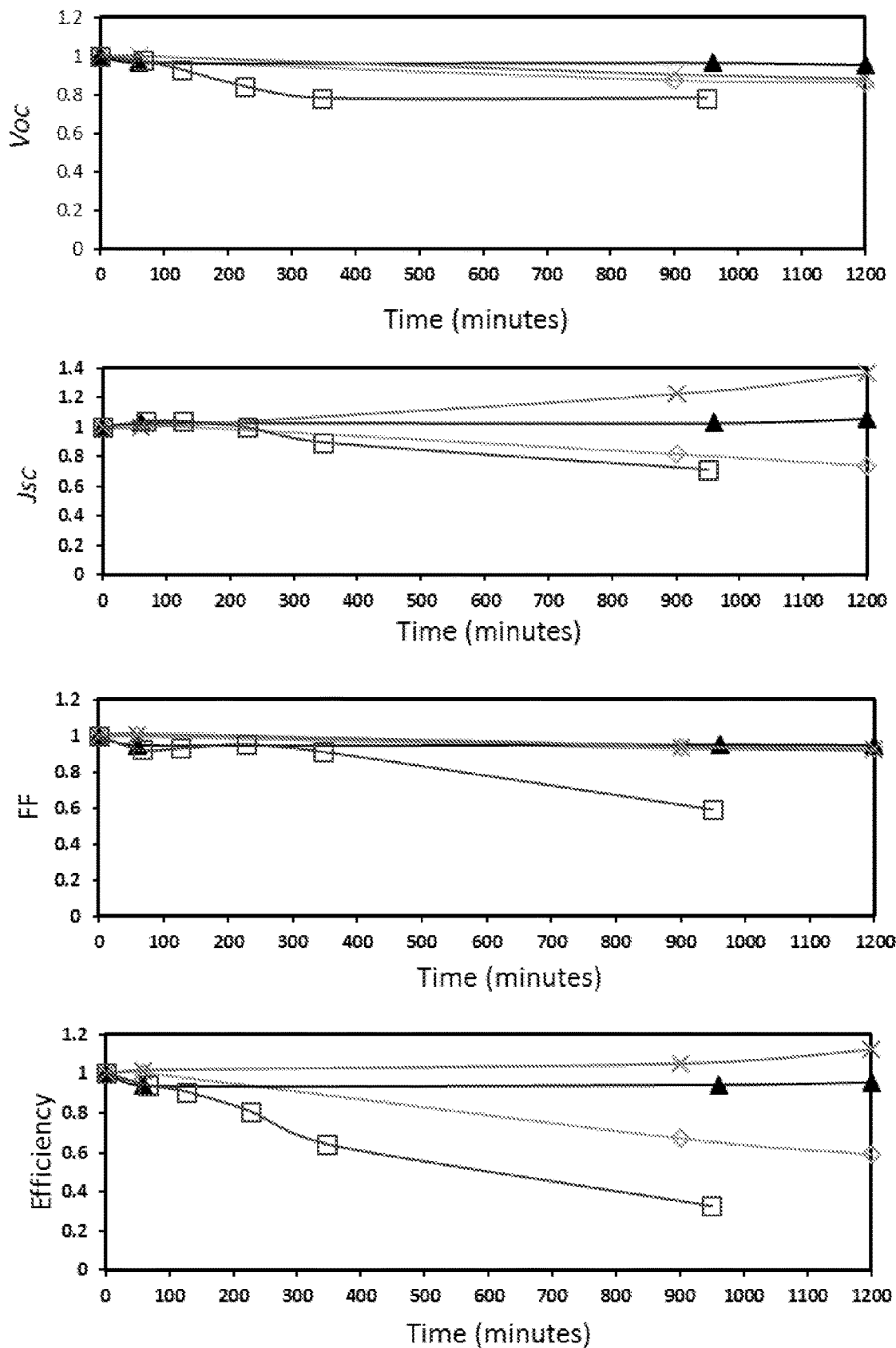
FIG. 16 shows graphs illustrating demonstration of a 1.2 μm stable front device by the application of a 385 nm UV cutoff filter and gel electrolyte. Black (triangle): gel electrolyte with the filter; Red (cross): liquid electrolyte with filter; Blue (square): liquid electrolyte no filter; Green (diamond): gel electrolyte no filter.

An interesting approach for solar-to-fuel conversion is the application of integrated photovoltaic-electrochemical cell (PV-EC) devices that operate without external bias. As a demonstration of the utility of the SSM-DSC systems discussed above, a 3 subcell SSM-DSC system was used to power the electrocatalytic reduction of $CO_2$ to CO in aqueous media with no external bias using an $IrO_2$ anode and an $Au_2O_3$ cathode (FIG. 13). This represents the only DSC system driven with simulated sunlight and water as the electron source for solar-to-CO conversion of $CO_2$ with no external bias. An overall efficiency for CO production ($\eta_{co}$) of 2% was calculated, with a solar-to-fuel efficiency of 2.7% when $H_2$ produced is accounted for using the equation: $\eta_{co}=(J_{op} \times E_{(CO2/CO)} \times FE)/I_o$, where $J_{op}$ is the operating current density, $E_{(CO2/CO)}$ is the thermodynamic free energy (1.43 V for this EC), FE is the Faradaic efficiency, and $I_o$ is the incident solar power density (FIG. 14). The diminishment of $J_{op}$ overtime was found to be due to deterioration of the performance of only the front cell in the SSM-DSC system (FIG. 4, Table 12). This loss in performance over time for the front device was found to be fully circumvented through the use of a gel electrolyte along with a 385 nm UV cutoff filter (FIGS. 15-16).

TABLE 12

Comparison of SSM-DSC (D35/Y123/Y123 ($Co(bpy)_3^{3+/2+}$) device parameters before and after powering $CO_2$ reduction.

| Cell type | $V_{oc}$ (mV) | $J_{sc}$ (mA/cm$^2$) | FF | PCE % |
|---|---|---|---|---|
| SSM-DSC with 1.2 µm front device | | | | |
| Before electrolysis | 2690 | 3.9 | 69 | 6.95 |
| After electrolysis | 2540 | 2.8 | 27 | 1.9 |
| SSM-DSC with 2.2 µm front device | | | | |
| Before electrolysis | 2695 | 3.7 | 60 | 6.2 |
| After electrolysis | 2578 | 3.5 | 42 | 3.9 |

Figure 17:
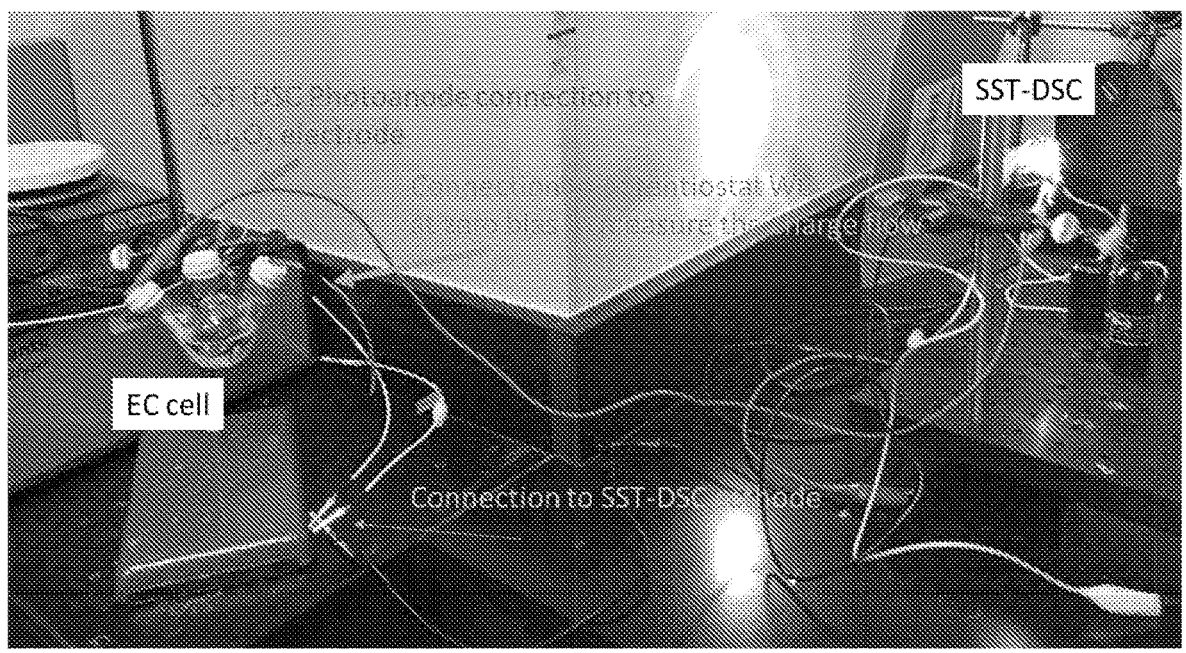
FIG. 17 shows an image illustrating PV-EC setup.
Figure 18:
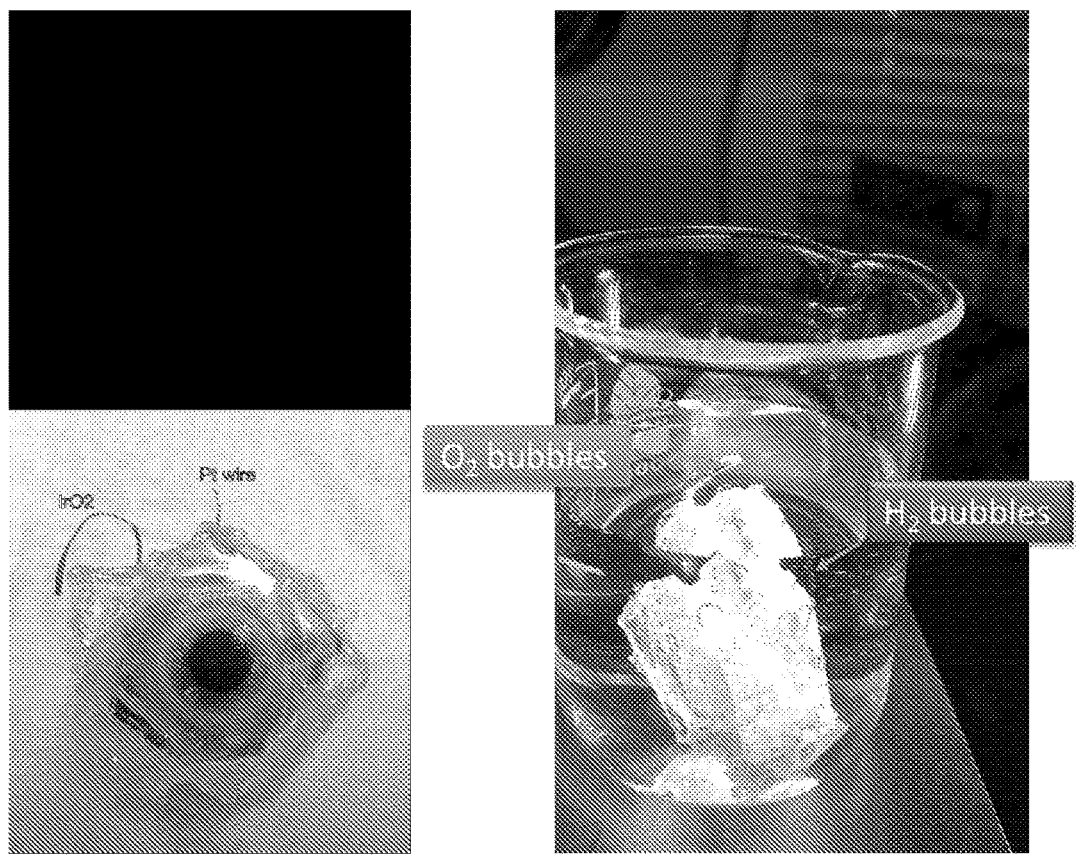
FIG. 18 shows an image illustrating SSM-DSC which was dropped in H$_2$O itself.

In a dramatic display of SSM-DSC device stability, a SSM-DSC device was constructed with an $IrO_2$ covered titanium electrode attached at the SSM-DSC cathode and a platinum wire connected to the SSM-DSC photoanode (FIG. 17). This device was fully submerged in an aqueous solution and irradiated with a solar simulator in a beaker open to air. A steady flow of $O_2$ and $H_2$ can be observed (FIG. 18) at the electrodes at approximately 0.5 mL of gas per second using a laboratory test cell design. This rate can be dramatically enhanced through increases in the solar active area size. This stands in stark contrast to other solar cell technologies that require precautions such as Argon chambers.

Conclusion

Sequential series multijunction dye-sensitized solar cells (SSM-DSCs), which are mechanically stacked single illuminated area DSC devices wired in series, are reported to have the highest photovoltages obtained from a single illuminated area DSC. In this Example, single illuminated area SSM-DSCs with more than 2 subcells were analyzed for the first time. The use of multiple photoactive films under one area within the SSM-DSC framework is made possible by fine tuning the thickness of $TiO_2$ in each device and judicious dye selection to allow for excellent light distribution among the films. Photovoltages ($V_{oc}$) ranging from 1.9-4.7 V with $J_{sc}$ from 6 to 2.4 mA/cm$^2$ and power conversion efficiency (PCE) of 7.7 to 4.1% were observed for SSM-DSCs fabricated from 2-5 stacked subcells constructed with metal-free organic dyes and cobalt redox shuttles. In particular, balancing the light transmission and absorption through $TiO_2$ film thickness of the individual subcells provided $V_{oc}$ values per unit area as high as ~4.7 V for a single illuminated area device connected in series, with a PCE of ~4.4%. This remarkable $V_{oc}$ was further enhanced by series connection of two SSM-DSCs devices irradiated side by side, which lead to an exceptionally high $V_{oc}$ of 8.5 V, $J_{sc}$ 1.9 (mA/cm$^2$), FF of 25% and PCE of 4%.

The SSM-DSC approach permits incorporation of materials designed to use the maximal potential energy of photons in each region of the solar spectrum. Importantly, SSM-DSCs were observed to maintain high $V_{oc}$ under low-light conditions, rendering these systems very attractive for indoor applications. Additionally, a SSM-DSC was found to have a solar-to-fuel conversion efficiency of 2% (2.7% including $H_2$ production) for the reduction of $CO_2$ to CO with $IrO_2$ and $Au_2O_3$ electrocatalysts, without an external bias. These devices have applicability in areas such as, but not limited to, solar-to-fuel devices and portable energy charging systems from a low area solar cell.

Example 2

Figure 19:
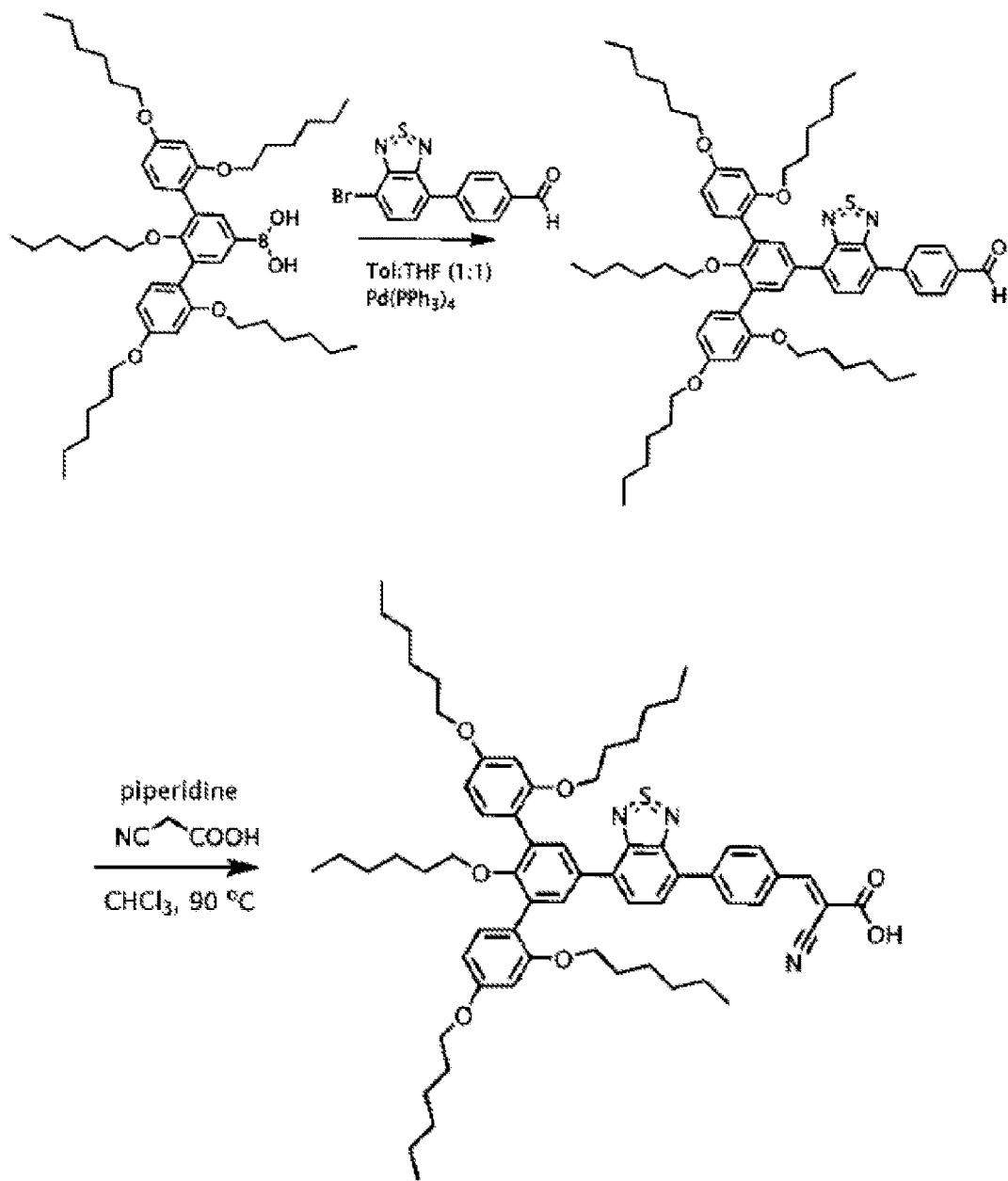
FIG. 19 shows a schematic of a method of synthesizing (E)-2-cyano-3-(4-(7-(2,2',2",4,4"-pentakis(hexyloxy)-[1,1': 3',1"-terphenyl]-5'-yl)benzo[c][1,2,5]thiadiazol-4-yl)phenyl)acrylic acid coded as RR9.

This Example describes the stepwise synthesis of (E)-2-cyano-3-(4-(7-(2,2',2'',4,4''-pentakis(hexyloxy)-[1,1':3',1''-terphenyl]-5'-yl)benzo[c][1,2,5]thiadiazol-4-yl)phenyl)acrylic acid, as illustrated in FIG. 19.

5-bromo-2-(hexyloxy)-1,3-diiodobenzene (1)

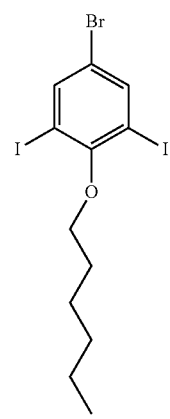 [SMILES: CCCCCCOc1c(I)cc(Br)cc1I]

To an oven dry, $N_2$ filled round bottom flask was added 4-bromo-2,6-diiodophenol (5.0 g, 11.8 mmol), 1-bromohexane (778 ml, 14.1 mmol), $K_2CO_3$ (2.4 g, 17.7 mmol) in 25 ml of DMF. The reaction mixture was heated to 90° C. for 16 hrs. The crude product was extracted with hexanes to give a light yellow oil (5.8 g, 97% yield). $^1$H NMR (500 MHz, $CDCl_3$) δ 7.09 (s, 2H), 3.96 (t, J=10.0 Hz, 3H), 1.94-1.91 (m, 2H), 1.58-1.56 (m, 2H), 1.40-1.39 (m, 4H), 0.95 (t, J=5.0 Hz).). $^{13}$C NMR (175 MHz, $CDCl_3$) δ 157.7, 141.7, 1178.0, 91.3, 73.7, 31.7, 30.0, 25.6, 22.6, 14.1. IR (neat, cm$^{-1}$) 3086.5, 3054.9, 2924.0, 2856.5, 2361.4, 2334.9, 2091.2, 1994.6, 1731.5, 1542.8, 1526.4, 1460.1, 1424.6, 1372.4, 1239.4, 1050.3, 985.8, 922.2, 860.0.

Synthesis of 5'-bromo-2,2',2",4,4"-pentakis(hesxyl)-1,1':3',1""-terphenyl (2)

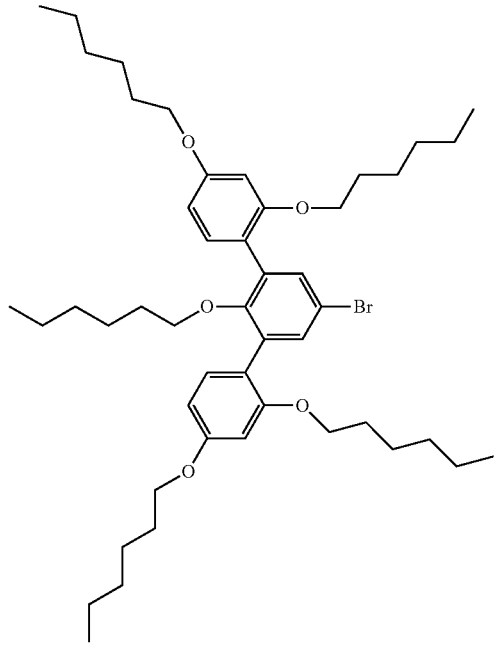 [SMILES: CCCCCCOc1ccc(-c2cc(Br)cc(-c3ccc(OCCCCCC)cc3OCCCCCC)c2OCCCCCC)c(OCCCCCC)c1]

To an oven dry, $N_2$ filled pressure flask was added 5-bromo-2-(hexyloxy)-1,3-diiodobenzene (718 mg, 1.41 mmol), $Pd(PPh_3)_4$ (163 mg, 0.1 mol %), (2,4-bis(hexyloxy)phenyl)boronic acid (1.0 g, 3.1 mmol) in 5 ml of toluene. 1.22 ml of a 2M solution of $K_2CO_3$ and 3 drops of Aliquot 336 were then added to the reaction mixture and heated to 110° C. for 16 hrs. The crude product was extracted with DCM and purified by silica gel chromatography using 10% DCM/Hex to give a colorless oil (604 mg, 53% yield). $^1$H NMR (300 MHz, $CDCl_3$) δ 7.37 (s, 2H), 7.24 (d, J=9.0 Hz, 2H), 6.54-6.49 (m, 4H), 4.00-3.93 (m, 8H), 3.18 (t, J=6.0, 2H), 1.82-1.69 (m, 8H), 1.52-1.29 (m, 24H), 1.1-1.0 (m, 4H), 0.96-0.88 (m, 16H), 0.78 (t, J=6.0 Hz, 3H). $^{13}$C NMR (175 MHz, $CDCl_3$) δ 159.9, 157.3, 154.8, 134.1, 133.3, 132.0, 119.8, 114.6, 104.7, 100.1, 72.6, 68.4, 68.1, 31.6, 31.5, 31.4, 29.8, 29.3, 29.1, 25.8, 25.8, 25.4, 22.6, 22.6, 22.6, 14.1, 14.1, 14.0. IR (neat, cm$^{-1}$) 2924.0, 2858.2, 2350.3, 2115.8, 1607.1, 1577.2, 1504.8, 1462.7, 1420.2, 1297.3, 1176.2, 1113.7, 1024.3, 212.3. HRMS (ESI) m/z $C_{48}H_{73}BrO_5Cs$ ([M+Cs]$^+$) 941.3696, found 943.3630.

Synthesis of (2,2',2",4,4"-pentakis(hexyloxy)-[1,1': 3',1"-terphenyl]-5'-yl)boronic acid (3)

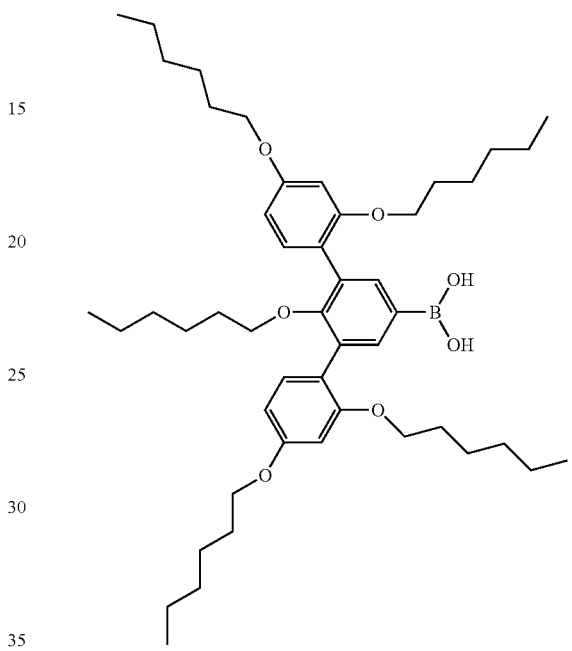

To an oven dry, $N_2$ filled round bottom flask was added 2 (200 mg, 0.12 mmol) in 1 ml of anhydrous THF. The reaction mixture was cooled to −78° C. and 2.5 M n-butyl lithium (0.12 ml, 0.14 mmol) was added dropwise. The reaction was left to stir at −78° C. for 1½ hrs. Trimethyl borate (0.09 ml, 0.81 mmol) was then added dropwise to the reaction mixture and left to cool to room temperature overnight. A 3:1 10% HCl:$Et_2O$ was added and the crude product was extracted with Et20 and purified by silica gel chromatography using 5% EtAc/Hex to give a light yellow oil (108 mg, 57% yield). $^1$H NMR (500 MHz, $CDCl_3$) δ 8.03 (s, 2H), 7.26 (d, J=9 Hz, 2H), 6.51-6.54 (m, 4H), 4.02 (t, J=5 Hz, 4H), 3.88 (t, J=5 Hz, 4H), 3.27 (t, J=5 Hz, 2H), 1.82-1.69 (m, 8H), 1.52-1.29 (m, 24H), 1.0-1.082 (m, 4H), 0.88-0.96 (m, 16H), 0.78 (t, J=6.0, 3H). $^{13}$C NMR (175 MHz, $CDCl_3$) δ 202.2, 154.7, 152.9, 133.9, 127.3, 126.8, 116.7, 99.8, 95.4, 26.9, 26.7, 26.2, 25.1, 24.7, 24.6, 24.4, 21.1, 21.0, 20.8, 20.6, 17.9, 17.9, 17.7. IR (neat, cm$^{-1}$) 3470.2, 3377.2, 2928.1, 2861.8, 2362.1, 2160.5, 1973.2, 1679.6, 1603.3, 1504.0, 1463.8, 1353.1, 1249.0, 1171.2, 1111.6, 1016.0, 954.3, 12.3. HRMS (ESI) m/z $C_{48}H_{75}BO_7Cs$ ([M+Cs]$^+$) 907.4669, found 907.5184.

4-(7-(2,2',2'',4,4''-pentakis(hexyloxy)-[1,1':3',1''-terphenyl]-5'-yl)benzo[c][1,2,5]thiadiazol-4-yl)benzaldehyde (4)

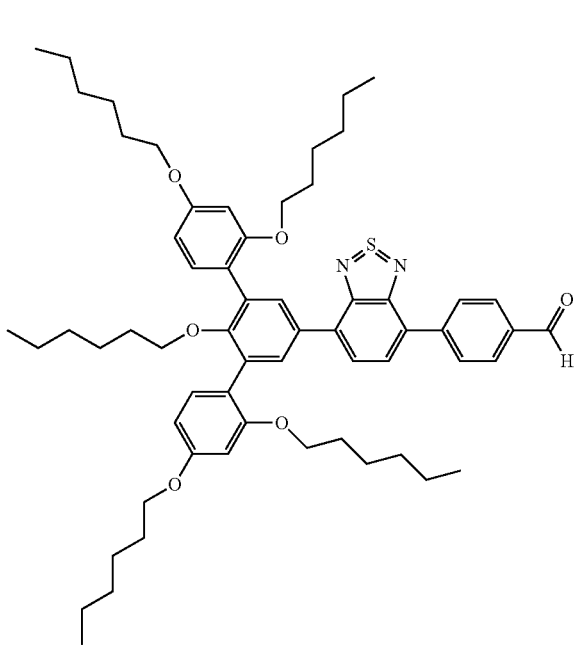 [SMILES: CCCCCCOc1ccc(-c2cc(-c3ccc(-c4ccc(C=O)cc4)c4c3N=S=N4)cc(-c3ccc(OCCCCCC)cc3OCCCCCC)c2OCCCCCC)c(OCCCCCC)c1]

Figure 20:
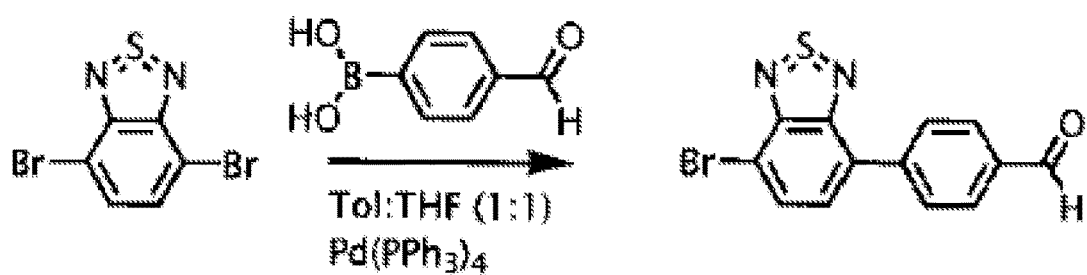
FIG. 20 shows a schematic of a method of synthesizing 4-(7-bromobenzo[c][1,2,5]thiadiazol-4-yl)benzaldehyde.

To an oven dry, $N_2$ filled pressure flask was added 4-(7-bromobenzo[c][1,2,5]thiadiazol-4-yl)benzaldehyde (FIG. 20) (45 mg, 0.14 mmol), 3 (109 mg, 0.15 mmol), Pd(PPh$_3$)$_4$ (16 mg, 0.1 mol %), 0.1 ml of 2 M solution of K$_2$CO$_3$ and 2 ml of (THF:toluene, 1:1). The vial was sealed and reaction mixture was stirred at 110° C. for 12 hrs. The crude product was extracted with DCM and purified by silica gel chromatography using 20% EtAc/Hex to give a yellow oil (104 mg, 76% yield). $^1$H NMR (500 MHz, CDCl$_3$) δ 10.14 (s, 1H), 8.20 (d, J=10.0 Hz, 2H), 8.08 (d, J=10.0 Hz, 2H), 7.96 (s, 2H), 7.86 (s, 2H), 7.40 (d, J=10 Hz, 2H), 6.59-6.57 (m, 4H), 4.03 (t, J=10.0 Hz, 4H), 4.00 (t, J=10.0 Hz, 4H), 3.32 (t, J=5.0 Hz, 2H), 1.86-1.83 (m, 4H), 1.75-1.72 (m, 4H), 1.39-1.32 (m, 4H), 1.0-1.082 (m, 4H), 0.88-0.96 (m, 16H), 0.78 (t, J=6.0, 3H). $^{13}$C NMR (175 MHz, CDCl$_3$) δ 203.6.9, 191.9, 171.1, 159.7, 157.4, 154.2, 143.6, 132.4, 132.3, 131.7, 130.7, 130.0, 129.8, 129.0, 127, 120.9, 104.7, 100.2, 72.7, 68.5, 68.1, 34.7, 34.5, 31.7, 31.5, 29.9, 29.4, 29.2, 29.1, 25.8, 25.8, 25.4, 25.3, 22.5, 21.1, 20.7. IR (neat, cm$^{-1}$) 2928.0, 2861.9, 2361.9, 2029.3, 1940.2, 1701.7, 1636.9, 1505.8, 1461.7, 1301.3, 11 78.4. HRMS (ESI) m/z C$_{61}$H$_{80}$N$_2$O$_6$S ([M+Cs]$^+$) 1101.4791, found 1101.5381.

(E)-2-cyano-3-(4-(7-(2,2',2'',4,4''-pentakis(hexyloxy)-[1,1':3',1''-terphenyl]-5'-yl)benzo[c][1,2,5]thiadiazol-4-yl)phenyl)acrylic acid (5)

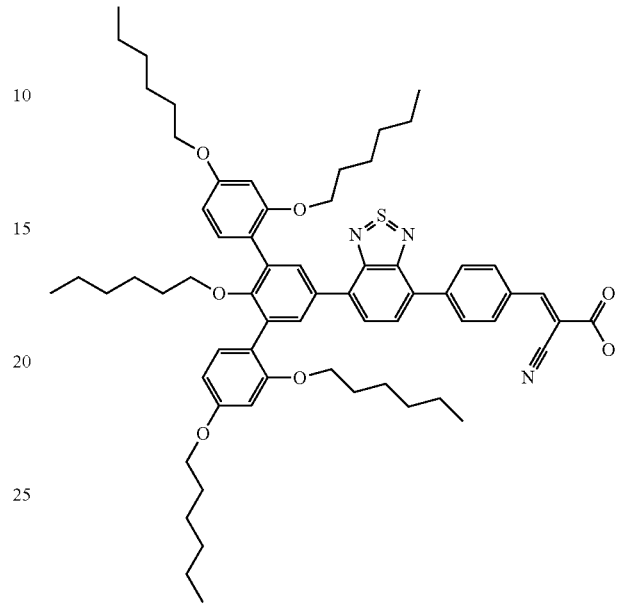

Figure 21:
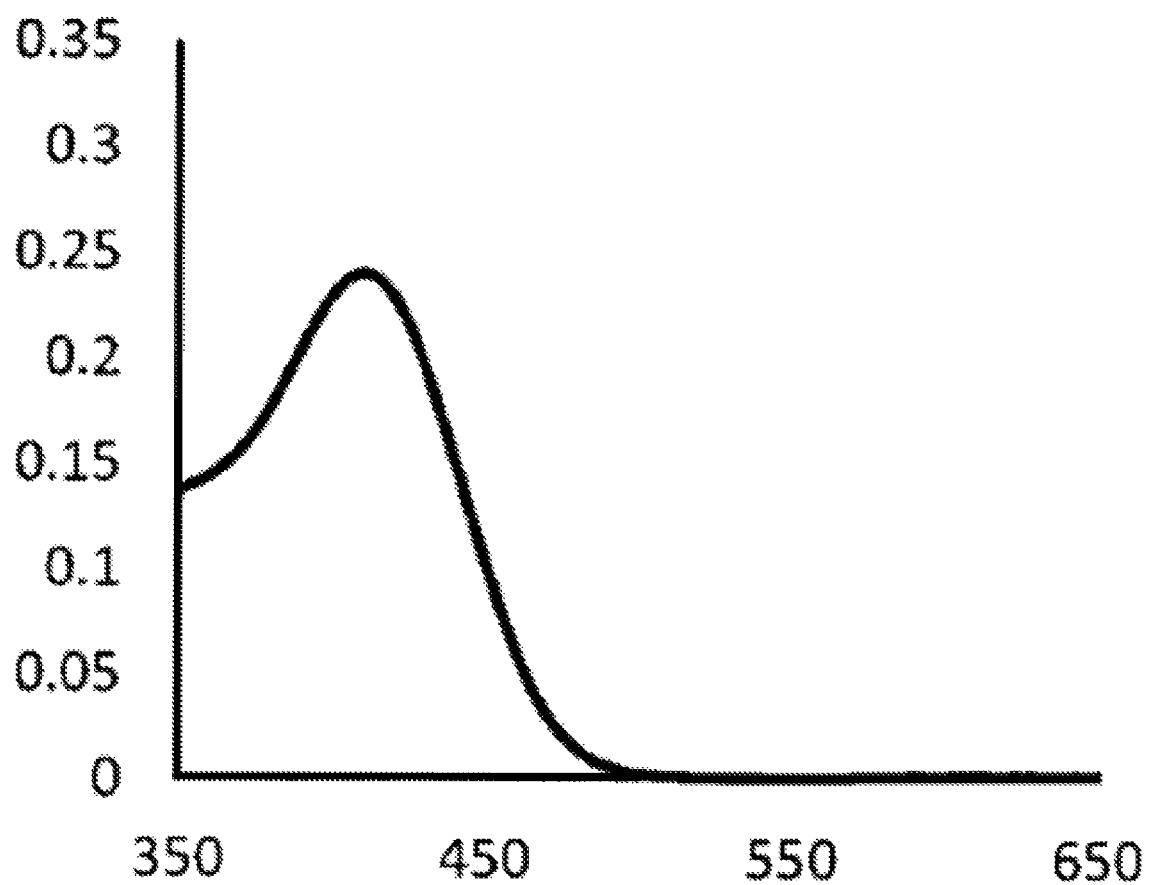
FIG. 21 shows a graph illustrating the absorption curve of RR9 in dichloromethane.

To an oven dry, $N_2$ filled pressure flask was added 4 (104 mg, 0.12 mmol), cyanoacetic acid (270 mg, 0.32 mmol), piperidine (0.074 ml, 0.75 mmol) and 2 ml of Chloroform. The vial was sealed and reaction mixture was stirred at 90° C. for 1 hr. The crude product was extracted with DCM and purified by silica gel chromatography using DCM, 5% MeOH/DCM and 10% MeOH/DCM to give a yellow oil (80 mg, 73% yield). $^1$H NMR (500 MHz, CDCl$_3$) δ 8.40 (s, 1H), 8.22 (ap s, 4H), 7.96 (s, 2H), 7.87 (ap s, 2H), 7.39 (d, J=10.0 Hz, 2H), 6.60-6.56 (m, 4H), 4.03 (t, J=5.0 Hz, 4H), 4.00 (t, J=5.0 Hz, 4H), 3.32 (t, J=5.0 Hz, 2H), 1.86-1.75 (m, 4H), 1.75-1.70 (m, 4H), 1.54-1.40 (m, 4H), 1.35-1.11 (m, 28H), 0.95 (t, J=7.0 Hz 6H), 0.81 (t, J=10.0, 3H), 0.76 (t, J=10.0 Hz, 6H). An absorption spectrum is illustrated in FIG. 21.

Synthesis of Redox Shuttle:

Fe(bpy)$_3$$^{+2}$ PF$_6$ 2,2'-bipyridine (1.85 g, 2.27 mmol) was dissolved in 15 ml of ethanol and heated to 60° C. The reaction mixture was added slowly to a stirring solution of FeCl$_2$ (0.500 g, 3.95 mmol) of in 10 ml of water also at 60° C. The solution immediately turns bright red. After 1 hr. the reaction mixture was cooled to room temperature and a saturated solution of KPF$_6$ in water was added to precipitate out the hexafluorophosphate salt. The complex was collected by vacuum filtration and was bed with water and ethanol to give the diamagnetic product as a bright red solid. $^1$HNMR (300 MHz, Acetone-d$_6$) δ 8.86 (d, J=9.0 Hz, 2H), 8.29 (t, J=6.0 Hz, 2H), 7.75 (d, J=6.0 Hz, 2H), 7.60 (t, J=6.0 Hz, 2H).

Fe(bpy)$_3$$^{3+}$ PF$_6$ 2,2'-bipyridine (1.85 g, 2.27 mmol) was dissolved in 15 ml of ethanol and heated to 60° C. The reaction mixture was added slowly to a stirring solution of FeCl$_3$ (0.500 g, 3.95 mmol) of in 10 ml of water also at 60° C. The solution immediately turns brown. After 1 hr. the reaction mixture was cooled to room temperature and a saturated solution of KPF$_6$ in water was added to precipitate out the hexafluorophosphate salt. The complex was collected by vacuum filtration and washed with water and ethanol to give the paramagnetic product as a light brown solid.

Example 3

This Example describes the results of $Fe(bpy)_3^{3+/2+}$ concentration studies (3+3+5 microns $TiO_2$) (Table 13).

TABLE 13

Parameters for Fe(bpy) concentration studies (3 + 3 + 5 microns).

| Cell PEDOT | $V_{oc}$ (mV) | $J_{sc}$ | FF | PCE | # Cells |
|---|---|---|---|---|---|
| RR-9 Fe(bpy)$_3$ E1 | 1.18 ± 0.009 | 2.4 ± 0 | 0.64 ± 0.02 | 2.0 ± 0.05 | 2 |

TABLE 13-continued

Parameters for Fe(bpy) concentration studies (3 + 3 + 5 microns).

| Cell PEDOT | $V_{oc}$ (mV) | $J_{sc}$ | FF | PCE | # Cells |
|---|---|---|---|---|---|
| RR-9 Fe(bpy)$_3$ E2 | 0.696 | 0.1 | 0.64 | 0.04 | 1 |
| RR-9 Fe(bpy)$_3$ E3 | 1.264 | 2.4 | 0.55 | 1.7 | 1 |

E1 = 0.25M Fe(bpy)$_3^{2+}$ 0.5M Fe(bpy)$_3^{3+}$
E2 = 0.15M Fe(bpy)$_3^{2+}$ 0.05M Fe(bpy)$_3^{3+}$
E3 = 0.35M Fe(bpy)$_3^{2+}$ 0.05M Fe(bpy)$_3^{3+}$ (Sat. Solution)
Cells were dipped in EtOH:TFH (4:1) solution for 19 hours.

Example 4

This Example describes the results of LiTFSI concentration studies (3+3+5 microns) (Table 14).

TABLE 14

Parameters for LiTFSI concentration studies (3 + 3 + 5 microns).

| Cell PEDOT | $V_{oc}$ (mV) | $J_{sc}$ | FF | PCE | # Cells |
|---|---|---|---|---|---|
| RR-9 Fe(bpy)$_3$ 0.05M E1 | 1.156 ± 0.04 | 2.2 ± 0.2 | 0.47 ± 0.07 | 1.2 ± 0.1 | 2 |
| RR-9 Fe(bpy)$_3$ 0.5M E1 | 1.026 ± 0.02 | 1.6 ± 0.1 | 0.54 ± 0.007 | 1.0 ± 0.1 | 2 |
| RR-9 Fe(bpy)$_3$ 0.1M E1 | 1.18 ± 0.009 | 2.4 ± 0 | 0.64 ± 0.02 | 2.0 ± 0.05 | 2 |

E1 = 0.25M Fe(bpy)$_3^{2+}$ 0.05M Fe(bpy)$_3^{3+}$
Cells were dipped in 60:1 CDCA 4:1 EtOH/THF solution

Example 5

This Example describes the results of solvents studies (3+3+5 μmicrons) (Table 15).

TABLE 15

Parameters for solvents studies (3 + 3 + 5 microns).

| Cell PEDOT/E1 | $V_{oc}$ (mV) | $J_{sc}$ | FF | PCE | # Cells |
|---|---|---|---|---|---|
| RR-9 Fe(bpy)$_3$ MeCN/ButEtOH | 1.219 ± 0.04 | 2.8 ± 0.07 | 0.44 ± 0.03 | 1.6 ± 0.2 | 2 |
| RR-9 Fe(bpy)$_3$ EtOH/THF | 1.131 ± 0.03 | 2.2 ± 0.2 | 0.55 ± 0.02 | 1.4 ± 0.2 | 2 |
| RR-9 Fe(bpy)$_3$ DCM/EtOH | 1.029 ± 0.03 | 1.7 ± 0.2 | 0.48 ± 0.07 | 0.9 ± 0.3 | 2 |
| RR-9 Fe(bpy)$_3$ CB | 1.013 | 1.5 | 0.56 | 0.9 | 1 |

E1 = 0.25M Fe(bpy)$_3^{2+}$ 0.05M Fe(bpy)$_3^{3+}$

Example 6

This Example describes the results of dye concentration studies (3+3+5 μmicrons) (Table 16).

TABLE 16

Parameters for dye concentration studies (3 + 3 + 5 microns).

| Cell PEDOT/E1 | $V_{oc}$ (mV) | $J_{sc}$ | FF | PCE | # Cells |
|---|---|---|---|---|---|
| RR-9 Fe(bpy)$_3$ 0.1M dye | 1.1016 | 1.3 | 0.48 | 0.7 | 1 |
| RR-9 Fe(bpy)$_3$ 0.5M dye | 1.280 ± 0.02 | 2.8 ± 0 | 0.44 ± 0.05 | 1.7 ± 0.2 | 2 |
| RR-9 Fe(bpy)$_3$ 1.0M dye | 1.283 ± 0.03 | 2.8 ± 0.07 | 0.42 ± 0.007 | 1.6 ± 0.01 | 2 |
| RR-9 Fe(bpy)$_3$ 0.5M dye 30 min $N_2$ | 1.409 | 2.8 | 0.56 | 2.4 | 1 |
| RR-9 Fe(bpy)$_3$ 0.5M dye 30 min $N_2$ overnight | 1.401 | 2.6 | 0.50 | 1.9 | 1 |

E1 = 0.25M Fe(bpy)$_3^{2+}$ 0.05M Fe(bpy)$_3^{3+}$
Cells were dipped in MeCN/ButOH (1:1) for 19 hours for experiment without $N_2$

Example 7

This Example describes the results of $N_2$ bubbling studies (3+3+5 μmicrons) (Table 17).

TABLE 17

Parameters for $N_2$ bubbling studies (3 + 3 + 5 microns).

| Cell PEDOT/E1 | $V_{oc}$ (mV) | $J_{sc}$ | FF | PCE | # Cells |
|---|---|---|---|---|---|
| RR-9 Fe(bpy)$_3$ 0.5M dye no $N_2$ 19 hour dipping | 1.280 ± 0.02 | 2.8 ± 0 | 0.44 ± 0.05 | 1.7 ± 0.2 | 2 |
| RR-9 Fe(bpy)$_3$ 0.5M 15 min $N_2$ | 1.302 | 2.3 | 0.53 | 1.7 | 1 |
| RR-9 Fe(bpy)$_3$ 0.5M 30 min $N_2$ | 1.409 | 2.8 | 0.56 | 2.4 | 1 |
| RR-9 Fe(bpy)$_3$ 0.5M 45 min $N_2$ | 1.283 ± 0.01 | 2.7 ± 0.2 | 0.51 ± 0.01 | 1.8 ± 0.06 | 2 |

E1 = 0.25M Fe(bpy)$_3$$^{2+}$ 0.05M Fe(bpy)$_3$$^{3+}$
After bubbling $N_2$ all cells were let to sit in dye solution for an extra 30 minutes.

Example 8

This Example describes the results of dipping time studies (3+5 μmicrons) (Table 18).

TABLE 18

Parameters for dipping time (3 + 5 microns) studies.

| Cell PEDOT/E1 | $V_{oc}$ (mV) | $J_{sc}$ | FF | PCE | # Cells |
|---|---|---|---|---|---|
| RR-9 Fe(bpy)$_3$ 0.5M dye 19 hour dipping | 1.312 | 2.1 | 0.45 | 1.3 | 1 |
| RR-9 Fe(bpy)$_3$ 0.5M 2 hours | 1.224 ± 0.009 | 2.0 ± 0.07 | 0.55 ± 0.03 | 1.4 ± 0 | 2 |
| RR-9 Fe(bpy)$_3$ 4 hours | 1.401 ± 0.01 | 2.6 ± 0.3 | 0.49 ± 0.02 | 1.8 ± 0.1 | 2 |
| RR-9 Fe(bpy)$_3$ 12 hours | 1.359 ± 0.002 | 2.4 ± 0.07 | 0.51 ± 0.04 | 1.7 ± 0.07 | 2 |

E1 = 0.25M Fe(bpy)$_3$$^{2+}$ 0.05M Fe(bpy)$_3$$^{3+}$

Example 9

This Example describes the results of thickness studies (Table 19).

TABLE 19

Parameters for thickness studies.

| Cell PEDOT/E1 | $V_{oc}$ (mV) | $J_{sc}$ | FF | PCE | # Cells |
|---|---|---|---|---|---|
| RR-9 Fe(bpy)$_3$ 3 + 5 | 1.312 | 2.1 | 0.45 | 1.3 | 1 |
| RR-9 Fe(bpy)$_3$ 3 + 3 + 5 | 1.280 ± 0.02 | 2.8 ± 0 | 0.44 ± 0.05 | 1.7 ± 0.2 | 2 |
| RR-9 Fe(bpy)$_3$ 3 + 3 + 3 + 5 | 1.192 ± 0.07 | 1.4 ± 0.07 | 0.55 ± 0.03 | 1.0 ± 0.2 | 2 |

E1 = 0.25M Fe(bpy)$_3$$^{2+}$ 0.05M Fe(bpy)$_3$$^{3+}$
Cells were dipped for 19 hours. Made with old dye solution.

Example 10

Introduction

Since the seminal discovered by O'Regan and Gratzel of dye sensitized solar cells (DSCs) in 1991, it has been a topic of extensive research. While improving the overall efficiency of the devices has been a topic of intense research throughout the years, improving the open circuit voltage (Voc) has emerged as an important topic of research. DSCs are a clean energy source that with voltage improvements can be used to power a number of electrocatalysts for chemical transformations such as hydrogen production from water splitting or carbon fuels from co, reduction, and DSCs can provide a high voltage electrical source to power electronic devices. DSC devices operate through (1) the absorption of light by the organic component (dye), (2) transfer of an excited-state electron to the semiconductor (commonly $TiO_2$), (3) the electron then travels an external circuit to a counter electrode where (4) the redox mediator collects the electron and returns it to the dye to complete the electrical circuit. The maximum voltage provided is defined by the energetic distance between the semiconductor conduction band and the redox shuttle electrochemical potential. A redox shuttle with a low oxidation potential can be selected to give higher Voc. Tuning the redox shuttle potentials also requires novel wide band dye designs as the electron transfer from the redox shuttle to the dye (step 4 above) to complete the circuit requires that the oxidized dyes redox potential be below that of the redox shuttle. Herein we report the first Fe redox mediator system to be used in a DSC cell and a novel wide band gap dye (RR9) that together this system produces a 1.4 V cell. Furthermore, prior attempts to increase the $V_{oc}$ required the use of $Mg^{+2}$ doped treatments to raise the CB of $TiO_2$, our system does not require any treatment on the $TiO_2$ CB to achieve a 1.4V cell.

Results and Discussions

Figure 22A:
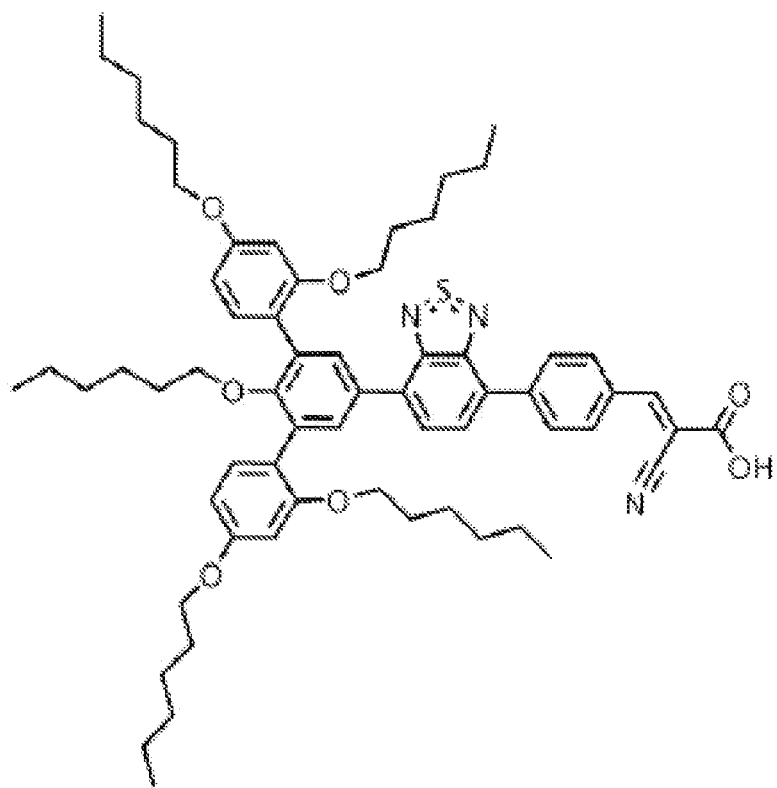
FIGS. 22A-B show chemical structures of (A) RR9 and (B) Fe(bpy)$_3^{+2/+3}$ redox mediators.
Figure 22B:
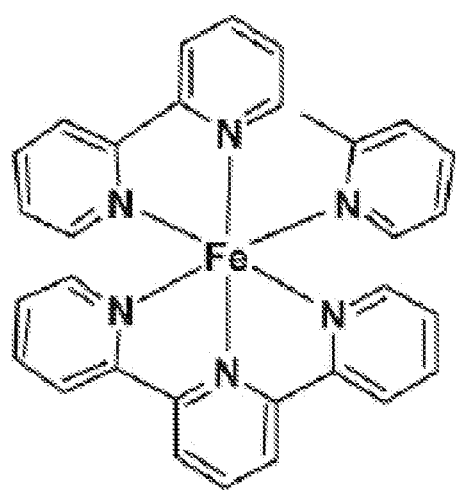

FIGS. 22A-B illustrates the chemical structures of RR9 and $Fe(bpy)_3^{3+/2+}$ redox mediator. RR9 is a simple Donor-bridge-acceptor (D-π-A) moiety dye with a donor molecule featuring 5 hydroxyl chains to prevent the non-productive recombination with the redox mediator pathway and dye aggregation. The energy levels of RR9 were evaluated to be 1.5 V for the ground state oxidation and −1.1 V for the excited-state oxidation, suitable to work with the $Fe(bpy)_3^{3+/2+}$ redox shuttles that have an oxidation potential at 1.3 V (Table 20).

TABLE 20

| Dye and Redox mediator | Absorbance data[a] | | | Electrochemical data | | |
|---|---|---|---|---|---|---|
| | $\lambda_{max}$ (nm) | ε($M^{-1}cm^{-1}$) | $\lambda_{onset}$ (nm)[b] | $E_{(S+/S)}$ (V)[c] | $E_{(S+/S)}$ (V)[d] | $E_g^{opt}$ (eV)[e] |
| RR9 | 412 | 18480 | 475 | 1.5 | | −1.1 |
| $Fe(bpy)_3^{+2/+3}$ | | | | 1.3 | | |

Designing dyes with energetics suitable for use at various positions is critical in further improving the performance of SSM-DSC devices. These energetic values show an encouraging initial direction where this molecular dye design approach has been put forward. As shown in Table 21 below, which compares RR9 to a benchmark dye, a record setting photovoltage of 1.4 V was achieved through this redox shuttle-dye pair. This allows for the front cell in a DSC system to generate 1.4 V rather than 1.0 V in the above example and can lead to SSM-DSCs with overall performances of >10 V for two side by side systems.

TABLE 21

Photovoltaic Parameters of DSC Devices

| Entry | Dye ($TiO_2$ thickness) | Redox Shuttle[a] | $V_{oc}$ [mV] | $J_{sc}$ [mA/cm²] | FF | PCE [%] |
|---|---|---|---|---|---|---|
| 1 | RR9 (2.7 μm) | Fe | 1420 | 2.8 | 0.47 | 1.9 |
| 2 | D35 (2.7 μm) | Fe | 550 | 0.1 | 0.56 | 0.0 |
| 3 | RR9 (2.7 μm) | Co | 680 | 3.5 | 0.72 | 1.8 |
| 4 | D35 (2.7 μm) | Co | 760 | 8.8 | 0.67 | 4.6 |

[a]Fe is $Fe(bpy)_3^{3+/2+}$. Co is $Co(bpy)_3^{3+/2+}$ unless noted.
All values are average of two cells.

Figure 23:
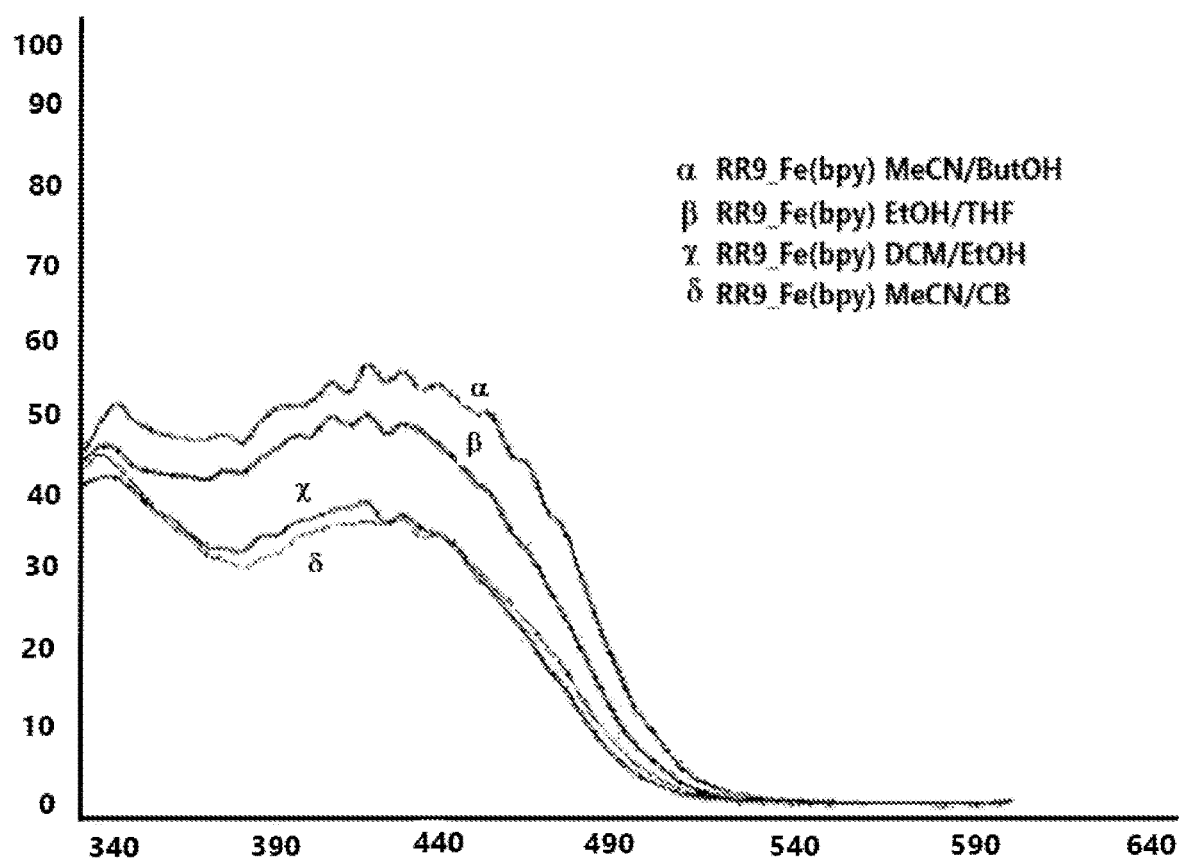
FIG. 23 shows a graph illustrating the IPCE spectrum of RR9 with Fe(bpy)$_3^{3+/2+}$.
Figure 24:
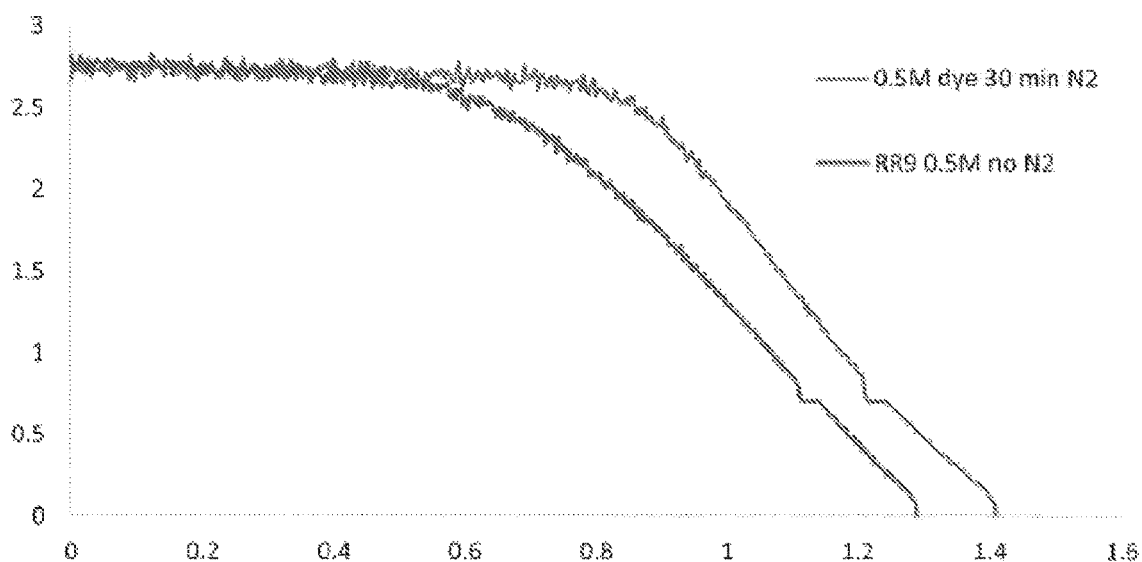
FIG. 24 shows a graph illustrating IV curves of electrodes 5.3 microns TiO$_2$+5 microns of scattering layer dipped for 30 min (0.5 M solution) while N$_2$ was flowing (blue curve) and the best device with the same thickness electrodes with no N$_2$ flow (red curve).

During device optimization several parameters were evaluated, our best results were with MeCN/tBuOH and a minimal amount of chlorobenzene in order to solubilize the dye in this combination of solvents (FIG. 23). Initially we used $TiO_2$ 5.3 microns thick and a 5 micron scattering layer and a 19 hrs dipping time. To further enhance the performance of the device nitrogen flow was applied to the system for 30 min. The flow of $N_2$ causes the dye to penetrate deeper into the $TiO_2$ and gave an increase of ~100 mV on the best cell (FIG. 24).

Figure 25:
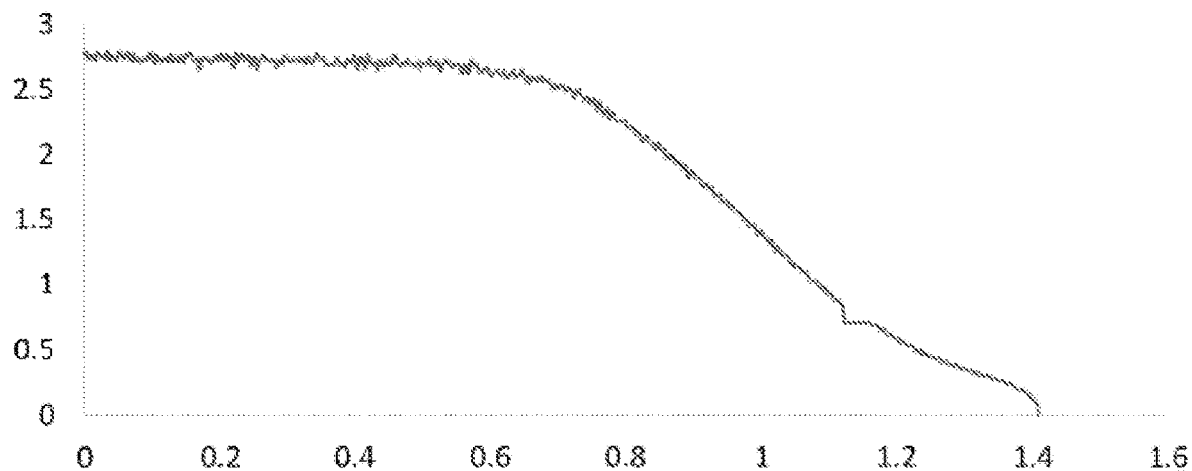
FIG. 25 shows a graph illustrating IV curves of electrode 2.7 microns TiO$_2$+5 microns of scattering layer dipped for 4 hrs in a RR9 solution (0.5 M solution).
Figure 26A:
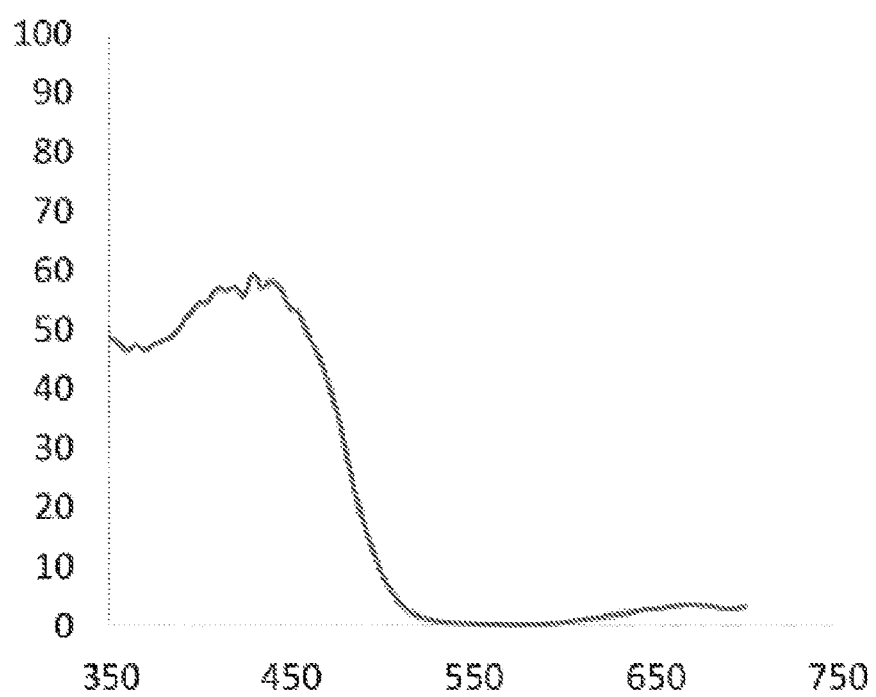
FIGS. 26A-B show graphs illustrating IPCE curves for RR9. (A) Shows a graph illustrating IPCE curve of electrodes 2.7 microns TiO$_2$+5 microns of scattering layer dipped for 4 hrs in a RR9 solution (0.5 M solution). (B) Shows a graph illustrating IPCE curves for RR9 with Fe(bpy)$_3^{+2/+2}$ and Co(bpy)$_3^{3+/2+}$ shuttles.
Figure 26B:
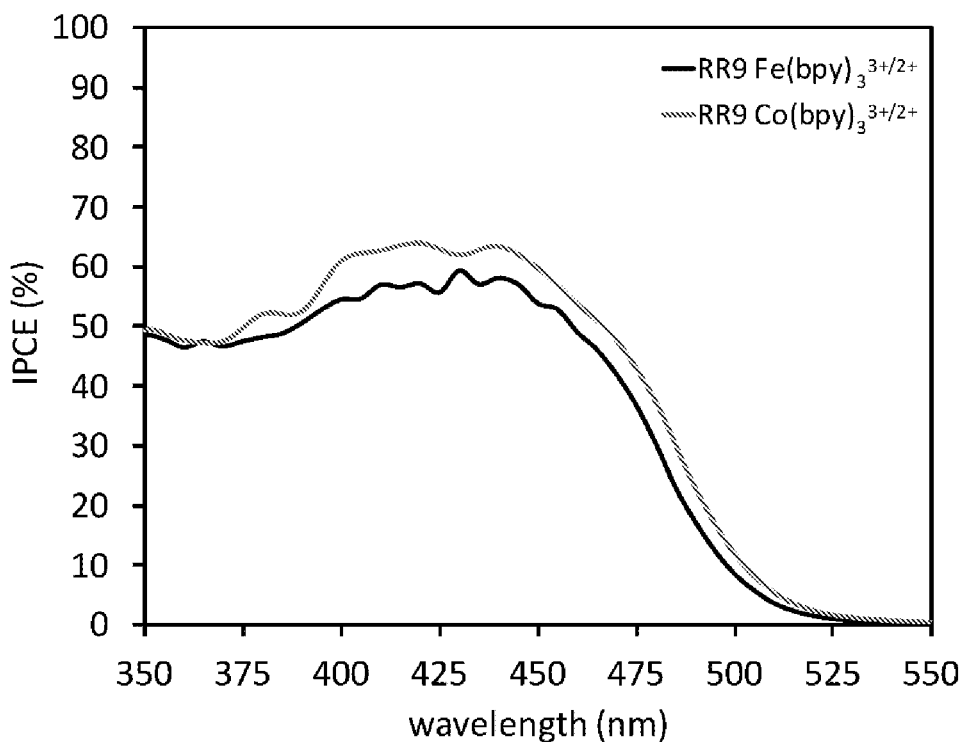

A 1.4 V cell was also achieved without $N_2$ flowing by controlling the thickness of $TiO_2$. The best results were obtained with a 2.7 microns $TiO_2$ film and a 5 micron scattering layer in a 0.5M solution of MeCN/tbutOH and minimal amount of chlorobenzene with a dipping time of 4 hrs (FIG. 25). The optimized device gave an IPCE (Incident photon-to-current efficiency) of ~60% (FIGS. 26A-B).

Figure 27:
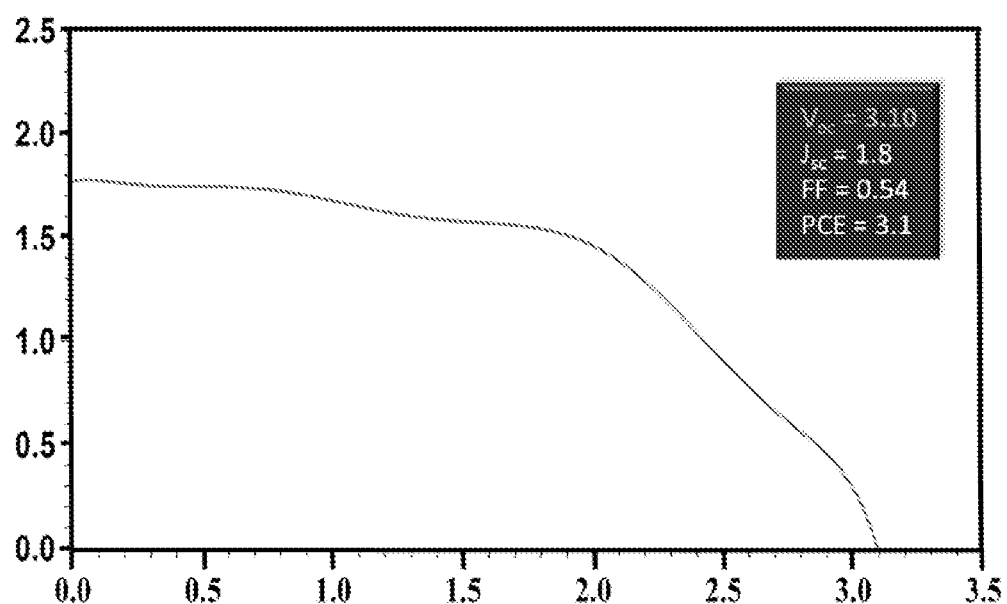
FIG. 27 shows a graph illustrating V$_{oc}$.

Finally, a three subcell SSM-DSC was constructed with $RR9/Fe(bpy)_3^{+3/+2}$ as a front cell, $D35/Co(bpy-pz)_3^{+3/+2}$ as a second cell, and $Y123/Co(bpy-pz)_3^{+3/+2}$ as a third cell. As shown in Table 22, this device achieved a voltage of 3.3 V, the highest known to date for a three tandem device system, beating the previous record of 2.8 also generated by the instant inventors (FIG. 27). The optimization of the front cell ($RR9/Fe(bpy)_3^{+3/+2}$) enabled an increase of 300 mA from the previous record.

TABLE 22

Photovoltaic Parameters of SSM-DSC Devices

| Entry | Dye ($TiO_2$ thickness)[a] | Redox Shuttle[b] | $V_{oc}$ [mV] | $J_{sc}$ [mA/cm²] | FF | PCE [%] |
|---|---|---|---|---|---|---|
| 1 | RR9 (1.3 μm)/ D35/Y123 | Fe/Co/Co | 2790 | 1.5 | 0.48 | 2.0 |
| 2 | RR9 (1.3 μm)/ D35/Y123 | Fe/Co*/Co* | 3100 | 1.8 | 0.54 | 3.1 |
| 3 | RR9 (1.5 μm)/ D35/Y123 | Fe/Co*/Co* | 3180 | 2.2 | 0.49 | 3.5 |
| 4 | RR9 (1.3 μm)/ Y123/Y123 | Fe/Co*/Co* | 3340 | 1.9 | 0.56 | 3.5 |

[a]For D35 and Y123 subcells the $TiO_2$ thickness is 2.2 μm and 4.5 μm, respectively.
[b]Fe is $Fe(bpy)_3^{3+/2+}$. Co is $Co(bpy)_3^{3+/2+}$ unless noted. Co* is $Co(bpy-pz)_2^{3+/2+}$.
All values are average of two cells.

Conclusion

Figure 28:
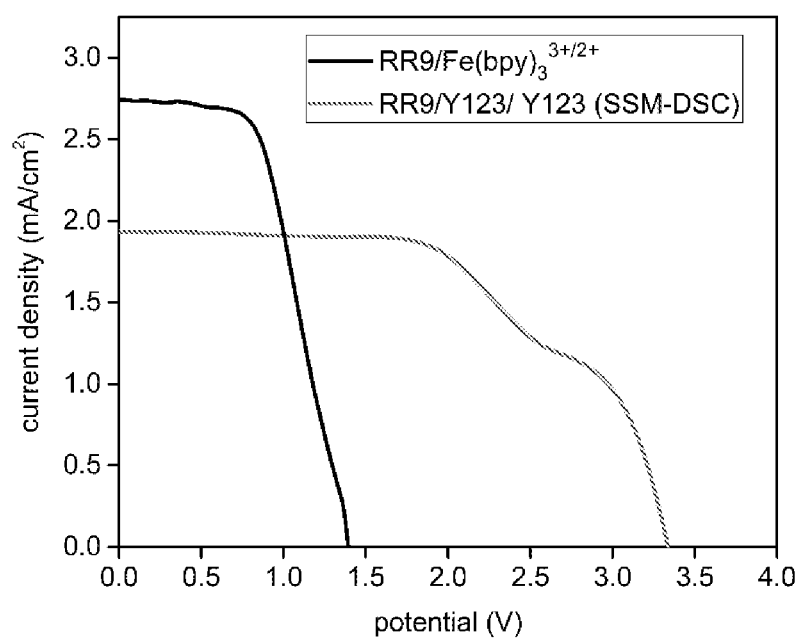
FIG. 28 shows J-V curves for RR9/Fe(bpy)$_3^{3+/2+}$ based DSC and SSM-DSC devices.

A $Fe(bpy)_3^{+3/+2}$ redox shuttle was successfully used as a redox mediator in a DSC system for the first time. It's ground state oxidation potential of 1.3 V in conjunction with a wide band gap dye RR9 (1.5 V) generated a device with a $V_{oc}$ up to 1.42 V (FIG. 28). To the best of our knowledge, this system is the highest photovoltage achieved by a single junction DSC device without metal oxide doping. Finally, a three devices tandem system was constructed with $RR9/Fe(bpy)_3^{+3/+2}$ as a front cell, $D35/Co(bpy-pz)_3^{+3/+2}$ as a second cell and $Y123/Co(bpy-pz)_3^{+3/+2}$ as a third cell. This tandem system achieved 3.3V (FIG. 28), the highest voltage for a three subcell device tandem to date, beating the previous record of 2.8 V also generated by our lab. Research is under way in our lab to test this redox mediator system with new dye designs as well as modifying the ligands on the Fe complex to increase the $V_{oc}$ even further. The further increase in $V_{oc}$ can potentially allow for a single junction DSC to provide enough voltage to power electrocatalytic water oxidation for the first time. At approximately 1.5 V water oxidation to generate hydrogen gas as a fuel becomes possible for the first time. This strategy will certainly lead to materials with these capabilities.

Example 11

Figure 29:
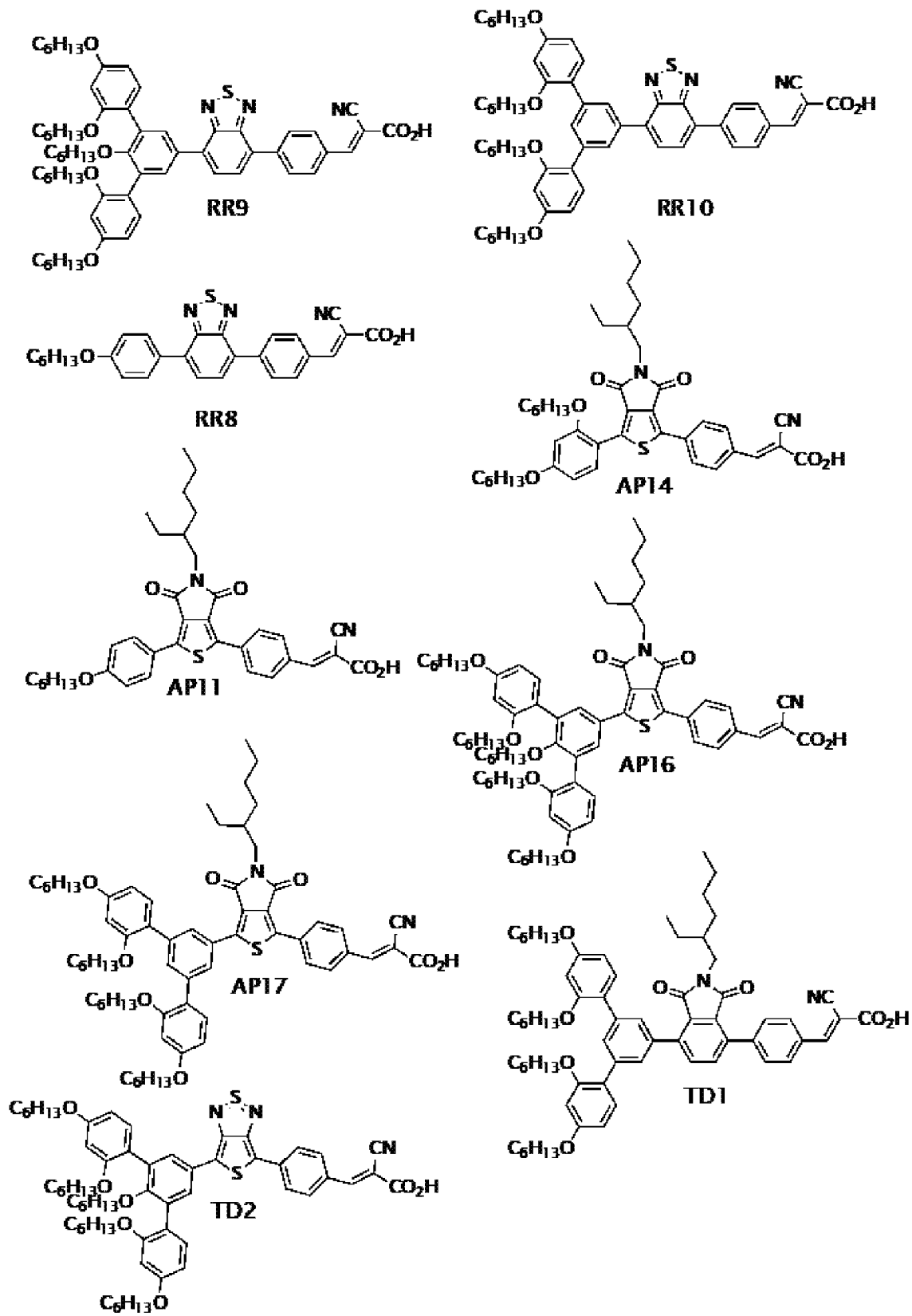
FIG. 29 shows structures for RR8, RR9, RR10, AP11, AP14, AP16, AP17, TD1, and TD2.
Figure 30:
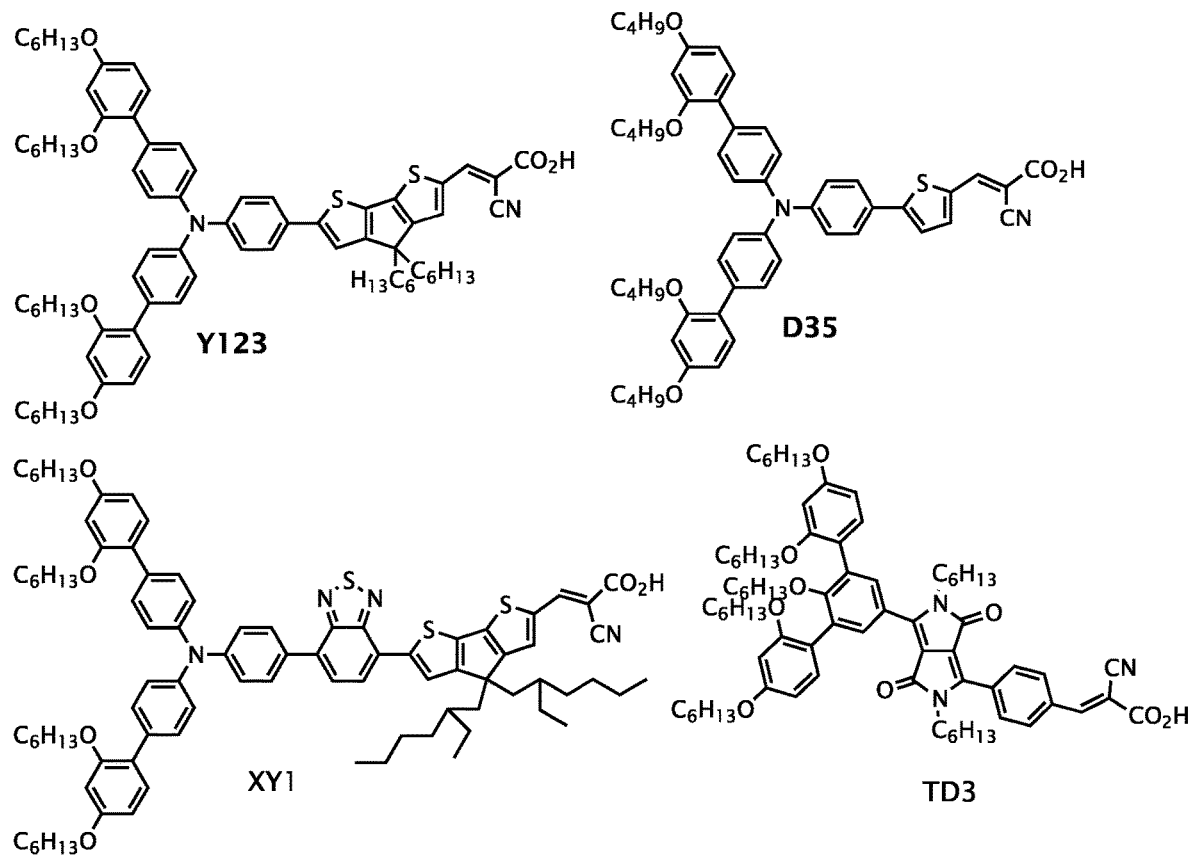
FIG. 30 shows structures for Y123, D35, XY1, and TD3.
Figure 31:
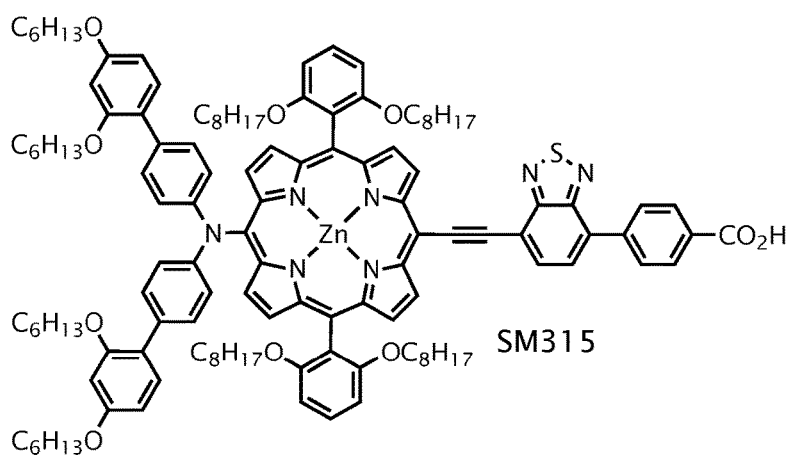
FIG. 31 shows the structure for SM315.

This Example is directed to development of novel dyes designed to maximize the voltages of specific subcells in SSM-DSC devices. A range of dyes with excited-states near −0.7 V and a variable array of ground-state potentials (0.3-2.4 V vs NHE) are highly desirable. Accordingly, several dyes with energetics nearing these values have been synthesized and tested in DSC devices. Through optimizations and the use of a novel dye structure (FIGS. 29-31), voltages exceeding 10V are possible from a single illuminated area SSM-DSC device.

Figure 32A:
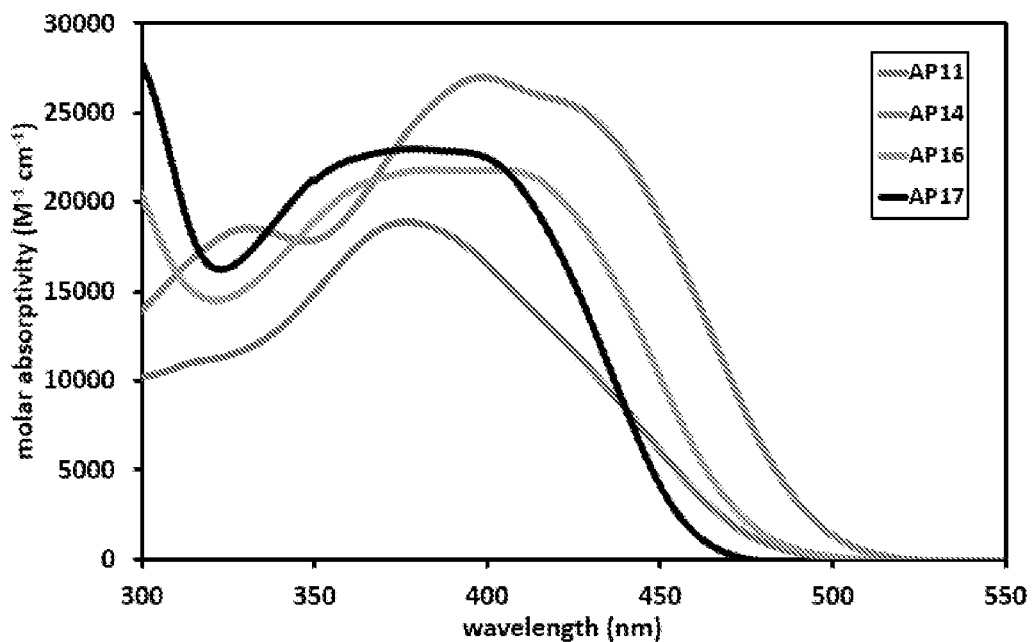
FIGS. 32A-B show graphs illustrating absorption and oxidations potentials for AP11, AP14, AP16, and AP17. (A) molar absorptivity versus wavelength. (B) oxidation potential.
Figure 32B:
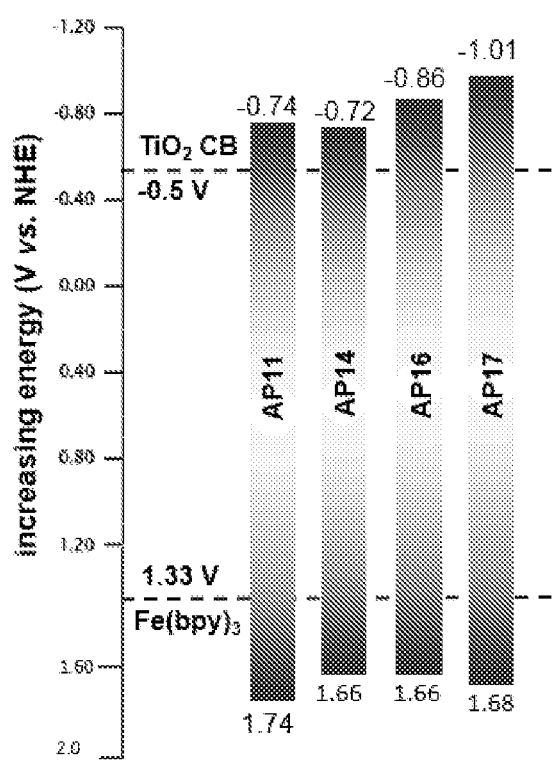
Figure 33:
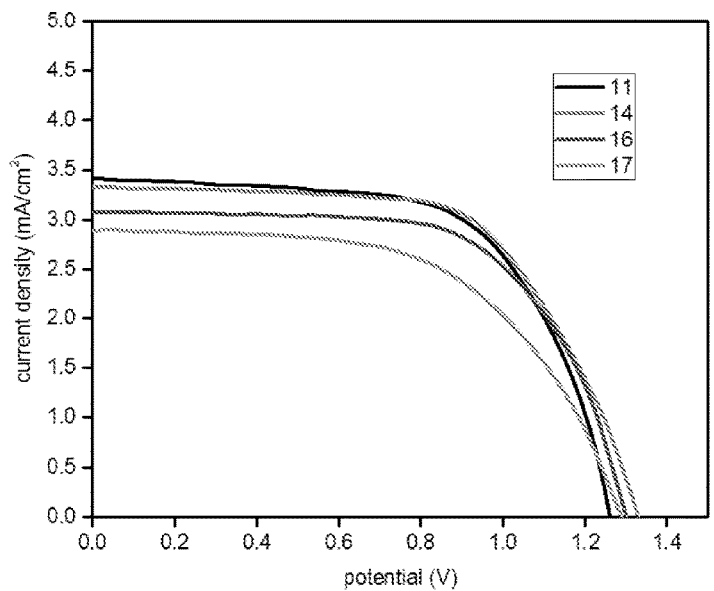
FIG. 33 shows a graph illustrating IV results for AP11, AP14, AP16, and AP17.

Dyes AP11, AP14, AP16 and AP17 (FIG. 29) show excellent energy level control with excited-states near ideal. Additionally, the ground-state potentials of these dyes were modulated, as seen in FIG. 32A and cyclic voltammetry studies. The oxidations potentials of these dyes are shown in FIG. 32B. Furthermore, these dyes exhibited excellent performance in DSC devices with regard to high photovoltages nearing the record setting 1.4V reported herein. FIGS. 33A-B and Table 23 detail the performances of these devices.

TABLE 23

| Cell | $V_{oc}$ (V) | $J_{sc}$ (mA/cm$^2$) | FF (%) | PCE (%) |
|------|------|------|------|------|
| AP11 | 1.20 | 3.0 | 0.48 | 1.7 |
| AP14 | 1.24 | 2.8 | 0.49 | 1.9 |
| AP16 | 1.33 | 3.3 | 0.45 | 2.0 |
| AP17 | TBA | TBA | TBA | TBA |

Figure 34:
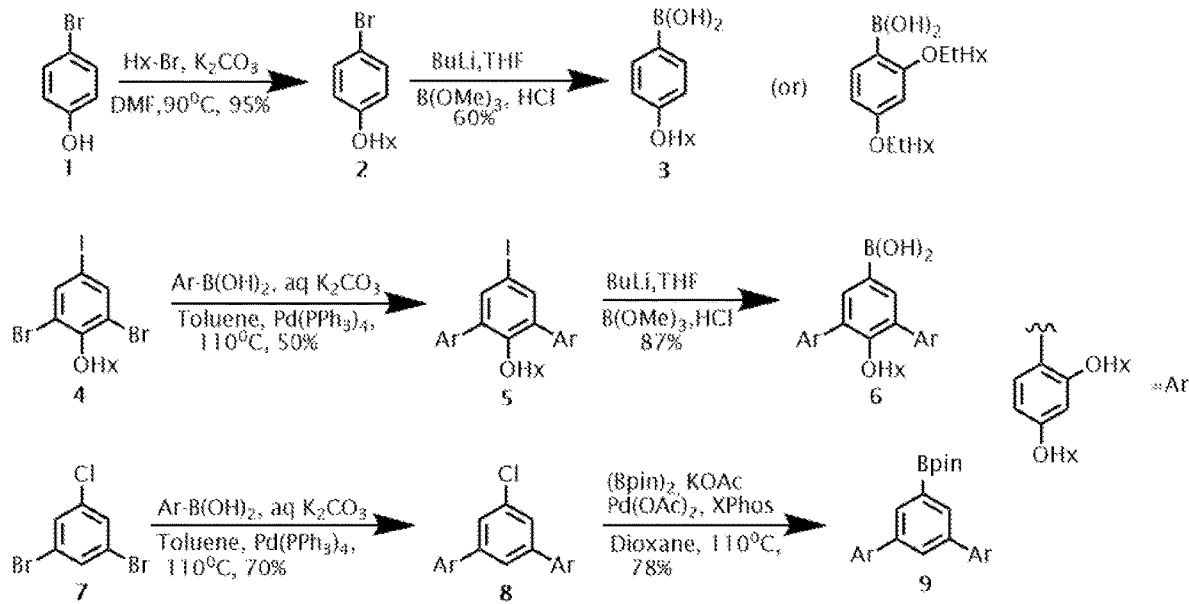
FIG. 34 shows a schematic view of a method for donor synthesis.
Figure 35:
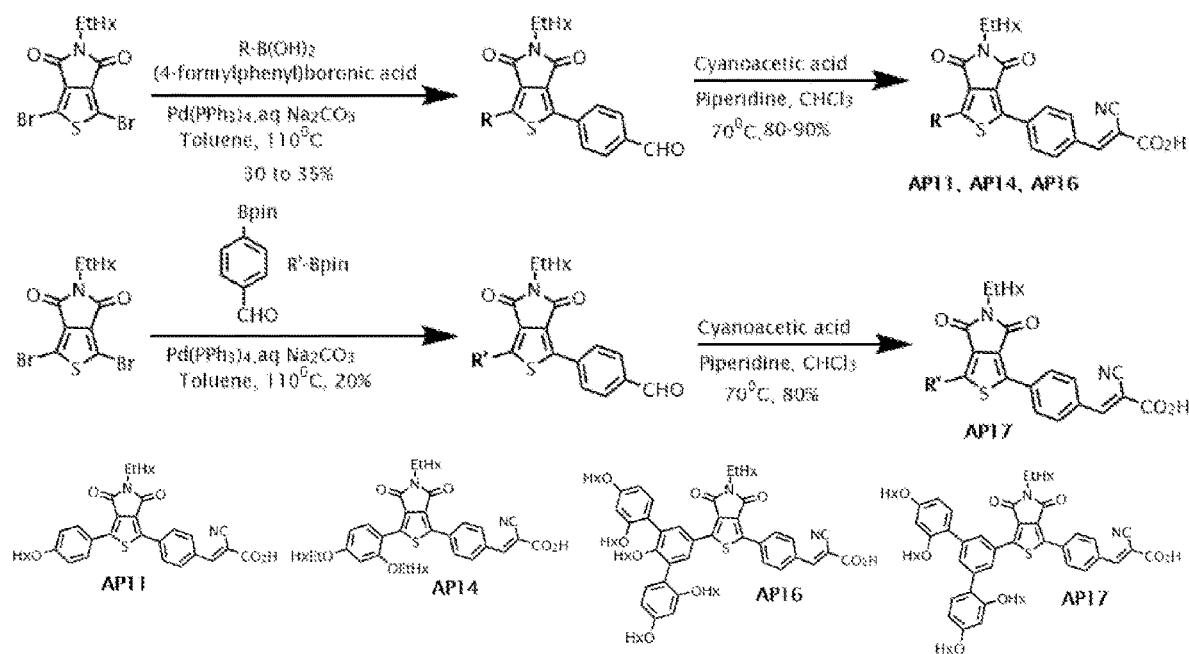
FIG. 35 shows a schematic view of a method for synthesizing AP11, AP14, AP16, and AP17.

A schematic of a method for synthesizing various donor groups, including those of dyes AP11, AP14, AP16, and AP17, is shown in FIG. 34. FIG. 35 shows a schematic of a method for synthesizing dyes including the donor groups of FIG. 34.

As illustrated in Examples 10-11, the novel dye design and low energy redox shuttle pairing can dramatically improve the record high voltages observed in Examples 1-9. Examples 10 and 11 offer a novel path forward in potentially powering higher voltage systems with low surface areas such as laptops and transport vehicle electronics.

Example 12

Figure 36:
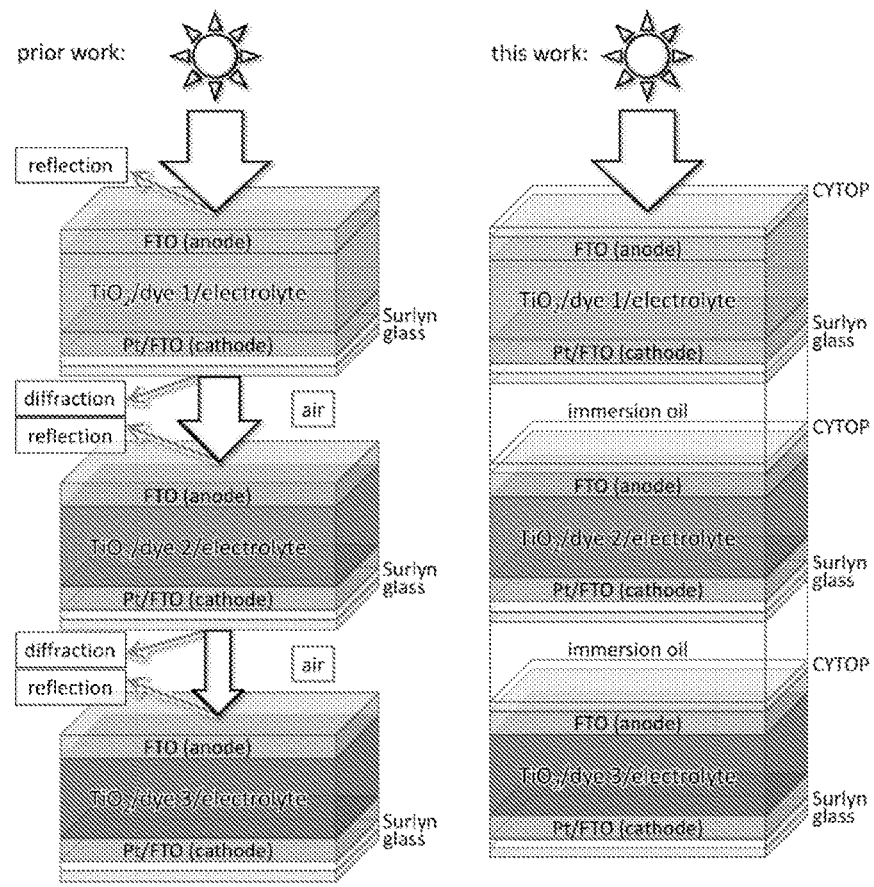
FIG. 36 shows a schematic comparison of SSM-DSC systems with and without CYTOP and immersion oil.
Figure 37:
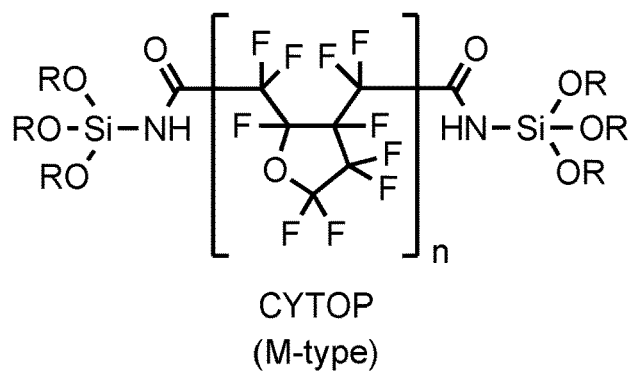
FIG. 37 shows the structure of CYTOP.
Figure 38:
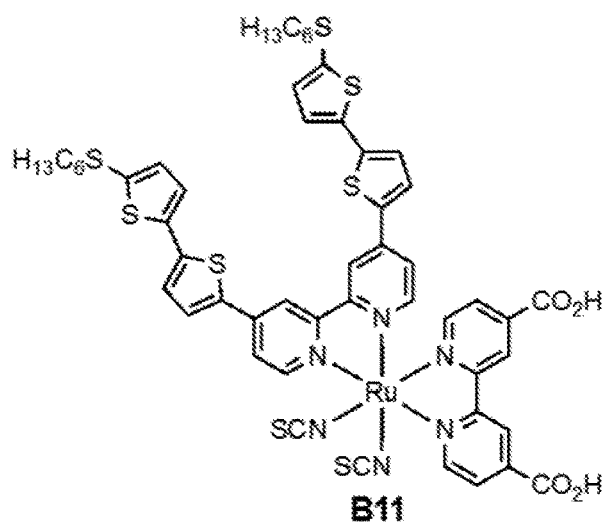
FIG. 38 shows the structure of B11.

This Example is directed to development of novel devices incorporating antireflective coatings and/or immersion oils. More specifically, as illustrated in FIG. 36, the SSM-DSC systems discussed hereinabove were modified to further include antireflective coatings and/or immersion oils. Referring to FIG. 37, one such antireflective coating includes CYTOP. The dyes used in this Example included D35 and Y123, both of which are discussed above, as well as B11, which is shown in FIG. 38.

The use of an antireflective coating and/or an immersion oil changed the interfacial refractive index to minimize light losses. This use of antireflective coating and/or immersion oil provided an overall power conversion efficiency (PCE) of greater than 10% with output of greater than 2 V (Table 24). The PCE of more than 10% represents a substantial increase as compared of the 3 SSM-DSC systems not including antireflective coatings and/or immersion oils.

TABLE 24

Performance of Devices Including Antireflective Coatings and Matched Refractive Index Oils.

| Device | Thickness (μm) | $V_{oc}$ (mV) | $J_{sc}$ (mA/cm$^2$) | FF % | PCE % |
|---|---|---|---|---|---|
| 2 Subcell SSM-DSC Devices | | | | | |
| Y123/B11 | 2.2/10 | 1560 | 7.9 | 0.64 | 7.9 |
| Y123/B11 CYTOP | 2.2/10 | 1550 | 9.3 | 0.60 | 8.7 |
| 3 Subcell SSM-DSC Devices | | | | | |
| D35/Y123/B11 | 1.5/2.2/10 | 2500 | 4.8 | 0.54 | 6.5 |
| D35/Y123/B11 CYTOP | 1.5/2.2/10 | 2500 | 5.4 | 0.66 | 8.6 |
| D35/B11/B11 | 1.5/2.2/10 | 2320 | 4.9 | 0.75 | 8.6 |
| D35/B11/B11 CYTOP | 1.5/2.2/10 | 2280 | 5.5 | 0.71 | 9.3 |
| D35/B11/B11 CYTOP/OIL | 1.5/2.2/10 | 2290 | 5.7 | 0.76 | 10.1 |

Figure 39:
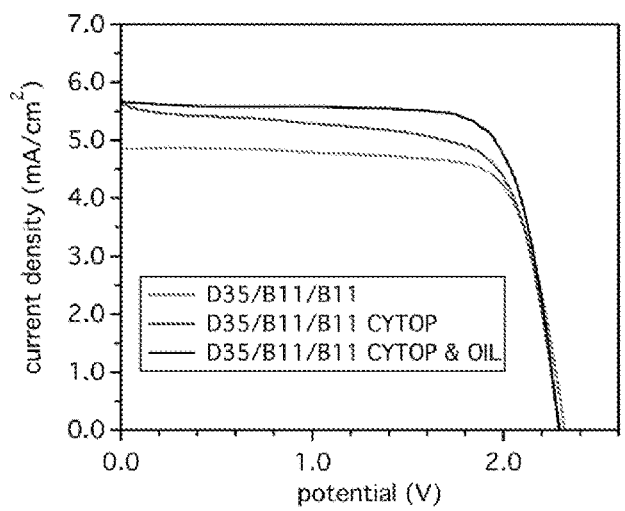
FIG. 39 shows a graph illustrating IV for a D35/B11/B11 system without CYTOP or oil, a D35/B11/B11 system with CYTOP, and a D35/B11/B11 system with CYTOP and oil.

FIG. 39 illustrates the IV potential of the D35/B11/B11, D35/B11/B11 CYTOP, and D35/B11/B11 CYTOP/OIL 3 subcell SSM-DSC devices in Table 24. As shown therein, each of the devices has a similar potential ($V_{oc}$). However, the CYTOP and CYTOP/OIL devices have a higher initial current density ($J_{sc}$) than the device without CYTOP or oil, while the device with just CYTOP has the quickest initial decline in current density.

Example 13

Mechanically stacked single illuminated area sequential series multijunction dye sensitized solar cells (SSM-DSCs) are compared with the replacement of bottom DSC with silicon (Si) and GaAs solar cells. This Example illustrates the practical advantage of using highly efficient near-infrared (>750 nm) photon-to-electron conversion efficiency of Si and GaAs cells compared to DSCs. For a three subcell SSM-DSC, top and middle devices were DSCs with D35 and B11 benchmark sensitizers. A comparison of three near-infrared active DSCs, Si and GaAs as a bottom device revealed that D35/B11/GaAs outperforms other combinations. Power conversion efficiency (PCE) order was D35/

B11/GaAs>D35/B11/Black Dye>D35/MK2/AP25+D35> D35/B11/B11>D35/B11/Si. It was found that as a bottom device under filtered or reduced illumination GaAs and DSCs response was superior than Si.

Solar cells are one of the major contenders for reliable and wide spread application of sustainable energy for future needs. Solar cells application for electricity generation is an attractive and sustainable option due to its renewable nature, mobile accessibility, abundance, and cost advantages. To harvest and utilize the energy from sun, various strategies based on photovoltaic (PV), photoelectric, photocatalytic and photoelectrochemical effect has been explored. A PV system or solar cells mainly demonstrates the following three attributes 1) light absorption and charge generation 2) separation of opposite charges 3) separate extraction of charges. Among the most studied PV materials for solar cells are semiconducting compounds from the group three and five (III-V) such as silicon, germanium, and gallium arsenide. In this regard, the development of solar cells can be divided into three generations envisioned and first reported by 6% crystalline silicon solar cell (Si) by Bell labs in 1954. Si have reached certified efficiencies of 20% and 26.6% for single crystal solar cells and occupy more than 90% of market share today. Si solar cells are unique in efficiently harvesting low energy photons up to 1200 nm. The second generation thin-film solar cells consist of thin film semiconducting materials and have certified PCEs of 28.8%, 22.1%, and 22.6% for GaAs, CdTe, and CIGS, respectively. Third generation solar cells with the potential for lower processing costs are perovskite solar cells (PSCs, 25.2%) and dye-sensitized solar cells (DSCs, 13%). Among the third generation PVs, dye-sensitized solar cells (DSCs) have emerged as a commercially viable mass producing technology owing to solution process ability, roll to roll production, variety of color (blue to red), low light performance and precious metal free materials applications.

For DSCs, to increase PCE one possible strategy is to decrease voltage loss in the short wavelength range and optical loss in the long wavelength range. Further, application of tandem (for two devices) and multijuntion (>2 devices) configuration employing solar cells with different wavelength responses can result in higher performance. _ ENREF_20_ENREF_17A recent and unique development of series connected DSCs is SSM-DSCs (sequential series multijunction-DSCs). SSM-DSCs are mechanically stacked single illuminated area series connected DSCs with more than two devices in the stack. With SSM-DSCs, overall higher PCE than any of the individual devices (>10%) in the stack and high photovoltage (>2.0 V) can be achieved. SSM-DSCs with >2.0 V photovoltage output can power $H_2O$ splitting and $CO_2$ reduction, thus potentially addressing the intermittent nature of solar resource by storing the energy in the chemical bonds.

Owing to highly modular configuration of SSM-DSCs (each device in the stack can be individually optimized), NIR active PV systems such as silicon and GaAs (FIG. 40) offer a potentially attractive alternative to DSCs as a bottom device (>3 devices in the stack). Previously, introduction of Si, GaAs and CIGS solar cells as a bottom device has been explored by Grätzel et al and others in tandem with DSCs (top and bottom devices only). Since SSM-DSCs can employ more than two devices, so offering the opportunity to further enhance the overall PCE. Thus, the basis of this study (FIG. 40) where the third (bottom) cell was replaced with either Si, GaAs or DSC devices to study the overall effect on PCE and other photovoltaic characteristics.

Figure 40:
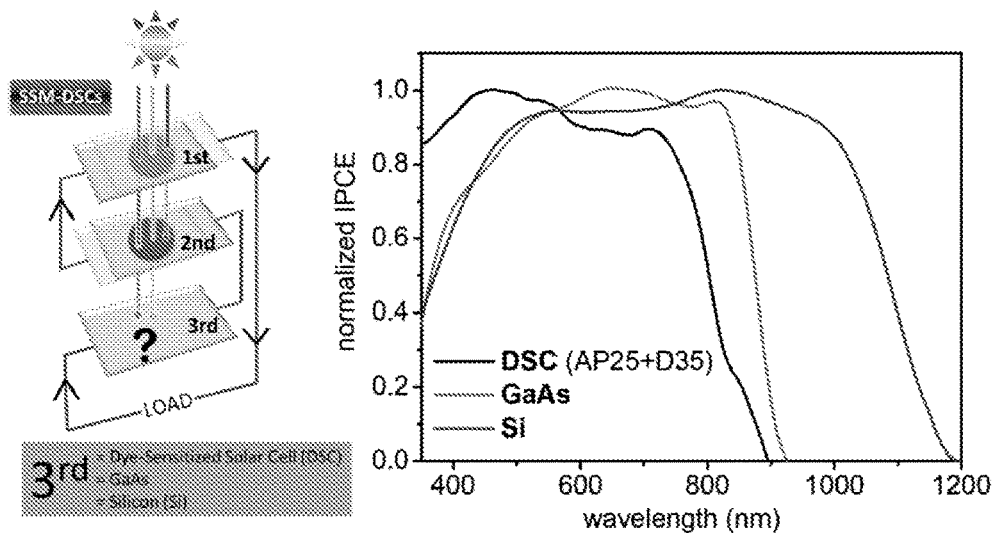
FIG. 40 shows an image and graph illustrating (left) a summary of design studied in Example 13 and (right) comparison of normalized typical incident photo-to-current conversion efficiency (IPCE) response of DSC, GaAs, and Si cells.

FIG. 40 (left) presents the concept of SSM-DSCs in regard to this study. In three subcell SSM-DSCs, photocurrent response in the stacked devices is controlled by the choice of the sensitizer, thickness of $TiO_2$, redox shuttle and reflection loss minimization. Such as an orange-yellow dye for the front device (550-600 nm absorption onset), red dye for the middle (650-750 nm absorption onset) and an NIR active sensitizer for the bottom device (FIG. 40, right). In the realm of DSCs, sensitizers which absorb and efficiently convert photons-to-electrons in the range of 400-750 nm are extensively studied and reported. However, sensitizers with efficient photo-to-electron conversion of low energy photons (>750 nm) have limited examples in the literature, owing to highly tuned requirements for the sensitizers design. Contrary to this, silicon has nearly ideal band gap (Eg=1.12 eV) to harvest photons far into NIR spectrum (FIG. 40, right). However, silicon solar cells offer a lower voltage 0.5-0.6 V, due to narrow bandgap and higher recombination losses and require energy intensive manufacturing. Due to efficient and broad photocurrent response introducing silicon in place of DSC as a bottom device thus offers an attractive option. Additionally, GaAs solar cells offer (1.42 eV) close to optimum bandgap and higher optical absorption coefficients thus resulting in higher efficiency thin film devices (FIG. 40, right). _ENREF_44 To realize the practical advantage in three subcell multijunction configuration DSC, GaAs and Silicon solar cells have been tested and compared as a bottom device.

Figure 41:
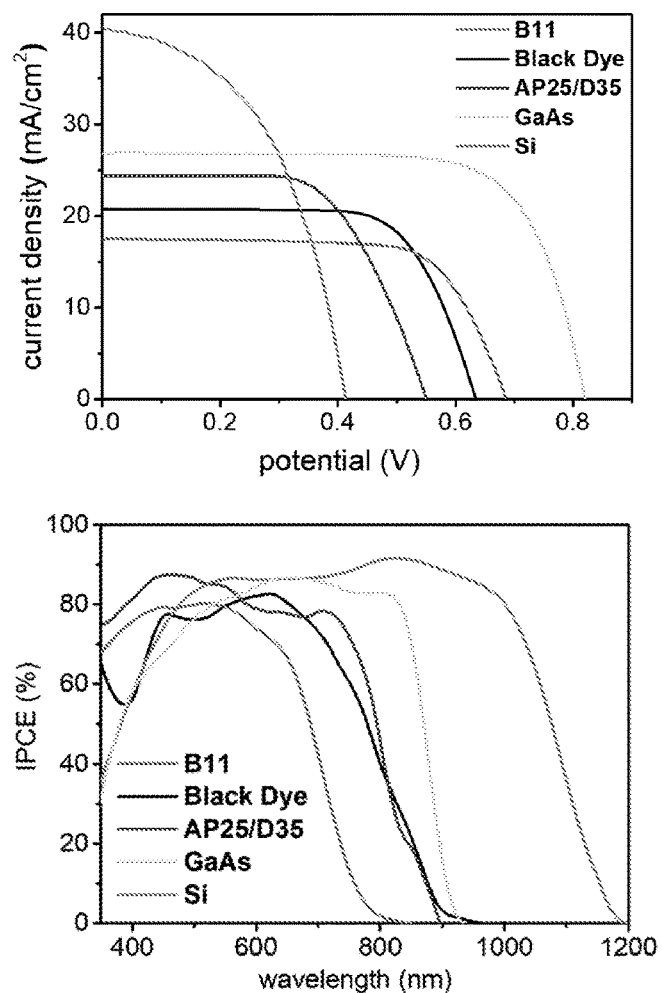
FIG. 41 shows graphs illustrating (Top) J-V and (Bottom) IPCE comparison of individual DSC (B11, Black Dye, AP25/D35), GaAs, and Si devices employed in Example 13.

Before analysing SSM-DSCs, single device power conversion efficiency (PCE) and IPCE was studied (FIG. 41, Table 25). PCE of a single device and SSM-DSCs was calculated according to the equation $PCE=(J_{sc} \times V_{oc} \times FF)/I_0$ where, $J_{sc}$ is the short-circuit current density, $V_{oc}$ is the open-circuit voltage, FF is the fill factor and $I_0$ is the intensity of the incident light (1 sun, air mass 1.5G). For the final DSC two metal complex based B11 and Black Dye and organic dye based co-sensitized AP25/D35 sensitizers were compared (FIG. 41, Table 25). For DSCs, all the dyes show broader light harvesting ability with Black Dye and AP25/D35 up to 100 nm red shifted in the IPCE response (900 nm onset vs. 800 nm). IPCE max of 82% at 650 nm for Black Dye and 550 nm for B11 was achieved (FIG. 42), whereas AP25/D35 achieved>80% IPCE response from 400-750 nm range. _EN_REF_45 Owing to broader current response, AP25/D35 translated into impressive $J_{sc}$ of 23.7 $mA/cm^2$ compared to 20.8 $mA/cm^2$ for Black Dye and 17.5 $mA/cm^2$ for B11. However, due to lower $V_{oc}$ of AP25/D35 overall PCE (8.3%) was slightly lower than Black Dye and B11 (9.5% and 8.5%, respectively).

TABLE 25

Figure 42:
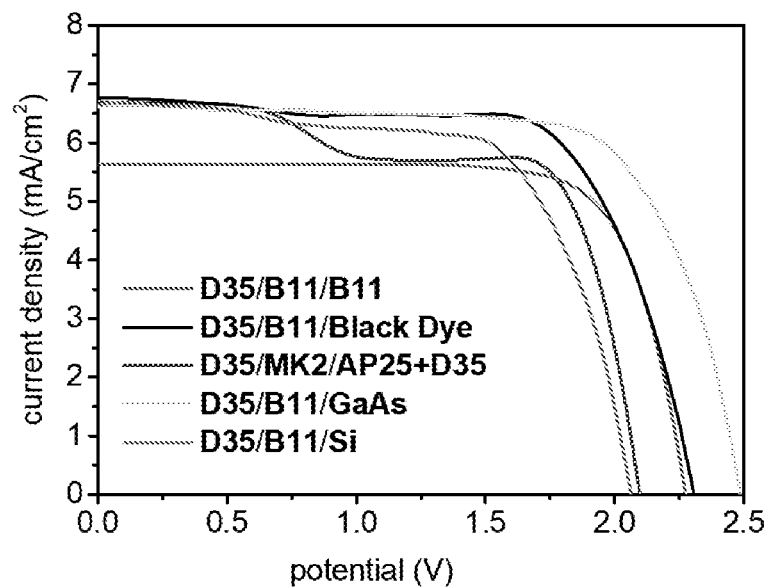
FIG. 42 shows a graph illustrating J-V comparison of three subcells SSM-DSCs with third cell as either a DSC (B11, Black Dye, AP25/D35), GaAs, or Si.

Comparison of device performances given in FIG. 42.

| Devices* | $J_{sc}$ (mA/cm$^2$) | $V_{oc}$ (mV) | FF (%) | PCE (%) |
|---|---|---|---|---|
| B11 | 17.5 ± 1.0 | 686 ± 10 | 70 ± 3 | 8.5 ± 0.2 |
| Black Dye | 20.8 ± 0.4 | 644 ± 7 | 70 ± 1 | 9.5 ± 0.1 |
| AP25/D35 | 23.7 ± 0.7 | 570 ± 11 | 63 ± 1 | 8.3 ± 0.2 |
| GaAs | 27.0 ± 0.6 | 824 ± 12 | 70 ± 3 | 15.9 ± 0.2 |
| Si | 41 ± 0.1 | 415 ± 1 | 47 ± 2 | 7.9 ± 0.2 |

*Details of $TiO_2$ film thickness, dipping solvent, electrolyte concentrations, CYTOP and device assembly are given in the SI.

GaAs's overall efficient response with IPCE of >90% at 700 nm, ($J_{sc}$ of 27 mA/cm$^2$, $V_{oc}$ of 824 mV and ff of 70%) resulted in PCE of 15.9%, which was higher than any single device tested for this study. Compared to photocurrent of other devices (DSCs and GaAs), silicon solar cells $J_{sc}$ of 41.2 μmA/cm$^2$ was higher than any other device due to its broad IPCE response (FIG. 41, bottom), whereas overall PCE was lower at 7.9% due to low $V_{oc}$ and fill factor (Table 25).

For SSM-DSCs, front and middle device employed D35, B11 and MK2 benchmark sensitizers with matching current in the stack as reported in previous studies. In SSM-DSCs sensitizers for individual devices are selected based on their complementary absorption profile such as D35 as a wideband gap orange dye (absorption onset ($\lambda_{onset}$), 570 nm, $\lambda_{max}$=500 nm), and the $2^{nd}$ device B11 ($\lambda_{onset}$=680 nm, $\lambda_{max}$=554 nm) and MK2 ($\lambda_{onset}$=560 nm, $\lambda_{max}$=480 nm) as a red dye for a fully organic SSM-DSC configuration. Owning to wideband gap of the front device (D35), it can be paired with a low lying redox shuttle such as Co(bpy-pz)$_2^{3+/2+}$ (bpy-pz=6-(1H-pyrazol-1-yl)-2,2'-bipyridine, redox potential=0.86 V vs. NHE). This strategic coupling of an orange dye and redox shuttle can lead to theoretical maximum photovoltage of 1.36 V with $TiO_2$ conduction band (CB) value at −0.5 V vs. NHE (assuming no shift in the conduction band of $TiO_2$). $TiO_2$ thickness of 1.8 μm, 5.0 μm, and 3.5 μm was optimized for D35, B11 and MK2 based DSCs respectively, with optimum matching of current for the front two devices in a three cell SSM-DSC. Thus, the choice of $2^{nd}$ subcell dye and thickness depends on the thickness of the front cell $TiO_2$ and the dye, and breadth and onset of IPCE response of the third cell (for three subcell SSM-DSCs). However, the final ($3^{rd}$ cell) dyes tested in SSM-DSCs so far were limited mainly in current generation to 900 nm.

FIG. 42 and Table 26, summarizes the results for multi-juntion devices (SSM-DSCs configuration) with three subcells stacked on top of each other. First comparing all the DSC based SSM-DSCs, D35/B11/B11 (in the order from top to bottom), D35/B11/Black Dye and D35/MK2/AP25+D35. Impressively, all the DSC based SSM-DSCs resulted in PCE higher than any single device in the stack (Table 25 and 27). D35/B11/Black Dye SSM-DSCs overall performance was superior to other two DSC only SSM-DSCs. For D35/B11/B11, the thickness of $1^{st}$ and $2^{nd}$ device (1.5 μm and 2.2 μm) was lesser than the $1^{st}$ and $2^{nd}$ device for D35/B11/Black Dye and D35/MK2/AP25+D35 (Table 26) to achieve current matching. Contrary to this, thicker $1^{st}$ and $2^{nd}$ devices were employed for D35/B11/Black Dye and D35/MK2/AP25+D35 because the bottom device can now harvest NIR photons (900 nm IPCE onset instead of 800 nm of B11). Overall higher PCE of D35/B11/Black Dye (10.5%) compared to D35/MK2/AP25+D35 (9.2%) was due to higher photovoltage and fill factor of farmer (Table 25, FIG. 42). AP25+D35 itself employ higher $Li^+$ (loading), which is known to lower $V_{oc}$ due to positive shift in $TiO_2$ conduction band.

TABLE 26

Summary of DSCs device data for different SSM-DSCs.*

| Devices | Thickness (μm) | $V_{oc}$ (mV) | $J_{sc}$ (mA/cm$^2$) | FF (%) | PCE (%) |
|---|---|---|---|---|---|
| D35/B11/B11 | 1.5 μm/2.2 μm/full | 2281 ± 20 | 5.5 ± 0.1 | 71 ± 2 | 9.3 ± 0.1 |
| D35/B11/Black Dye | 1.8 μm/5.0 μm/full | 2323 ± 54 | 6.5 ± 0.4 | 66 ± 3 | 10.5 ± 0.1 |
| D35/MK2/AP25 + D35 | 1.8 μm/5.0 μm/full | 2132 ± 21 | 6.4 ± 0.4 | 64 ± 2 | 9.2 ± 0.3 |
| D35/B11/GaAs | 1.8 μm/5.0 μm/full | 2472 ± 27 | 6.9 ± 0.3 | 68 ± 3 | 11.2 ± 0.1 |
| D35/B11/Si | 1.8 μm/5.0 μm/full | 2064 ± 5 | 6.7 ± 0.2 | 67 ± 2 | 9.1 ± 0.1 |

*Details of dipping solvent, electrolyte concentrations, CYTOP and device assembly are given in the SI.
"full" refers to the bottom cell.

With the highest performing GaAs device as the bottom device, the overall PCE (11.2%, Table 26) for the stacked series connected devices was higher than any other combinations tested for SSM-DSCs in this study. However, the D35/B11/GaAs (11.2%) SSM-DSC device performance was not higher than the single GaAs (15.9%) and other device (DSCs) in the stack.

Previous highest PCE with the mechanical stacking of a DSC and GaAs is 7.63% and 6.87 in monolithic configuration. In that regard, DSC/DSC/GaAs configuration was found with impressively high $V_{oc}$ of 2.5 V and PCE of 11.2%. With D35/B11/Si mechanical stacking configuration, well matched current was achieved however overall PCE (9.1%, Table 25, FIG. 41) was lowest compared to other combinations studied. This is mainly caused by the lower $V_{oc}$ and fill factor of individual Si solar cell (Table 25) which also led to SSM-DSC (D35/B11/Si) with lower $V_{oc}$ and fill factor (Table 26).

To further elaborate the results for SSM-DSCs in Table 26, performance of individual bottom devices (final $3^{rd}$) under filtered light (i.e., in the stack) was compared (FIG. 43, Table 27) in terms of IPCE response.

TABLE 27

Summary of $3^{rd}$ device performance when in the stack of devices for SSM-DSCs (under filtered light). *

| Device | $V_{oc}$ (mV) | $J_{sc}$ (mA/cm$^2$) | FF (%) | PCE (%) |
|---|---|---|---|---|
| B11 | 658 ± 7 | 5.4 ± 0.1 | 77 ± 1 | 2.8 ± 0.1 |
| Black Dye | 612 ± 3 | 6.7 ± 0.2 | 78 ± 1 | 3.4 ± 0.1 |
| AP25/D35 | 567 ± 11 | 6.2 ± 0.1 | 77 ± 1 | 2.7 ± 0.1 |
| GaAs | 732 ± 4 | 7.6 ± 0.2 | 71 ± 1 | 3.9 ± 0.2 |
| Si | 310 ± 2 | 13.7 ± 0.4 | 42 ± 1 | 1.7 ± 0.1 |

Figure 43:
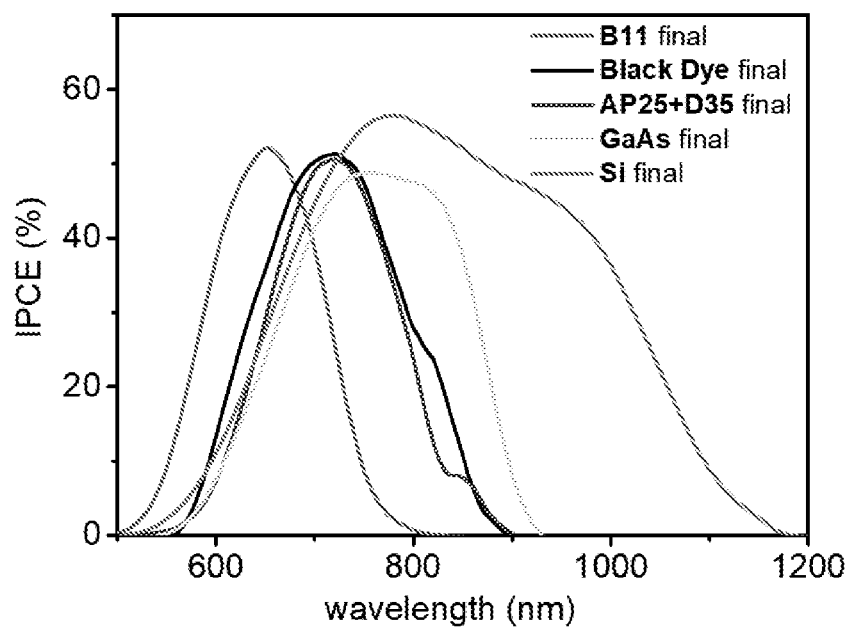
FIG. 43 shows a graph illustrating comparison of third device IPCE response when in the stack of devices for SSM-DSCs.

For all DSC based SSM-DSCs, performance of Black Dye as bottom device was superior to B11 and AP25/D35. $J_{sc}$ of B11 as $3^{rd}$ device was mainly limited due to lack of light absorption breadth and blue shifted IPCE onset (FIG. 43). Lowered PCE of AP25/D35 (2.7%) compared to Black Dye (3.45) was due to lower $V_{oc}$ mainly as discussed already. GaAs's performance as the $3^{rd}$ device was superior than any other device in the solar cells studied here. This can be assigned to its highly efficient red photon harvesting ability (FIGS. 41 and 43) and higher $V_{oc}$. Si solar cell as the bottom device maintained the high enough $J_{sc}$ (13.7 mA/cm$^2$, Table 27) due to broad IPCE response (FIG. 43, Table 27), however, inherently lower $V_{oc}$ and fill factor resulted in lowest performance $3^{rd}$ device. Interestingly, the order of individual device PCE performance (Table 25, GaAs>Black Dye>B11>AP25/D35>Si) was same as when the devices were studied under filtered light in the stack (Table 27). Since Si is observed to maintains high enough photocurrent under filtered light for three cell SSM-DSCs, it was further studied as bottom device in four (D35/Y123/Black Dye/Si) and two devices (B11/Si) configuration. Thicker B11 (5.5 μm) as top and GaAs as bottom outperformed B11/Si (11.5% vs. 10.3), respectively. With four cell SSM-DSCs (D35/Y123/Black Dye/Si), bottom Si cell showed well matching current with other devices in the stack, however, $V_{oc}$ was low as 2.7 V and PCE of 8.5%.

Figure 44:
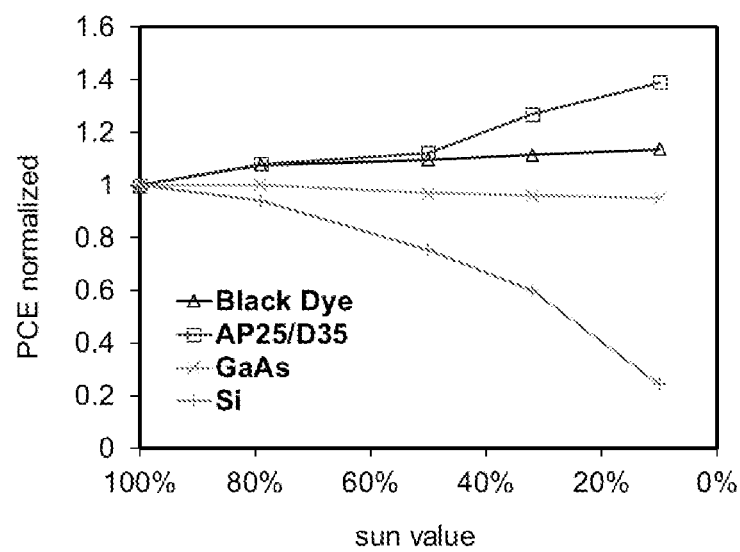
FIG. 44 shows a graph illustrating PCE of devices as function of sun value for DSC (Black Dye, AP25/D35), GaAs, and Si.

FIG. 44 further illustrates the reason for lower performance when Si solar cell was employed as the bottom device. Inherently, DSCs showed enhanced performance under reduced light due to diminished aggregation related losses and efficient handling of absorbed photons, thus making DSCs an ideal choice for indoor solar cells and bottom devices in SSM-DSCs. _ENREF_46 GaAs too maintains its performance under lowered illumination with minimal loss in overall PCE (FIG. 44). It is noticeable (FIG. 44), that the solar cell performance difference become more evident after 40% sun value, under which condition organic dye based DSC (AP25/D35) outperform Black Dye, GaAs and Si cells.

Conclusions

In summary, SSM-DSCs were successfully engineered with a comparison of DSC, Si and GaAs bottom cells. Impressively, SSM-DSCs performance was higher than any single device in the stack only in the case of all DSCs (highest PCE of 10.5% from D35/B11/Black Dye). By replacing Black Dye DSC with a highly efficient GaAs solar cell in a three cell SSM-DSC, highest PCE was achieved in the series (11.2% vs. 10.5%), respectively. Combing the inherently high photovoltage from DSCs and GaAs in a series multijuntion device led to impressively high $V_{oc}$ of 2.5 V. Si solar cells were found to be poor in performance compared to DSCs and GaAs as bottom device due to lower photovoltage and ff. As a $3^{rd}$ device, Black Dye DSCs (PCE 3.4%) was slightly lower in performance compared to GaAs (3.9%).

Example 14

In initial investigations into mechanically stacked DSC devices, the limit was 2 subcell (termed 'tandem') due to the prevailing theory in the field that photon losses were a result of scattering of light, reflectance of light, and poor transmission which would be too great for a third subcell to provide significant device performance increases. However, this circumvents a substantial advantage of the mechanically stacked approach relative to other options such as dichroic mirrors for beam splitting or monolithic approaches which are traditionally limited to 2 subcell tandem designs due to fabrication technique complexity or experimental setup complexity. By stacking dye-sensitized subcells in series to create an illuminated area where each subcell filters photons for subsequent active layers, the present inventors discovered that they were able to form a three subcell arrangement for a multijunction solar cell. This mechanically stacked approach is uniquely suited to allow for multijunction systems at 3 or greater subcells with a simple fabricate design.

This discovery shows a surprising performance enhancement by utilizing a third subcell. It is observed that a 3 subcell D35/Y123/HD-2-mono (I) device mechanically stacked DSC significantly increases in performance (7.7% PCE in the first example reported) when properly configured relative to 2 subcell D35/Y123 devices (7.1% PCE in the first example reported) and >3 subcell D35/D35/Y123/Y123 or D35/D35/Y123/Y123/Y123 devices (5.8% PCE or less). The design of the three subcell device allows for better division of photons between active layers, which can limit thermal losses by efficiently utilizing the potential energy of photons in a specific region. This is achieved by specifically tailoring dyes to absorb distinct regions of photons desired for these three subcell multijunction SSM-DSC devices. When RR9 is used as the front subcell, the $V_{OC}$ per subcell rises to a record high 1.12 V per subcell with RR9 (Fe)/Y123/Y123 over the 0.96 V per subcell reported for the 2 subcell D35/Y123 device and 0.88 V per subcell for the three subcell D35/Y123/HD-2-mono (I) device. The voltage per subcell is an indicator of the amount of thermal energy waste in the system. Theoretically, in the absence of photon loss pathways due to incomplete transmission, infinite subcells could give a thermal loss-free system. However, practically this is not achievable due to photon loss pathways. Both photon division between subcells and photon loss pathways must be balanced for the highest functional practical system. This balance, prior to this technology, was believed to be at 2 subcells in the dye-sensitized solar cell field. However, though careful control of TiO2 layer thickness, dye absorption breadth, use of anti-reflective coatings, and use of immersion oil between subcells, optical losses can be minimized revealing that a 3 subcell device can give superior performance to a 2 subcell device for the first time (Table 28).

| Device | Subcells | $V_{OC}$ (V) | $J_{SC}$ (mA/cm$^2$) | FF | PCE (%) |
| --- | --- | --- | --- | --- | --- |
| D35/Y123 | 2 | 1.92 | 5.9 | 0.62 | 7.1 |
| D35/Y123/HD-2-mono (I) | 3 | 2.63 | 3.9 | 0.74 | 7.7 |
| D35/D35/Y123/Y123 | 4 | 3.72 | 2.7 | 0.58 | 5.8 |
| D35/D35/Y123/Y123/Y123 | 5 | 4.67 | 2.4 | 0.38 | 4.3 |
| RR9 (Fe)/Y123/Y123 | 3 | 3.34 | 1.9 | 0.56 | 3.5 |
| D35/B11(I)/B11(I) | 3 | 2.28 | 5.5 | 0.71 | 9.3 |
| D35/B11(I)/B11(I) CYTOP/Oil | 3 | 2.29 | 5.7 | 0.76 | 10.1 |
| D35/B11(I)/Black Dye (I) CYTOP/Oil | 3 | 2.27 | 7.1 | 0.72 | 11.1 |
| B11 (I) | 1 | 0.69 | 17.5 | 0.70 | 8.5 |
| Black Dye (I) | 1 | 0.64 | 20.8 | 0.70 | 9.5 |
| Silicon | 1 | 0.42 | 41.0 | 0.47 | 7.9 |
| D35/B11 (I)/Si | 3 | 2.06 | 6.7 | 0.67 | 9.1 |

The redox shuttle is noted in parenthesis with (Fe) being an iron redox shuttle, (I) being an iodide redox shuttle, and a cobalt based redox shuttle is used if not noted.

While solar cells traditionally use the thickest active layer needed to catch all light, the present inventors have surprisingly found that thinner active layers, such as transparent or partially transparent films, provide improved results. In other words, the present inventors have found that controlling the TiO$_2$ active layer thickness through paste formulations and screen mesh selection unexpectedly provides improved performance.

SSM-DSC device performance can further be enhanced by a more careful balancing of photon flux through dye selection with D35/B11(I)/B11(I) leading to a 9.3% PCE. This performance can be enhanced significantly to 10.1% through the use of an antireflective coating (CYTOP) and an emersion oil designed to limit photon reflection or diffraction losses between subcells. The highest tested performance to date is observed with a D35/B11(I)/Black Dye (I) CYTOP/Oil SSM-DSC device at 11.1% PCE, which is made possible by controlling TiO2 thicknesses of each layer to evenly divide photons through three complementary chromophores that absorb high (D35), medium (B11), and lower energy photon (Black Dye). If the TiO2 thickness is not carefully controlled, the subcell photon flux is unbalanced leading to lower device performance typically on the order of <9% PCE. The high performing D35/B11(I)/Black Dye (I) SSM-DSC device is significantly greater performing than the individual dyes at 6.6%, 8.5%, and 9.5%, respectively. This combined overall better performance is not expected to occur without exceptional photon flux balance made possible by dye selection, TiO2 thickness control, anti-reflective coatings, and immersion oils—all of which are necessary to reach a peak performance. As a demonstration of the complementary nature of this design approach with that of existing solar cell technologies, a 7.9% PCE silicon solar cell was used as the third subcell in a hybrid SSM-DSC/inorganic solar cell device to give 9.1% PCE. This is an initial example of how this technology can be combined with solar cells already under mass production to boost efficiencies with existing solar cells.

This current solar cell technology can most directly be improved at the front/first subcell. Without wishing to be bound by theory, it is believed that the front subcell is practically capable of >2.0 V output with a 500 nm absorption onset dye, with the second subcell capable of ~1.3 V output with a 650 nm onset, and an output of 0.7 V for the third subcell. In the D35/B11(I)/Black Dye (I) device the subcells give 1.1 V, 0.7 V, and 0.6 V, respectively. However, by replacing the first subcell with a wide band-gap dye to give 2.0 V, the second subcell can be replaced with D35 or Y123 which already give up to 1.2 V. This would give a wide band-gap dye/D35 or Y123/Black Dye device with only 0.2 V loss versus the 1.4 V loss of a D32/B11/Black Dye device. Therefore, the use of a wide band-gap dye would lead to lower photon losses with the PCE linearly scaling to 19.4% PCE which is exceptionally high for a simple to mass produce technology. By comparison, commercially mass produced silicon devices are often on the order of 10-15% depending on the silicon grade used.

With this in mind, a suitable model chromophore series has been identified for the front subcell dyes. The suitability of these chromophores as front subcell systems is evidenced in their reported ground state and excited state potentials. The current record holding dye RR9 for a front subcell device with minimal loss has ground and excited state values of 1.56 V and −1.08 V respectively versus normal hydrogen electrode (NHE). To function efficiently in an SSM-DSC device, the ground state should be >2.0 V and the excited state should be at 2.2V. CC1-CC3 all show >2.0V at up to 2.2 V. These dyes are nearly ideally position energetically to be front subcells in DSC devices. Additionally, the dyes show below incorporate long alkyl chains to limit internal charge losses due to redox shuttle-TiO2 electron recombination losses.

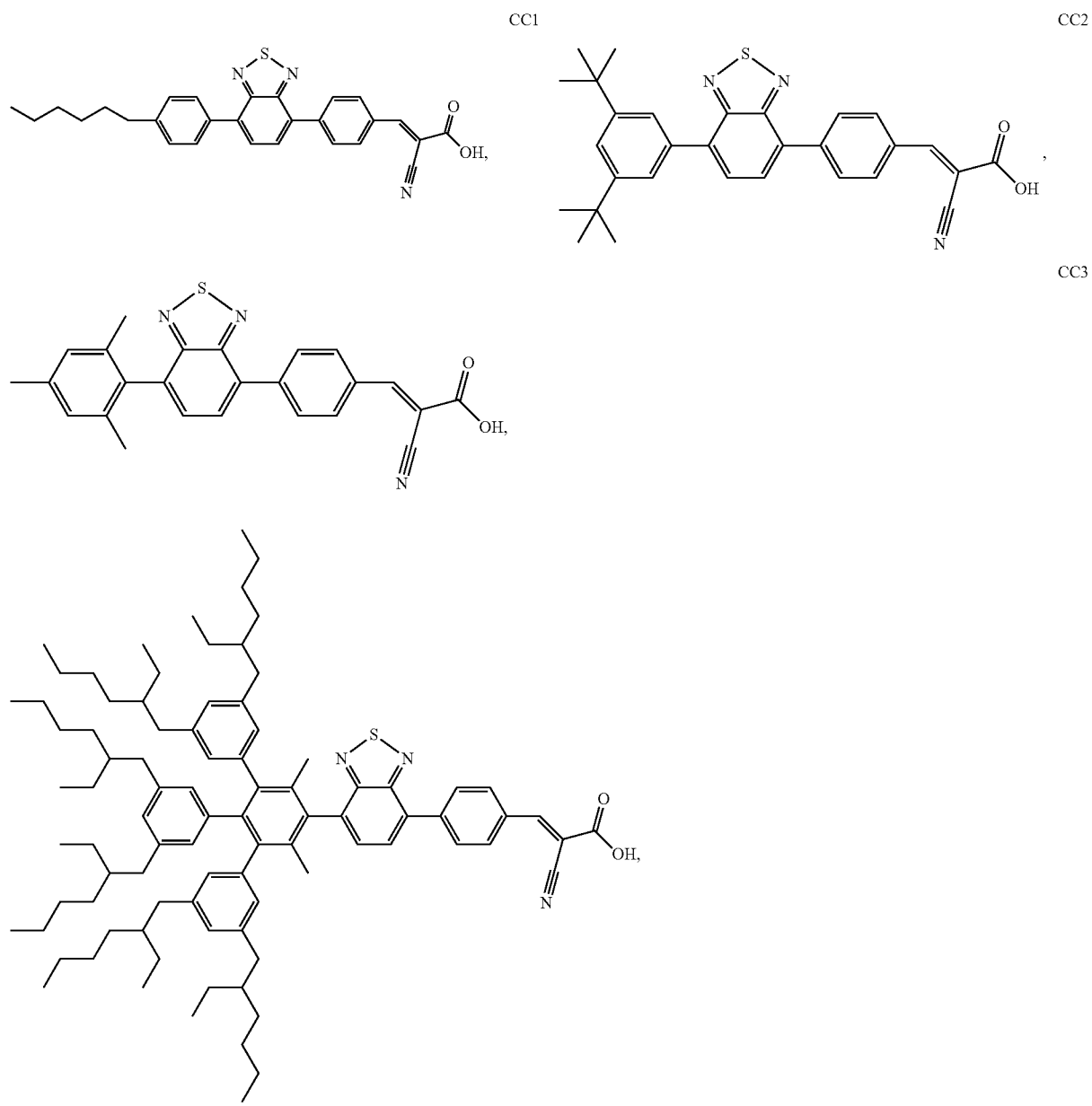

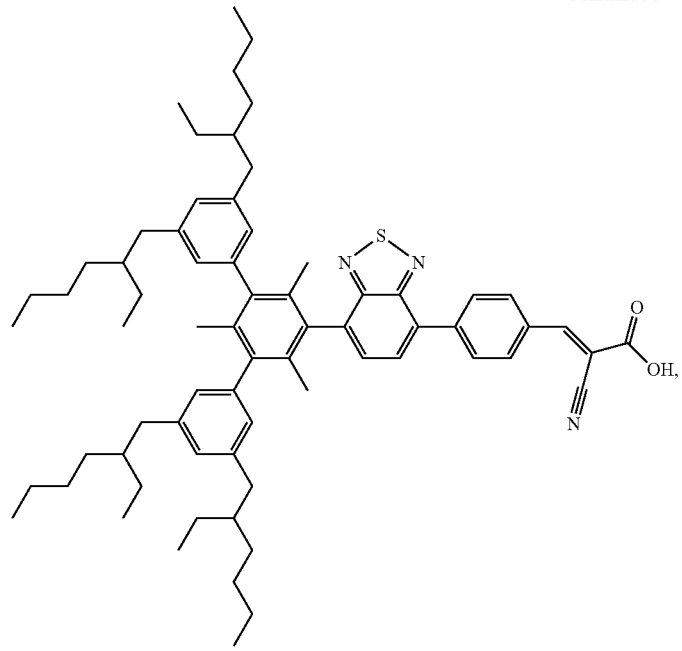
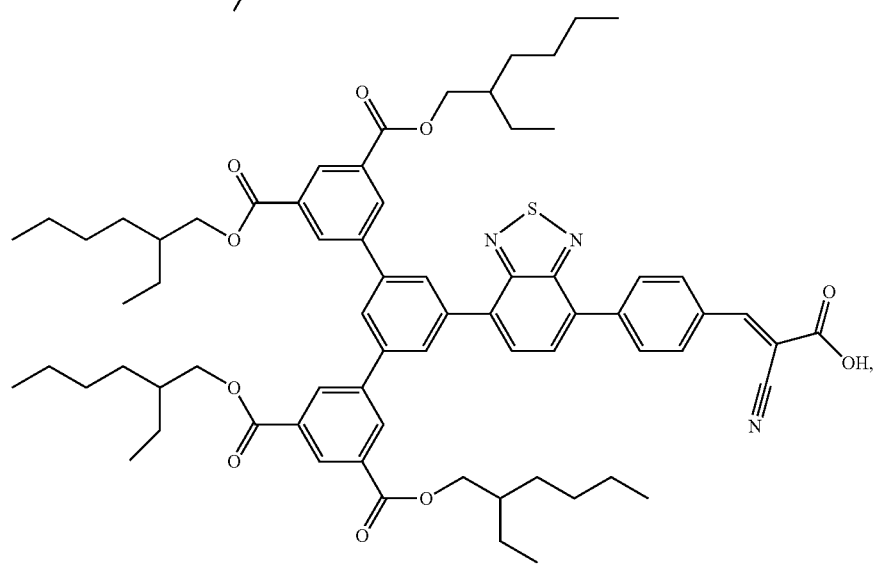
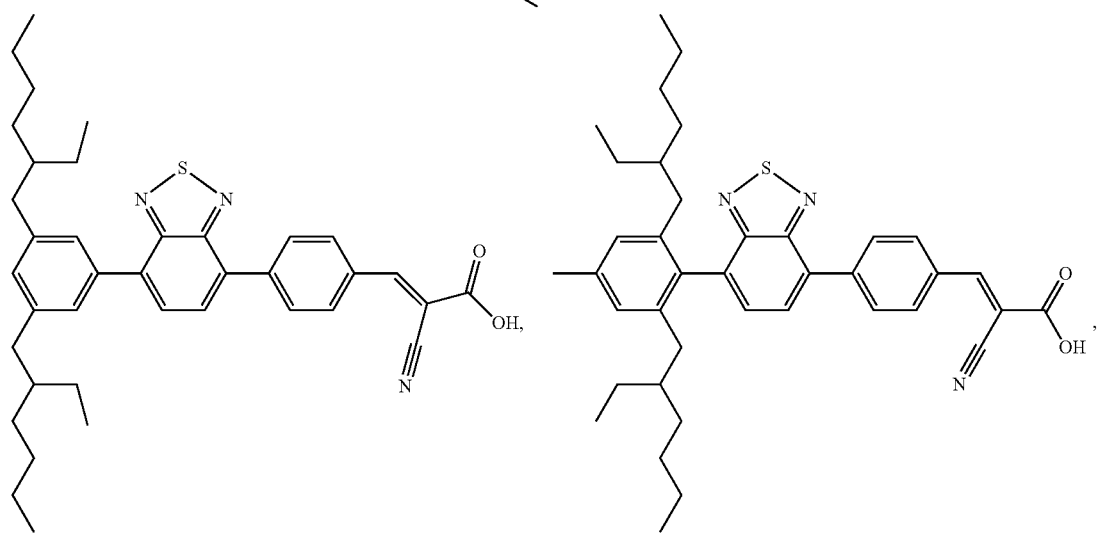

-continued
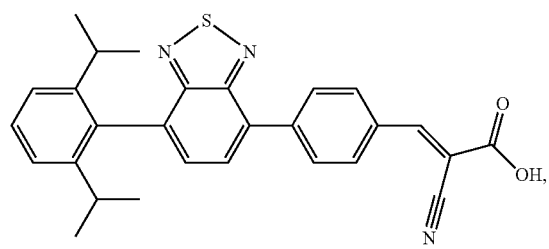
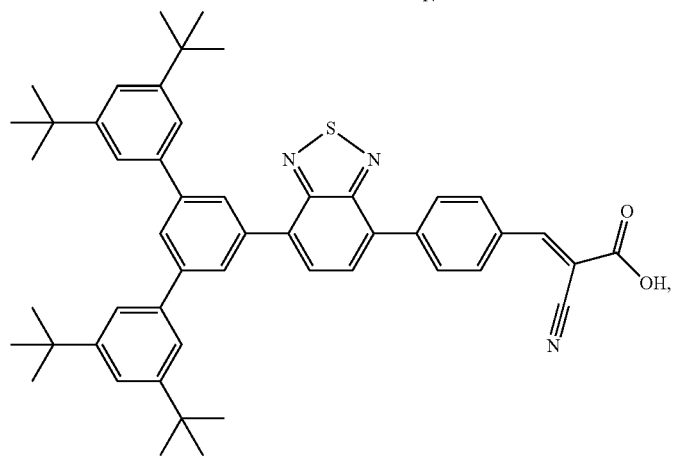
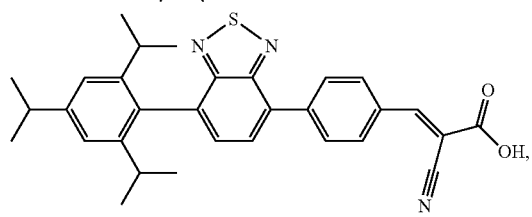
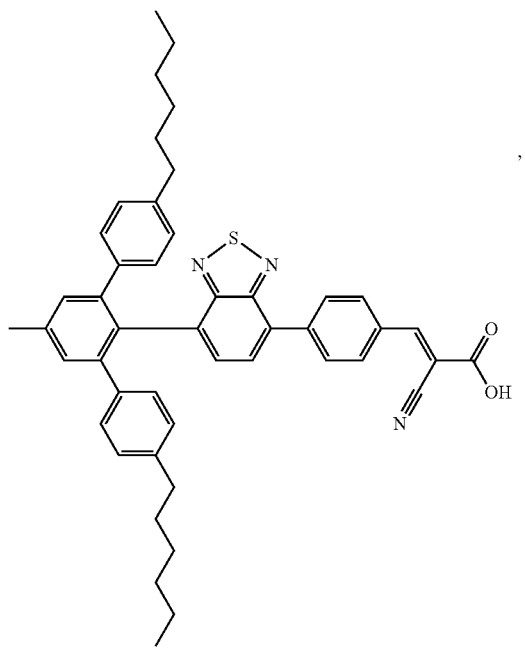
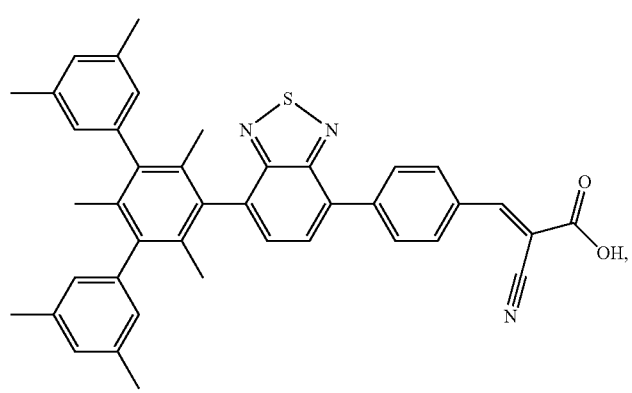

-continued

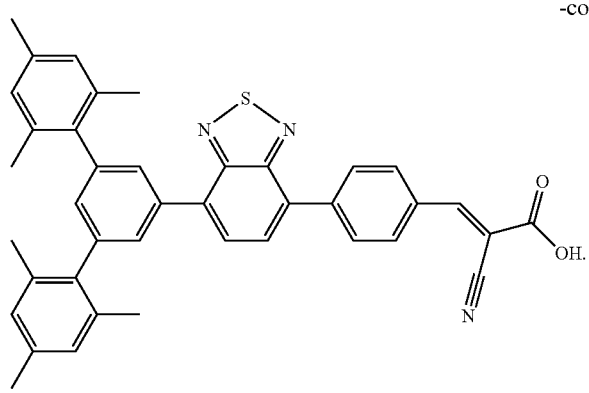

This approach provides the desired dye for a 3 subcell (or 2 subcell or DSC-inorganic hybrid) high performing system. This design also enables the use of alternate positively charged redox shuttles to Fe which must be replaced with the RR9 devices due to strong light absorption and long term stability concerns.

While the disclosure is susceptible to various modifications and alternative forms, specific embodiments thereof have been shown by way of example in the drawings and are herein described below in detail. It should be understood, however, that the description of specific embodiments is not intended to limit the disclosure to cover all modifications, equivalents and alternatives falling within the spirit and scope of the disclosure as defined by the appended claims.

REFERENCES (1) World Energy Outlook 2015. International Energy Agency 2015.
(2) Colton, W., The Outlook for Energy: A View to 2040. Exxon Mobil Corporation 2011.
(3) Olah, G. A., Beyond Oil and Gas: The Methanol Economy. Angewandte Chemie International Edition 2005, 44, 2636-2639.
(4) Chu, S.; Majumdar, A., Opportunities and Challenges for a Sustainable Energy Future. Nature 2012, 488, 294-303.
(5) Turner, J. A., Sustainable Hydrogen Production. Science 2004, 305, 972-974.
(6) Lewis, N. S.; Nocera, D. G., Powering the Planet: Chemical Challenges in Solar Energy Utilization. Proceedings of the National Academy of Sciences 2006, 103, 15729-15735.
(7) Luo, J.; Im, J. H.; Mayer, M. T.; Schreier, M.; Nazeeruddin, M. K.; Park, N. G.; Tilley, S. D.; Fan, H. J.; Gratzel, M., Water Photolysis at 12.3% Efficiency Via Perovskite Photovoltaics and Earth-Abundant Catalysts. Science 2014, 345, 1593-6.
(8) Arasiliba, K.; Miyake, Y.; Nishibayashi, Y., A Molybdenum Complex Bearing Pnp-Type Pincer Ligands Leads to the Catalytic Reduction of Dinitrogen into Ammonia. Nat Chem 2011, 3, 120-5.
(9) Joya, K. S.; Joya, Y. F.; Ocakoglu, K.; van de Krol, R., Water-Splitting Catalysis and Solar Fuel Devices: Artificial Leaves on the Move. Angewandte Chemie International Edition 2013, 52, 10426-10437.
(10) Schreier, M.; Curvat, L.; Giordano, F.; Steier, L.; Abate, A.; Zakeeruddin, S. M.; Luo, J.; Mayer, M. T.; Gratzel, M., Efficient Photosynthesis of Carbon Monoxide from $Co_2$ Using Perovskite Photovoltaics. Nat Commun 2015, 6, 7326.
(11) Seh, Z. W.; Kibsgaard, J.; Dickens, C. F.; Chorkendorff, I.; Norskov, J. K.; Jaramillo, T. F., Combining Theory and Experiment in Electrocatalysis: Insights into Materials Design. Science 2017, 355, eaad4998.
(12) Mathew, S.; Yella, A.; Gao, P.; Humphry-Baker, R.; Curchod, B. F.; Ashari-Astani, N.; Tavernelli, I.; Rothlisberger, U.; Nazeeruddin, M. K.; Gratzel, M., Dye-Sensitized Solar Cells with 13% Efficiency Achieved through the Molecular Engineering of Porphyrin Sensitizers. Nature Chemistry 2014, 6, 242-7.
(13) Yella, A.; Lee, H. W.; Tsao, H. N.; Yi, C.; Chandiran, A. K.; Nazeeruddin, M. K.; Diau, E. W.; Yeh, C. Y.; Zakeeruddin, S. M.; Gratzel, M., Porphyrin-Sensitized Solar Cells with Cobalt (Ii/Iii)-Based Redox Electrolyte Exceed 12 Percent Efficiency. Science 2011, 334, 629-34.
(14) Yum, J. H.; Baranoff, E.; Kessler, F.; Moehl, T.; Ahmad, S.; Bessho, T.; Marchioro, A.; Ghadiri, B; Moser, J. E.; Yi, C.; Nazeeruddin, M. K.; Gratzel, M., A Cobalt Complex Redox Shuttle for Dye-Sensitized Solar Cells with High Open-Circuit Potentials. Nature Communications 2012, 3, 631.
(15) Ozawa, H.; Sugiura, T.; Kuroda, T.; Nozawa, K.; Arakawa, H., Highly Efficient Dye-Sensitized Solar Cells Based on a Ruthenium Sensitizer Bearing a Hexylthiophene Modified Terpyridine Ligand. Journal of Materials Chemistry A 2016, 4, 1762-1770.
(16) Kakiage, K.; Aoyama, Y.; Yano, T.; Oya, K.; Fujisawa, J.-i.; Hanaya, M., Highly-Efficient Dye-Sensitized Solar Cells with Collaborative Sensitization by Silyl-Anchor and Carboxy-Anchor Dyes. Chemical Communications 2015, 51, 15894-15897.
(17) Kang, S. H.; Jeong, M. J.; Eom, Y. K.; Choi, I. T.; Kwon, S. M.; Yoo, Y.; Kim, J.; Kwon, J.; Park, J. H.; Kim, H. K., Porphyrin Sensitizers with Donor Structural Engineering for Superior Performance Dye-Sensitized Solar Cells and Tandem Solar Cells for Water Splitting Applications. Advanced Energy Materials 2016, 1602117-n/a.
(18) Kwon, J.; Im, M. J.; Kim, C. U.; Won, S. H.; Kang, S. B.; Kang, S. H.; Choi, I. T.; Kim, H. K.; Kim, I. H.; Park, J. H.; Choi, K. J., Two-Terminal Dssc/Silicon Tandem Solar Cells Exceeding 18% Efficiency. Energy & Environmental Science 2016, 9, 3657-3665.
(19) Bin, A. R.; Yusoff, M.; Jang, J., Highly Efficient Photoelectrochemical Water Splitting by a Hybrid Tandem Perovskite Solar Cell. Chemical Communications 2016, 52, 5824-5827.
(20) Ito, S.; Dharmadasa, I.; Tolan, G.; Roberts, J.; Hill, G.; Miura, H.; Yum, J.-H.; Pechy, P.; Liska, P.; Comte, P., High-Voltage (1.8 V) Tandem Solar Cell System Using a Gaas/Alxga (1–X) as Graded Solar Cell and Dye-Sensitised Solar Cells with Organic Dyes Having Different Absorption Spectra. Solar Energy 2011, 85, 1220-1225.
(21) Bruder, I.; Karlsson, M.; Eickemeyer, F.; Hwang, J.; Erk, P.; Hagfeldt, A.; Weis, J.; Pschirer, N., Efficient Organic Tandem Cell Combining a Solid State Dye-Sensitized and a Vacuum Deposited Bulk Heterojunction Solar Cell. Solar Energy Materials and Solar Cells 2009, 93, 1896-1899.
(22) Kakiage, K.; Osada, H.; Aoyama, Y.; Yano, T.; Oya, K.; Iwamoto, S.; Fujisawa, J. I.; Hanaya, M., Achievement of over 1.4 V Photovoltage in a Dye-Sensitized Solar Cell by the Application of a Silyl-Anchor Coumarin Dye. Scientific Reports 2016, 6, 35888.
(23) Kakiage, K.; Tokutome, T.; Iwamoto, S.; Kyomen, T.; Hanaya, M., Fabrication of a Dye-Sensitized Solar Cell Containing a Mg-Doped Tio2 Electrode and a Br3-/Br-Redox Mediator with a High Open-Circuit Photovoltage of 1.21 V. Chemical Communications 2013, 49, 179-180.
(24) Cheema, H.; Delcamp, J. H., Harnessing Photovoltage: Effects of Film Thickness, $TiO_2$ Nanoparticle Size, Mgo and Surface Capping with Dscs. ACS Applied Materials & Interfaces 2017, 9, 3050-3059.
(25) Wooh, S.; Kim, T.-Y.; Song, D.; Lee, Y.-G.; Lee, T. K.; Bergmann, V. W.; Weber, S. A. L.; Bisquert, J.; Kang, Y. S.; Char, K., Surface Modification of Tio2 Photoanodes with Fluorinated Self-Assembled Monolayers for Highly Efficient Dye-Sensitized Solar Cells. ACS Applied Materials & Interfaces 2015, 7, 25741-25747.
(26) Yamaguchi, T.; Uchida, Y.; Agatsuma, S.; Arakawa, H., Series-Connected Tandem Dye-Sensitized Solar Cell for Improving Efficiency to More Than 10%. Solar Energy Materials and Solar Cells 2009, 93, 733-736.
(27) Yanagida, M.; Onozawa-Komatsuzaki, N.; Kurashige, M.; Sayama, K.; Sugihara, H., Optimization of Tandem-Structured Dye-Sensitized Solar Cell. Solar Energy Materials and Solar Cells 2010, 94, 297-302.
(28) Jeong, W.-S.; Lee, J.-W.; Jung, S.; Yun, J. H.; Park, N.-G., Evaluation of External Quantum Efficiency of a 12.35% Tandem Solar Cell Comprising Dye-Sensitized and Cigs Solar Cells. Solar Energy Materials and Solar Cells 2011, 95, 3419-3423.
(29) Sullivan, P.; Schumann, S.; Da Campo, R.; Howells, T.; Duraud, A.; Shipman, M.; Hatton, R. A.; Jones, T. S., Ultra-High Voltage Multijunction Organic Solar Cells for Low-Power Electronic Applications. Advanced Energy Materials 2013, 3, 239-244.
(30) Barber, G. D.; Hoertz, P. G.; Lee, S.-H. A.; Abrams, N. M.; Mikulca, J.; Mallouk, T. E.; Liska, P.; Zakeeruddin, S. M.; Gratzel, M.; Ho-Baillie, A., Utilization of Direct and Diffuse Sunlight in a Dye-Sensitized Solar Cell•Silicon Photovoltaic Hybrid Concentrator System. The Journal of Physical Chemistry Letters 2011, 2, 581-585.
(31) Chandiran, A. K.; Tetreault, N.; Humphry-Baker, R.; Kessler, F.; Baranoff, E.; Yi, C.; Nazeeruddin, M. K.; Gratzel, M., Subnanometer Ga2o3 Tunnelling Layer by Atomic Layer Deposition to Achieve 1.1 V Open-Circuit Potential in Dye-Sensitized Solar Cells. Nano Letters 2012, 12, 3941-3947.
(32) Yum, J.-H.; Moehl, T.; Yoon, J.; Chandiran, A. K.; Kessler, F.; Gratia, P.; Gratzel, M., Toward Higher Photovoltage: Effect of Blocking Layer on Cobalt Bipyridine Pyrazole Complexes as Redox Shuttle for Dye-Sensitized Solar Cells, The Journal of Physical Chemistry C 2014, 118, 16799-16805.
(33) Feldt, S. M.; Lohse, P. W.; Kessler, F.; Nazeeruddin, M. K.; Gratzel, M.; Boschloo, G.; Hagfeldt, A., Regeneration and Recombination Kinetics in Cobalt Polypyridine Based Dye-Sensitized Solar Cells, Explained Using Marcus Theory. Physical Chemistry Chemical Physics 2013, 15, 7087-7097.
(34) Safdari, M.; Lohse, P. W.; Haggman, L.; Frykstrand, S.; Hogberg, D.; Rutland, M.; Asencio, R. A.; Gardner, J.; Kloo, L.; Hagfeldt, A.; Boschloo, G., Investigation of Cobalt Redox Mediators and Effects of Tio2 Film Topology in Dye-Sensitized Solar Cells. RSC Advances 2016, 6, 56580-56588.
(35) Pashaei, B.; Shahroosvand, H.; Abbasi, P., Transition Metal Complex Redox Shuttles for Dye-Sensitized Solar Cells. RSC Advances 2015, 5, 94814-94848.
(36) Eom, Y. K.; Choi, I. T.; Kang, S. H.; Lee, J.; Kim, J.; Ju, M. J.; Kim, H. K., Thieno[3,2-13][1]Benzothiophene Derivative as a New Π-Bridge Unit in D-Π-a Structural Organic Sensitizers with over 10.47% Efficiency for Dye-Sensitized Solar Cells. Advanced Energy Materials 2015, 5, n/a-n/a.
(37) Feldt, S.; Gibson, E. A.; Gabrielsson, E.; Sun, S.; Boschloo, G.; Hagfeldt, A., Design of Organic Dyes and Cobalt Polypyridine Redox Mediators for High-Efficiency Dye-Sensitized Solar Cells. Journal of the American Chemical Society 2010, 132, 16714-16724.
(38) Yum, J.-H.; Baranoff, E.; Kessler, F.; Moehl, T.; Ahmad, S.; Bessho, T.; Marchioro, A.; Ghadiri, E.; Moser, J.-E.; Yi, C.; Nazeeruddin, M. K.; Gratzel, M., A Cobalt Complex Redox Shuttle for Dye-Sensitized Solar Cells with High Open-Circuit Potentials. Nat Commun 2012, 3, 631
(39) Boschloo, G.; Haggman, L.; Hagfeldt, A., Quantification of the Effect of 4-Tert-Butylpyridine Addition to 1-/I3-Redox Electrolytes in Dye-Sensitized Nanostructured Tio2 Solar Cells. The Journal of Physical Chemistry B 2006, 110, 13144-13150.
(40) Koops, S. E.; OKTmRegan, B. C.; Barnes, P. R. F.; Durrant, J. R., Parameters Influencing the Efficiency of Electron Injection in Dye-Sensitized Solar Cells, Journal of the American Chemical Society 2009, 131, 4808-4818.
(41) Schlichthorl, G.; Huang, S. Y.; Sprague, J.; Frank, A. J., Band Edge Movement and Recombination Kinetics in Dye-Sensitized Nanocrystalline Tio2 Solar Cells: A Study by Intensity Modulated Photovoltage Spectroscopy. The Journal of Physical Chemistry B 1997, 101, 8141-8155.
(42) Sewvandi, G. A.; Tao, Z.; Kusunose, T.; Tanaka, Y; Nakanishi, S.; Feng, Q., Modification of $TiO_2$ Electrode with Organic Silane Interposed Layer for High-Performance of Dye-Sensitized Solar Cells. ACS Applied Materials & Interfaces 2014, 6, 5818-5826.
(43) Cong, J.; Kinschel, D.; Daniel, Q.; Safdari, M.; Gabrielsson, E.; Chen, H.; Svensson, P. H.; Sun, L.; Kloo, L., Bis(1,1-Bis(2-PyridypEthane)Copper(1/Ii) as an Efficient Redox Couple for Liquid Dye-Sensitized Solar Cells. Journal of Materials Chemistry A 2016, 4, 14550-14554.
(44) Shavaleev, N. M.; Scopelliti, R.; Gratzel, M.; Nazeeruddin, M. K. Inorganica Chimica Acta 2013, 404, 210.
(45) Feldt, S.; Gibson, E. A.; Gabrielsson, E.; Sun, S.; Boschloo, G.; Hagfeldt, A. Journal of the American Chemical Society 2010, 132, 16714.
(46) Cheema, H.; Delcamp, J. H. ACS Applied Materials & Interfaces 2017, 9, 3050.
(47) Yum, J. H.; Baranoff, E.; Kessler, F.; Moehl, T.; Ahmad, S.; Bessho, T.; Marchioro, A.; Ghadiri, E.; Moser, J. E.; Yi, C.; Nazeeruddin, M. K.; Gratzel, M. Nature Communications 2012, 3, 631.
(48) Zhang, X.; Xu, Y.; Giordano, F.; Schreier, M.; Pellet, N.; Hu, Y.; Yi, C.; Robertson, N.; Hua, J.; Zakeeruddin, S.

M.; Tian, H.; Gratzel, M. Journal of the American Chemical Society 2016, 138, 10742.
(49) Gabrielsson, E.; Ellis, H.; Feldt, S.; Tian, H.; Boschloo, G.; Hagfeldt, A.; Sun, L. Advanced Energy Materials 2013, 3, 1647.
(50) Schreier, M.; Curvat, L.; Giordano, F.; Steier, L.; Abate, A.; Zakeeruddin, S. M.; Luo, J.; Mayer, M. T.; Gratzel, M. Nat Commun 2015, 6, 7326.
(51) Chen, Y.; Li, C. W.; Kanan, M. W. Journal of the American Chemical Society 2012, 134, 19969.
(52) Olah, G. A. *Angew. Chem., Int. Ed.* 2005, 44, 2636.
(53) Chu, S.; Majumdar, A. *Nature* 2012, 488, 294.
(54) Turner, J. A. *Science* 2004, 305, 972.
(55) Lewis, N. S.; Nocera, D. G. *Proc. Natl. Acad. Sci. U.S.A.* 2006, 103, 15729.
(56) Luo, J.; Im, J. H.; Mayer, M. T.; Schreier, M.; Nazeeruddin, M. K.; Park, N. G.; Tilley, S. D.; Fan, H. J.; Gratzel, M. *Science* 2014, 345, 1593.
(57) Arashiba, K.; Miyake, Y.; Nishibayashi, Y. *Nat. Chem.* 2011, 3, 120.
(58) Joya, K. S.; Joya, Y. F.; Ocakoglu, K.; van de Krol, R. *Angew. Chem., Int. Ed.* 2013, 52, 10426.
(59) Schreier, M.; Curvat, L.; Giordano, F.; Steier, L.; Abate, A.; Zakeeruddin, S. M.; Luo, J.; Mayer, M. T.; Gratzel, M. *Nat. Commun.* 2015, 6, 7326.
(60) Seh, Z. W.; Kibsgaard, J.; Dickens, C. F.; Chorkendorff, I.; Norskov, J. K.; Jaramillo, T. F. *Science* 2017, 355, eaad4998.
(61) Ager, J. W.; Shaner, M. R.; Walczak, K. A.; Sharp, I. D.; Ardo, S. *Energy Environ. Sci.* 2015, 8, 2811.
(62) Sherman, B. D.; Bergkamp, J. J.; Brown, C. L.; Moore, A. L.; Gust, D.; Moore, T. A. *Energy Environ. Sci.* 2016, 9, 1812.
(63) Jia, J.; Seitz, L. C.; Benck, J. D.; Huo, Y.; Chen, Y.; Ng, J. W. D.; Bilir, T.; Harris, J. S.; Jaramillo, T. F. *Nat. Commun.* 2016, 7, 13237.
(64) Kakiage, K.; Osada, H.; Aoyama, Y.; Yano, T.; Oya, K.; Iwamoto, S.; Fujisawa, J. I.; Hanaya, M. *Sci. Rep.* 2016, 6, 35888.
(65) Kakiage, K.; Tokutome, T.; Iwamoto, S.; Kyomen, T.; Hanaya, M. *Chem. Commun.* 2013, 49, 179.
(66) Yella, A.; Lee, H. W.; Tsao, H. N.; Yi, C.; Chandiran, A. K.; Nazeeruddin, M. K.; Diau, E. W.; Yeh, C. Y.; Zakeeruddin, S. M.; Gratzel, M. *Science* 2011, 334, 629.
(67) Yum, J. H.; Baranoff, E.; Kessler, F.; Moehl, T.; Ahmad, S.; Bessho, T.; Marchioro, A.; Ghadiri, E.; Moser, J. E.; Yi, C.; Nazeeruddin, M. K.; Gratzel, M. *Nat. Commun.* 2012, 3, 631.
(68) Ozawa, H.; Sugiura, T.; Kuroda, T.; Nozawa, K.; Arakawa, H. *J. Mater. Chem. A* 2016, 4, 1762.
(69) Kakiage, K.; Aoyama, Y.; Yano, T.; Oya, K.; Fujisawa, J.-i.; Hanaya, M. *Chem. Commun.* 2015, 51, 15894.
(70) Kang, S. H.; Jeong, M. J.; Eom, Y. K.; Choi, I. T.; Kwon, S. M.; Yoo, Y.; Kim, J.; Kwon, J.; Park, J. H.; Kim, H. K. *Adv. Energy Mater.* 2016, 1602117.
(71) Kwon, J.; Im, M. J.; Kim, C. U.; Won, S. H.; Kang, S. B.; Kang, S. H.; Choi, I. T.; Kim, H. K.; Kim, I. H.; Park, J. H.; Choi, K. J. *Energy Environ. Sci.* 2016, 9, 3657.
(72) Bin, A. R.; Yusoff, M.; Jang, J. *Chem. Commun.* 2016, 52, 5824.
(73) Ito, S.; Dharmadasa, I.; Tolan, G.; Roberts, J.; Hill, G.; Miura, H.; Yum, J.-H.; Pechy, P.; Liska, P.; Comte, P. *Solar Energy* 2011, 85, 1220.
(74) Bruder, I.; Karlsson, M.; Eickemeyer, F.; Hwang, J.; Erk, P.; Hagfeldt, A.; Weis, J.; Pschirer, N. *Sol. Energ. Mat. Sol. Cells* 2009, 93, 1896.
(75) Yamaguchi, T.; Uchida, Y.; Agatsuma, S.; Arakawa, H. *Sol. Energ. Mat. Sol. Cells* 2009, 93, 733.
(76) Yanagida, M.; Onozawa-Komatsuzaki, N.; Kurashige, M.; Sayama, K.; Sugihara, H. *Sol. Energ. Mat. Sol. Cells* 2010, 94, 297.
(77) Jeong, W.-S.; Lee, J.-W.; Jung, S.; Yun, J. H.; Park, N.-G. *Sol. Energ. Mat. Sol. Cells* 2011, 95, 3419.
(78) Chen, B.; Zheng, X.; Bai, Y.; Padture, N. P.; Huang, J. *Adv. Energy Mater.* 2017.
(79) Sullivan, P.; Schumann, S.; Da Campo, R.; Howells, T.; Duraud, A.; Shipman, M.; Hatton, R. A.; Jones, T. S. *Adv. Energy Mater.* 2013, 3, 239.
(80) Chandiran, A. K.; Tetreault, N.; Humphry-Baker, R.; Kessler, F.; Baranoff, E.; Yi, C.; Nazeeruddin, M. K.; Grätzel, M. *Nano Lett.* 2012, 12, 3941.
(81) Yum, J.-H.; Moehl, T.; Yoon, J.; Chandiran, A. K.; Kessler, F.; Gratia, P.; Grätzel, M. *J. Phys. Chem. C* 2014, 118, 16799.
(82) Feldt, S. M.; Lohse, P. W.; Kessler, F.; Nazeeruddin, M. K.; Gratzel, M.; Boschloo, G.; Hagfeldt, A. *Phys. Chem. Chem. Phys.* 2013, 15, 7087.
(83) Safdari, M.; Lohse, P. W.; Haggman, L.; Frykstrand, S.; Hogberg, D.; Rutland, M.; Asencio, R. A.; Gardner, J.; Kloo, L.; Hagfeldt, A.; Boschloo, G. *RSC Adv.* 2016, 6, 56580.
(84) Pashaei, B.; Shahroosvand, H.; Abbasi, P. *RSC Adv.* 2015, 5, 94814.
(85) Eom, Y. K.; Choi, I. T.; Kang, S. H.; Lee, J.; Kim, J.; Ju, M. J.; Kim, H. K. *Adv. Energy Mater.* 2015, 5, n/a.
(86) Feldt, S.; Gibson, E. A.; Gabrielsson, E.; Sun, S.; Boschloo, G.; Hagfeldt, A. *J. Am. Chem. Soc.* 2010, 132, 16714.
(87) Yum, J.-H.; Baranoff, E.; Kessler, F.; Moehl, T.; Ahmad, S.; Bessho, T.; Marchioro, A.; Ghadiri, E.; Moser, J.-E.; Yi, C.; Nazeeruddin, M. K.; Grätzel, M. *Nat. Commun.* 2012, 3, 631.
(88) Cheema, H.; Delcamp, J. H. *ACS Appl. Mater. Interfaces* 2017, 9, 3050.
(89) Sewvandi, G. A.; Tao, Z.; Kusunose, T.; Tanaka, Y.; Nakanishi, S.; Feng, Q. *ACS Appl. Mater. Interfaces* 2014, 6, 5818.
(90) Wooh, S.; Kim, T.-Y.; Song, D.; Lee, Y.-G.; Lee, T. K.; Bergmann, V. W.; Weber, S. A. L.; Bisquert, J.; Kang, Y. S.; Char, K. *ACS Appl. Mater. Interfaces* 2015, 7, 25741.
(91) Tsao, H. N.; Comte, P.; Yi, C.; Grätzel, M. *Phys. Chem. Chem. Phys.* 2012, 13, 2976.
(92) Heiniger, L. P.; Giordano, F.; Moehl, T.; Grätzel, M. *Adv. Energy Mater.* 2014, 4.
(93) Miyashita, M.; Sunahara, K.; Nishikawa, T.; Uemura, Y.; Koumura, N.; Hara, K.; Mori, A.; Abe, T.; Suzuki, E.; Mori, S. *J. Am. Chem. Soc.* 2008, 130, 17874.
(94) Dualeh, A.; Delcamp, J. H.; Nazeeruddin, M. K.; Grätzel, M. *Appl. Phys. Lett.* 2012, 100, 173512.
(95) Mosconi, E.; Yum, J.-H.; Kessler, F.; Gómez Garcia, C. J.; Zuccaccia, C.; Cinti, A.; Nazeeruddin, M. K.; Grätzel, M.; De Angelis, F. *J. Am. Chem. Soc.* 2012, 134, 19438.
(96) Rongé, J.; Bosserez, T.; Martel, D.; Nervi, C.; Boarino, L.; Taulelle, F.; Decher, G.; Bordiga, S.; Martens, J. A. *Chem. Soc. Rev.* 2014, 43, 7963.
(97) Sathre, R.; Greenblatt, J. B.; Walczak, K.; Sharp, I. D.; Stevens, J. C.; Ager, J. W.; Houle, F. A. *Energy. Environ. Sci.* 2016, 9, 803.
(98) Zhou, H.; Yan, R.; Zhang, D.; Fan, T. *Chem. Eur. J.* 2016, 22, 9870.
(99) Winkler, M. T.; Cox, C. R.; Nocera, D. G.; Buonassisi, T. *Proc. Natl. Acad. Sci. U.S.A.* 2013, 110, E1076.

(100) Chen, Y.; Li, C. W.; Kanan, M. W. *J. Am. Chem. Soc.* 2012, 134, 19969.
(101) Xiang, W.; Huang, W.; Bach, U.; Spiccia, L. *Chem. Commun.* 2013, 49, 8997.
(102) Yum, J.-H.; Baranoff, E.; Kessler, F.; Moehl, T.; Ahmad, S.; Bessho, T.; Marchioro, A.; Ghadiri, E.; Moser, J.-E.; Yi, C.; Nazeeruddin, M. K.; Grätzel, M. *Nat Commun* 2012, 3, 631.
(103) Shavaleev, N. M.; Scopelliti, R.; Grätzel, M.; Nazeeruddin, M. K. *Inorganica Chimica Acta* 2013, 404, 210.
(104) Feldt, S.; Gibson, E. A.; Gabrielsson, E.; Sun, S.; Boschloo, G.; Hagfeldt, A. *Journal of the American Chemical Society* 2010, 132, 16714.
(105) Cheema, H.; Delcamp, J. H. *ACS Applied Materials & Interfaces* 2017, 9, 3050.
(106) Yum, J. H.; Baranoff, E.; Kessler, F.; Moehl, T.; Ahmad, S.; Bessho, T.; Marchioro, A.; Ghadiri, E.; Moser, J. E.; Yi, C.; Nazeeruddin, M. K.; Gratzel, M. *Nature Communications* 2012, 3, 631.
(107) Cong, J.; Kinschel, D.; Daniel, Q.; Safdari, M.; Gabrielsson, E.; Chen, H.; Svensson, P. H.; Sun, L.; Kloo, L. *Journal of Materials Chemistry A* 2016, 4, 14550.
(108) Zhang, X.; Xu, Y.; Giordano, F.; Schreier, M.; Pellet, N.; Hu, Y.; Yi, C.; Robertson, N.; Hua, J.; Zakeeruddin, S. M.; Tian, H.; Grätzel, M. *Journal of the American Chemical Society* 2016, 138, 10742.
(109) Gabrielsson, E.; Ellis, H.; Feldt, S.; Tian, H.; Boschloo, G.; Hagfeldt, A.; Sun, L. *Advanced Energy Materials* 2013, 3, 1647.
(110) Huckaba, A. J.; Yella, A.; Brogdon, P.; Scott Murphy, J.; Nazeeruddin, M. K.; Grätzel, M.; Delcamp, J. H. *Chemical Communications* 2016.
(111) Cheema, H.; Islam, A.; Han, L.; El-Shafei, A. *ACS Applied Materials & Interfaces* 2014, 6, 11617.
(112) Feldt, S. M.; Lohse, P. W.; Kessler, F.; Nazeeruddin, M. K.; Gratzel, M.; Boschloo, G.; Hagfeldt, A. *Physical Chemistry Chemical Physics* 2013, 15, 7087.
(113) Schreier, M.; Curvat, L.; Giordano, F.; Steier, L.; Abate, A.; Zakeeruddin, S. M.; Luo, J.; Mayer, M. T.; Gratzel, M. *Nat Commun* 2015, 6, 7326.
(114) Chen, Y.; Li, C. W.; Kanan, M. W. *Journal of the American Chemical Society* 2012, 134, 19969.
(115) J. A. Turner, *Science,* 2004, 305, 972-974.
(116) J. Turner, G. Sverdrup, M. K. Mann, P. C. Maness, B. Kroposki, M. Ghirardi, R. J. Evans and D. Blake, *International journal of energy research,* 2008, 32, 379-407.
(117) J. H. Montoya, L. C. Seitz, P. Chakthranont, A. Vojvodic, T. F. Jaramillo and J. K. Nørskov, *Nature Materials,* 2017, 16, 70-81.
(118) J. H. Kim, D. Hansora, P. Sharma, J.-W. Jang and J. S. Lee, *Chemical Society Reviews,* 2019, 48, 1908-1971.
(119) H. Zhou, R. Yan, D. Zhang and T. Fan, *Chemistry-A European Journal,* 2016, 22, 9870-9885.
(120) S. Yun, Y. Qin, A. R. Uhl, N. Vlachopoulos, M. Yin, D. Li, X. Han and A. Hagfeldt, *Energy & Environmental Science,* 2018, 11, 476-526.
(121) A. Polman, M. Knight, E. C. Garnett, B. Ehrler and W. C. Sinke, *Science,* 2016, 352, aad4424-aad4424.
(122) D. M. Chapin, C. Fuller and G. Pearson, *Journal of Applied Physics,* 1954, 25, 676-677.
(123) K. Yoshikawa, H. Kawasaki, W. Yoshida, T. Irie, K. Konishi, K. Nakano, T. Uto, D. Adachi, M. Kanematsu and H. Uzu, *Nature Energy,* 2017, 2, 17032.
(124) M. A. Green, *Progress in Photovoltaics: Research and Applications,* 2017, 25, 333-334.
(125) C. Grätzel and S. M. Zakeeruddin, *Materials Today,* 2013, 16, 11-18.
(126) S. Mathew, A. Yella, P. Gao, R. Humphry-Baker, B. F. Curchod, N. Ashari-Astani, I. Tavernelli, U. Rothlisberger, M. K. Nazeeruddin and M. Gratzel, *Nature Chemistry,* 2014, 6, 242-247.
(127) M. Grätzel, *Accounts of chemical research,* 2017, 50, 487-491.
(128) X. Li, D. Bi, C. Yi, J.-D. Décoppet, J. Luo, S. M. Zakeeruddin, A. Hagfeldt and M. Grätzel, *Science,* 2016, 353, 58-62.
(129) B. O'Regan and M. Grätzel, *Nature,* 1991, 353, 737-740.
(130) A. Hagfeldt, G. Boschloo, L. Sun, L. Kloo and H. Pettersson, *Chemical reviews,* 2010, 110, 6595-6663.
(140) H.-G. Han, H. C. Weerasinghe, K. Min Kim, J. Soo Kim, Y.-B. Cheng, D. J. Jones, A. B. Holmes and T.-H. Kwon, *Scientific Reports,* 2015, 5, 14645.
(141) A. Fakharuddin, R. Jose, T. M. Brown, F. Fabregat-Santiago and J. Bisquert, *Energy &Environmental Science,* 2014, 7, 3952-3981.
(142) Y. Ren, D. Sun, Y. Cao, H. N. Tsao, Y. Yuan, S. M. Zakeeruddin, P. Wang and M. Grätzel, *Journal of the American Chemical Society,* 2018, 140, 2405-2408.
(143) S. Yoon, S. Tak, J. Kim, Y. Jun, K. Kang and J. Park, *Building and Environment,* 2011, 46, 1899-1904.
(144) S. Ahmad, E. Guillen, L. Kavan, M. Gratzel and M. K. Nazeeruddin, *Energy & Environmental Science,* 2013, 6, 3439-3466.
(145) T. Kinoshita, K. Nonomura, N. Joong Jeon, F. Giordano, A. Abate, S. Uchida, T. Kubo, S. I. Seok, M. K. Nazeeruddin, A. Hagfeldt, M. Gratzel and H. Segawa, *Nature Communications,* 2015, 6, 8834.
(146) P. K. Nayak, J. Bisquert and D. Cahen, *Advanced materials,* 2011, 23, 2870-2876.
(147) J. Luo, J. H. Im, M. T. Mayer, M. Schreier, M. K. Nazeeruddin, N. G. Park, S. D. Tilley, H. J. Fan and M. Gratzel, *Science,* 2014, 345, 1593-1596.
(148) M. Schreier, L. Curvat, F. Giordano, L. Steier, A. Abate, S. M. Zakeeruddin, J. Luo, M. T. Mayer and M. Gratzel, *Nat Commun,* 2015, 6, 7326.
(149) A. R. Bin, M. Yusoff and J. Jang, *Chemical Communications,* 2016, 52, 5824-5827.
(150) T. Yamaguchi, Y. Uchida, S. Agatsuma and H. Arakawa, *Solar Energy Materials and Solar Cells,* 2009, 93, 733-736.
(151) S. H. Kang, M. J. Jeong, Y. K. Eom, I. T. Choi, S. M. Kwon, Y. Yoo, J. Kim, J. Kwon, J. H. Park and H. K. Kim, *Advanced Energy Materials,* 2017, 7, 1602117.
(152) H. Ozawa, T. Sugiura, T. Kuroda, K. Nozawa and H. Arakawa, *Journal of Materials Chemistry A,* 2016, 4, 1762-1770.
(153) K. Kakiage, Y. Aoyama, T. Yano, K. Oya, J.-i. Fujisawa and M. Hanaya, *Chemical Communications,* 2015, 51, 15894-15897.
(154) S. H. Kang, M. J. Jeong, Y. K. Eom, I. T. Choi, S. M. Kwon, Y. Yoo, J. Kim, J. Kwon, J. H. Park and H. K. Kim, *Advanced Energy Materials,* 2016, 1602117-n/a.
(155) J. Kwon, M. J. Im, C. U. Kim, S. H. Won, S. B. Kang, S. H. Kang, I. T. Choi, H. K. Kim, I. H. Kim, J. H. Park and K. J. Choi, *Energy & Environmental Science,* 2016, 9, 3657-3665.
(156) H. Cheema, R. R. Rodrigues and J. H. Delcamp, *Energy & Environmental Science,* 2017, 10, 1764-1769.
(157) R. R. Rodrigues, H. Cheema and J. H. Delcamp, *Angewandte Chemie International Edition,* 2018, 57, 5472-5476.
(158) H. Cheema and J. H. Delcamp, *Advanced Energy Materials,* 2019, 9, 1900162.

(159) T. Kinoshita, J. T. Dy, S. Uchida, T. Kubo and H. Segawa, *Nat Photon*, 2013, 7, 535-539.
(160) J. H. Yum, E. Baranoff, F. Kessler, T. Moehl, S. Ahmad, T. Bessho, A. Marchioro, E. Ghadiri, J. E. Moser, C. Yi, M. K. Nazeeruddin and M. Gratzel, *Nature Communications*, 2012, 3, 631.
(161) C. Teng, X. Yang, S. Li, M. Cheng, A. Hagfeldt, L. Z. Wu and L. Sun, *Chem. Eur. J.*, 2010, 16, 13127-13138.
(162) K. Kakiage, H. Osada, Y. Aoyama, T. Yano, K. Oya, S. Iwamoto, J. I. Fujisawa and M. Hanaya, *Scientific Reports*, 2016, 6, 35888.
(163) K. Kakiage, T. Tokutome, S. Iwamoto, T. Kyomen and M. Hanaya, *Chemical Communications*, 2013, 49, 179-180.
(164) N. S. Lewis, *Science*, 2007, 315, 798-801.
(165) J. J. Concepcion, R. L. House, J. M. Papanikolas and T. J. Meyer, *Proceedings of the National Academy of Sciences*, 2012, 109, 15560-15564.
(166) S. Ito, I. M. Dharmadasa, G. J. Tolan, J. S. Roberts, G. Hill, H. Miura, J. H. Yum, P. Pechy, P. Liska, P. Comte and M. Grätzel, *Solar Energy*, 2011, 85, 1220-1225.
(167) P. Liska, K. Thampi, M. Grätzel, D. Bremaud, D. Rudmann, H. Upadhyaya and A. Tiwari, *Applied Physics Letters*, 2006, 88, 203103.
(168) M. Liang and J. Chen, *Chemical Society Reviews*, 2013, 42, 3453-3488.
(169) A. Mishra, M. K. Fischer and P. Bauerle, *Angewandte Chemie International Edition in English*, 2009, 48, 2474-2499.
(170) P. Brogdon, H. Cheema and J. H. Delcamp, *ChemSusChem*, 2018, 11, 86-103.
(171) E. Moon, I. Lee, D. Blaauw and J. D. Phillips, *Progress in Photovoltaics: Research and Applications*, 2019.
(172) C. Y. Chen, M. Wang, J. Y. Li, N. Pootrakulchote, L. Alibabaei, C. H. Ngoc-le, J. D. Decoppet, J. H. Tsai, C. Gratzel, C. G. Wu, S. M. Zakeeruddin and M. Gratzel, *ACS Nano*, 2009, 3, 3103-3109.
(173) H. Ozawa, M. Awa, T. Ono and H. Arakawa, *Chemistry—An Asian Journal*, 2012, 7, 156-162.
(174) T. A. Heimer, E. J. Heilweil, C. A. Bignozzi and G. J. Meyer, *The Journal of Physical Chemistry A*, 2000, 104, 4256-4262.
(175) J. R. Jennings and Q. Wang, *The Journal of Physical Chemistry C*, 2010, 114, 1715-1724.
(176) S. Y. Chae, S. J. Park, O.-S. Joo, Y. Jun, B. K. Min and Y. J. Hwang, *Scientific Reports*, 2016, 6.
(177) A. Peddapuram, H. Cheema, R. E. Adams, R. H. Schmehl and J. H. Delcamp, *The Journal of Physical Chemistry C*, 2017, 121, 8770-8780.
(178) M. Freitag, J. Teuscher, Y. Saygili, X. Zhang, F. Giordano, P. Liska, J. Hua, S. M. Zakeeruddin, J.-E. Moser, M. Grätzel and A. Hagfeldt, *Nat Photon*, 2017, 11, 372-378.

What is claimed is:

1. A sequential series multijunction dye-sensitized solar cell comprising:
a first subcell, a second subcell, and a third subcell mechanically stacked and connected in series, each of the subcells comprising;
a glass substrate coated with a transparent conductive film;
a dye-sensitized active layer; and
a redox shuttle;
wherein the dye-sensitized active layer of at least the first subcell is sensitized with a dye comprising
an electron deficient acceptor moiety;
a medium electron density π-bridge moiety; and
an electron rich donor moiety comprising a biaryl, a substituted biaryl, or a moiety having the following structure:

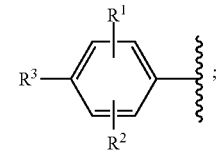

wherein each of $R^1$, $R^2$, and $R^3$ independently comprises H, aryl, multiaryl, alkyl substituted aryl, alkoxy substituted aryl, alkyl substituted multiaryl, alkoxy substituted multiaryl, $OR^4$, $N(R^5)_2$, or a combination thereof;
wherein each $R^4$ independently comprises H, alkyl, aryl, alkyl substituted aryl, alkoxy substituted aryl, or a combination thereof; and
wherein each $R^5$ independently comprises aryl, multiaryl, alkyl substituted aryl, alkoxy substituted aryl, alkyl substituted multiaryl, alkoxy substituted multiaryl, or a combination thereof.

2. The dye-sensitized solar cell of claim 1, further comprising a UV cutoff filter.

3. The dye-sensitized solar cell of claim 1, wherein the dye-sensitized active layer of the first subcell has a thickness of between 0.8 and 3.0 μm.

4. The dye-sensitized solar cell of claim 3, wherein the dye-sensitized active layer of the second subcell has a thickness of between 1.5 and 5.0 μm.

5. The dye-sensitized solar cell of claim 1, further comprising an antireflective coating applied over a non-conductive side of at least one of a photoanode and a cathode of one or more of the dye-sensitized solar cells.

6. The dye-sensitized solar cell of claim 1, further comprising an immersion oil positioned between at least two of the subcells.

7. The dye-sensitized solar cell of claim 1, wherein the dye-sensitized active layer of the first subcell is sensitized with a dye comprising:

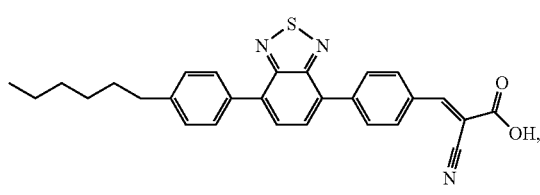

CC1

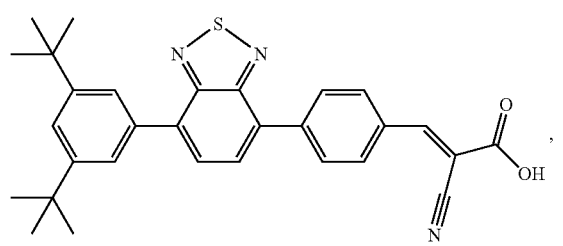

CC2

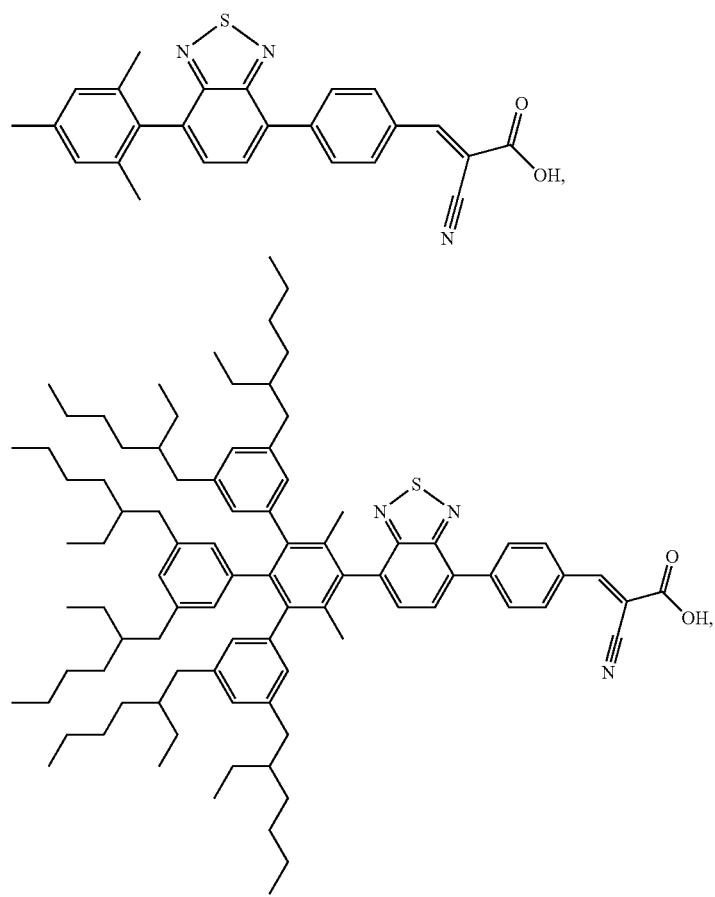
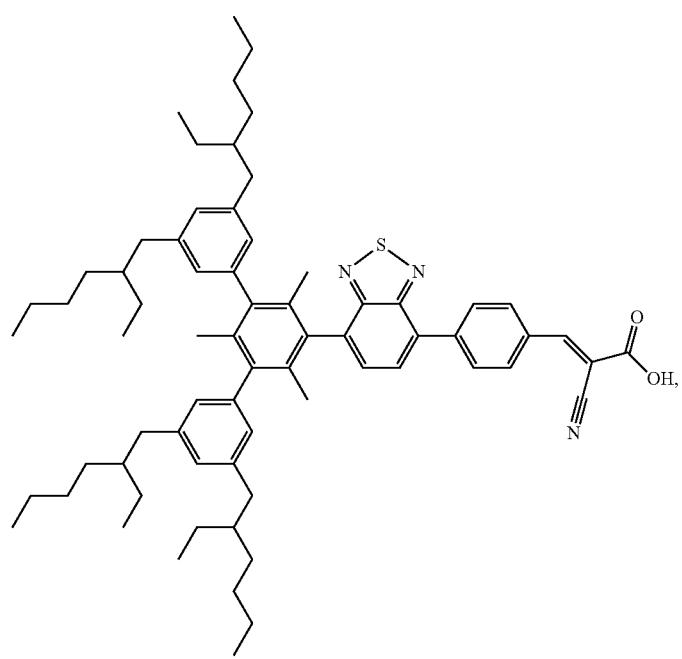
CC3

-continued
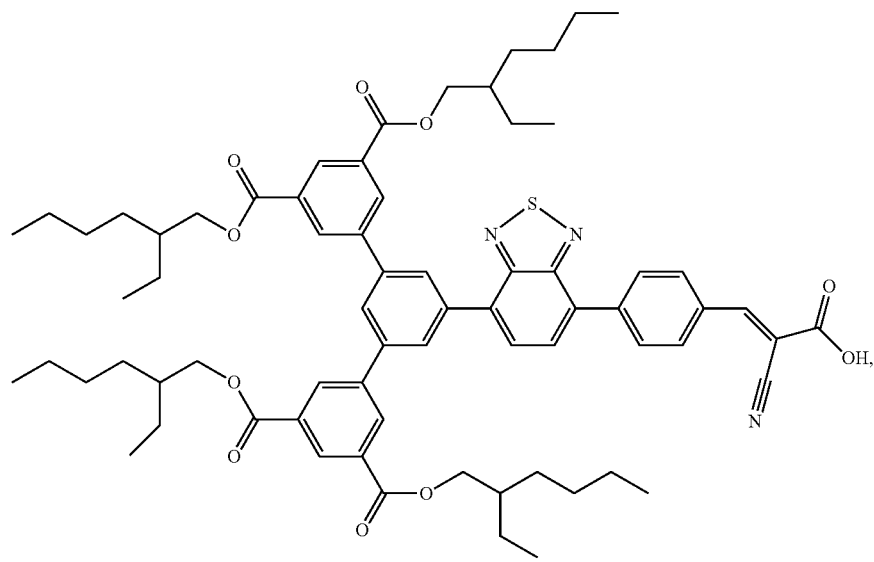
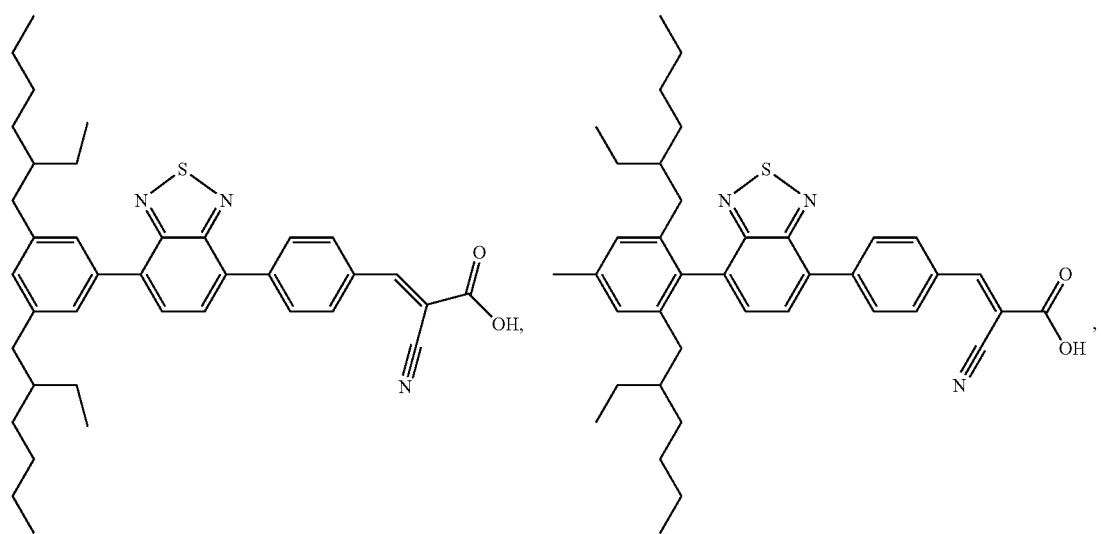
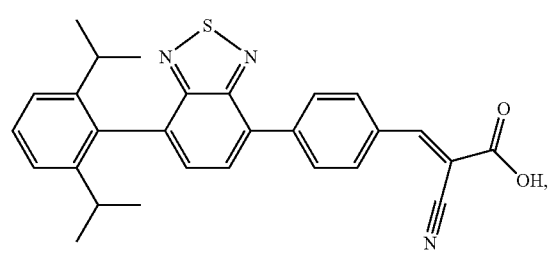

-continued
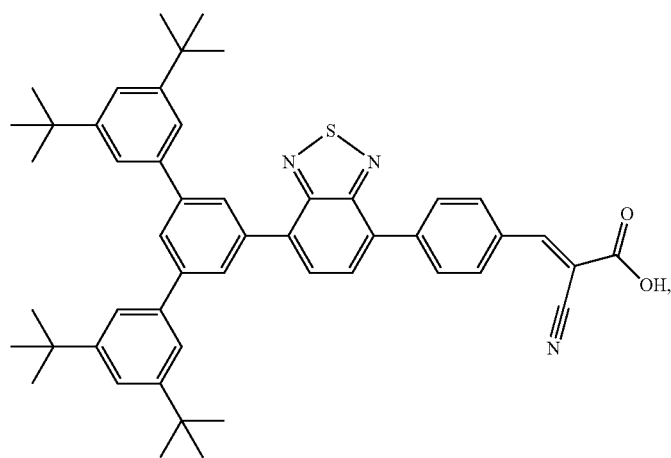
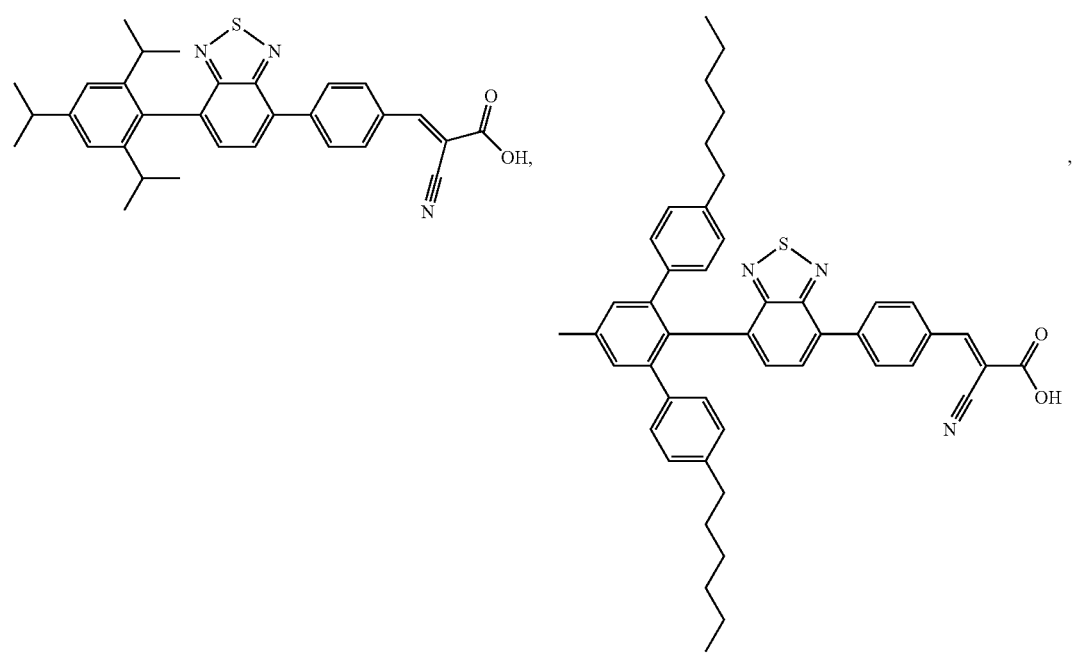
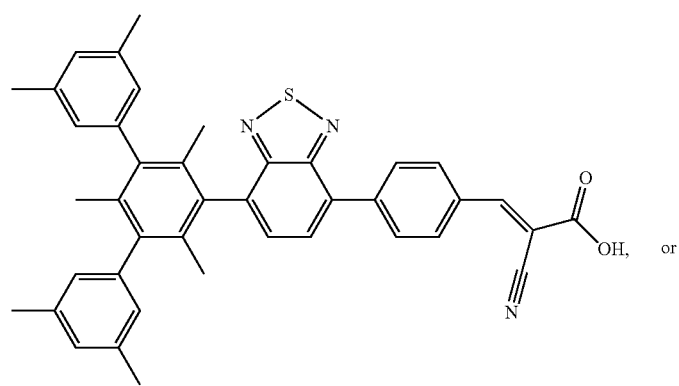, or

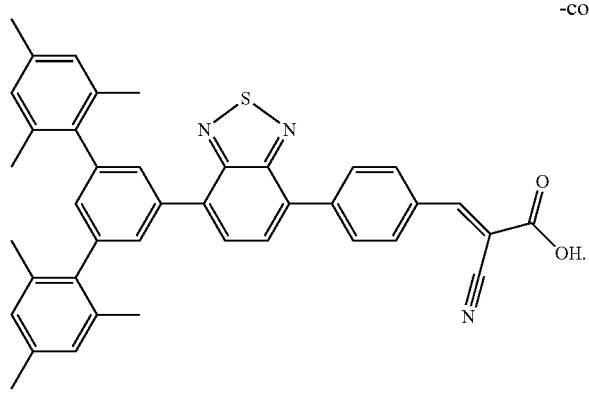

8. The dye-sensitized solar cell of claim 1, wherein the dye-sensitized active layer of at least the first and second subcells is sensitized with a dye comprising D35, B11, Y123, or Black Dye.

9. The dye-sensitized solar cell of claim 1, wherein the dye-sensitized active layer of each of the subcells is sensitized with a dye comprising D35, B11, Y123, or Black Dye.

10. A sequential series multijunction dye-sensitized solar cell comprising:
   at least two dye-sensitized subcells mechanically stacked and connected in series, each of the subcells comprising;
      a glass substrate coated with a transparent conductive;
      a dye-sensitized active layer; and
      a redox shuttle; and
   at least one additional subcell mechanically stacked and connected in series;
   wherein the at least one additional subcell is an inorganic solar cell.

11. The dye-sensitized solar cell of claim 10, wherein the dye-sensitized active layer of the first subcell has a thickness of between 0.8 and 3.0 μm.

12. The dye-sensitized solar cell of claim 11, wherein the dye-sensitized active layer of the second subcell has a thickness of between 1.5 and 5.0 μm.

13. The dye-sensitized solar cell of claim 1, wherein the dye-sensitized active layer is sensitized with D35, B11, Y123, or Black Dye.

14. The dye-sensitized solar cell of claim 1, wherein the donor moiety comprises:

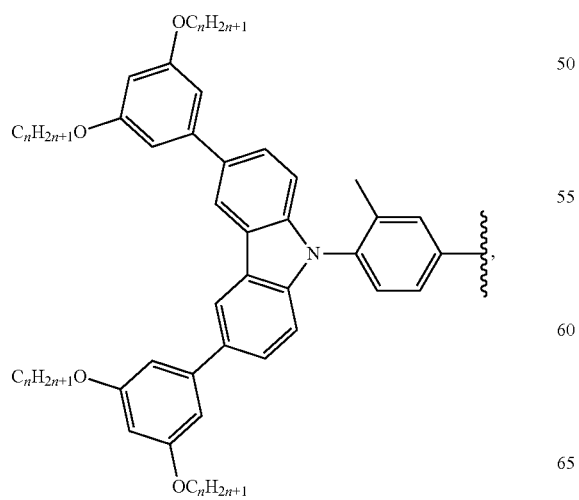

-continued

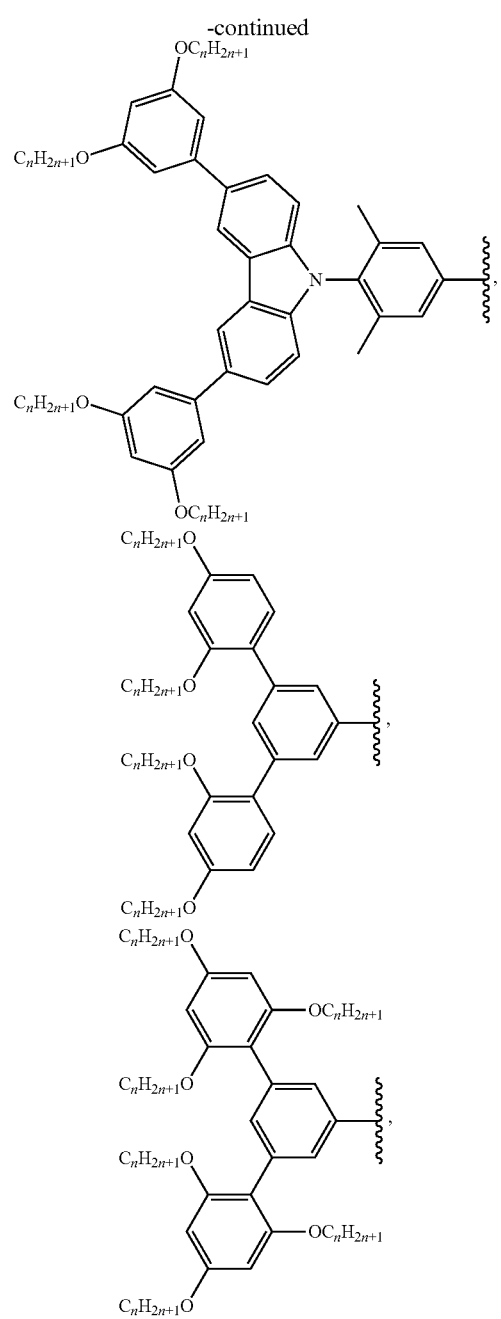

-continued

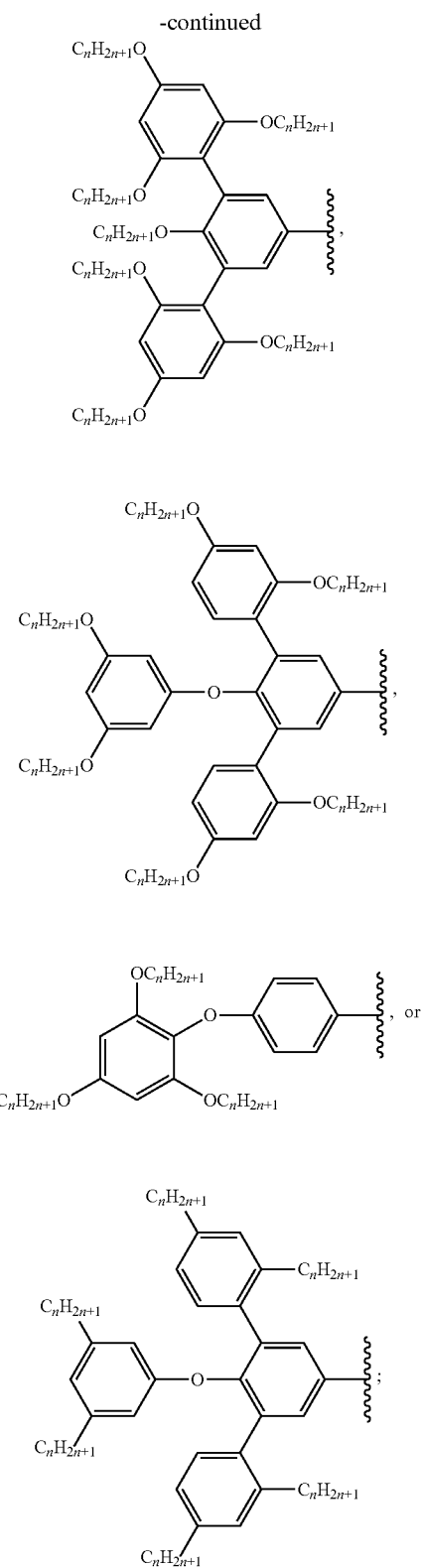

and
  wherein n is between 1 and 30.

15. The dye-sensitized solar cell of claim 1, wherein the substituted biaryl comprises an alkyl or alkoxy substituted biaryl.

16. The dye-sensitized solar cell of claim 15, wherein the alkyl substituted biaryl comprises the structure:

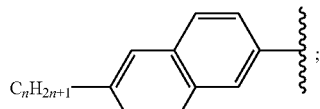

and
  wherein n is between 1 and 30.

17. The dye-sensitized solar cell of claim 15, wherein the alkoxy substituted biaryl comprises the structure:

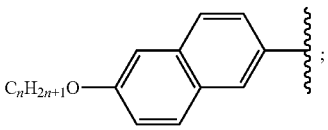

and
  wherein n is between 1 and 30.

18. The dye-sensitized solar cell of claim 1, wherein the 7-bridge moiety comprises:

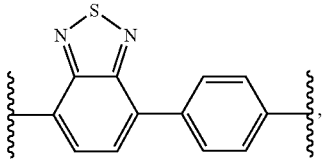

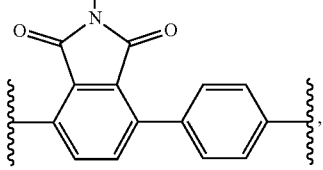

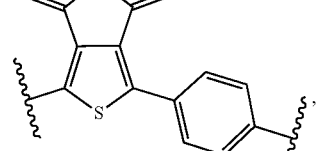

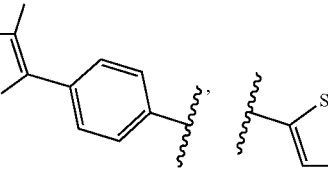

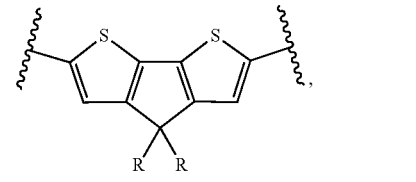

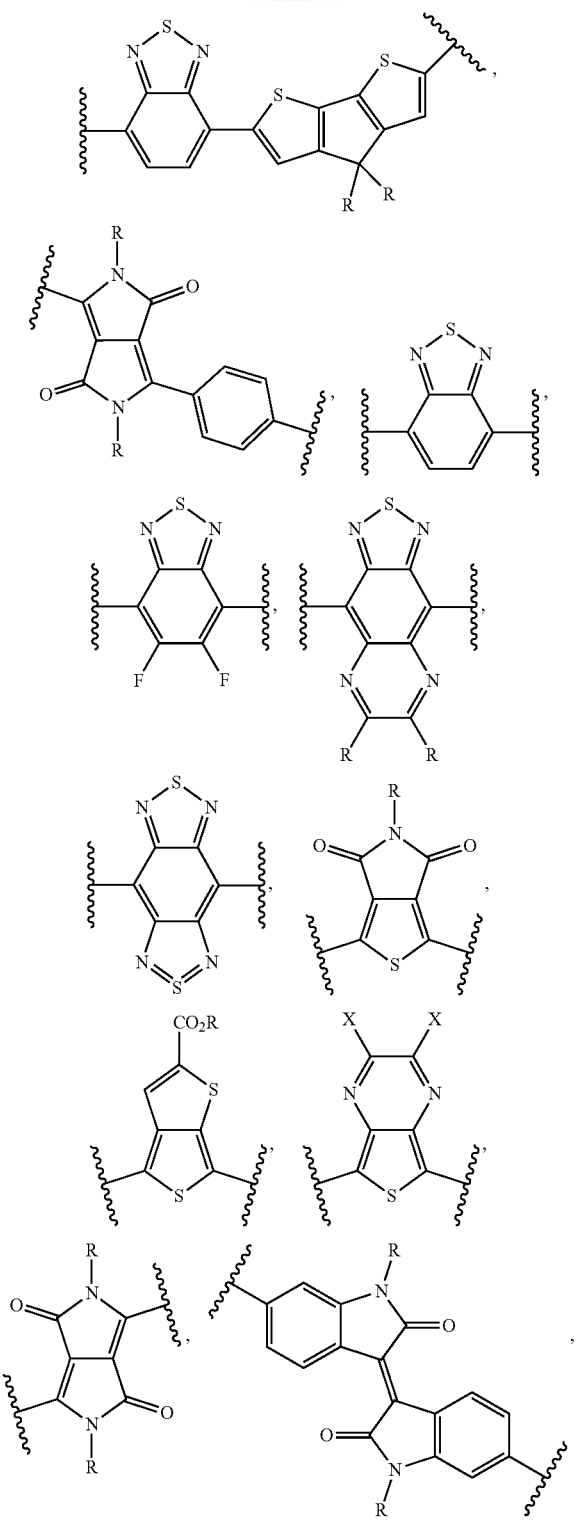

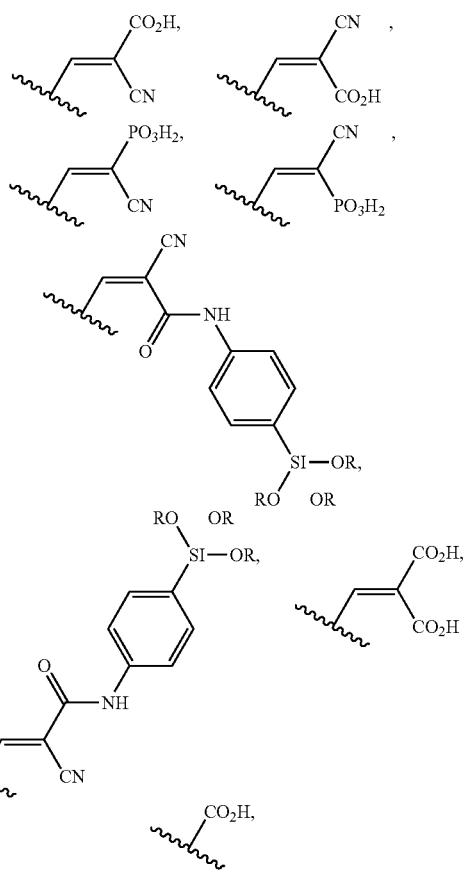

or derivatives thereof;
wherein each X independently comprises H, F, CN, or CO$_2$R; and
wherein each R independently comprises H, alkyl, aryl, alkyl substituted aryl, alkoxy substituted aryl, or a combination thereof.

19. The dye-sensitized solar cell of claim 1, wherein the acceptor moiety comprises:

or derivatives thereof; and
wherein each R independently comprises H, alkyl, aryl, alkyl substituted aryl, alkoxy substituted aryl, or a combination thereof.

20. The dye-sensitized solar cell of claim 1, wherein the π-bridge moiety has the structure

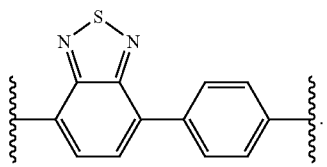 [SMILES: *c1ccc(-c2ccc(*)c3nsnc23)cc1]

* * * * *